(12) United States Patent
Iino et al.

(10) Patent No.: US 12,035,547 B2
(45) Date of Patent: Jul. 9, 2024

(54) IMAGE PICKUP ELEMENT, STACKED IMAGE PICKUP ELEMENT, AND SOLID-STATE IMAGE PICKUP APPARATUS THAT EXEL IN CHARACTERISTICS OF TRANSFERRING AN ELECTRIC CHARGE ACCMLARTED IN PHOTOELECTRIC CONVERSION LAYER

(71) Applicant: SONY CORPORATION, Tokyo (JP)

(72) Inventors: Yoichiro Iino, Tokyo (JP); Hiroshi Nakano, Tokyo (JP); Toshiki Moriwaki, Tokyo (JP)

(73) Assignee: SONY CORPORATION, Tokyo (JP)

( * ) Notice: Subject to any disclaimer, the term of this patent is extended or adjusted under 35 U.S.C. 154(b) by 563 days.

(21) Appl. No.: 17/276,963

(22) PCT Filed: Sep. 6, 2019

(86) PCT No.: PCT/JP2019/035183
§ 371 (c)(1),
(2) Date: Mar. 17, 2021

(87) PCT Pub. No.: WO2020/066553
PCT Pub. Date: Apr. 2, 2020

(65) Prior Publication Data
US 2022/0037602 A1    Feb. 3, 2022

(30) Foreign Application Priority Data
Sep. 28, 2018    (JP) ................................. 2018-183617

(51) Int. Cl.
*H10K 30/10*    (2023.01)
*H10K 39/32*    (2023.01)
*H10K 85/20*    (2023.01)

(52) U.S. Cl.
CPC ............ *H10K 30/10* (2023.02); *H10K 39/32* (2023.02); *H10K 85/211* (2023.02)

(58) Field of Classification Search
CPC ...... H10K 30/10; H10K 39/32; H10K 85/211; H01L 27/14623; H01L 27/14627;
(Continued)

(56) References Cited

U.S. PATENT DOCUMENTS

2015/0188065 A1*  7/2015  Takimoto .......... H01L 27/14685
                                                            257/40
2015/0311259 A1*  10/2015  Joei .................... H01L 27/14636
                                                            257/40
(Continued)

FOREIGN PATENT DOCUMENTS

CN    106206627 A    12/2016
CN    110088914 A    8/2019
(Continued)

OTHER PUBLICATIONS

International Search Report and Written Opinion of PCT Application No. PCT/JP2019/035183, dated Nov. 5, 2019, 09 pages of ISRWO.

*Primary Examiner* — Gevell V Selby
(74) *Attorney, Agent, or Firm* — CHIP LAW GROUP

(57) ABSTRACT

An image pickup element 10 includes a first electrode 21, a charge accumulation electrode 24 that is arranged apart from the first electrode 21, a photoelectric conversion unit 23 that contacts the first electrode 21 and is formed above the charge accumulation electrode 24 via an insulation layer 82, and a second electrode 22 formed on the photoelectric conversion unit 23. The photoelectric conversion unit 23 includes, from the second-electrode side, a photoelectric conversion layer
(Continued)

23A, and an inorganic oxide semiconductor material layer 23B including $In_aGa_bSn_cO_d$, and $0.30 \leq b/(a+b+c) \leq 0.50$ and $b \geq c$ are satisfied.

14 Claims, 75 Drawing Sheets

(58) Field of Classification Search
CPC ......... H01L 27/14605; H01L 27/14612; H01L 27/14636; H01L 27/14638; H01L 27/1464; H01L 27/14643; H01L 27/14665; Y02E 10/549; H04N 25/76
See application file for complete search history.

(56) References Cited

U.S. PATENT DOCUMENTS

| | | |
|---|---|---|
| 2016/0037098 A1 | 2/2016 | Lee et al. |
| 2018/0175102 A1 | 6/2018 | Togashi |

FOREIGN PATENT DOCUMENTS

| | | |
|---|---|---|
| JP | 2011-138927 A | 7/2011 |
| JP | 2016-063165 A | 4/2016 |
| KR | 10-2016-0017168 A | 2/2016 |
| TW | 201309616 A | 3/2013 |
| TW | 201826582 A | 7/2018 |
| WO | 2013/027391 A1 | 2/2013 |
| WO | 2018/110072 A1 | 6/2018 |

\* cited by examiner

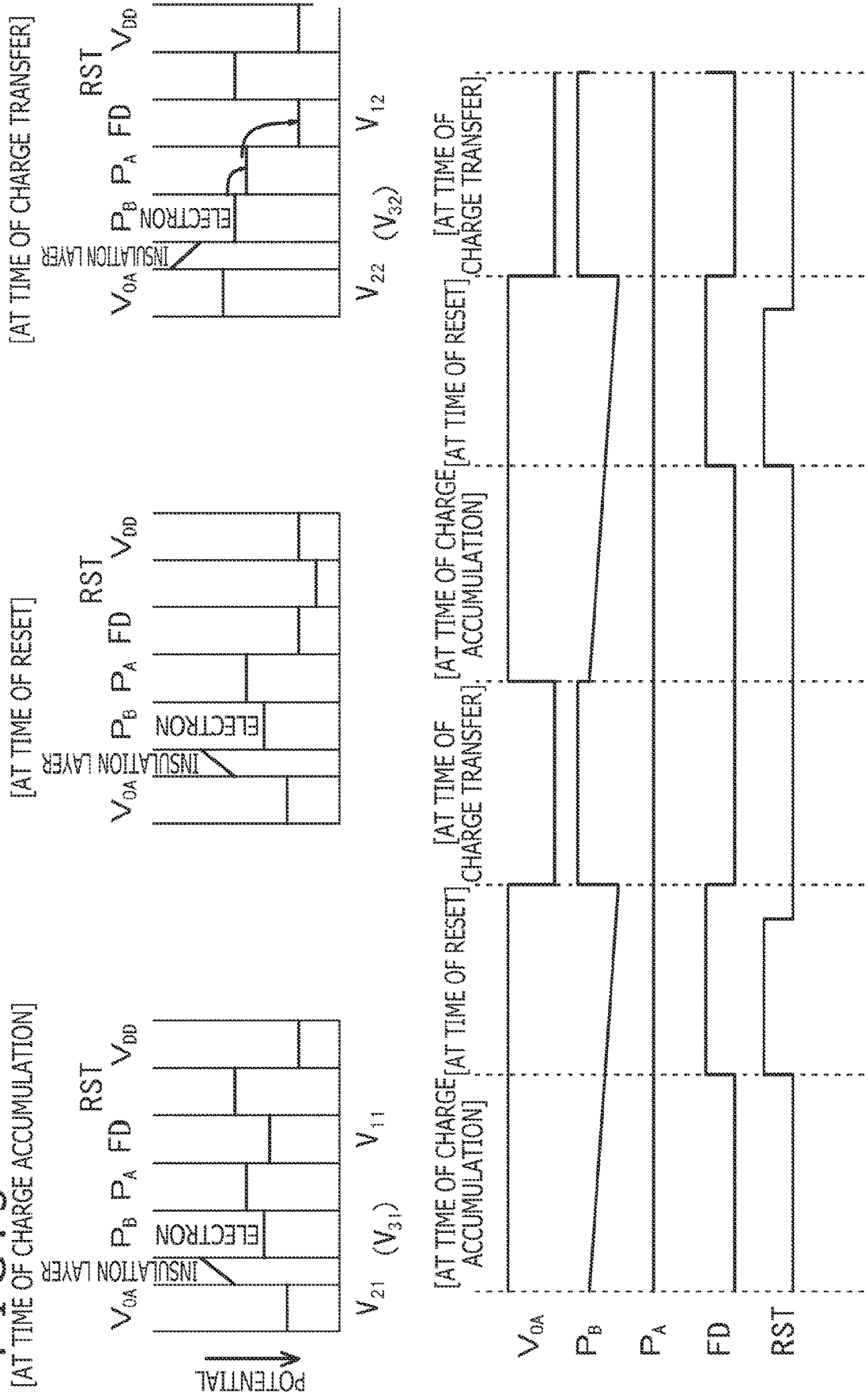

FIG. 20
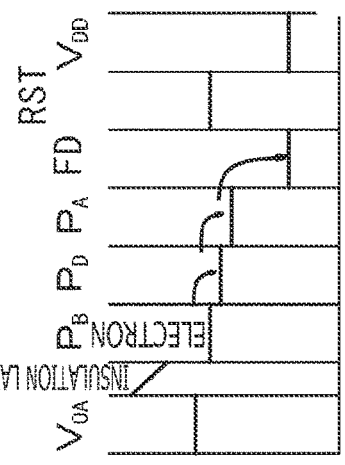
[AT TIME OF CHARGE ACCUMULATION]
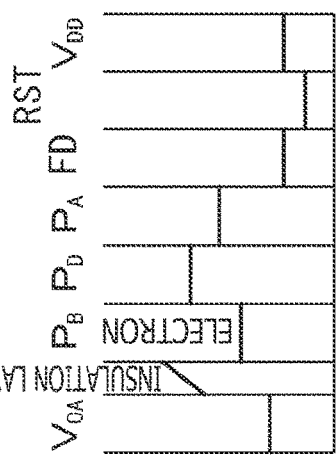
[AT TIME OF RESET]
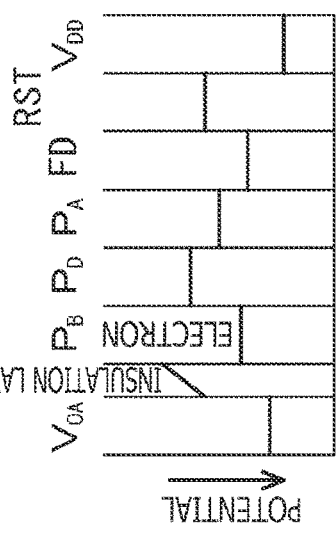
[AT TIME OF CHARGE TRANSFER]
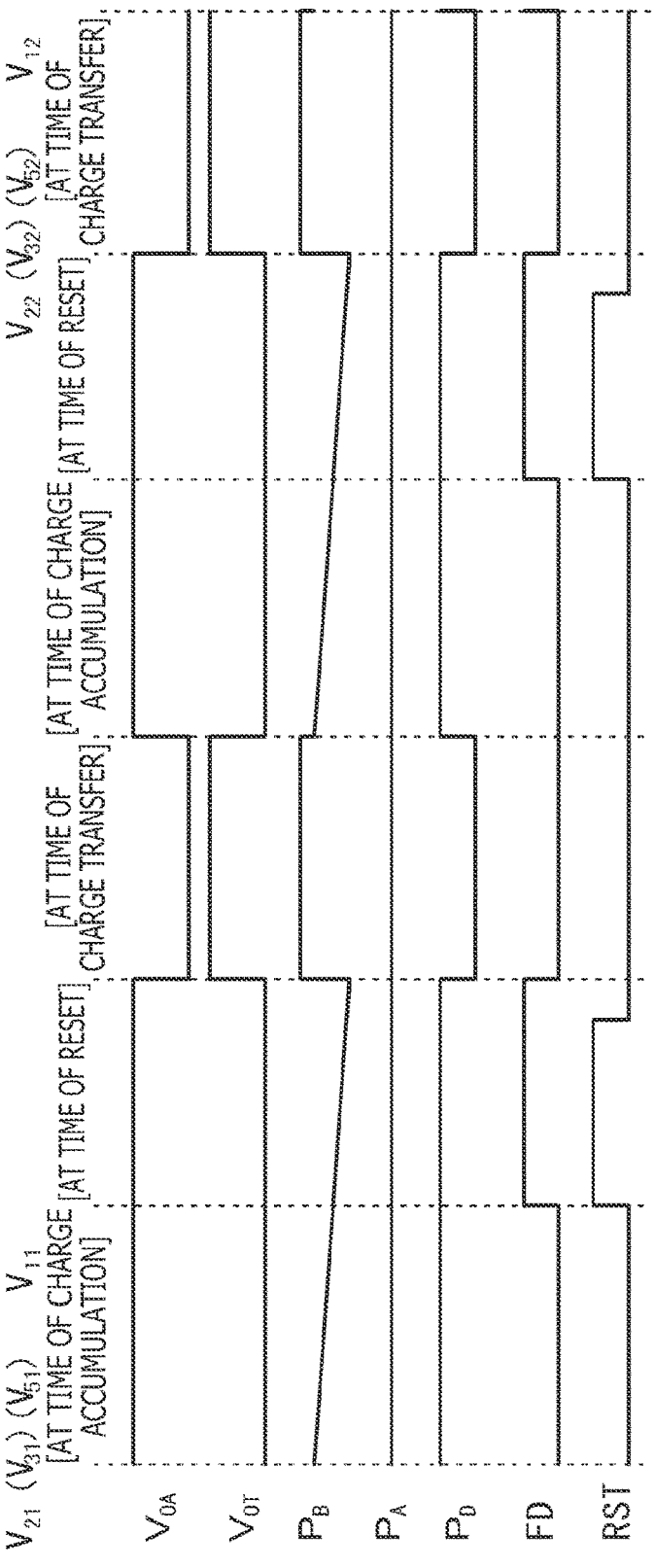

F I G. 2 1
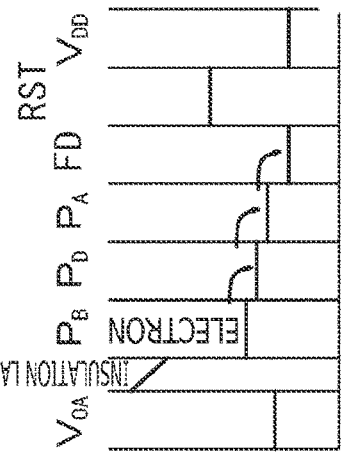
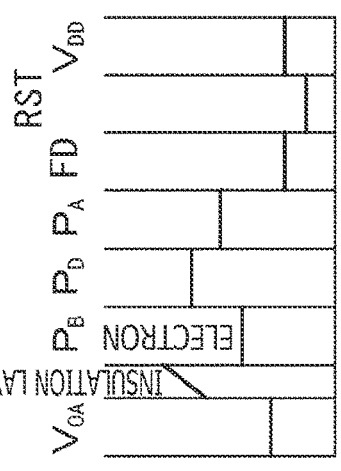
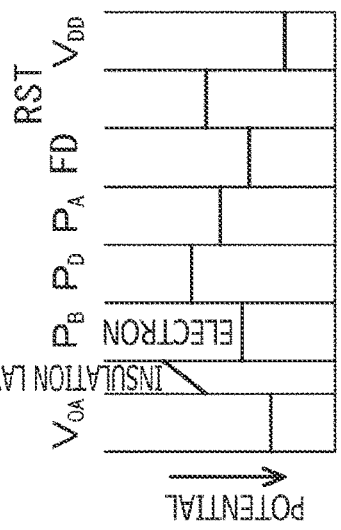
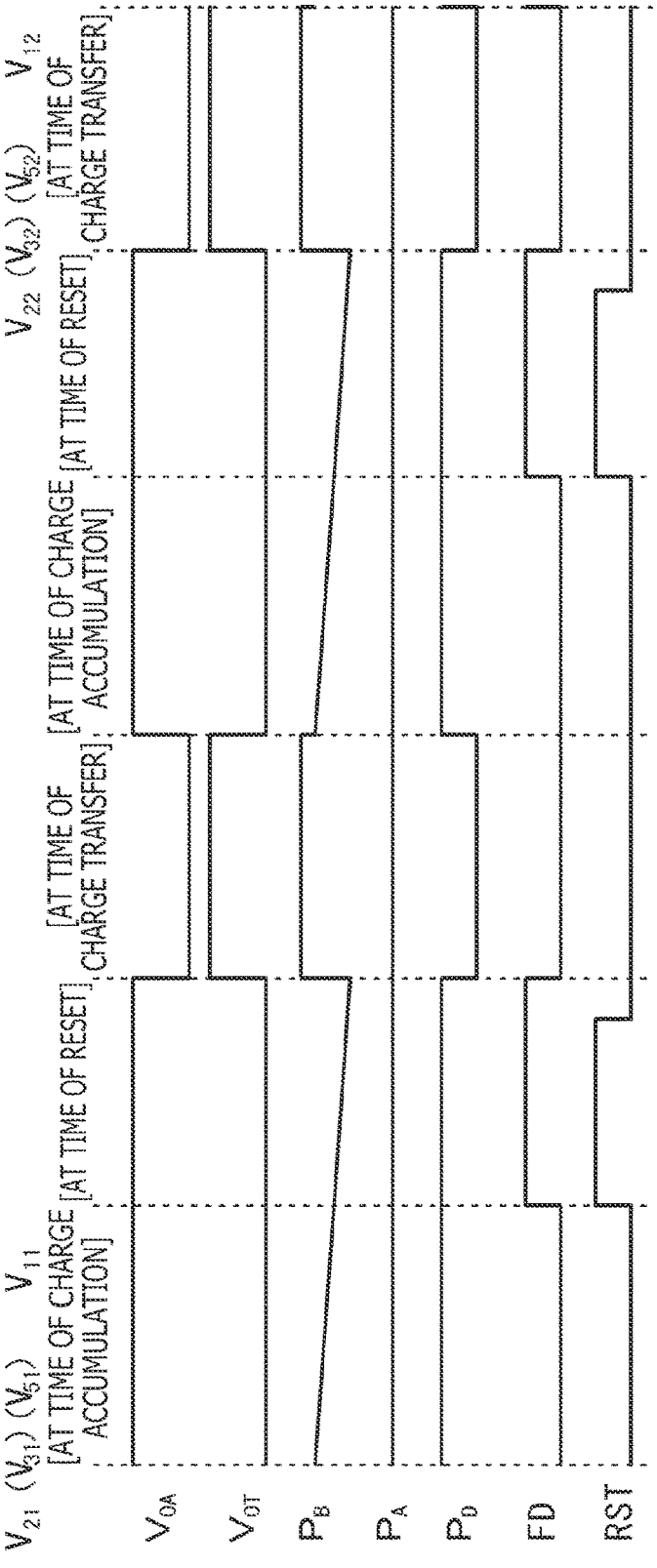

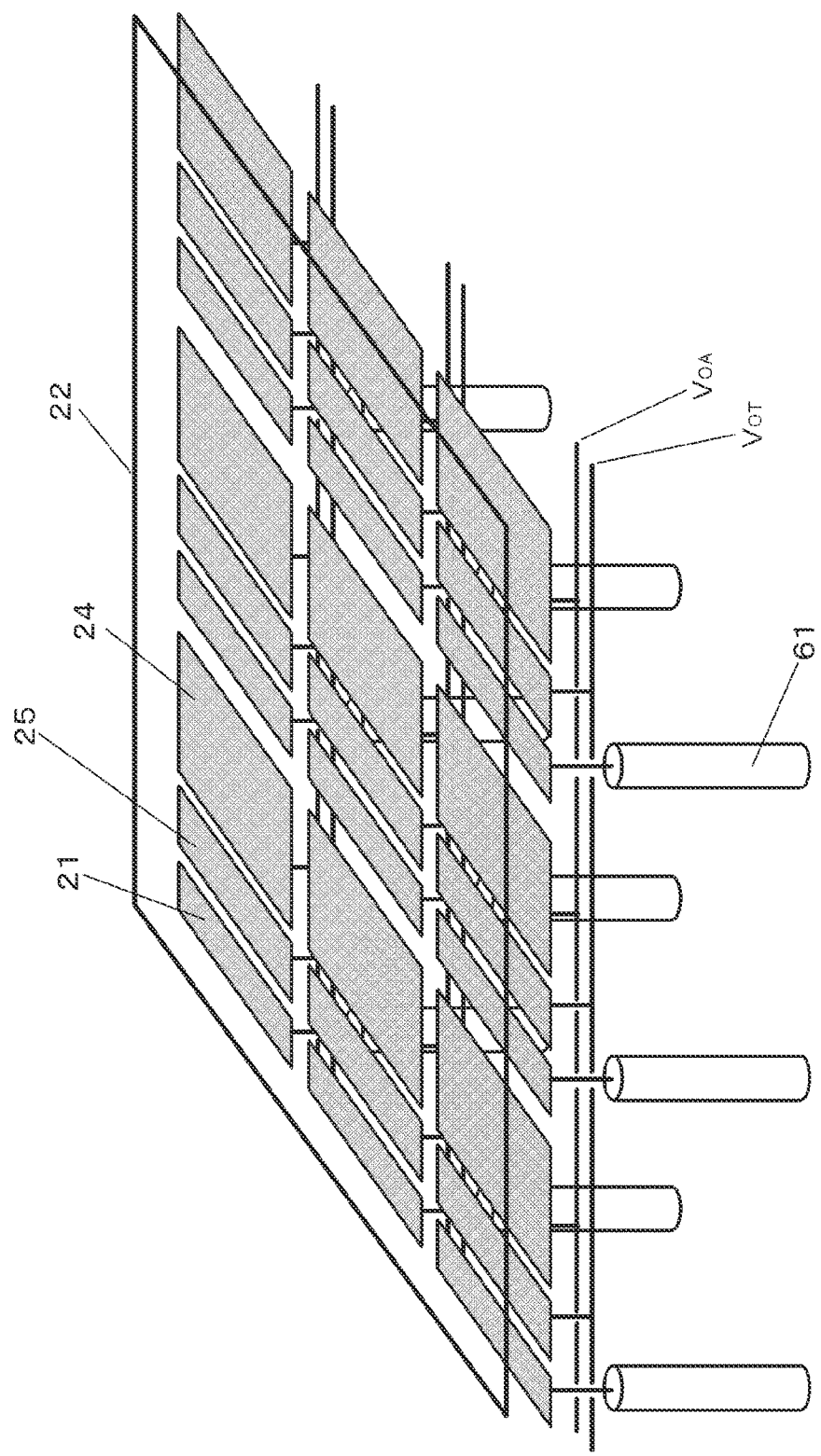
F I G . 2 3

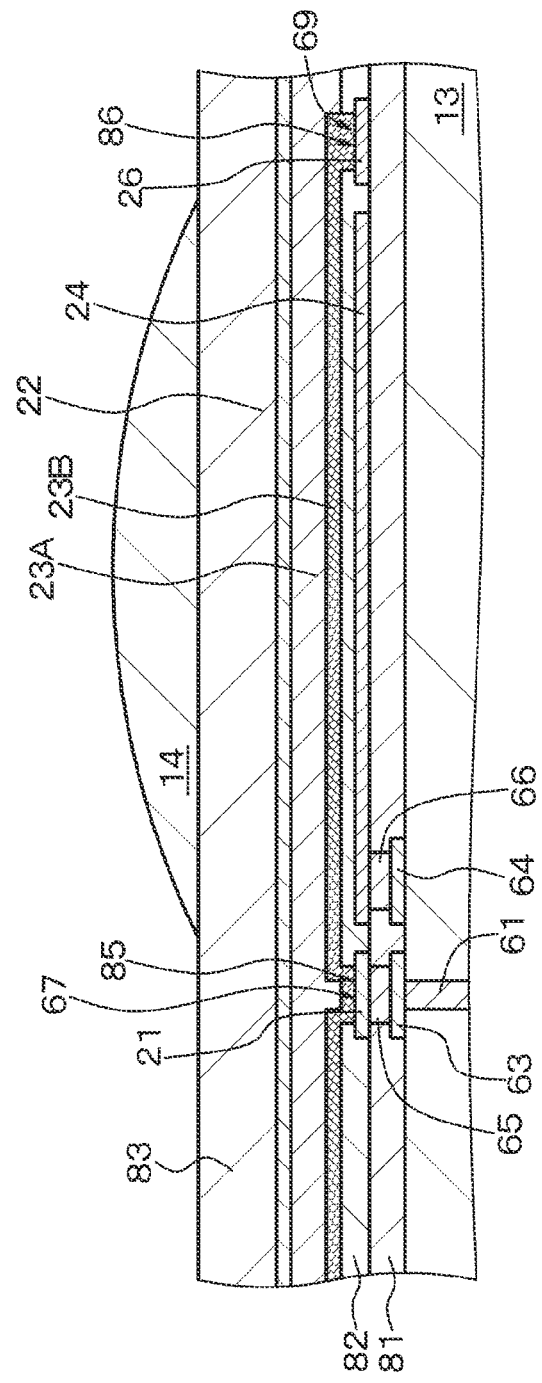
F I G . 2 5

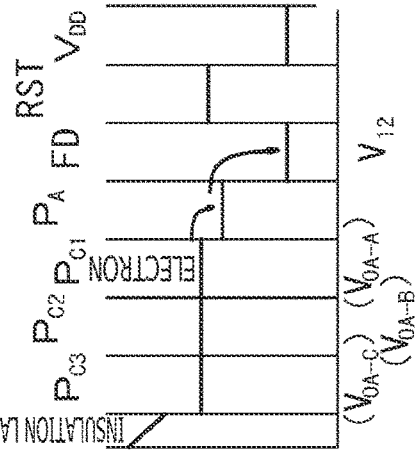
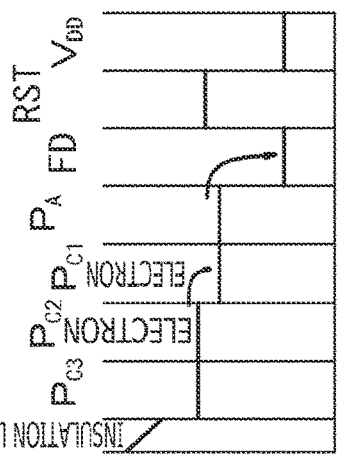
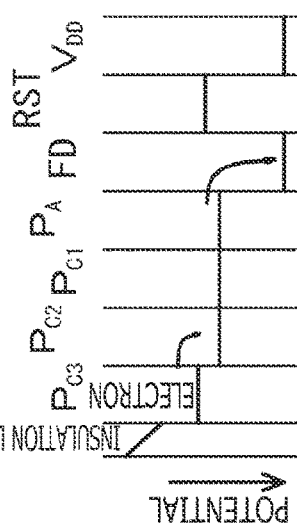
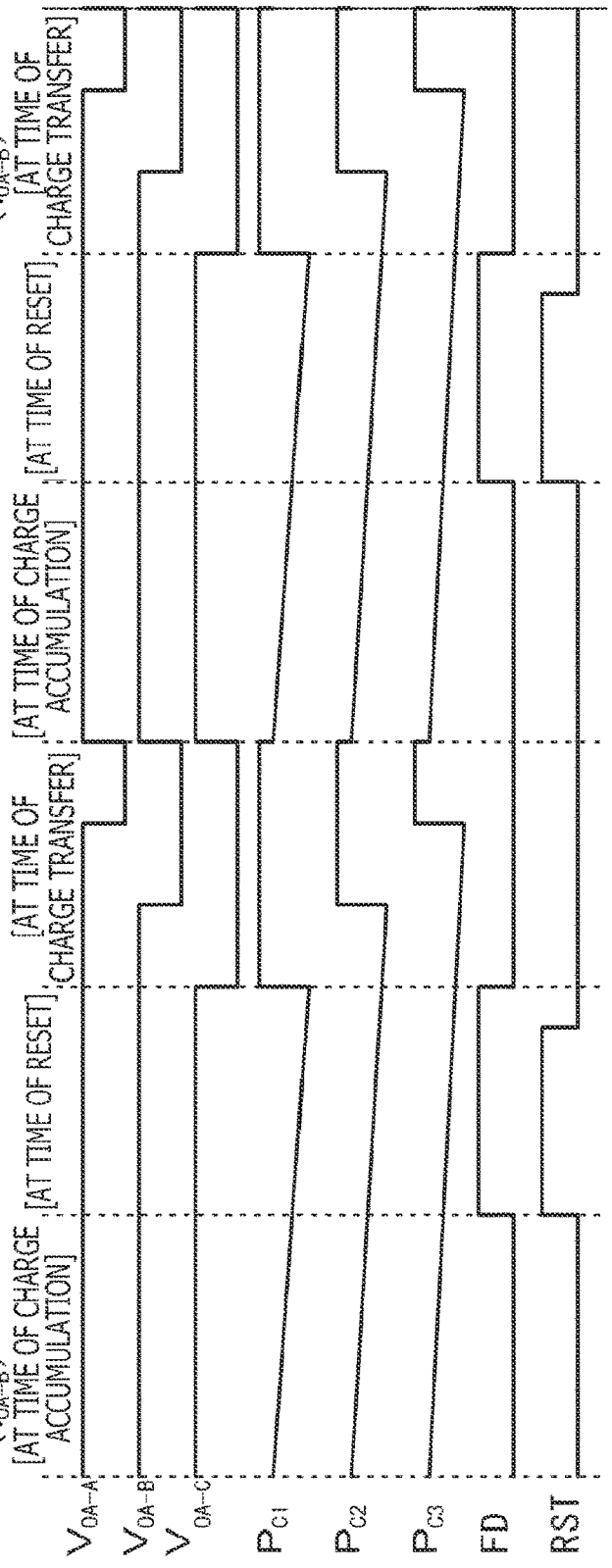
FIG. 33

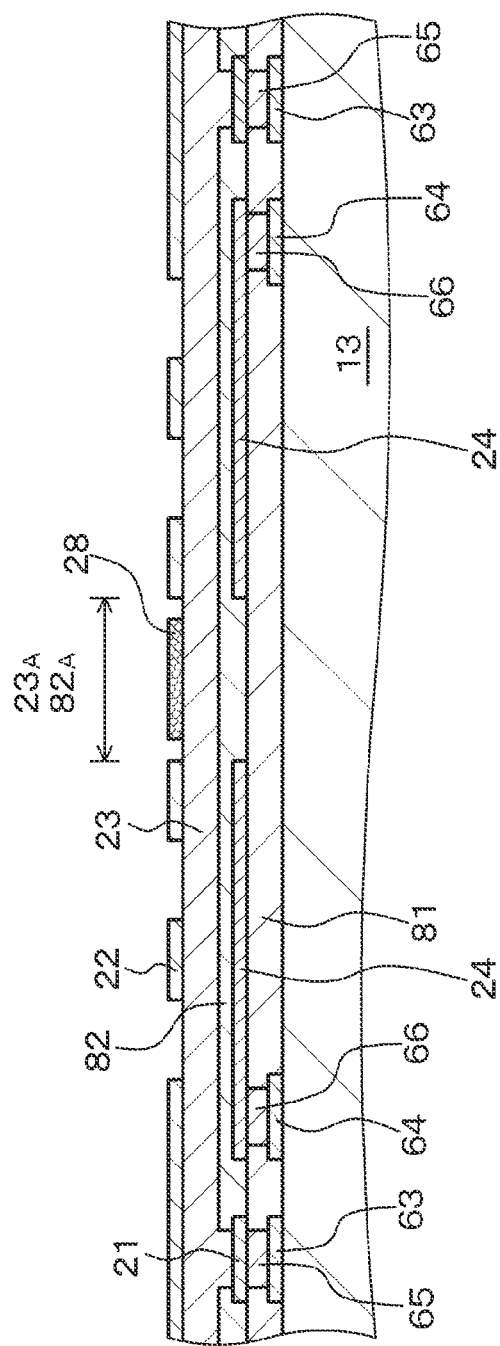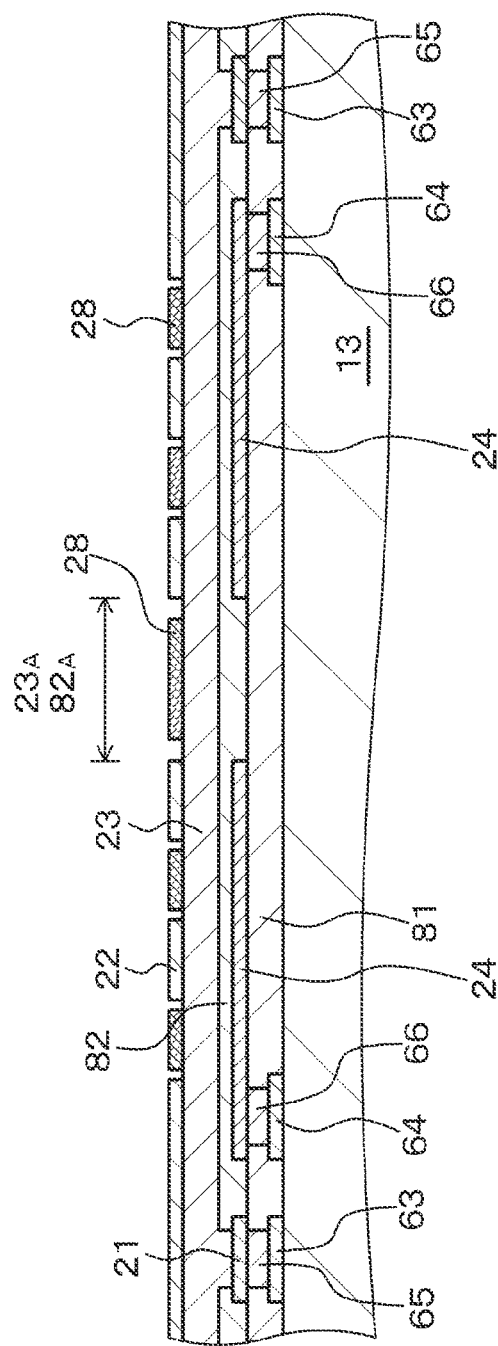

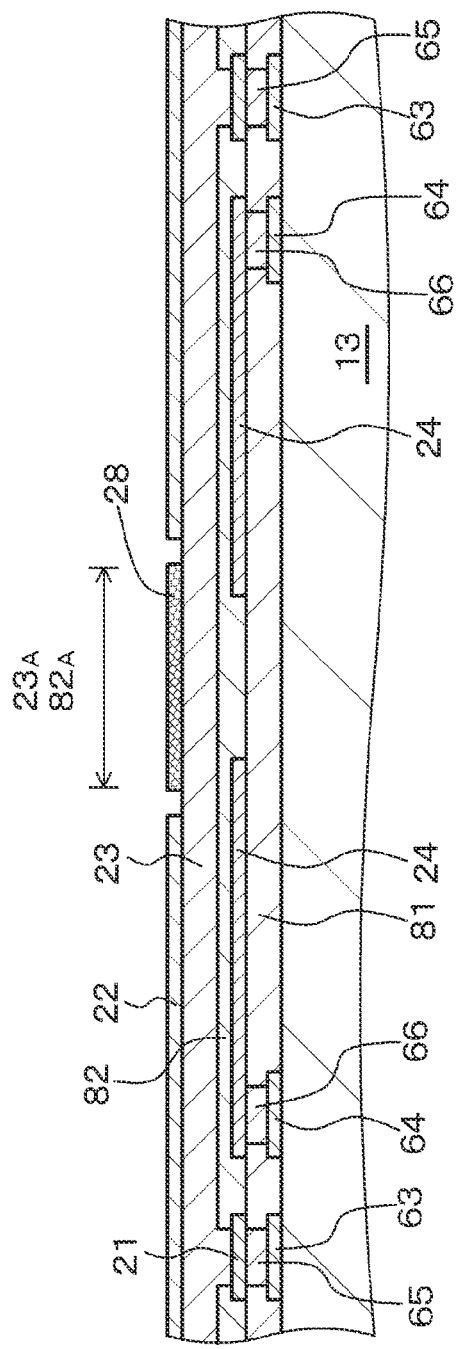

IMAGE PICKUP ELEMENT, STACKED IMAGE PICKUP ELEMENT, AND SOLID-STATE IMAGE PICKUP APPARATUS THAT EXEL IN CHARACTERISTICS OF TRANSFERRING AN ELECTRIC CHARGE ACCMLARTED IN PHOTOELECTRIC CONVERSION LAYER

CROSS REFERENCE TO RELATED APPLICATIONS

This application is a U.S. National Phase of International Patent Application No. PCT/JP2019/035183 filed on Sep. 6, 2019, which claims priority benefit of Japanese Patent Application No. JP 2018-183617 filed in the Japan Patent Office on Sep. 28, 2018. Each of the above-referenced applications is hereby incorporated herein by reference in its entirety.

TECHNICAL FIELD

The present disclosure relates to an image pickup element, a stacked image pickup element, and a solid-state image pickup apparatus.

BACKGROUND ART

In recent years, stacked image pickup elements are attracting attention as image pickup elements included in image sensors and the like. A stacked image pickup element has a structure in which a photoelectric conversion layer (light receiving layer) is sandwiched by two electrodes. Then, the stacked image pickup element needs to have a structure that accumulates and transfers a signal charge generated in the photoelectric conversion layer on the basis of photoelectric conversion. Conventional structures require a structure that accumulates a signal charge in a FD (Floating Drain) electrode and transfers the signal charge therefrom, and need to perform high-speed transfer such that the signal charge will not be delayed.

An image pickup element (photoelectric converting element) for overcoming such a problem is disclosed in JP 2016-63165A, for example. The image pickup element includes:

an accumulation electrode formed on a first insulation layer;
a second insulation layer formed on the accumulation electrode;
a semiconductor layer formed to cover the accumulation electrode and the second insulation layer;
a collection electrode formed to contact the semiconductor layer and formed to be apart from the accumulation electrode;
a photoelectric conversion layer formed on the semiconductor layer; and
an upper-section electrode formed on the photoelectric conversion layer.

An image pickup element that uses an organic semiconductor material for a photoelectric conversion layer can perform photoelectric conversion of a particular color (wavelength band). Then, because of such a feature, in a case that the image pickup element is used in a solid-state image pickup apparatus, it is possible to obtain a structure (stacked image pickup element) in which stacked subpixels, each including a combination of an on-chip color filter layer (OCCF) and the image pickup element, are arrayed two-dimensionally (see JP 2011-138927A, for example), which structure had been impossible with conventional solid-state image pickup apparatuses. In addition, because demosaicing is not necessary, there is an advantage that false colors do not occur. In the following explanation, in some cases, an image pickup element including a photoelectric conversion unit provided on or above a semiconductor substrate is called a "first-type image pickup element," for convenience, the photoelectric conversion unit included in the first-type image pickup element is called a "first-type photoelectric conversion unit," for convenience, an image pickup element provided in a semiconductor substrate is called a "second-type image pickup element," for convenience, and a photoelectric conversion unit included in the second-type image pickup element is called a "second-type photoelectric conversion unit," for convenience.

FIG. 71 illustrates a configuration example of a conventional stacked image pickup element (stacked solid-state image pickup apparatus). In the example illustrated in FIG. 71, a third photoelectric conversion unit 331 and a second photoelectric conversion unit 321 which are second-type photoelectric conversion units included in a third image pickup element 330 and a second image pickup element 320 which are second-type image pickup elements are formed in a semiconductor substrate 370 while being stacked one on another. In addition, a first photoelectric conversion unit 310 which is a first-type photoelectric conversion unit is arranged above the semiconductor substrate 370 (specifically, above the second image pickup element 320). Here, the first photoelectric conversion unit 310 includes a first electrode 311, a photoelectric conversion layer 313 including an organic material, and a second electrode 312, and is included in a first image pickup element which is a first-type image pickup element. The second photoelectric conversion unit 321 and the third photoelectric conversion unit 331 perform photoelectric conversion of blue light and red light, respectively, for example, according to a difference in absorption coefficient. In addition, the first photoelectric conversion unit 310 performs photoelectric conversion of green light, for example.

Electric charges generated by the photoelectric conversion at the second photoelectric conversion unit 321 and the third photoelectric conversion unit 331 are temporarily accumulated in the second photoelectric conversion unit 321 and the third photoelectric conversion unit 331. Thereafter, the electric charges accumulated in the second photoelectric conversion unit 321 and the third photoelectric conversion unit 331 are transferred to a second floating diffusion layer (Floating Diffusion) $FD_2$ and a third floating diffusion layer $FD_3$ by a vertical transistor (a gate section 322 is illustrated) and a transfer transistor (a gate section 332 is illustrated), respectively, and further output to an external read circuit (not illustrated). These transistors and floating diffusion layers $FD_2$ and $FD_3$ are also formed in the semiconductor substrate 370.

The electric charge generated by the photoelectric conversion at the first photoelectric conversion unit 310 is accumulated in a first floating diffusion layer $FD_1$ formed in the semiconductor substrate 370, via a contact hole section 361 and a wiring layer 362. In addition, the first photoelectric conversion unit 310 is connected also to a gate section 318 of an amplification transistor that converts an electric charge amount into a voltage, via the contact hole section 361 and the wiring layer 362. Then, the first floating diffusion layer $FD_1$ is included as part of a reset transistor (a gate section 317 is illustrated). The reference numeral 371 denotes element separation regions, the reference numeral 372 denotes an oxide film formed on a surface of the semiconductor substrate 370, the reference numerals 376 and 381 denote interlayer insulation layers, the reference numeral 383 denotes a protective layer, and the reference numeral 314 denotes an on-chip micro lens.

CITATION LIST

Patent Literature

[PTL 1]
  JP 2016-63165A
[PTL 2]
  JP 2011-138927A

SUMMARY

Technical Problems

However, in the technology disclosed in JP 2016-63165A described above, a constraint that the accumulation electrode and the second insulation layer formed thereon have to be formed to have the same length, an interval which the collection electrode should be provided at, and the like are specified specifically, and this complicates fabrication steps and can lead to deterioration of the manufacturing yield. Further, although a material included in the semiconductor layer is mentioned at some points, a more specific composition and configuration of the material is not mentioned. In addition, a formula of correlation between the mobility of the semiconductor layer and an accumulated electric charge is mentioned. However, matters related to improvements in transfer of an electric charge such as matters related to a relation in terms of energy level between the semiconductor layer and a section that is in the photoelectric conversion layer and is adjacent to the semiconductor layer, which relation is important for transfer of a generated electric charge, are not mentioned at all.

Accordingly, an object of the present disclosure is to provide an image pickup element, a stacked image pickup element, and a solid-state image pickup apparatus that excel in characteristics of transferring electric charges accumulated in photoelectric conversion layers, despite the fact that the image pickup element, the stacked image pickup element, and the solid-state image pickup apparatus have simple configurations and structures.

Solution to Problems

An image pickup element of the present disclosure for achieving the object described above is an image pickup element including:
  a first electrode;
  a charge accumulation electrode arranged apart from the first electrode;
  a photoelectric conversion unit that contacts the first electrode and is formed above the charge accumulation electrode via an insulation layer; and
  a second electrode formed on the photoelectric conversion unit, in which
  the photoelectric conversion unit includes, from a second-electrode side, a photoelectric conversion layer, and an inorganic oxide semiconductor material layer including $In_aGa_bSn_cO_d$, and $0.30 \leq b/(a+b+c) \leq 0.50$ and $b \geq c$ are satisfied.

A stacked image pickup element of the present disclosure for achieving the object described above has at least one of the image pickup element of the present disclosure described above.

A solid-state image pickup apparatus according to a first aspect of the present disclosure for achieving the object described above includes a plurality of the image pickup elements of the present disclosure described above. In addition, a solid-state image pickup apparatus according to a second aspect of the present disclosure for achieving the object described above includes a plurality of the stacked image pickup elements of the present disclosure described above.

BRIEF DESCRIPTION OF DRAWINGS

FIG. 5 is a figure schematically illustrating a state of a potential at each section at a time of operation of the image pickup element of Embodiment 1.

FIG. 20 is a figure schematically illustrating a state of a potential at each section at a time of operation of the image pickup element of Embodiment 4.

FIG. 21 is a figure schematically illustrating a state of the potential at each section at a time of other operation of the image pickup element of Embodiment 4.

FIG. 23 is a schematic perspective oblique view of the first electrodes, the transfer control electrodes, the charge accumulation electrodes, the second electrode, and the contact hole sections that are included in the image pickup elements of Embodiment 4.

FIG. 25 is a schematic partial cross-sectional view of a section of the image pickup element of Embodiment 5.

FIG. 33 is a figure schematically illustrating a state of the potential at each section at a time of other operation (at the time of transfer) of the image pickup element of Embodiment 6.

FIGS. 46A and 46B are schematic cross-sectional views of sections of modification examples of the image pickup elements (two image pickup elements that are arranged side by side) of Embodiment 8.

FIGS. 47A and 47B are other schematic cross-sectional views of sections of modification examples of the image pickup elements (two image pickup elements that are arranged side by side) of Embodiment 8.

FIGS. 58A, 58B, 58C are charts illustrating examples of read and drive operation in an image pickup element block of Embodiment 9.

DESCRIPTION OF EMBODIMENTS

Figure 1:
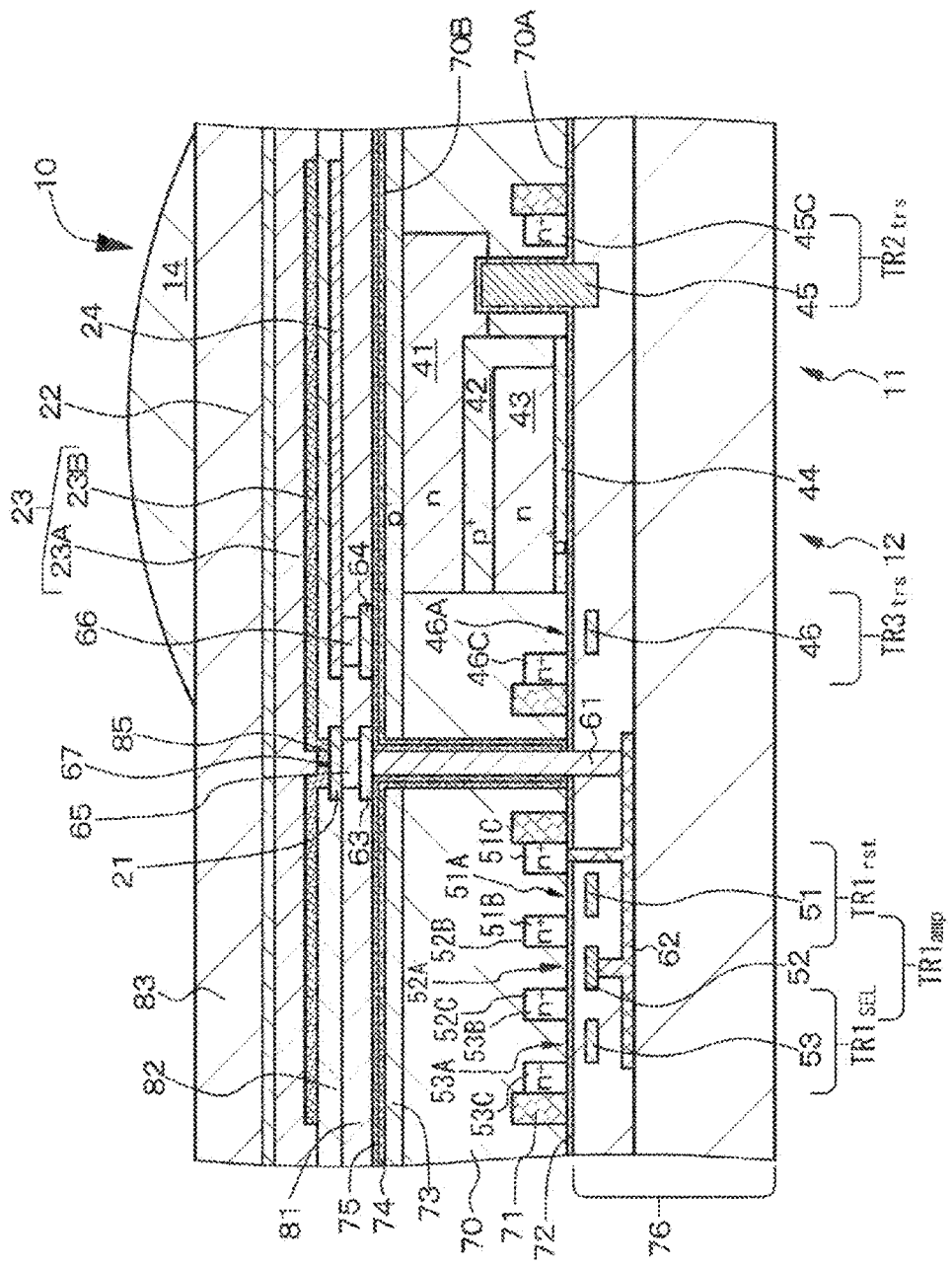
FIG. 1 is a schematic partial cross-sectional view of an image pickup element of Embodiment 1.

In the following, the present disclosure is explained on the basis of embodiments with reference to the drawings. The present disclosure is not limited to the embodiments, and a variety of numerical values and materials in the embodiments are illustrated as examples. Note that the explanation is given in the following order.

1. Overall Explanation regarding Image Pickup Element of Present Disclosure, Stacked Image Pickup Element of Present Disclosure, and Solid-State Image Pickup Apparatus according to First Aspect and Second Aspect of Present Disclosure
2. Embodiment 1 (Image Pickup Element of Present Disclosure, Stacked Image Pickup Element of Present Disclosure, and Solid-State Image Pickup Apparatus according to Second Aspect of Present Disclosure)
3. Embodiment 2 (Modification Example of Embodiment 1)
4. Embodiment 3 (Modification Example of Embodiment 1 and Embodiment 2, Solid-State Image Pickup Apparatus according to First Aspect of Present Disclosure)
5. Embodiment 4 (Modification Example of Embodiment 1 to Embodiment 3, Image Pickup Element Including Transfer Control Electrode)
6. Embodiment 5 (Modification Example of Embodiment 1 to Embodiment 4, Image Pickup Element Including Charge Discharge Electrode)
7. Embodiment 6 (Modification Example of Embodiment 1 to Embodiment 5, Image Pickup Element Including Plurality of Charge Accumulation Electrode Segments)
8. Embodiment 7 (Modification Example of Embodiment 1 to Embodiment 6, Image Pickup Element Including Lower-Section Charge Transfer Control Electrode)

9. Embodiment 8 (Modification Example of Embodiment 1 to Embodiment 6, Image Pickup Element Including Upper-Section Charge Transfer Control Electrode)

10. Embodiment 9 (Solid-State Image Pickup Apparatus with First Configuration and Second Configuration)

11. Embodiment 10 (Modification Example of Embodiment 9)

12. Others

<Overall Explanation Regarding Image Pickup Element of Present Disclosure, Stacked Image Pickup Element of Present Disclosure, and Solid-State Image Pickup Apparatus According to First Aspect and Second Aspect of Present Disclosure>

In an image pickup element of the present disclosure, an Image pickup element of the present disclosure included in a stacked image pickup element of the present disclosure, and an image pickup element of the present disclosure included in a solid-state image pickup apparatus according to a first aspect and a second aspect of the present disclosure (hereinafter, these image pickup elements are collectively called the "image pickup element and the like of the present disclosure," in some cases), the optical gap increases as the value of b (Ga atomic ratio) increases. In order to attain transparency in the visible band, the optical gap is required to be 2.8 eV. On the basis of this, the value of b (Ga atomic ratio) needs to be equal to or greater than 0.15. Note that, in some cases, it is sufficient if only wavelengths longer than the wavelength of green are transmitted, and in such cases the optical gap needs to be equal to or higher than 2.5 eV. On the other hand, for example, in order for an inorganic oxide semiconductor material layer to smoothly receive an electric charge (electrons) generated in a photoelectric conversion layer including fullerene C60, the absolute value of an energy average value $E_{11}$ of the maximum energy value in the conduction band of the inorganic oxide semiconductor material layer needs to be equivalent to or larger than the absolute value 4.5 eV of the maximum energy value in the conduction band of the fullerene. On the basis of this, the value of b (Ga atomic ratio) is preferably equal to or smaller than 0.5. Note that, broadly speaking, the absolute value of the energy average value $E_{11}$ of the maximum energy value in the conduction band of the inorganic oxide semiconductor material layer needs to be equivalent to or larger than the absolute value of the energy average value of the LUMO value of the photoelectric conversion layer.

In addition, gallium (Ga) atoms provide an effect of suppressing occurrence of oxygen deficiency more than indium (In) atoms and tin (Sn) atoms do. Then, in order to suppress oxygen deficiency, the value of b (Ga atomic ratio) is equal to or larger than 0.25, preferably equal to or larger than 0.30, more preferably equal to or larger than 0.35, and particularly preferably equal to or larger than 0.40. On the other hand, if the value of b (Ga atomic ratio) is larger, the value of the electron mobility in the inorganic oxide semiconductor material layer tends to lower, and if the value of b exceeds approximately 0.7, the value of the electron mobility undesirably falls below 10 cm$^2$/V·s. Therefore, in order to keep the electron mobility high, the value of b (Ga atomic ratio) is equal to or smaller than 0.7, and preferably equal to or smaller than 0.5, desirably. Note that the mobility of a material included in the inorganic oxide semiconductor material layer is desirably equal to or higher than 10 cm$^2$/V·s.

In general, in a case that the channel formation region of a thin film transistor includes an inorganic oxide semiconductor material layer, a material included in the inorganic oxide semiconductor material layer needs to have a certain degree of carrier density. On the other hand, the carrier density in the inorganic oxide semiconductor material layer is desirably a value close to 0 when a photoelectric conversion unit is not illuminated with light because it is requested to transfer carriers in the inorganic oxide semiconductor material layer to a first electrode without allowing the carriers to be left in the inorganic oxide semiconductor material layer as much as possible. Then, in order to achieve this, the value of b (Ga atomic ratio) is preferably equal to or larger than 0.3.

Then, taking the discussion above into consideration, the value of b (Ga atomic ratio) is specified such that it satisfies:

$$0.30 \leq b/(a+b+c) \leq 0.50, \text{ and}$$

preferably $$0.40 \leq b/(a+b+c) \leq 0.50,$$

although this is not the sole example. Although, in some cases, hydrogen, other metals, or other impurities such as metal compounds are mixed in, in the film formation process for an inorganic oxide semiconductor material layer, if its volume is very small (e.g., equal to or smaller than 3 mol %), such mixing is not prohibited.

In addition, because tin atoms have a property of easily generating oxygen deficiency, b≥c is satisfied preferably, b≥1.1c is satisfied more preferably, and b≥1.2c is satisfied still more preferably.

Provided that it is defined that the vacuum level is set as the zero reference level, and the absolute value of energy (the sign of the value is negative) increases as the difference from the vacuum level increases, in an image pickup element and the like of the present disclosure including the preferred modes explained above, if the energy average value of the maximum energy value in the conduction band of the inorganic oxide semiconductor material layer is $E_{11}$ (eV), and an energy average value of the LUMO value of the photoelectric conversion layer is $E_{12}$ (eV), $$E_{12} \geq E_{11}$$

is satisfied desirably. Note that the "minimum energy" means the minimum absolute value of the value of energy, and the "maximum energy" means the maximum absolute value of the value of energy. The same also applies to the following explanation.

Further, in the image pickup element and the like of the present disclosure including the preferred modes explained above, if an energy average value of the minimum energy value in the valence band of the inorganic oxide semiconductor material layer is $E_{21}$ (eV), and an energy average value of the HOMO value of the photoelectric conversion layer is $E_{22}$ (eV), $$E_{22} \geq E_{21}$$

is satisfied desirably.

Note that the LUMO value or HOMO value is an energy difference between the vacuum level, which is set to 0 eV, and the LUMO level or HOMO level. The LUMO value of the photoelectric conversion layer also includes the LUMO value of an electron transport material included in the photoelectric conversion layer.

Further, in the image pickup element and the like of the present disclosure including the preferred modes explained above, if the energy average value of the maximum energy value in the conduction band of the inorganic oxide semiconductor material layer is $E_{11}$, $$E_{11} \leq -4.5 \text{ eV}$$

is satisfied desirably, although this is not the sole example. Note that, in this case, a fullerene is preferably used as an electron transport material included in a material included in the photoelectric conversion layer.

Further, in the image pickup element and the like of the present disclosure including the preferred modes explained above, the photoelectric conversion layer desirably includes an n-type organic semiconductor, and in this case the photoelectric conversion layer preferably includes a fullerene, a fullerene derivative or a fullerene derivative. Alternatively, the photoelectric conversion layer desirably includes an electron transport material.

Further, in a possible mode of the image pickup element and the like of the present disclosure including the preferred modes explained above, an electric charge generated in the photoelectric conversion layer is transferred to the first electrode via the inorganic oxide semiconductor material layer, and in this case the electric charge is electrons.

The energy average value $E_{11}$ of the maximum energy value in the conduction band of the inorganic oxide semiconductor material layer and the energy average value $E_{21}$ of the minimum energy value in the valence band of the inorganic oxide semiconductor material layer are average values in the inorganic oxide semiconductor material layer. In addition, the energy average value $E_{12}$ of the LUMO value of the photoelectric conversion layer and the energy average value $E_{22}$ of the HOMO value of the photoelectric conversion layer are average values at a section that is in the photoelectric conversion layer and is positioned near the inorganic oxide semiconductor material layer. Here, the "section that is in the photoelectric conversion layer and is positioned near the inorganic oxide semiconductor material layer" means a section that is in the photoelectric conversion layer and is positioned in a region with a depth equivalent to 10% of the thickness of the photoelectric conversion layer (i.e., a region with a depth equal to 0% to 10% of the thickness of the photoelectric conversion layer) from the interface between the inorganic oxide semiconductor material layer and the photoelectric conversion layer.

The energy in the valence band and the HOMO value can be determined on the basis of the ultraviolet photoelectron spectroscopy (UPS method), for example. In addition, the energy in the conduction band and the LUMO value can be determined from {(energy in valence band, HOMO value)+ $E_b$}. Further, the bandgap energy $E_b$ can be determined on the basis of the following formula from an optically absorbed wavelength λ (an optical absorption edge wavelength measured in nm).

$$E_b = hv = h(c/\lambda) = 1239.8/\lambda \text{ [eV]}$$

Further, in the image pickup element and the like of the present disclosure including the various types of preferred modes explained above, the inorganic oxide semiconductor material layer may have a crystalline structure or may be amorphous, and preferably is amorphous (e.g., amorphous without having a crystalline structure locally). Whether or not the inorganic oxide semiconductor material layer is amorphous can be decided on the basis of an X-ray diffraction analysis.

Further, in the image pickup element and the like of the present disclosure including the various types of preferred modes explained above, preferably the thickness of the inorganic oxide semiconductor material layer is $1 \times 10^{-8}$ to $1.5 \times 10^{-7}$ m, preferably $2 \times 10^{-8}$ to $1.0 \times 10^{-7}$ m, more preferably $3 \times 10^{-8}$ to $1.0 \times 10^{-7}$ m.

Further, in the image pickup element and the like of the present disclosure including the various types of preferred modes explained above, preferably, light enters from a second electrode,
surface roughness Ra of a surface of the inorganic oxide semiconductor material layer at the interface between the photoelectric conversion layer and the inorganic oxide semiconductor material layer is equal to or lower than 1.5 nm, and the value of root mean square roughness Rq of the surface of the inorganic oxide semiconductor material layer is equal to or lower than 2.5 nm. The surface roughness Ra and Rq is based on specifications in JIS B0601:2013. Such smoothness of the surface of the inorganic oxide semiconductor material layer suppresses surface scattering reflection on the inorganic oxide semiconductor material layer, and it is possible to attempt to enhance bright current characteristics in photoelectric conversion. Preferably, the surface roughness Ra of a surface of a charge accumulation electrode is equal to or lower than 1.5 nm, and the value of the root mean square roughness Rq of the surface of the charge accumulation electrode is equal to or smaller than 2.5 nm.

Further, in the image pickup element and the like of the present disclosure including the various types of preferred modes explained above, the carrier concentration of the inorganic oxide semiconductor material layer is preferably lower than $1 \times 10^{16}/cm^3$.

The first electrode, the second electrode, the charge accumulation electrode, and the photoelectric conversion layer are explained in detail later.

Figure 71:
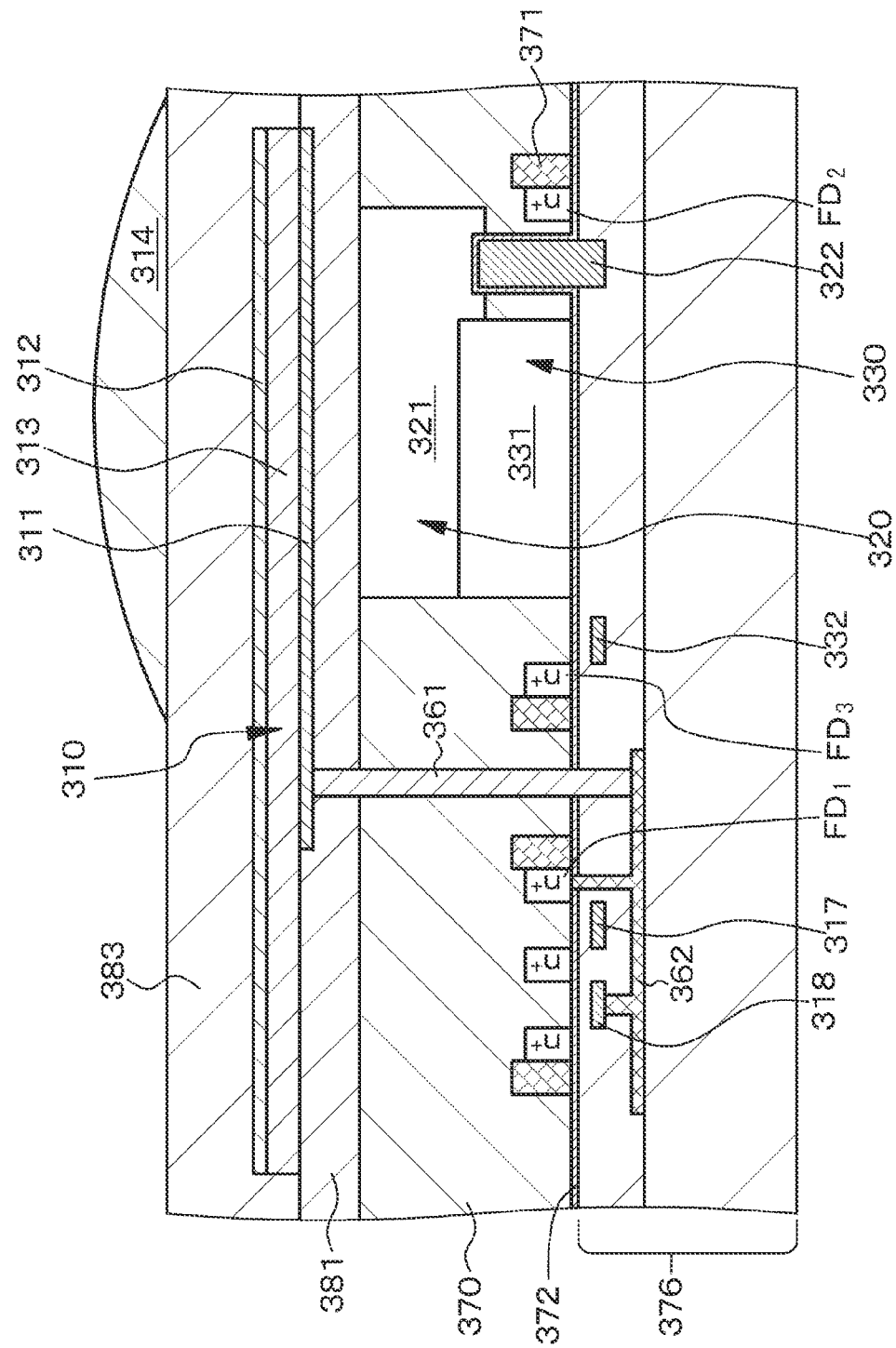
FIG. 71 is a conceptual diagram of a conventional stacked image pickup element (stacked solid-state image pickup apparatus).

In the conventional image pickup element illustrated in FIG. 71, electric charges generated by photoelectric conversion at the second photoelectric conversion unit 321 and the third photoelectric conversion unit 331 are temporarily accumulated in the second photoelectric conversion unit 321 and the third photoelectric conversion unit 331, and then transferred to the second floating diffusion layer $FD_2$ and the third floating diffusion layer $FD_3$. Therefore, the electric charges can completely be depleted at the second photoelectric conversion unit 321 and the third photoelectric conversion unit 331. However, an electric charge generated by photoelectric conversion at the first photoelectric conversion unit 310 is directly accumulated in the first floating diffusion layer $FD_1$. Therefore, it is difficult to completely deplete the electric charge in the first photoelectric conversion unit 310. Then, as a result, there is a possibility that kTC noise increases, random noise worsens, and the image pickup quality deteriorates.

Because, as mentioned above, the image pickup element and the like of the present disclosure includes the charge accumulation electrode that is arranged apart from the first electrode and that is arranged to face the inorganic oxide semiconductor material layer via the insulation layer, when the light applies to the photoelectric conversion unit, and the light is photoelectrically converted at the photoelectric conversion unit, an electric charge can be accumulated in the inorganic oxide semiconductor material layer (the inorganic oxide semiconductor material layer and the photoelectric conversion layer, in some cases). Therefore, it becomes possible to completely deplete an electric charge in the charge accumulation section, and to erase the electric charge at the start of exposure. As a result, it is possible to suppress occurrence of a phenomenon that kTC noise increases, random noise worsens, and the image pickup quality deteriorates. Note that the inorganic oxide semiconductor material layer, or the inorganic oxide semiconductor material layer and the photoelectric conversion layer collectively is/are called an "inorganic oxide semiconductor material layer and the like," in some cases, in the following explanation.

The inorganic oxide semiconductor material layer may have a single layer configuration or may have a multi-layer configuration. In addition, a material included in the inorganic oxide semiconductor material layer positioned above the charge accumulation electrode and a material included in the inorganic oxide semiconductor material layer positioned above the first electrode may be made different from each other.

Film formation for the inorganic oxide semiconductor material layer can be performed on the basis of a sputtering method, for example. Specifically, for example, a parallel flat plate sputtering apparatus, a DC magnetron sputtering apparatus, or an RF sputtering apparatus can be used as a sputtering apparatus, and an argon (Ar) gas can be used as a process gas. In addition, it is sufficient if an $In_aGa_bSn_cO_d$ sintered body is used as a target.

Note that, in a case that the inorganic oxide semiconductor material layer is formed on the basis of a sputtering method, the energy level of the inorganic oxide semiconductor material layer can be controlled by controlling an oxygen gas introduction amount (oxygen gas partial pressure). Specifically, the oxygen gas partial pressure=($O_2$ gas pressure)/(total pressure of Ar gas and an $O_2$ gas) at the time of formation based on the sputtering method is preferably set to 0.005 to 0.10. Further, in a possible mode of the image pickup element and the like of the present disclosure, the content rate of oxygen in the inorganic oxide semiconductor material layer is made lower than the oxygen content rate of a stoichiometric composition. Here, it is possible to control the energy level of the inorganic oxide semiconductor material layer on the basis of the content rate of oxygen, and it becomes possible to deepen the energy level by further lowering the content rate of oxygen below the oxygen content rate of the stoichiometric composition, that is, by increasing oxygen deficiency.

Examples of the image pickup element of the present disclosure include a CCD element, a CMOS image sensor, a CIS (Contact Image Sensor), and a CMD (Charge Modulation Device) signal amplification image sensor. The solid-state image pickup apparatus according to the first aspect and the second aspect of the present disclosure, and a solid-state image pickup apparatus with a first configuration and a second configuration mentioned below can form, for example, a digital still camera, a video camera, a camcorder, a surveillance camera, a camera to be mounted on a vehicle, a smartphone camera, a game user interface camera, and a biometric authentication camera.

Embodiment 1

Figure 2:
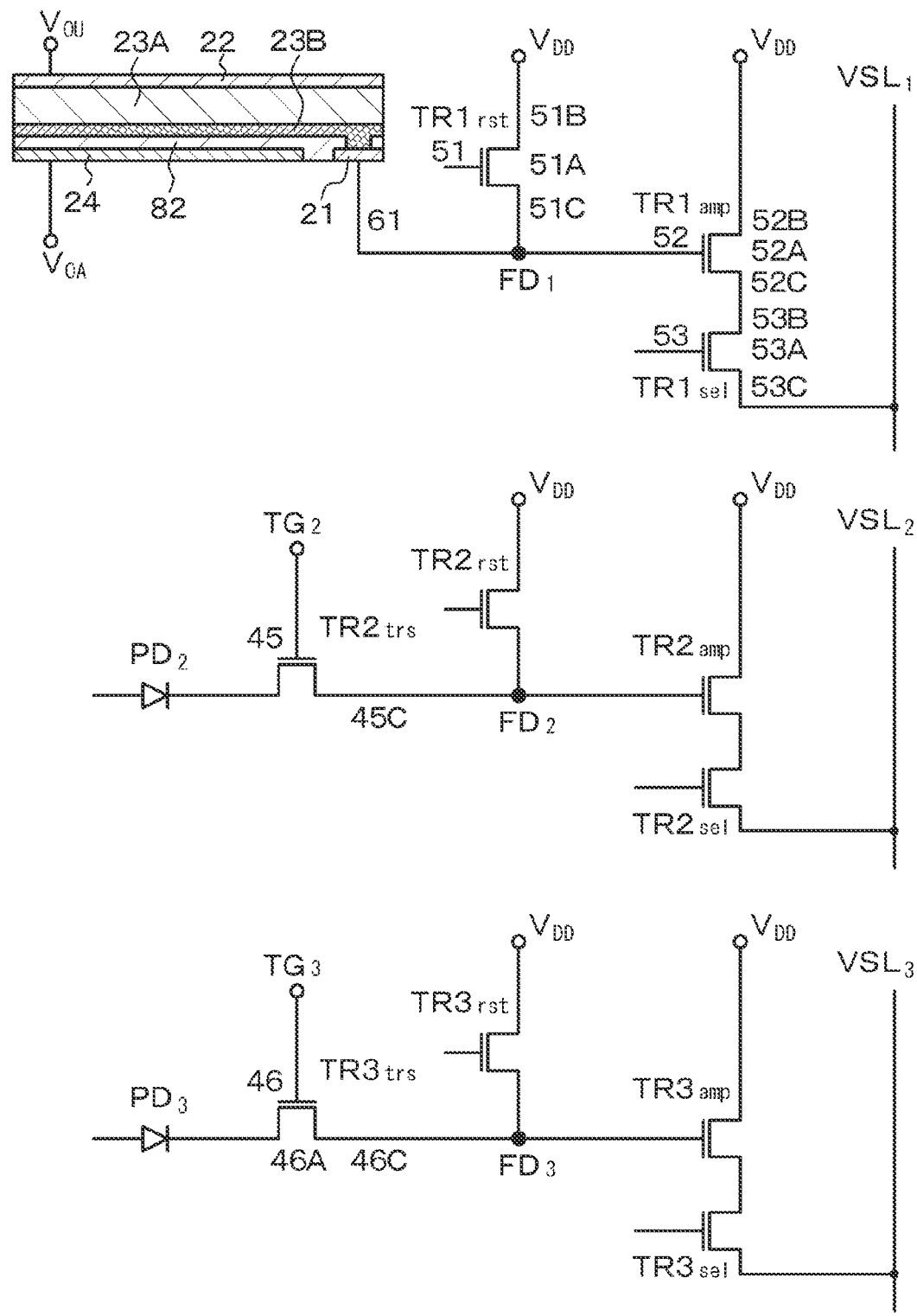
FIG. 2 is an equivalent circuit diagram of the image pickup element of Embodiment 1.
Figure 3:
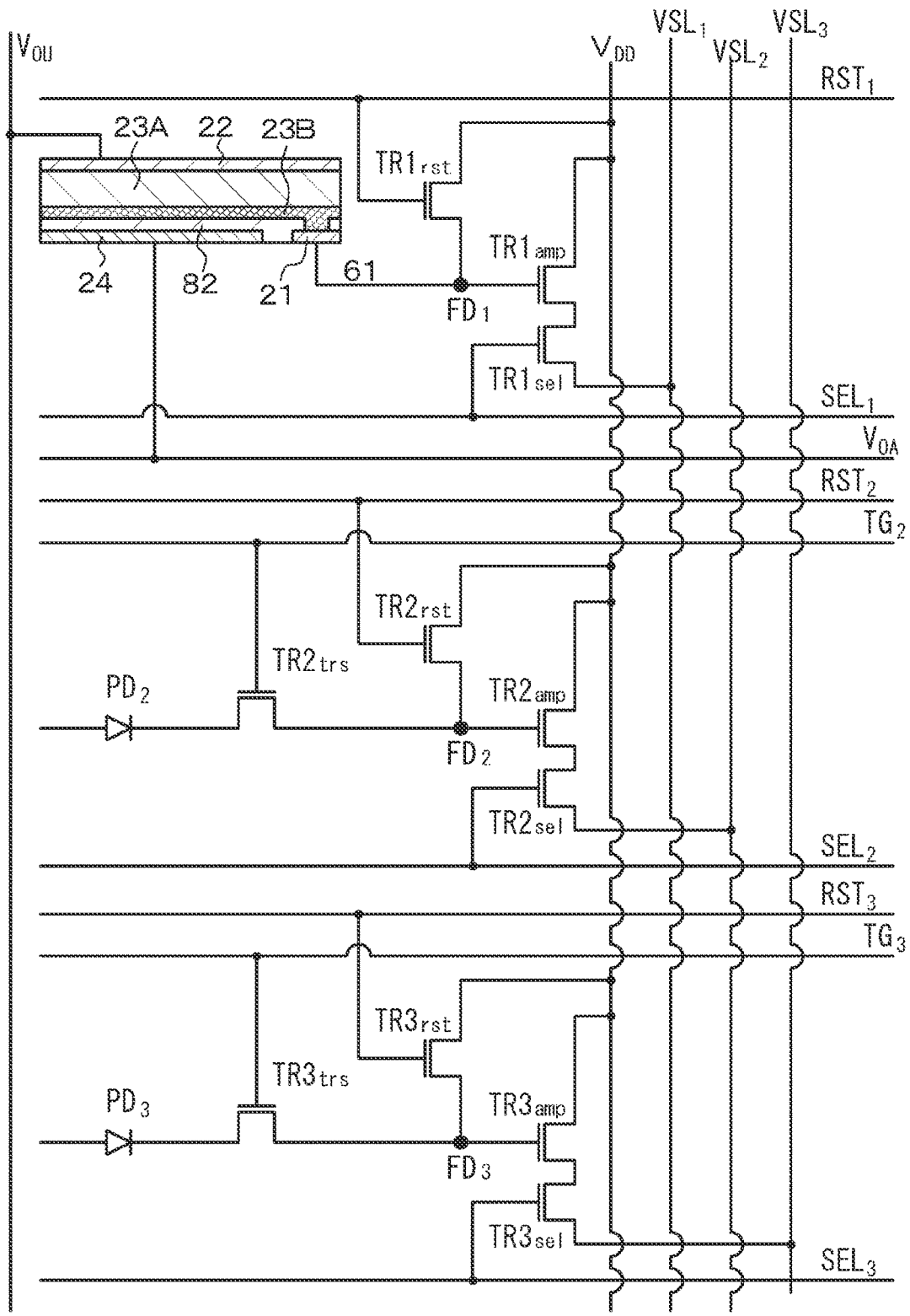
FIG. 3 is another equivalent circuit diagram of the image pickup element of Embodiment 1.
Figure 4:
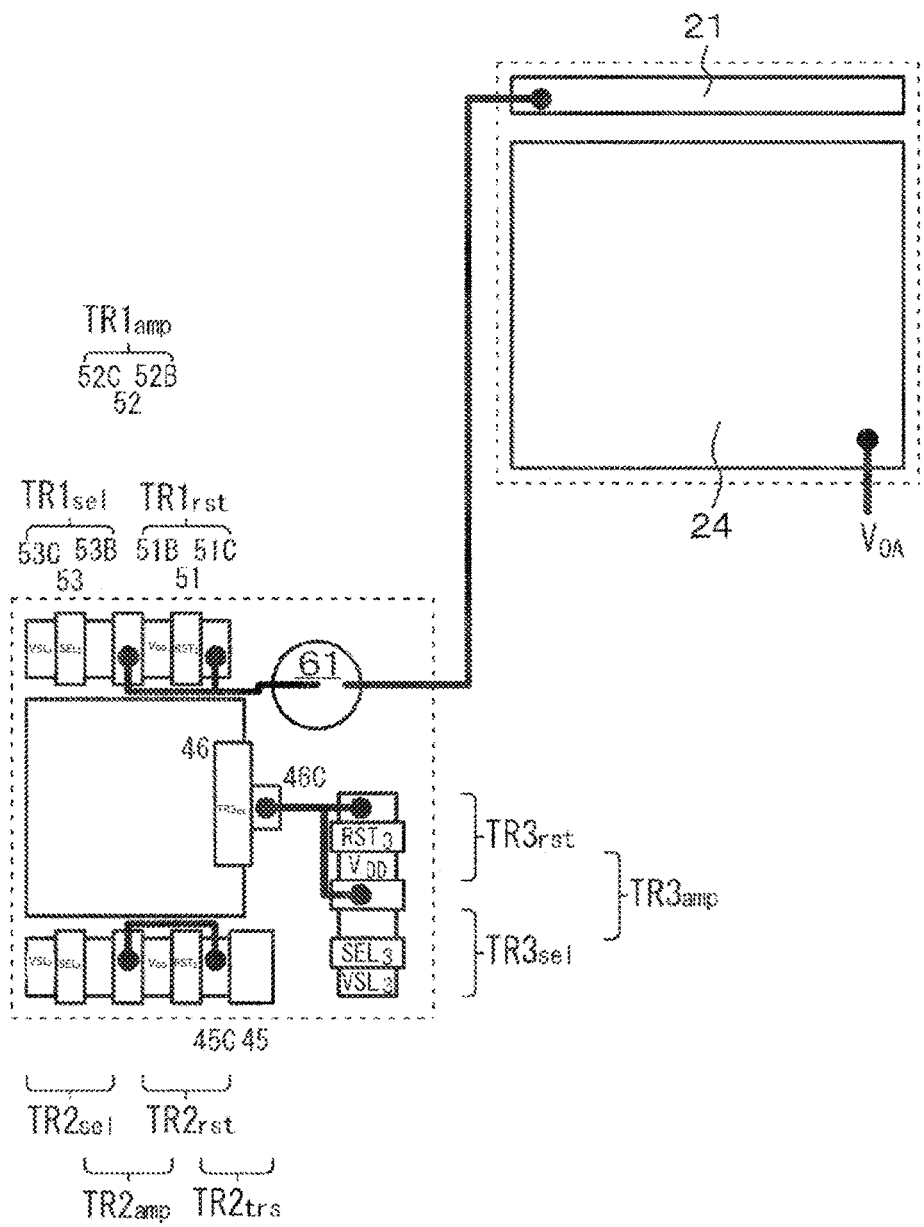
FIG. 4 is a schematic arrangement diagram of a first electrode and a charge accumulation electrode that are included in the image pickup element of Embodiment 1, and transistors included in a control unit.
Figure 6A:
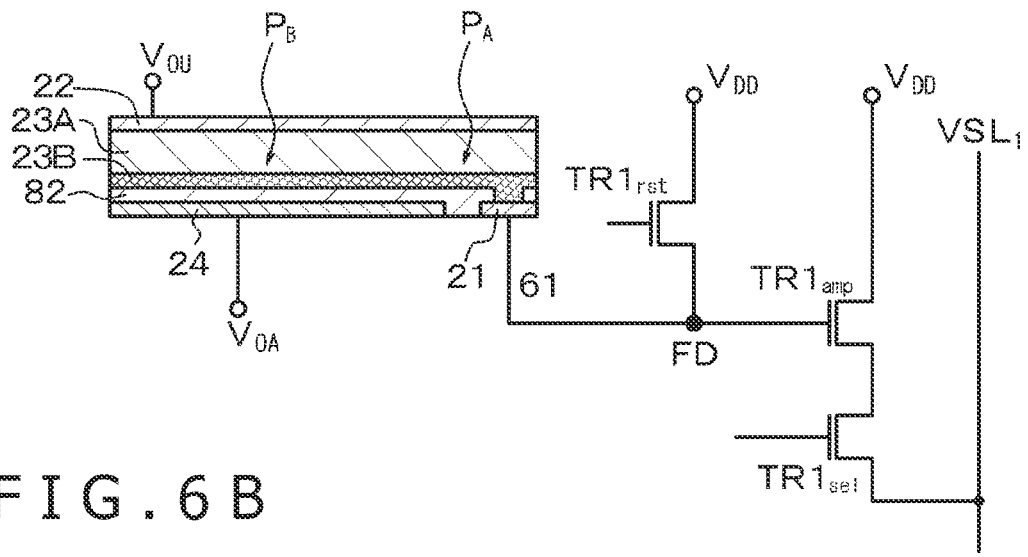
FIG. 6A, FIG. 6B, and FIG. 6C are equivalent circuit diagrams of the image pickup element of Embodiment 1, Embodiment 4, and Embodiment 6 for explaining each section in FIG. 5 (Embodiment 1), FIG. 20 and FIG. 21 (Embodiment 4), and FIG. 32 and FIG. 33 (Embodiment 6).
Figure 7:
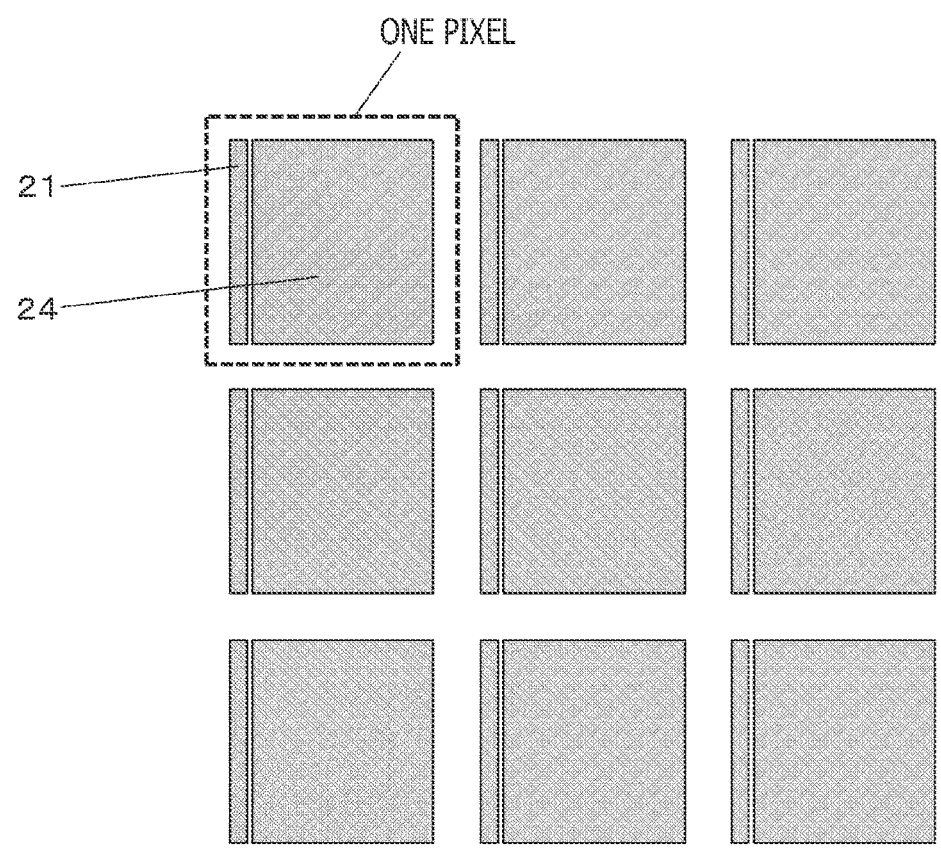
FIG. 7 is a schematic arrangement diagram of the first electrodes and the charge accumulation electrodes that are included in the image pickup elements of Embodiment 1.
Figure 8:
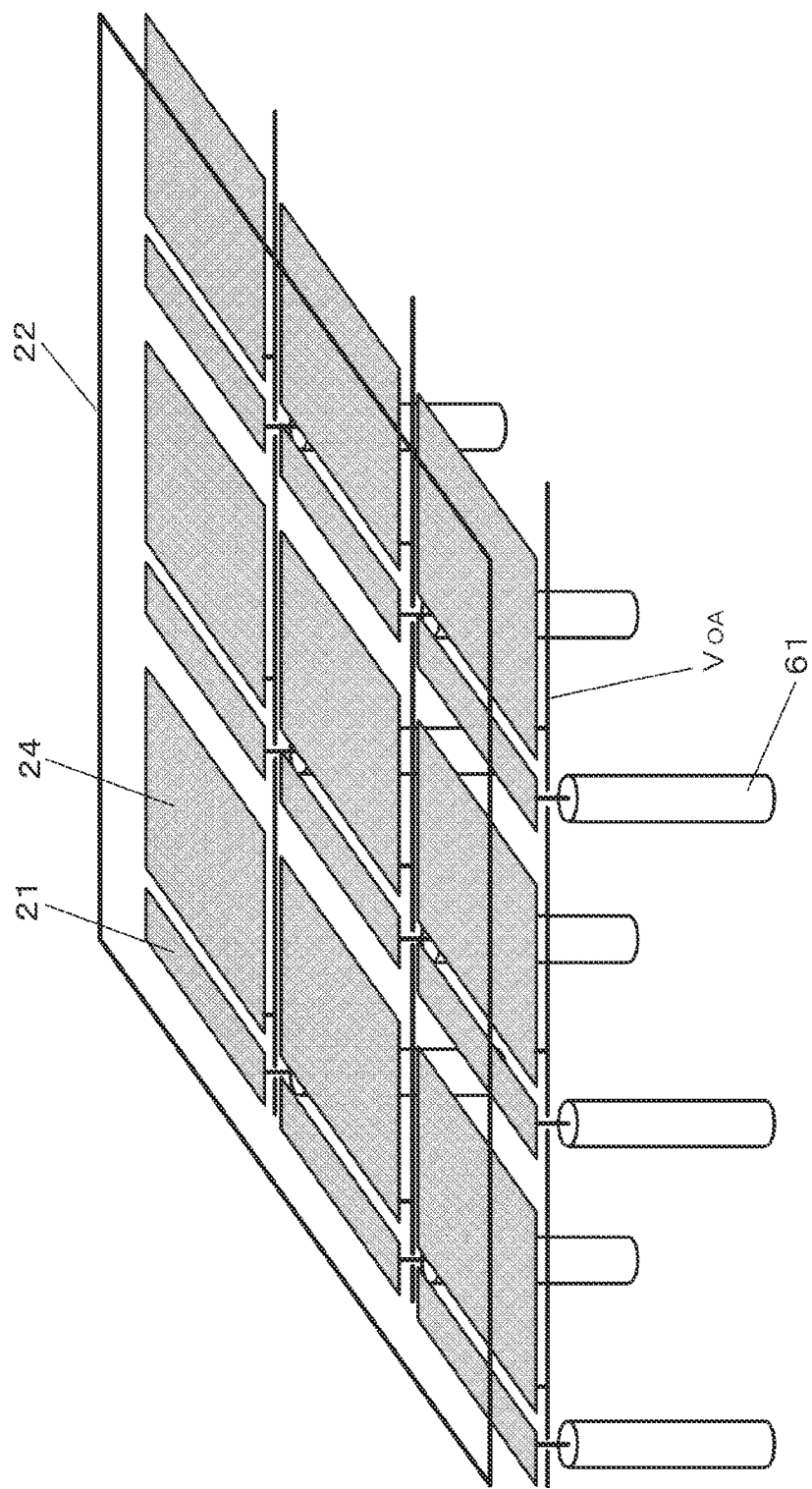
FIG. 8 is a schematic perspective oblique view of the first electrodes, the charge accumulation electrodes, a second electrode, and contact hole sections that are included in the image pickup elements of Embodiment 1.
Figure 68:
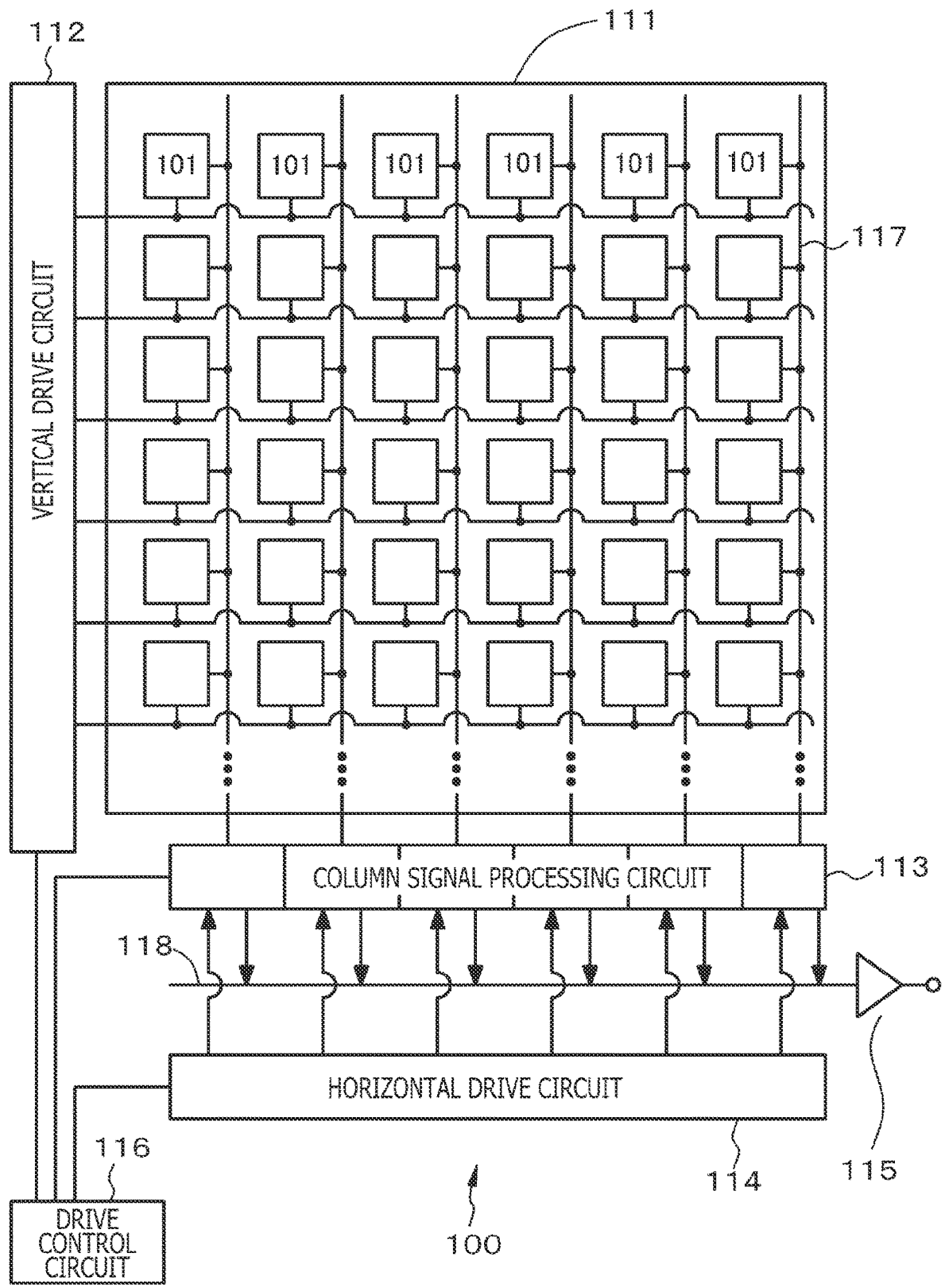
FIG. 68 is a conceptual diagram of the solid-state image pickup apparatus of Embodiment 1.

Embodiment 1 relates to the image pickup element of the present disclosure, the stacked image pickup element of the present disclosure, and the solid-state image pickup apparatus according to the second aspect of the present disclosure. FIG. 1 illustrates a schematic partial cross-sectional view of the image pickup element and the stacked image pickup element (hereinafter, called the "image pickup element" simply) of Embodiment 1, FIG. 2 and FIG. 3 illustrate equivalent circuit diagrams of the image pickup element of Embodiment 1, FIG. 4 illustrates a schematic arrangement diagram of a first electrode and a charge accumulation electrode that are included in a photoelectric conversion unit of the image pickup element of Embodiment 1, and transistors included in a control unit, FIG. 5 schematically illustrates a state of a potential at each section at a time of operation of the image pickup element of Embodiment 1, and FIG. 6A illustrates an equivalent circuit diagram for explaining each section of the image pickup element of Embodiment 1. In addition, FIG. 7 illustrates a schematic arrangement diagram of the first electrodes and the charge accumulation electrodes that are included in the image pickup elements of Embodiment 1, and FIG. 8 illustrates a schematic perspective oblique view of the first electrodes, the charge accumulation electrodes, a second electrode, and contact hole sections that are included in the image pickup elements of Embodiment 1. Further, FIG. 68 illustrates a conceptual diagram of the solid-state image pickup apparatus of Embodiment 1.

Figure 70:
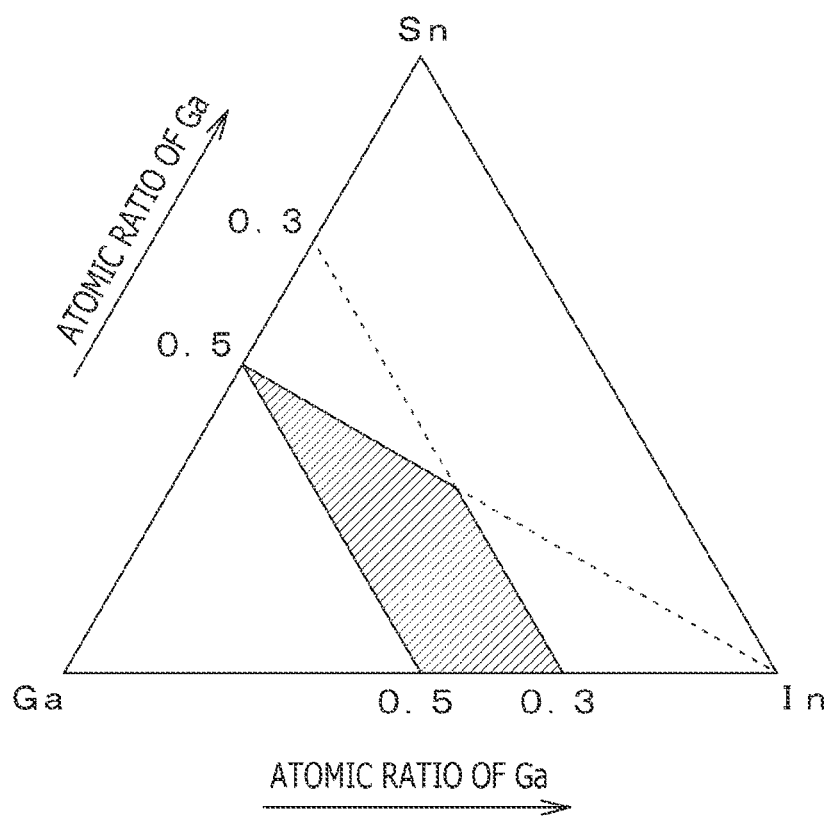
FIG. 70 is a graph illustrating a region that is in an inorganic oxide semiconductor material layer including $In_a$-$Ga_bSn_cO_d$ and has values of (a, b, c) satisfying Formula (1-A) and Formula (2-A).

An image pickup element 10 of Embodiment 1 includes:
a first electrode 21;
a charge accumulation electrode 24 arranged apart from the first electrode 21;
a photoelectric conversion unit 23 that contacts the first electrode 21 and is formed above the charge accumulation electrode 24 via an insulation layer 82; and
a second electrode 22 formed on the photoelectric conversion unit 23. Then, the photoelectric conversion unit 23 includes, from the second-electrode side, a photoelectric conversion layer 23A, and an inorganic oxide semiconductor material layer 23B including $In_aGa_bSn_cO_d$, and $$0.30 \leq b/(a+b+c) \leq 0.50 \quad (1\text{-}A),$$

preferably $$0.40 \leq b/(a+b+c) \leq 0.50 \quad (1\text{-}B),$$

and $$b \geq c \quad (2\text{-}A),$$

preferably $$b \geq 1.2c \quad (2\text{-}B)$$

are satisfied. Note that a region where Formula (1-A) and Formula (2-A) are satisfied is illustrated in FIG. 70 as a region surrounded by hatching lines.

The inorganic oxide semiconductor material layer 23B includes indium (In) atoms, gallium (Ga) atoms, and tin (Sn) atoms, but does not include zinc (Zn) atoms. That is, the inorganic oxide semiconductor material layer 23B includes a composite oxide including indium (In) atoms, gallium (Ga) atoms, and tin (Sn) atoms, and specifically includes a composite oxide including an indium oxide, a gallium oxide, and a tin oxide. The inorganic oxide semiconductor material layer 23B is amorphous, and the thickness of the inorganic oxide semiconductor material layer 23B is $1 \times 10^{-8}$ to $1.5 \times 10^{-7}$ m. The inorganic oxide semiconductor material layer 23B has a region which contacts the first electrode 21, a region which contacts the insulation layer 82 and below which there is not the charge accumulation electrode 24, and a region which contacts the insulation layer 82 and below which there is the charge accumulation electrode 24. Then, light enters from the second electrode 22, the surface roughness Ra of a surface of the inorganic oxide semiconductor material layer 23B at the interface between the photoelectric conversion layer 23A and the inorganic oxide semiconductor material layer 23B is equal to or lower than 1.5 nm, and the value of the root mean square roughness Rq of the surface of the inorganic oxide semiconductor material layer 23B is equal to or lower than 2.5 nm.

In addition, the relation between the energy average value $E_{11}$ (eV) of the maximum energy value in the conduction band of the inorganic oxide semiconductor material layer 23B and the energy average value $E_{12}$ (eV) of the LUMO value of the photoelectric conversion layer 23A is $E_{12} \geq E_{11}$. Note that a fullerene is used as an electron transport material included in a material included in the photoelectric conversion layer 23A. In addition, the relation between the energy average value $E_{21}$ (eV) of the minimum energy value in the valence band of the inorganic oxide semiconductor material layer 23B and the energy average value $E_{22}$ (eV) of the HOMO value of the photoelectric conversion layer 23A is $E_{22} \geq E_{21}$. Further, the energy average value $E_{11}$ of the maximum energy value in the conduction band of the inorganic oxide semiconductor material layer 23B satisfies $E_{11} \leq -4.5$ eV. In addition, the mobility of a material included in the inorganic oxide semiconductor material layer 23B is equal to or higher than 10 cm²/V·s, and the carrier concentration of the inorganic oxide semiconductor material layer 23B is lower than $1 \times 10^{16}$/cm³.

In addition, an electric charge generated in the photoelectric conversion layer 23A is transferred to the first electrode 21 via the inorganic oxide semiconductor material layer 23B. The electric charge is electrons.

By controlling an oxygen gas introduction amount (oxygen gas partial pressure) at the time of formation of the inorganic oxide semiconductor material layer 23B on the basis of a sputtering method, the energy level of the inorganic oxide semiconductor material layer 23B can be controlled. The oxygen gas partial pressure is preferably made 0.005 (0.5%) to 0.10 (10%).

The stacked image pickup element 10 of Embodiment 1 has at least one of the image pickup element of Embodiment 1. In addition, the solid-state image pickup apparatus of Embodiment 1 includes a plurality of the stacked image pickup elements of Embodiment 1. Then, the solid-state image pickup apparatus of Embodiment 1 forms, for example, a digital still camera, a video camera, a camcorder, a surveillance camera, a camera to be mounted on a vehicle (vehicle-mounted camera), a smartphone camera, a game user interface camera, a biometric authentication camera and the like.

Film formation for the inorganic oxide semiconductor material layer was performed on the basis of a sputtering method by using $In_aGa_bSn_cO_d$ sintered body targets with a variety of different values of a, b, c, and d in the compositions, and the optical gap, state of occurrence of oxygen deficiency, and mobility were evaluated. Results of the evaluation are illustrated in the following Table 1A and Table 1B.

TABLE 1A

|  | a | b | c |
|---|---|---|---|
| Embodiment 1A | 0.20 | 0.47 | 0.33 |
| Embodiment 1B | 0.33 | 0.33 | 0.33 |
| Embodiment 1C | 0.60 | 0.30 | 0.10 |
| Comparative Example 1A | 0.45 | 0.24 | 0.31 |
| Comparative Example 1B | 0.00 | 0.67 | 0.33 |

TABLE 1B

|  | Optical gap | State of occurrence of oxygen deficiency | Mobility |
|---|---|---|---|
| Embodiment 1A | 3.2 eV | Hard to occur | High |
| Embodiment 1B | 3.0 eV | Hard to occur | High |
| Embodiment 1C | 3.1 eV | Hard to occur | High |
| Comparative Example 1A | 2.9 eV | Occurs easily | High |
| Comparative Example 1B | 3.4 eV | Occurs easily | Low |

In the image pickup element of Embodiment 1 or various types of embodiment mentioned below, the inorganic oxide semiconductor material layer includes predetermined atomic ratios of indium (In) atoms, gallium (Ga) atoms, and tin (Sn) atoms. Therefore, lowering of the carrier density of the inorganic oxide semiconductor material layer (ensuring the easiness and sureness of transfer of an electric charge accumulated in the inorganic oxide semiconductor material layer to the first electrode), optimization of the carrier concentration of the inorganic oxide semiconductor material layer (optimization of the degree of depletion in the inorganic oxide semiconductor material layer), achieving high mobility of the material included in the inorganic oxide semiconductor material layer, and control of the energy average value of the maximum energy value in the conduction band of the inorganic oxide semiconductor material layer can be achieved in a well-balanced manner; as a result, it is possible to provide the image pickup element, the stacked image pickup element, and the solid-state image pickup apparatus that excel in characteristics of transferring an electric charge accumulated in the photoelectric conversion layer, despite the fact that the image pickup element, the stacked image pickup element, and the solid-state image pickup apparatus have simple configurations and structures. That is, by controlling the ratio of gallium atoms in atoms included in the inorganic oxide semiconductor material layer, it becomes possible to optimize the carrier density and carrier concentration of the inorganic oxide semiconductor material layer; further, it is possible to achieve high electron mobility, control the transmittivity of light through the inorganic oxide semiconductor material layer, and suppress occurrence of oxygen deficiency. In addition, by controlling the ratio of indium atoms, it becomes possible to control the mobility and conductivity of the inorganic oxide semiconductor material layer. Further, it is estimated that, by controlling the ratio of tin atoms, it becomes possible to suppress occurrence of oxygen deficiency, and it becomes possible to control the amorphous state of the inorganic oxide semiconductor material layer, control the surface smoothness, and control the LUMO value. Additionally, because the photoelectric conversion unit has a two-layer structure including the inorganic oxide semiconductor material layer and the photoelectric conversion layer, it is possible to prevent recombination at the time of charge accumulation, and further increase the efficiency of charge transfer of an electric charge accumulated in the photoelectric conversion layer to the first electrode. Further, it is possible to temporarily retain an electric charge generated in the photoelectric conversion layer, control the transfer timing and the like, and suppress generation of dark currents.

In the following, a general explanation of the image pickup element of the present disclosure, the stacked image pickup element of the present disclosure, and the solid-state image pickup apparatus according to the second aspect of the present disclosure is given, and next a detailed explanation of the image pickup element and the solid-state image pickup apparatus of Embodiment 1 is given. Reference signs representing potentials applied to various types of electrode in the following explanation are illustrated in the following Table 2.

TABLE 2

|  | Charge accumulation period | Charge transfer period |
|---|---|---|
| First electrode | $V_{11}$ | $V_{12}$ |
| Second electrode | $V_{21}$ | $V_{22}$ |
| Charge accumulation electrode | $V_{31}$ | $V_{32}$ |
| Charge transfer control electrode | $V_{41}$ | $V_{42}$ |
| Transfer control electrode | $V_{51}$ | $V_{52}$ |
| Charge discharge electrode | $V_{61}$ | $V_{62}$ |

In the image pickup element and the like of the present disclosure, the optical transmittance of the inorganic oxide semiconductor material layer for light with a wavelength of 400 to 660 nm is preferably equal to or higher than 65%. In addition, the optical transmittance of the charge accumulation electrode for light with a wavelength of 400 to 660 nm is also preferably equal to or higher than 65%. The sheet resistance value of the charge accumulation electrode is preferably $3\times10$ to $1\times10^3 \Omega/\square$.

In a possible mode, the image pickup element and the like of the present disclosure further include a semiconductor substrate, and the photoelectric conversion unit is arranged above the semiconductor substrate. Note that the first electrode, the charge accumulation electrode, the second electrode, and various types of electrode are connected with a drive circuit mentioned below.

The second electrode positioned on the light-incidence side may be made common to a plurality of image pickup elements. That is, in a possible mode, except for the image pickup element and the like including an upper-section charge transfer control electrode of the present disclosure mentioned below, the second electrode is what is generally called a solid electrode. The photoelectric conversion layer may be made common to a plurality of image pickup elements, that is, one photoelectric conversion layer may be formed over the plurality of image pickup elements or may be provided for each image pickup element. Although the inorganic oxide semiconductor material layer is preferably provided for each image pickup element, it may be made common to a plurality of image pickup elements, in some cases. That is, for example, one inorganic oxide semiconductor material layer made common to a plurality of image pickup elements may be formed by providing the charge transfer control electrode mentioned below between an image pickup element and an image pickup element. In a case that one inorganic oxide semiconductor material layer made common to a plurality of image pickup elements is formed, end sections of the inorganic oxide semiconductor material layer are desirably covered at least with the photoelectric conversion layer, from the perspective of protection of the end sections of the inorganic oxide semiconductor material layer.

Further, in a possible mode of the image pickup element and the like of the present disclosure including the various types of preferred modes explained above, the first electrode extends inside an opening section provided through the insulation layer and is connected with the inorganic oxide semiconductor material layer. Alternatively, in a possible mode, the inorganic oxide semiconductor material layer extends inside an opening section provided through the insulation layer and is connected with the first electrode. In this case, edge sections of the top surface of the first electrode are covered with the insulation layer, the first electrode is exposed at the bottom surface of the opening section, if a surface of the insulation layer contacting the top surface of the first electrode is a first surface, and a surface of the insulation layer contacting a section that is in the inorganic oxide semiconductor material layer and faces the charge accumulation electrode is a second surface, the side surface of the opening section has an inclination that spreads from the first surface toward the second surface in a possible mode, and further the side surface of the opening section having the inclination that spreads from the first surface toward the second surface is positioned closer to the charge accumulation electrode in a possible mode.

Further, in a possible mode of the image pickup element and the like of the present disclosure including the various types of preferred modes explained above, a charge transfer control electrode is formed in a region that faces, via the insulation layer, a region that is in the photoelectric conversion layer and is positioned between adjacent image pickup elements. Note that such a mode is called the "image pickup element and the like including the lower-section charge transfer control electrode of the present disclosure," in some cases, for convenience. Alternatively, in a possible mode, instead of the formation of the second electrode, a charge transfer control electrode is formed in a region that is in the photoelectric conversion layer and is positioned between adjacent image pickup elements. Note that such a mode is called the "image pickup element and the like including the upper-section charge transfer control electrode of the present disclosure," in some cases, for convenience.

In the following explanation, the 'region that is in the photoelectric conversion layer and is positioned between adjacent image pickup elements' is called a "region −A of the photoelectric conversion layer," for convenience, and the 'region that is in the insulation layer and is positioned between adjacent image pickup elements' is called a "region −A of the insulation layer," for convenience. The region −A of the photoelectric conversion layer corresponds to the region −A of the insulation layer. Further, the 'region between adjacent image pickup elements' is called a "region −a," for convenience.

In the image pickup element and the like including the lower-section charge transfer control electrode of the present disclosure (which is a lower charge transfer control electrode, and a charge transfer control electrode positioned opposite the light-incidence side relative to the photoelectric conversion layer), the lower-section charge transfer control electrode is formed in a region that faces the region −A of the photoelectric conversion layer via the insulation layer. In other words, the lower-section charge transfer control electrode is formed under a section of the insulation layer (the region −A of the insulation layer) in a region (region −a) sandwiched between a charge accumulation electrode and a charge accumulation electrode that are included in adjacent image pickup elements. The lower-section charge transfer control electrode is provided apart from the charge accumulation electrodes. Alternatively, in other words, the lower-section charge transfer control electrode is provided to surround the charge accumulation electrodes and to be apart from the charge accumulation electrodes, and the lower-section charge transfer control electrode is arranged to face the region −A of the photoelectric conversion layer via the insulation layer.

Then, in a possible mode, the image pickup element and the like including the lower-section charge transfer control electrode of the present disclosure further includes a control unit that is provided in a semiconductor substrate and has a drive circuit, in which the first electrode, the second electrode, the charge accumulation electrode, and the lower-section charge transfer control electrode are connected with the drive circuit, in a charge accumulation period, from the drive circuit, the potential $V_{11}$ is applied to the first electrode, the potential $V_{31}$ is applied to the charge accumulation electrode, the potential $V_{41}$ is applied to the lower-section charge transfer control electrode, and an electric charge is accumulated in the inorganic oxide semiconductor material layer (or the inorganic oxide semiconductor material layer and the photoelectric conversion layer), and, in a charge transfer period, from the drive circuit, the potential $V_{12}$ is applied to the first electrode, the potential $V_{32}$ is applied to the charge accumulation electrode, the potential $V_{42}$ is applied to the lower-section charge transfer control electrode, and the electric charge accumulated in the inorganic oxide semiconductor material layer (or the inorganic oxide semiconductor material layer and the photoelectric conversion layer) is read out to the control unit through the first electrode, where $V_{31} \geq V_{11}$, $V_{31} > V_{41}$, and $V_{12} > V_{32} > V_{42}$. The lower-section charge transfer control electrode may be formed at the same level as the first electrode or the charge accumulation electrode or may be formed at a different level.

In the image pickup element and the like including the upper-section charge transfer control electrode of the present disclosure (which is an upper charge transfer control electrode, and is a charge transfer control electrode positioned on the light-incidence side relative to the photoelectric conversion layer), instead of the formation of the second electrode, the upper-section charge transfer control electrode is formed on the region that is in the photoelectric conversion layer and is positioned between adjacent image pickup elements, but the upper-section charge transfer control electrode is provided apart from the second electrode. In other words,

[A] in a possible mode, the second electrode is provided for each image pickup element, and the upper-section charge transfer control electrode is provided on the region −A of the photoelectric conversion layer such that the upper-section charge transfer control electrode surrounds at least some of the second electrodes and is apart from the second electrodes,

[B] in a possible mode, the second electrode is provided for each image pickup element, the upper-section charge transfer control electrode is provided to surround at least some of the second electrodes and to be apart from the second electrodes, and there are some of the charge accumulation electrodes below the upper-section charge transfer control electrode, or

[C] in a possible mode, the second electrode is provided for each image pickup element, the upper-section charge transfer control electrode is provided to surround at least some of the second electrodes and to be apart from the second electrodes, there are some of the charge accumulation electrodes below the upper-section charge transfer control electrode, and further the lower-section charge transfer control electrode is formed below the upper-section charge transfer control electrode. A potential generated by coupling between the upper-section charge transfer control electrode and the second electrode is applied to a region that is in the photoelectric conversion layer and is positioned under the region between the upper-section charge transfer control electrode and the second electrode, in some cases.

In addition, in a possible mode, the image pickup element and the like including the upper-section charge transfer control electrode of the present disclosure further includes a control unit that is provided in a semiconductor substrate and has a drive circuit, in which the first electrode, the second electrode, the charge accumulation electrode, and the upper-section charge transfer control electrode are connected with the drive circuit, in a charge accumulation period, from the drive circuit, the potential $V_{21}$ is applied to the second electrode, the potential $V_{41}$ is applied to the upper-section charge transfer control electrode, and an electric charge is accumulated in the inorganic oxide semiconductor material layer (or the inorganic oxide semiconductor material layer and the photoelectric conversion layer), and, in a charge transfer period, from the drive circuit, the potential $V_{22}$ is applied to the second electrode, the potential $V_{42}$ is applied to the upper-section charge transfer control electrode, and the electric charge accumulated in the inorganic oxide semiconductor material layer (or the inorganic oxide semiconductor material layer and the photoelectric conversion layer) is read out to the control unit through the first electrode, where $V_{21} \geq V_{41}$ and $V_{22} \geq V_{42}$. The upper-section charge transfer control electrode is formed at the same level as the second electrode.

Further, in a possible configuration, the image pickup element and the like of the present disclosure including the various types of preferred modes explained above further include a control unit that is provided in a semiconductor substrate and has a drive circuit, in which the first electrode and the charge accumulation electrode are connected with the drive circuit, in a charge accumulation period, from the drive circuit, the potential $V_{11}$ is applied to the first electrode, the potential $V_{31}$ is applied to the charge accumulation electrode, and an electric charge is accumulated in the inorganic oxide semiconductor material layer (or the inorganic oxide semiconductor material layer and the photoelectric conversion layer), and, in a charge transfer period, from the drive circuit, the potential $V_{12}$ is applied to the first electrode, the potential $V_{32}$ is applied to the charge accumulation electrode, and the electric charge accumulated in the inorganic oxide semiconductor material layer (or the inorganic oxide semiconductor material layer and the photoelectric conversion layer) is read out to the control unit through the first electrode, where the potentials of the first electrode are higher than the potentials of the second electrode, and $V_{31} \geq V_{11}$ and $V_{32} < V_{12}$.

Further, in a possible mode, the image pickup element and the like of the present disclosure including the various types of preferred modes explained above further include a transfer control electrode (charge transfer electrode) that is arranged between the first electrode and the charge accumulation electrode and apart from the first electrode and the charge accumulation electrode and that is arranged to face the inorganic oxide semiconductor material layer via the insulation layer. The image pickup element and the like of the present disclosure in such a mode are called the "image pickup element and the like including the transfer control electrode of the present disclosure," for convenience.

Then, in a possible configuration, the image pickup element and the like including the transfer control electrode of the present disclosure further includes a control unit that is provided in a semiconductor substrate and has a drive circuit, in which the first electrode, the charge accumulation electrode, and the transfer control electrode are connected with the drive circuit, in a charge accumulation period, from the drive circuit, the potential $V_{11}$ is applied to the first electrode, the potential $V_{31}$ is applied to the charge accumulation electrode, the potential $V_{51}$ is applied to the transfer control electrode, and an electric charge is accumulated in the inorganic oxide semiconductor material layer (or the inorganic oxide semiconductor material layer and the photoelectric conversion layer), and, in a charge transfer period, from the drive circuit, the potential $V_{12}$ is applied to the first electrode, the potential $V_{32}$ is applied to the charge accumulation electrode, the potential $V_{52}$ is applied to the transfer control electrode, and the electric charge accumulated in the inorganic oxide semiconductor material layer (or the inorganic oxide semiconductor material layer and the photoelectric conversion layer) is read out to the control unit via the first electrode, where the potentials of the first electrode are higher than the potentials of the second electrode, and $V_{31} > V_{51}$ and $V_{32} \le V_{52} \le V_{12}$.

Further, in a possible mode, the image pickup element and the like of the present disclosure including the various types of preferred modes explained above further include a charge discharge electrode that is connected with the inorganic oxide semiconductor material layer and that is arranged apart from the first electrode and the charge accumulation electrode. The image pickup element and the like of the present disclosure in such a mode are called the "image pickup element and the like including the charge discharge electrode of the present disclosure," for convenience. Then, in a possible mode of the image pickup element and the like including the charge discharge electrode of the present disclosure, the charge discharge electrode is arranged to surround the first electrode and the charge accumulation electrode (i.e., in a picture frame-like manner). The charge discharge electrode can be shared by (made common to) a plurality of image pickup elements. Then, in this case, in a possible mode, the inorganic oxide semiconductor material layer extends inside a second opening section provided through the insulation layer and is connected with the charge discharge electrode, edge sections of the top surface of the charge discharge electrode are covered with the insulation layer, the charge discharge electrode is exposed at the bottom surface of the second opening section, and, if a surface of the insulation layer contacting the top surface of the charge discharge electrode is a third surface, and a surface of the insulation layer contacting a section that is in the inorganic oxide semiconductor material layer and faces the charge accumulation electrode is a second surface, the side surface of the second opening section has an inclination that spreads from the third surface toward the second surface.

Further, in a possible configuration, the image pickup element and the like including the charge discharge electrode of the present disclosure further includes a control unit that is provided in a semiconductor substrate and has a drive circuit, in which the first electrode, the charge accumulation electrode, and the charge discharge electrode are connected with the drive circuit, in a charge accumulation period, from the drive circuit, the potential $V_{11}$ is applied to the first electrode, the potential $V_{31}$ is applied to the charge accumulation electrode, the potential $V_{61}$ is applied to the charge discharge electrode, and an electric charge is accumulated in the inorganic oxide semiconductor material layer (or the inorganic oxide semiconductor material layer and the photoelectric conversion layer), and, in a charge transfer period, from the drive circuit, the potential $V_{12}$ is applied to the first electrode, the potential $V_{32}$ is applied to the charge accumulation electrode, the potential $V_{62}$ is applied to the charge discharge electrode, and the electric charge accumulated in the inorganic oxide semiconductor material layer (or the inorganic oxide semiconductor material layer and the photoelectric conversion layer) is read out to the control unit via the first electrode, where the potentials of the first electrode are higher than the potentials of the second electrode, and $V_{61} > V_{11}$ and $V_{62} < V_{12}$.

Further, in a possible mode of the various types of preferred modes explained above regarding the image pickup element and the like of the present disclosure, the charge accumulation electrode includes a plurality of charge accumulation electrode segments. The image pickup element and the like of the present disclosure in such a mode are called the "image pickup element and the like including the plurality of charge accumulation electrode segments of the present disclosure," for convenience. It is sufficient if the number of the charge accumulation electrode segments are any number equal to or greater than two. Then, in a possible mode of the image pickup element and the like including the plurality of charge accumulation electrode segments of the present disclosure, in a case that a different potential is applied to each of N charge accumulation electrode segments, in a case that a potential of the first electrode is higher than a potential of the second electrode, in a charge transfer period, a potential applied to a charge accumulation electrode segment (first photoelectric conversion unit segment) positioned closest to the first electrode is higher than a potential applied to a charge accumulation electrode segment (N-th photoelectric conversion unit segment) positioned farthest from the first electrode, and, in a case that a potential of the first electrode is lower than a potential of the second electrode, in a charge transfer period, a potential applied to the charge accumulation electrode segment (first photoelectric conversion unit segment) positioned closest to the first electrode is lower than a potential applied to the charge accumulation electrode segment (N-th photoelectric conversion unit segment) positioned farthest from the first electrode.

In a possible configuration, in the image pickup element and the like of the present disclosure including the various types of preferred modes explained above, the semiconductor substrate is provided with at least a floating diffusion layer and an amplification transistor that are included in the control unit, and the first electrode is connected with the floating diffusion layer and a gate section of the amplification transistor. Then, in a possible configuration, in this case, further, the semiconductor substrate is further provided with a reset transistor and a selection transistor that are included in the control unit, the floating diffusion layer is connected with one source/drain region of the reset transistor, and one source/drain region of the amplification transistor is connected with one source/drain region of the selection transistor, and the other source/drain region of the selection transistor is connected with a signal line.

Further, in a possible mode of the image pickup element and the like of the present disclosure including the various types of preferred modes explained above, the size of the charge accumulation electrode is larger than the first electrode. If an area of the charge accumulation electrode is $s_1'$, and an area of the first electrode is $s_1$, preferably, $$4 \leq s_1'/s_1$$

is satisfied, although this is not the sole example.

Alternatively, modification examples of the image pickup element and the like of the present disclosure including the various types of preferred modes explained above include the image pickup element with a first configuration to a sixth configuration explained in the following. That is, in the image pickup element with the first configuration to the sixth configuration in the image pickup element and the like of the present disclosure including the various types of preferred modes explained above, the photoelectric conversion unit includes N (where N≥2) photoelectric conversion unit segments, the inorganic oxide semiconductor material layer and the photoelectric conversion layer include N photoelectric conversion layer segments, the insulation layer includes N insulation layer segments, in the image pickup element with the first configuration to the third configuration, the charge accumulation electrode includes N charge accumulation electrode segments, in the image pickup element with the fourth configuration to the fifth configuration, the charge accumulation electrode includes N charge accumulation electrode segments that are arranged apart from each other, an n-th (where n=1, 2, 3 . . . N) photoelectric conversion unit segment includes an n-th charge accumulation electrode segment, an n-th insulation layer segment, and an n-th photoelectric conversion layer segment, and a photoelectric conversion unit segment with a larger value of n is positioned farther apart from the first electrode. Here, the "photoelectric conversion layer segments" mean segments each including a stacked photoelectric conversion layer and inorganic oxide semiconductor material layer.

Then, in the image pickup element with the first configuration, the thicknesses of the insulation layer segments vary gradually from the first photoelectric conversion unit segment to the N-th photoelectric conversion unit segment. In addition, in the image pickup element with the second configuration, the thicknesses of the photoelectric conversion layer segments vary gradually from the first photoelectric conversion unit segment to the N-th photoelectric conversion unit segment. Note that, in the photoelectric conversion layer segments: the thicknesses of sections of the photoelectric conversion layers may be varied, and the thicknesses of sections of the inorganic oxide semiconductor material layers may be made constant to vary the thicknesses of the photoelectric conversion layer segments; the thicknesses of sections of the photoelectric conversion layers may be made constant, and the thicknesses of sections of the inorganic oxide semiconductor material layers may be varied to vary the thicknesses of the photoelectric conversion layer segments; or the thicknesses of sections of the photoelectric conversion layers may be varied, and the thicknesses of sections of the inorganic oxide semiconductor material layers may be varied to vary the thicknesses of the photoelectric conversion layer segments. Further, in the image pickup element with the third configuration, materials included in the insulation layer segments are different between adjacent photoelectric conversion unit segments. In addition, in the image pickup element with the fourth configuration, materials included in charge accumulation electrode segments are different between adjacent photoelectric conversion unit segments. Further, in the image pickup element with the fifth configuration, the areas of the charge accumulation electrode segments decrease gradually from the first photoelectric conversion unit segment to the N-th photoelectric conversion unit segment. The areas may decrease continuously or may decrease stepwise.

Alternatively, in the image pickup element with the sixth configuration in the image pickup element and the like of the present disclosure including the various types of preferred modes explained above, if a stacking direction of the charge accumulation electrode, the insulation layer, the inorganic oxide semiconductor material layer, and the photoelectric conversion layer is a Z-direction, and a direction away from the first electrode is an X direction, a cross-sectional area, taken along an imaginary YZ plane, of a stacked section where the charge accumulation electrode, the insulation layer, the inorganic oxide semiconductor material layer, and the photoelectric conversion layer are stacked varies depending on the distance from the first electrode. Variations of the cross-sectional areas may be continuous variations or may be stepwise variations.

In the image pickup element with the first configuration and the second configuration, the N photoelectric conversion layer segments are provided continuously, the N insulation layer segments are also provided continuously, and the N charge accumulation electrode segments are also provided continuously. In the image pickup element with the third configuration to the fifth configuration, the N photoelectric conversion layer segments are provided continuously. In addition, in the image pickup element with the fourth configuration and the fifth configuration, the N insulation layer segments are provided continuously; on the other hand, in the image pickup element with the third configuration, the N insulation layer segments are provided individually corresponding to the photoelectric conversion unit segments. Further, in the image pickup element with the fourth configuration and the fifth configuration, and in the image pickup element with the third configuration in some cases, the N charge accumulation electrode segments are provided individually corresponding to the photoelectric conversion unit segments. Then, in the image pickup element with the first configuration to the sixth configuration, the same potential is applied to all of the charge accumulation electrode segments. Alternatively, in the image pickup element with the fourth configuration and the fifth configuration, and, in some cases, in the image pickup element with the third configuration, a different potential may be applied to each of the N charge accumulation electrode segments.

In the image pickup element and the like of the present disclosure including the image pickup element with the first configuration to the sixth configuration, the thicknesses of the insulation layer segments are specified, the thicknesses of the photoelectric conversion layer segments are specified, materials included in the insulation layer segments are different, materials included in the charge accumulation electrode segments are different, the areas of the charge accumulation electrode segments are specified, or the cross-sectional areas of stacked sections are specified. Accordingly, a type of charge transfer gradient is formed, and it becomes possible to more easily and surely transfer electric charges generated by photoelectric conversion to the first electrode. Then, as a result, it is possible to prevent occurrence of afterimages and occurrence of untransferred charges.

In the image pickup element with the first configuration to the fifth configuration, a photoelectric conversion unit segment with a larger value of n is positioned farther apart from the first electrode, and whether or not the photoelectric conversion unit segment is positioned farther apart from the first electrode is decided in terms of the X direction. In addition, while the direction away from the first electrode is the X direction in the image pickup element with the sixth configuration, the "X direction" is defined as follows. That is, a pixel region in which plural image pickup elements or stacked image pickup elements are arrayed include plural pixels that are arrayed regularly in a two-dimensional array, that is, arrayed in the X direction and the Y-direction. In a case that the planar shape of pixels is rectangular, the direction in which an edge closest to the first electrode extends is the Y-direction, and the direction orthogonal to the Y-direction is the X direction. Alternatively, in a case that the planar shape of pixels is any other shape, the overall direction including a line segment or curve closest to the first electrode is the Y-direction, and the direction orthogonal to the Y-direction is the X direction.

In the following, the image pickup element with the first configuration to the sixth configuration is explained regarding a case that the potential of the first electrode is higher than the potential of the second electrode.

In the image pickup element with the first configuration, while the thicknesses of the insulation layer segments vary gradually from the first photoelectric conversion unit segment to the N-th photoelectric conversion unit segment, preferably the thicknesses of the insulation layer segments increase gradually, and a type of charge transfer gradient is formed thereby. Then, in a state where $V_{31} \geq V_{11}$ in a charge accumulation period, an n-th photoelectric conversion unit segment can accumulate a larger electric charge than an (n+1)-th photoelectric conversion unit segment can, and receives an intense electrical field, thereby making it possible to surely prevent the flow of an electric charge from the first photoelectric conversion unit segment to the first electrode. In addition, in a state where $V_{32} < V_{12}$ in a charge transfer period, it is possible to surely ensure the flow of an electric charge from the first photoelectric conversion unit segment to the first electrode and the flow of an electric charge from the (n+1)-th photoelectric conversion unit segment to the n-th photoelectric conversion unit segment.

In the image pickup element with the second configuration, while the thicknesses of the photoelectric conversion layer segments vary gradually from the first photoelectric conversion unit segment to the N-th photoelectric conversion unit segment, preferably the thicknesses of the photoelectric conversion layer segments increase gradually, and a type of charge transfer gradient is formed thereby. Then, in a state where $V_{31} \geq V_{11}$ in a charge accumulation period, an n-th photoelectric conversion unit segment receives a more intense electrical field than an (n+1)-th photoelectric conversion unit segment does, thereby making it possible to surely prevent the flow of an electric charge from the first photoelectric conversion unit segment to the first electrode. In addition, in a state where $V_{32} < V_{12}$ in a charge transfer period, it is possible to surely ensure the flow of an electric charge from the first photoelectric conversion unit segment to the first electrode and the flow of an electric charge from the (n+1)-th photoelectric conversion unit segment to the n-th photoelectric conversion unit segment.

In the image pickup element with the third configuration, while materials included in the insulation layer segments are different between adjacent photoelectric conversion unit segments, and a type of charge transfer gradient is formed thereby, preferably the values of relative permittivities of the materials included in the insulation layer segments decrease gradually from the first photoelectric conversion unit segment to the N-th photoelectric conversion unit segment. Then, by adopting such a configuration, an n-th photoelectric conversion unit segment can accumulate a larger electric charge than an (n+1)-th photoelectric conversion unit segment can in a state where $V_{31} \geq V_{11}$ in a charge accumulation period. In addition, in a state where $V_{32} < V_{12}$ in a charge transfer period, it is possible to surely ensure the flow of an electric charge from the first photoelectric conversion unit segment to the first electrode and the flow of an electric charge from the (n+1)-th photoelectric conversion unit segment to the n-th photoelectric conversion unit segment.

In the image pickup element with the fourth configuration, while materials included in charge accumulation electrode segments are different between adjacent photoelectric conversion unit segments, and a type of charge transfer gradient is formed thereby, preferably the values of work functions of the materials included in the insulation layer segments increase gradually from the first photoelectric conversion unit segment to the N-th photoelectric conversion unit segment. Then, by adopting such a configuration, it is possible to form a potential gradient advantageous for signal charge transfer, without being dependent on whether a voltage (potential) is positive or negative.

In the image pickup element with the fifth configuration, the areas of the charge accumulation electrode segments decrease gradually from the first photoelectric conversion unit segment to the N-th photoelectric conversion unit segment, and a type of charge transfer gradient is formed thereby. Accordingly, in a state where $V_{31} \geq V_{11}$ in a charge accumulation period, an n-th photoelectric conversion unit segment can accumulate a larger electric charge than an (n+1)-th photoelectric conversion unit segment can. In addition, in a state where $V_{32} < V_{12}$ in a charge transfer period, it is possible to surely ensure the flow of an electric charge from the first photoelectric conversion unit segment to the first electrode and the flow of an electric charge from the (n+1)-th photoelectric conversion unit segment to the n-th photoelectric conversion unit segment.

In the image pickup element with the sixth configuration, the cross-sectional areas of stacked sections vary depending on the distance from the first electrode, and a type of charge transfer gradient is formed thereby. Specifically, by adopting a configuration in which the thicknesses of cross-sections of stacked sections are made constant, and the widths of the cross-sections of the stacked sections decrease as the stacked sections are farther apart from the first electrode, similarly to the image pickup element with the fifth configuration having been explained, in a state where $V_{31} \geq V_{11}$ in a charge accumulation period, a region closer to the first electrode can accumulate a larger electric charge than a farther region can. Accordingly, in a state where $V_{32} < V_{12}$ in a charge transfer period, it is possible to surely ensure the flow of an electric charge from a region closer to the first electrode to the first electrode and the flow of an electric charge from a farther region to a closer region. On the other hand, by adopting a configuration in which the widths of cross-sections of stacked sections are made constant, and the thicknesses of the cross-sections of the stacked sections, specifically the thicknesses of insulation layer segments, increase gradually, similarly to the image pickup element with the first configuration having been explained, in a state where $V_{31} \geq V_{11}$ in a charge accumulation period, a region closer to the first electrode can accumulate a larger electric charge than a farther region can, and receives an intense electrical field, thereby making it possible to surely prevent the flow of an electric charge from a region closer to the first electrode to the first electrode. Then, in a state where $V_{32} < V_{12}$ in a charge transfer period, it is possible to surely ensure the flow of an electric charge from a region closer to the first electrode to the first electrode and the flow of an electric charge from a farther region to a closer region. In addition, by adopting a configuration in which the thicknesses of the photoelectric conversion layer segments gradually, similarly to the image pickup element with the second configuration having been explained, in a state where $V_{31} \geq V_{11}$ in a charge accumulation period, a region closer to the first electrode receives a more intense electrical field than a farther region does, thereby making it possible to surely prevent the flow of an electric charge from a region closer to the first electrode to the first electrode. Then, in a state where $V_{32} < V_{12}$ in a charge transfer period, it is possible to surely ensure the flow of an electric charge from a region closer to the first electrode to the first electrode and the flow of an electric charge from a farther region to a closer region.

Two types or more of the image pickup element with the first configuration to the sixth configuration including the preferred modes explained above can be combined as appropriate as desired.

A modification example of the solid-state image pickup apparatus according to the first aspect and the second aspect of the present disclosure can be a solid-state image pickup apparatus including a plurality of the image pickup elements with the first configuration to the sixth configuration, in which each image pickup element block includes a plurality of image pickup elements, and the first electrode is shared by the plurality of image pickup elements included in the image pickup element block. The thus-formed solid-state image pickup apparatus is called a "solid-state image pickup apparatus with the first configuration," for convenience. Alternatively, a modification example of the solid-state image pickup apparatus according to the first aspect and the second aspect of the present disclosure can be a solid-state image pickup apparatus including a plurality of the image pickup elements with the first configuration to the sixth configuration or stacked image pickup elements including at least one of the image pickup element with the first configuration to the sixth configuration, in which each image pickup element block includes a plurality of image pickup elements or stacked image pickup elements, and the first electrode is shared by the plurality of image pickup elements or the stacked image pickup elements included in the image pickup element block. The thus-formed solid-state image pickup apparatus is called a "solid-state image pickup apparatus with the second configuration," for convenience. Then, by making the first electrode shared by the plurality of image pickup elements included in the image pickup element block in such a way, the configuration and structure of a pixel region in which a plurality of the image pickup elements is arrayed can be simplified and miniaturized.

In the solid-state image pickup apparatus with the first configuration and the second configuration, one floating diffusion layer is provided for a plurality of image pickup elements (one image pickup element block). Here, the plurality of image pickup elements provided for the one floating diffusion layer may include a plurality of first-type image pickup elements mentioned below or may include at least one first-type image pickup element and one or two or more second-type image pickup elements mentioned below. Then, by appropriately controlling the timing of charge transfer periods, it becomes possible for the plurality of image pickup elements to share the one floating diffusion layer. The plurality of image pickup elements is caused to operate in a coordinated manner and is connected as an image pickup element block to a drive circuit mentioned below. That is, the plurality of image pickup elements included in the image pickup element block is connected with the one drive circuit. Note that the control of the charge accumulation electrode is performed for each image pickup element. In addition, the plurality of image pickup elements can share one contact hole section. In an arrangement relation between the first electrode shared by the plurality of image pickup elements and a charge accumulation electrode of each image pickup element, the first electrode is arranged adjacent to the charge accumulation electrode of each image pickup element, in some cases. Alternatively, the first electrode is arranged adjacent to charge accumulation electrodes of some of the plurality of image pickup elements and, in some cases, is arranged not adjacent to charge accumulation electrodes of the rest of the plurality of image pickup elements, and in this case transfer of electric charges from the rest of the plurality of image pickup elements to the first electrode is transfer via the some of the plurality of image pickup elements. For the purpose of ensuring transfer of an electric charge from each image pickup element to the first electrode, a distance (called a "distance A," for convenience) between a charge accumulation electrode included in an image pickup element and a charge accumulation electrode included in an image pickup element is preferably longer than a distance (called a "distance B," for convenience) between the first electrode and a charge accumulation electrode in an image pickup element adjacent to the first electrode. In addition, an image pickup element that is positioned farther apart from the first electrode preferably has a larger value of the distance A. Note that the explanation above applies not only to the solid-state image pickup apparatus with the first configuration and the second configuration, but also to the solid-state image pickup apparatus according to the first aspect and the second aspect of the present disclosure.

Further, in a possible mode of the image pickup element and the like of the present disclosure including the various types of preferred modes explained above, light enters from the second-electrode side, and a light-shielding layer is formed on the light-incidence side closer to the second electrode. Alternatively, in a possible mode, light enters from the second-electrode side, and light does not enter the first electrode (the first electrode and the transfer control electrode, in some cases). Then, in this case, in a possible configuration, a light-shielding layer is formed above the first electrode (the first electrode and the transfer control electrode, in some cases), and on the light-incidence side closer to the second electrode, or in a possible configuration an on-chip micro lens is provided above the charge accumulation electrode and the second electrode, and light that enters the on-chip micro lens is concentrated onto the charge accumulation electrode. Here, the light-shielding layer may be arranged in place above a light-incidence-side surface of the second electrode or may be arranged in place on the light-incidence-side surface of the second electrode. In some cases, the second electrode may have a light-shielding layer formed thereon. Examples of a material included in the light-shielding layer include chromium (Cr), copper (Cu), aluminum (Al), tungsten (W), and resins (e.g., a polyimide resin) that do not allow passage of light therethrough.

Specific examples of the image pickup element and the like of the present disclosure include: an image pickup element (called a "first-type image pickup element for blue light," for convenience) including a photoelectric conversion layer or a photoelectric conversion unit (called a "first-type photoelectric conversion layer for blue light" or a "first-type photoelectric conversion unit for blue light," for convenience) that absorbs blue light (light of 425 to 495 nm), and sensitive to blue light; an image pickup element (called a "first-type image pickup element for green light," for convenience) including a photoelectric conversion layer or a photoelectric conversion unit (called a "first-type photoelectric conversion layer for green light" or a "first-type photoelectric conversion unit for green light," for convenience) that absorbs green light (light of 495 to 570 nm), and sensitive to green light; and an image pickup element (called a "first-type image pickup element for red light," for convenience) including a photoelectric conversion layer or a photoelectric conversion unit (called a "first-type photoelectric conversion layer for red light" or a "first-type photoelectric conversion unit for red light," for convenience) that absorbs red light (light of 620 to 750 nm), and sensitive to red light. In addition, a conventional image pickup element not including a charge accumulation electrode and sensitive to blue light is called a "second-type image pickup element for blue light," for convenience, a conventional image pickup element not including a charge accumulation electrode and sensitive to green light is called a "second-type image pickup element for green light," for convenience, and a conventional image pickup element not including a charge accumulation electrode and sensitive to red light is called a "second-type image pickup element for red light," for convenience. A photoelectric conversion layer or a photoelectric conversion unit included in the second-type image pickup element for blue light is called a "second-type photoelectric conversion layer for blue light" or a "second-type photoelectric conversion unit for blue light," for convenience, a photoelectric conversion layer or a photoelectric conversion unit included in the second-type image pickup element for green light is called a "second-type photoelectric conversion layer for green light" or a "second-type photoelectric conversion unit for green light," for convenience, and a photoelectric conversion layer or a photoelectric conversion unit included in the second-type image pickup element for red light is called a "second-type photoelectric conversion layer for red light" or a "second-type photoelectric conversion unit for red light," for convenience.

The stacked image pickup element of the present disclosure has at least one of the image pickup element and the like (photoelectric converting element) of the present disclosure, and specific examples of the configuration and structure of the stacked image pickup element include, for example:

[A] a configuration and structure in which
the first-type photoelectric conversion unit for blue light, the first-type photoelectric conversion unit for green light, and the first-type photoelectric conversion unit for red light are stacked vertically, and
each of control units of the first-type image pickup element for blue light, the first-type image pickup element for green light, and the first-type image pickup element for red light is provided in a semiconductor substrate;

[B] a configuration and structure in which
the first-type photoelectric conversion unit for blue light and the first-type photoelectric conversion unit for green light are stacked vertically,
the second-type photoelectric conversion unit for red light is arranged below the two layers of the first-type photoelectric conversion units, and
each of control units of the first-type image pickup element for blue light, the first-type image pickup element for green light, and the second-type image pickup element for red light is provided in a semiconductor substrate;

[C] a configuration and structure in which
the second-type photoelectric conversion unit for blue light and the second-type photoelectric conversion unit for red light are arranged below the first-type photoelectric conversion unit for green light, and
each of control units of the first-type image pickup element for green light, the second-type image pickup element for blue light, and the second-type image pickup element for red light is provided in a semiconductor substrate; and

[D] a configuration and structure in which
the second-type photoelectric conversion unit for green light and the second-type photoelectric conversion unit for red light are arranged below the first-type photoelectric conversion unit for blue light, and
each of control units of the first-type image pickup element for blue light, the second-type image pickup element for green light, and the second-type image pickup element for red light is provided in a semiconductor substrate. The order of arrangement of these photoelectric conversion units of the image pickup elements in the vertical direction is preferably the photoelectric conversion unit for blue light, the photoelectric conversion unit for green light, and the photoelectric conversion unit for red light in the direction of incidence of light, or the photoelectric conversion unit for green light, the photoelectric conversion unit for blue light, and the photoelectric conversion unit for red light in the direction of incidence of light. This is because light with shorter wavelengths are absorbed efficiently on the incidence-surface side. Because red light has the longest wavelength among the three colors, the photoelectric conversion unit for red light is preferably positioned at the lowermost layer as seen from the light incidence surface. One of these stacked structures of the image pickup element is used to form one pixel. In addition, a first-type photoelectric conversion unit for near infrared light (or a photoelectric conversion unit for infrared light) may be included. Here, preferably, a photoelectric conversion layer of the first-type photoelectric conversion unit for infrared light includes an organic material, for example, and is arranged as the lowermost layer in the stacked structure of first-type image pickup elements, and above a second-type image pickup element. Alternatively, a second-type photoelectric conversion unit for near infrared light (or a photoelectric conversion unit for infrared light) may be included below first-type photoelectric conversion units.

In a first-type image pickup element, for example, the first electrode is formed on an interlayer insulation layer provided on a semiconductor substrate. The image pickup element formed in the semiconductor substrate can be a backside illumination image pickup element or a frontside illumination image pickup element.

In a case that photoelectric conversion layers include organic materials, the photoelectric conversion layers may have any of four configurations which are:

(1) a configuration with a p-type organic semiconductor;
(2) a configuration with an n-type organic semiconductor;
(3) a configuration with a stacked structure of a p-type organic semiconductor layer/an n-type organic semiconductor layer; a configuration with a stacked structure of a p-type organic semiconductor layer/a mixed layer of a p-type organic semiconductor and an n-type organic semiconductor (bulk hetero structure)/an n-type organic semiconductor layer; a configuration with a stacked structure of a p-type organic semiconductor layer/a mixed layer of a p-type organic semiconductor and an n-type organic semiconductor (bulk hetero structure); and a configuration with a stacked structure of an n-type organic semiconductor layer/a mixed layer of a p-type organic semiconductor and an n-type organic semiconductor (bulk hetero structure); and
(4) a configuration with a mixture of a p-type organic semiconductor and an n-type organic semiconductor (bulk hetero structure). Note that the order of stacking can be changed in any manner in a possible configuration.

Examples of the p-type organic semiconductor include naphthalene derivatives, anthracene derivatives, phenanthrene derivatives, pyrene derivatives, perylene derivatives, tetracene derivatives, pentacene derivatives, quinacridone derivatives, thiophene derivatives, thienothiophene derivatives, benzothiophene derivatives, benzothienobenzothiophene derivatives, triarylamine derivatives, carbazole derivatives, perylene derivatives, picene derivatives, chrysene derivatives, fluoranthene derivatives, phthalocyanine derivatives, subphthalocyanine derivatives, subporphyrazine derivatives, metal complexes with heterocyclic compounds as ligands, polythiophene derivatives, polybenzothiadiazole derivatives, polyfluorene derivatives and the like. As mentioned before, examples of the n-type organic semiconductor include fullerenes and fullerene derivatives <e.g., C60, fullerenes (higher fullerenes) such as C70 or C74, endohedral fullerenes, etc.) or fullerene derivatives (e.g., fullerene fluoride, PCBM fullerene compounds, fullerene multimers, etc.)>, organic semiconductors with HOMO and LUMO larger (deeper) than the p-type organic semiconductor, and transparent inorganic metal oxides. Specific examples of the n-type organic semiconductor include organic molecules having, as part of their molecular frameworks, heterocyclic compounds containing nitrogen atoms, oxygen atoms, or sulfur atoms such as pyridine derivatives, pyrazine derivatives, pyrimidine derivatives, triazine derivatives, quinoline derivatives, quinoxalin derivatives, isoquinoline derivatives, acridine derivatives, phenazine derivatives, phenanthroline derivatives, tetrazole derivatives, pyrazole derivatives, imidazole derivatives, thiazole derivatives, oxazole derivatives, imidazole derivatives, benzoimidazole derivatives, benzotriazole derivatives, benzoxazole derivatives, benzoxazole derivatives, carbazole derivatives, benzofuran derivatives, dibenzofuran derivatives, subporphyrazine derivatives, polyphenylene vinylene derivatives, polybenzothiadiazole derivatives, polyfluorene derivatives or the like, organic metal complexes, and subphthalocyanine derivatives. Examples of groups included in the fullerene derivatives include: halogen atoms; straight-chain, branched or cyclic alkyl groups or phenyl groups; groups with straight-chain or condensed ring aromatic compounds; groups with halide; partial fluoroalkyl groups; perfluoroalkyl groups; silylalkyl groups; silyl alkoxy groups; arylsilyl groups; arylsulfanyl groups; alkylsulfanyl groups; arylsulfonyl groups; alkylsulfonyl groups; arylsulfide groups; alkylsulfide groups; amino groups; alkylamino groups; arylamino groups; hydroxy groups; alkoxy groups; acylamino groups; acyloxy groups; carbonyl groups; carboxy groups; carboxamide groups; carboalkoxy groups; acyl groups; sulfonyl groups; cyano groups; nitro groups; groups having chalcogenide; phosphine groups; phosphon groups; and derivatives thereof. Although this is not the sole example, examples of the thickness of the photoelectric conversion layer (called an "organic photoelectric conversion layer," in some cases) including an organic material include, for example, $1 \times 10^{-8}$ to $5 \times 10^{-7}$ m, preferably $2.5 \times 10^{-8}$ to $3 \times 10^{-7}$ m, more preferably $2.5 \times 10^{-8}$ to $2 \times 10^{-7}$ m, still more preferably $1 \times 10^{-7}$ to $1.8 \times 10^{-7}$ m. Note that organic semiconductors are often classified as p-type or n-type, p-type means that holes are easily transported, and n-type means that electrons are easily transported. These are not limited to an interpretation that, like inorganic semiconductors, organic semiconductors have holes or electrons as the majority carrier of thermal excitation.

Alternatively, examples of a material included in the organic photoelectric conversion layer that photoelectrically converts green light include, for example, a rhodamine dye, a merocyanine dye, a quinacridone derivative, a subphthalocyanine dye (subphthalocyanine derivative) and the like, examples of a material included in an organic photoelectric conversion layer that photoelectrically converts blue light include, for example, a coumaric acid dye, tris (8-hydroxyquinoline) aluminum (Alq3), a merocyanine dye and the like, and examples of a material included in an organic photoelectric conversion layer that photoelectrically converts red light include, for example, a phthalocyanine dye and a subphthalocyanine dye (subphthalocyanine derivative).

Alternatively, examples of an inorganic material included in the photoelectric conversion layer include: crystalline silicon; amorphous silicon; microcrystalline silicon; crystalline selenium; amorphous selenium; chalcopyrite compounds such as CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, or AgInSe$_2$; Group III-V compounds such as GaAs, InP, AlGaAs, InGaP, AlGaInP, or InGaAsP; and compound semiconductors such as CdSe, CdS, In$_2$Se$_3$, In$_2$S$_3$, Bi$_2$Se$_3$, Bi$_2$S$_3$, ZnSe, ZnS, PbSe, or PbS. Additionally, quantum dots including these materials can also be used for the photoelectric conversion layer.

The solid-state image pickup apparatus according to the first aspect and the second aspect of the present disclosure and the solid-state image pickup apparatus with the first configuration and the second configuration can form a single-plate color solid-state image pickup apparatus.

In the solid-state image pickup apparatus according to the second aspect of the present disclosure including the stacked image pickup element, unlike a solid-state image pickup apparatus including an image pickup element with the Bayer array (i.e., light is not split into blue, green, and red by using color filter layers), image pickup elements that are sensitive to light with plural types of wavelength are stacked in the direction of incidence of light in a single pixel to thereby form the pixel. Accordingly, it is possible to attempt to enhance the sensitivity and enhance the pixel density per unit volume. In addition, because organic materials have high absorption coefficients, the film thicknesses of the organic photoelectric conversion layer can be made small as compared with conventional Si-based photoelectric conversion layers, and light leakage from adjacent pixels can be reduced, and the restriction on the angle of incidence of light can be relaxed. Further, although false colors occur in conventional Si-based image pickup elements because color signals are created by performing an interpolation process among pixels of three colors, occurrence of false colors can be reduced in the solid-state image pickup apparatus according to the second aspect of the present disclosure including the stacked image pickup element. The organic photoelectric conversion layer itself functions also as a color filter layer, and so color separation is possible without disposing color filter layers in place.

On the other hand, in the solid-state image pickup apparatus according to the first aspect of the present disclosure, the requirement in terms of spectral characteristics of blue, green, and red can be relaxed by using color filter layers, and it also enables high mass productivity. Examples of the array of the image pickup element in the solid-state image pickup apparatus according to the first aspect of the present disclosure include, other than the Bayer array, an interline array, a G stripe RB checkered array, a G stripe RB complete checkered array, a checkered complementary color array, a striped array, an oblique striped array, a primary-color color difference array, a field color difference sequential array, a frame color difference sequential array, a MOS array, an improved MOS array, a frame interleaved array, and a field interleaved array. Here, one image pickup element forms one pixel (or one subpixel).

Examples of color filter layers (wavelength selection means) include not only red, green, and blue color filter layers, but also filter layers that transmit particular wavelengths of cyan, magenta, yellow and the like, in some cases. Color filter layers can be formed not only with color filter layers of organic materials using organic compounds such as pigments or dyestuffs, but can also include thin films including an inorganic material such as photonic crystal, a wavelength selection element to which plasmon is applied (a color filter layer having a conductor grid structure in which a conductor thin film is provided with a grid-like hole structure; see JP 2008-177191A, for example), or amorphous silicon.

A pixel region in which plural the image pickup element and the like of the present disclosure or the stacked image pickup elements in the present disclosure are arrayed includes plural pixels that are arrayed regularly in a two-dimensional array. Normally, the pixel region includes an active pixel region that actually receives light, amplifies a signal charge generated by photoelectric conversion, and reads out the amplified signal charge to a drive circuit, and a black reference pixel region (also called an optical black pixel region (OPB)) for outputting optical black to serve as the reference black level. Normally, the black reference pixel region is arranged at an outer circumferential section of the active pixel region.

In the image pickup element and the like of the present disclosure including the various types of preferred modes explained above, light enters, photoelectric conversion occurs in the photoelectric conversion layer, and holes (holes) and electrons are subjected to carrier separation. Then, electrodes at which holes are taken out are anodes, and electrodes at which electrons are taken out are cathodes. The first electrode forms a cathode, and the second electrode forms an anode.

In a possible configuration, the first electrode, the charge accumulation electrode, the transfer control electrode, the charge transfer control electrode, the charge discharge electrode, and the second electrode include transparent conductive materials. The first electrode, the charge accumulation electrode, the transfer control electrode, and the charge discharge electrode are collectively called a "first electrode and the like," in some cases. Alternatively, in a case that the image pickup element and the like of the present disclosure are disposed on a plane as in the Bayer array, for example, in a possible configuration, the second electrode includes a transparent conductive material, and the first electrode and the like include metal material. In this case, specifically, in a possible configuration, the second electrode positioned on the light-incidence side includes a transparent conductive material, and the first electrode and the like include, for example, Al—Nd (an alloy of aluminum and neodymium) or ASC (an alloy of aluminum, samarium, and copper). Electrodes including transparent conductive materials are called "transparent electrodes," in some cases. Here, the bandgap energy of the transparent conductive materials is equal to or higher than 2.5 eV, and is preferably equal to or higher than 3.1 eV, desirably. Examples of the transparent conductive materials included in the transparent electrodes include electrically conductive metal oxides, and specifically include: an indium oxide; an indium-tin oxide (ITO, Indium Tin Oxide; Sn-doped $In_2O_3$, a crystalline ITO and an amorphous ITO are included); an indium-zinc oxide (IZO, Indium Zinc Oxide) formed by doping a zinc oxide with indium as a dopant; an indium-gallium oxide (IGO) formed by doping a gallium oxide with indium as a dopant; an indium-gallium-zinc oxide (IGZO, In—$GaZnO_4$) formed by doping a zinc oxide with indium and gallium as dopants; an indium-tin-zinc oxide (ITZO) formed by doping a zinc oxide with indium and tin as dopants; an IFO (F-doped $In_2O_3$); a tin oxide ($SnO_2$); an ATO (an Sb-doped $SnO_2$); an FTO (an F-doped $SnO_2$); a zinc oxide (ZnO doped with other elements is included); an aluminum-zinc oxide (AZO) formed by doping a zinc oxide with aluminum as a dopant; a gallium-zinc oxide (GZO) formed by doping a zinc oxide with gallium as a dopant; a titanium oxide ($TiO_2$); a niobium-titanium oxide (TNO) formed by doping a titanium oxide with niobium as a dopant; an antimony oxide; CuI; $InSbO_4$; ZnMgO; $CuInO_2$; $MgIn_2O_4$; CdO; $ZnSnO_3$; a spinel oxide; and an oxide having a $YbFe_2O_4$ structure. Alternatively, examples of the transparent electrodes include those having, as their mother layers, a gallium oxide, a titanium oxide, a niobium oxide, a nickel oxide or the like. Examples of the thicknesses of the transparent electrodes include $2\times10^{-8}$ to $2\times10^{-7}$ m, and preferably $3\times10^{-8}$ to $1\times10^{-7}$ m. In a case that the first electrode is required to have transparency, the charge discharge electrode preferably also includes a transparent conductive material, from the perspective of simplification of the manufacturing process.

Alternatively, in a case that transparency is not required, a conductive material having a low work function (e.g., (1)=3.5 to 4.5 eV) is preferably used as a conductive material included in a cathode having a functionality as an electrode to take out electrons, and specific examples of the conductive material include: an alkali metal (e.g., Li, Na, K, etc.), and a fluoride or oxide thereof; an alkaline earth metal (e.g., Mg, Ca, etc.), and a fluoride or oxide thereof; aluminum (Al); zinc (Zn); tin (Sn); thallium (Tl); a sodium-potassium alloy; an aluminum-lithium alloy; a magnesium-silver alloy; indium; rare earth metals such as ytterbium, or alloys thereof. Alternatively, examples of a material included in the cathode include: metals such as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), or molybdenum (Mo); alloys including these metal elements; polysilicon containing conductive particles including these metals, conductive particles of alloys including these metals, and impurities; carbon-based materials; oxide semiconductor materials; carbon nanotubes; and conductive materials such as graphene. Also, other examples thereof include stacked structures of layers including these elements. Further, examples of a material included in the cathode include an organic material (conductive polymer) such as poly(3,4-ethylenedioxythiophene)/polystyrene sulfonate [PEDOT/PSS]. In addition, these conductive materials may be mixed with a binder (polymer) to form a paste or an ink, and the paste or ink may be cured to be used as an electrode.

As the film formation method for the first electrode and the like and the second electrode (the cathode or the anode), a dry method or a wet method can be used. Examples of the dry method include a physical vapor deposition method (PVD method) and a chemical vapor deposition method (CVD method). Examples of the film formation method by using the principle of the PVD method include: a vacuum vapor deposition method by using resistance heating or high-frequency heating; an EB (electron beam) vapor deposition method; various types of sputtering method (a magnetron sputtering method, an RF-DC coupled bias sputtering method, an ECR sputtering method, an opposed target sputtering method, and a high-frequency sputtering method); an ion plating method; a laser ablation method; a molecular beam epitaxy method; and a laser transfer method. In addition, examples of the CVD method include: a plasma CVD method; a thermal CVD method; an organic metal (MO) CVD method; and an optical CVD method. On the other hand, examples of the wet method include methods such as: an electroplating method and an electroless plating method; a spin coating method; an inkjet method; a spray coat method; a stamping method; a micro contact print method; a flexographic printing method; an offset printing method; a gravure printing method; or a dipping method. Examples of the patterning method include: shadow mask; laser transfer; chemical etching such as photolithography; physical etching by using ultraviolet rays, laser or the like; and the like. As the flattening technology for the first electrode and the like and the second electrode, a laser flattening method, a reflowing method, a CMP (Chemical Mechanical Polishing) method, and the like can be used.

Examples of a material included in the insulation layer include not only inorganic insulation materials examples of which include metal-oxide high-dielectric insulation materials such as: silicon oxide materials; silicon nitride ($SiN_Y$); or an aluminum oxide ($Al_2O_3$), but also: polymethylmethacrylate (PMMA); polyvinyl phenol (PVP); polyvinyl alcohol (PVA); polyimide; polycarbonate (PC); polyethylene terephthalate (PET); polystyrene; silanol derivatives (silane coupling agents) such as N-2-(aminoethyl)-3-aminopropyltrimethoxysilane (AEAPTMS), 3-mercaptopropyltrimethoxysilane (MPTMS), or octadecyltrichlorosilane (OTS); novolac phenolic resin; fluorine resin; and organic insulation materials (organic polymers) examples of which include straight-chain hydrocarbon such as octadecane thiol or dodecyl isocyanate having, at one end thereof, a functional group that can bind with the control electrode. Also, combinations of these can be used. Examples of the silicon oxide materials include silicon oxides ($SiO_X$), BPSG, PSG, BSG, AsSG, PbSG, silicon oxynitride (SiON), SOG (spin-on glass), and low-dielectric-constant insulation materials (e.g., polyaryl ether, cycloperfluorocarbon polymer, benzocyclobutene, cyclic fluororesin, polytetrafluoroethylene, fluorinated aryl ether, fluorinated polyimide, amorphous carbon, and organic SOG). The insulation layer can have a single layer configuration and can also have a configuration including a plurality of stacked layers (e.g., two layers). In the latter case, it is sufficient if the insulation layer/lower layer are formed at least on the charge accumulation electrode, and in a region between the charge accumulation electrode and the first electrode, the insulation layer/lower layer are left at least in the region between the charge accumulation electrode and the first electrode by performing a flattening process on the insulation layer/lower layer, and the insulation layer/upper layer are formed on the insulation layer/lower layer that are left and the charge accumulation electrode. Thereby, the flattening of the insulation layer can surely be achieved. It is sufficient if materials to be included in the protective layer, various types of interlayer insulation layers, and the insulation material film are also selected as appropriate from these materials.

The configuration and structure of the floating diffusion layer, the amplification transistor, the reset transistor, and the selection transistor that are included in the control unit can be made similar to the configuration and structure of a conventional floating diffusion layer, amplification transistor, reset transistor, and selection transistor. The drive circuit can also have a well-known configuration and structure.

Although the first electrode is connected with the floating diffusion layer and the gate section of the amplification transistor, it is sufficient if a contact hole section is formed for connection between the first electrode, and the floating diffusion layer and the gate section of the amplification transistor. Examples of a material included in the contact hole section include polysilicon doped with impurities, high-melting point metals and metal silicide such as tungsten, Ti, Pt, Pd, Cu, TiW, TiN, TiNW, $WSi_2$, or $MoSi_2$, and a stacked structure of layers including these materials (e.g., Ti/TiN/W).

A first carrier blocking layer may be provided between the inorganic oxide semiconductor material layer and the first electrode, and a second carrier blocking layer may be provided between the organic photoelectric conversion layer and the second electrode. In addition, a first charge injection layer may be provided between the first carrier blocking layer and the first electrode, and a second charge injection layer may be provided between the second carrier blocking layer and the second electrode. For example, examples of a material included in the electron injection layers include, for example: an alkali metal such as lithium (Li), sodium (Na), or potassium (K), and a fluoride or oxide thereof; and an alkaline earth metal such as magnesium (Mg) or calcium (Ca), and a fluoride or oxide thereof.

Examples of the film formation method for various types of organic layer include a dry film formation method and a wet film formation method. Examples of the dry film formation method include: a vacuum vapor deposition method by using resistance heating, high-frequency heating, or electron beam heating; a flash vapor deposition method; a plasma vapor deposition method; an EB vapor deposition method; various types of sputtering method (a bipolar sputtering method, a DC sputtering method, a DC magnetron sputtering method, a high-frequency sputtering method, a magnetron sputtering method, an RF-DC coupled bias sputtering method, an ECR sputtering method, an opposed target sputtering method, a high-frequency sputtering method, and an ion beam sputtering method); a DC (Direct Current) method; an RF method; a multiple hot filaments ion plating; an activation reaction method; an electrical field vapor deposition method; various types of ion plating method such as a high-frequency ion plating method or a reactive ion plating method; a laser ablation method, a molecular beam epitaxy method, a laser transfer method, and a molecular beam epitaxy method (MBE method). In addition, examples of the CVD method include: a plasma CVD method; a thermal CVD method; an MO CVD method; and an optical CVD method. On the other hand, specific examples of the wet method include: a spin coating method; a dipping method; a casting method; a micro contact print method; a drop casting method; various types of printing method such as a screen printing method, an inkjet printing method, an offset printing method, a gravure printing method, or a flexographic printing method; a stamping method; a spray method; and various types of coating method such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, or a calendar coater method. Examples of a solvent to be used in the coating method include non-polar or low-polarity organic solvents such as toluene, chloroform, hexane, or ethanol. Examples of the patterning method include: shadow mask; laser transfer; chemical etching such as photolithography; physical etching by using ultraviolet rays, laser or the like; and the like. As the flattening technology for the various types of organic layer, a laser flattening method, a reflowing method or the like can be used.

The image pickup element or the solid-state image pickup apparatus may be provided with an on-chip micro lens or a light-shielding layer as necessary as mentioned before and is provided with a drive circuit and wires for driving the image pickup element. As necessary, a shutter for controlling the incidence of light into the image pickup element may be disposed in place, and an optical cut filter may be included according to the purpose of the solid-state image pickup apparatus.

In addition, in a possible mode of the solid-state image pickup apparatus with the first configuration and the second configuration, one on-chip micro lens is arranged in place above one image pickup element and the like of the present disclosure, or in a possible mode, an image pickup element block includes two image pickup elements and the like of the present disclosure, and one on-chip micro lens is arranged in place above the image pickup element block.

For example, in a case that the solid-state image pickup apparatus is stacked with a readout integrated circuit (ROIC), the solid-state image pickup apparatus and the readout integrated circuit can be stacked by superimposing a drive substrate on which the readout integrated circuit and a connecting section including copper (Cu) are formed, and the image pickup element on which a connecting section is formed one on another such that the connecting sections come into contact with each other and joining the connecting sections with each other, and the connecting sections can also be joined by using solder bumps and the like.

In addition, the drive method for driving the solid-state image pickup apparatus according to the first aspect and the second aspect of the present disclosure includes repeating each step of:

while accumulating electric charges in inorganic oxide semiconductor material layers (or inorganic oxide semiconductor material layers and photoelectric conversion layers) in all image pickup elements all at once, discharging electric charges in first electrodes to the outside of the system; and then transferring, to the first electrodes, the electric charges accumulated in the inorganic oxide semiconductor material layers (or the inorganic oxide semiconductor material layers and the photoelectric conversion layers) in all the image pickup elements all at once, and, after the completion of the transfer, sequentially reading out an electric charge transferred to a first electrode in each image pickup element.

In such a drive method for the solid-state image pickup apparatus, each image pickup element has a structure in which light having entered from the second-electrode side does not enter the first electrode, and while electric charges are accumulated in the inorganic oxide semiconductor material layers and the like in all the image pickup elements all at once, electric charges at the first electrodes are discharged to the outside of the system. Accordingly, the first electrodes in all the image pickup elements can surely be reset simultaneously. Then, thereafter, the electric charges accumulated in the inorganic oxide semiconductor material layers and the like are transferred to the first electrodes in all the image pickup elements all at once, and after the completion of the transfer, an electric charge having been transferred to the first electrode is read out in each image pickup element sequentially. Therefore, what is generally called a global shutter functionality can easily be realized.

In the following, the image pickup element and the solid-state image pickup apparatus of Embodiment 1 are explained in detail.

The image pickup element 10 of Embodiment 1 further includes a semiconductor substrate (more specifically, a silicon semiconductor layer) 70, and the photoelectric conversion unit is arranged above the semiconductor substrate 70. In addition, a control unit that is provided in the semiconductor substrate 70 and has a drive circuit to which the first electrode 21 and the second electrode 22 are connected is further included. Here, the light incidence surface of the semiconductor substrate 70 is treated as the upper side, and the opposite side of the semiconductor substrate 70 is treated as the lower side. A wiring layer 62 including a plurality of wires is provided below the semiconductor substrate 70.

The semiconductor substrate 70 is provided at least with the floating diffusion layer $FD_1$ and an amplification transistor $TR1_{amp}$ that are included in the control unit, and the first electrode 21 is connected with the floating diffusion layer $FD_1$ and the gate section of the amplification transistor $TR1_{amp}$. The semiconductor substrate 70 is further provided with a reset transistor $TR1_{rst}$ and a selection transistor $TR1_{sel}$ that are included in the control unit. The floating diffusion layer $FD_1$ is connected with one source/drain region of the reset transistor $TR1_{rst}$, the other source/drain region of the amplification transistor $TR1_{amp}$ is connected with one source/drain region of the selection transistor $TR1_{sel}$, and the other source/drain region of the selection transistor $TR1_{sel}$ is connected with a signal line $VSL_1$. These amplification transistor $TR1_{amp}$, reset transistor $TR1_{rst}$, and selection transistor $TR1_{sel}$ are included in the drive circuit.

Specifically, the image pickup element and the stacked image pickup element of Embodiment 1 are a backside illumination image pickup element and stacked image pickup element and have a structure including three stacked image pickup elements which are a first-type image pickup element for green light of Embodiment 1 (hereinafter, called a "first image pickup element") including a first-type photoelectric conversion layer for green light that absorbs green light and sensitive to green light, a conventional second-type image pickup element for blue light (hereinafter, called a "second image pickup element") including a second-type photoelectric conversion layer for blue light that absorbs blue light and sensitive to blue light, and a conventional second-type image pickup element for red light (hereinafter, called a "third image pickup element") including a second-type photoelectric conversion layer for red light that absorbs red light and sensitive to red light. Here, the image pickup element for red light (third image pickup element) 12 and the image pickup element for blue light (second image pickup element) 11 are provided in the semiconductor substrate 70, and the second image pickup element 11 is positioned on the light-incidence side relative to the third image pickup element 12. In addition, the image pickup element for green light (first image pickup element 10) is provided above the image pickup element for blue light (second image pickup element 11). The stacked structure including the first image pickup element 10, the second image pickup element 11, and the third image pickup element 12 forms one pixel. Color filter layers are not provided.

In the first image pickup element 10, the first electrode 21 and the charge accumulation electrode 24 are formed apart from each other on an interlayer insulation layer 81. The interlayer insulation layer 81 and the charge accumulation electrode 24 are covered with the insulation layer 82. The inorganic oxide semiconductor material layer 23B and the photoelectric conversion layer 23A are formed on the insulation layer 82, and the second electrode 22 is formed on the photoelectric conversion layer 23A. A protective layer 83 is formed on the entire surface including the second electrode 22, and an on-chip micro lens 14 is provided on the protective layer 83. Color filter layers are not provided. The first electrode 21, the charge accumulation electrode 24, and the second electrode 22 include transparent electrodes including ITO (work function: approximately 4.4 eV), for example. The inorganic oxide semiconductor material layer 23B includes $In_aGa_bSn_cO_d$. The photoelectric conversion layer 23A includes a layer including a well-known organic photoelectric conversion material that is sensitive to at least green light (for example, including an organic material such as a rhodamine dye, a merocyanine dye, or a quinacridone, and further including a fullerene which is an n-type organic semiconductor, a fullerene derivative or a fullerene derivative, or including an electron transport material). The interlayer insulation layer 81, the insulation layer 82, and the protective layer 83 include a well-known insulation material (e.g., $SiO_2$ or $SiN$). The inorganic oxide semiconductor material layer 23B and the first electrode 21 are connected by a connecting section 67 provided through the insulation layer 82. The inorganic oxide semiconductor material layer 23B extends inside the connecting section 67. That is, the inorganic oxide semiconductor material layer 23B extends inside an opening section 85 provided through the insulation layer 82 and is connected with the first electrode 21.

The charge accumulation electrode 24 is connected with the drive circuit. Specifically, the charge accumulation electrode 24 is connected with a vertical drive circuit 112 included in the drive circuit via a connection hole 66, a pad section 64, and a wire $V_{OA}$ that are provided in the interlayer insulation layer 81.

The size of the charge accumulation electrode 24 is larger than the first electrode 21. If the area of the charge accumulation electrode 24 is $s_1'$, and the area of the first electrode 21 is $s_1$, $$4 \geq s_1'/s_1$$

is preferably satisfied, although this is not the sole example. In Embodiment 1, $$s_1'/s_1 = 8$$

is satisfied, for example, although this is not the sole example.

An element separation region 71 is formed closer to the first surface (front surface) 70A of the semiconductor substrate 70, and an oxide film 72 is formed on the first surface 70A of the semiconductor substrate 70. Further, the reset transistor $TR1_{rst}$, the amplification transistor $TR1_{amp}$, and the selection transistor $TR1_{sel}$ that are included in the control unit of the first image pickup element 10 are provided on the first-surface side of the semiconductor substrate 70, and further the first floating diffusion layer $FD_1$ is provided on the first-surface side of the semiconductor substrate 70.

The reset transistor $TR1_{rst}$ includes a gate section 51, a channel formation region 51A, and source/drain regions 51B and 51C. The gate section 51 of the reset transistor $TR1_{rst}$ is connected with a reset line $RST_1$, the one source/drain region 51C of the reset transistor $TR1_{rst}$ doubles as the first floating diffusion layer $FD_1$, and the other source/drain region 51B is connected with a power supply $V_{DD}$.

The first electrode 21 is connected with the one source/drain region 51C (first floating diffusion layer $FD_1$) of the reset transistor $TR1_{rst}$ via a connection hole 65 and a pad section 63 that are provided in the interlayer insulation layer 81, a contact hole section 61 formed through the semiconductor substrate 70 and the interlayer insulation layer 76, and the wiring layer 62 formed in the interlayer insulation layer 76.

The amplification transistor $TR1_{amp}$ includes a gate section 52, a channel formation region 52A, and source/drain regions 52B and 52C. The gate section 52 is connected with the first electrode 21, and the one source/drain region 51c (first floating diffusion layer $FD_1$) of the reset transistor $TR1_{rst}$ via the wiring layer 62. In addition, the one source/drain region 52B is connected with the power supply $V_{DD}$.

The selection transistor $TR1_{sel}$ includes a gate section 53, a channel formation region 53A, and source/drain regions 53B and 53C. The gate section 53 is connected with a selection line $SEL_1$. In addition, the one source/drain region 53B shares a region with the other source/drain region 52C included in the amplification transistor $TR1_{amp}$, and the other source/drain region 53C is connected with a signal line (data output line) $VSL_1$ (117).

The second image pickup element 11 includes, as a photoelectric conversion layer, an n-type semiconductor region 41 provided in the semiconductor substrate 70. A gate section 45 of a transfer transistor $TR2_{trs}$ including a vertical transistor extends to the n-type semiconductor region 41 and is connected with a transfer gate line $TG_2$. In addition, a region 45C that is in the semiconductor substrate 70 and is near the gate section 45 of the transfer transistor $TR2_{trs}$ is provided with the second floating diffusion layer $FD_2$. An electric charge accumulated in the n-type semiconductor region 41 is read out to the second floating diffusion layer $FD_2$ via a transfer channel formed along the gate section 45.

In the second image pickup element 11, a reset transistor $TR2_{rst}$, an amplification transistor $TR2_{amp}$, and a selection transistor $TR2_{sel}$ that are included in the control unit of the second image pickup element 11 are further provided on the first-surface side of the semiconductor substrate 70.

The reset transistor $TR2_{rst}$ includes a gate section, a channel formation region, and source/drain regions. The gate section of the reset transistor $TR2_{rst}$ is connected with a reset line $RST_2$, the one source/drain region of the reset transistor $TR2_{rst}$ is connected with the power supply $V_{DD}$, and the other source/drain region doubles as the second floating diffusion layer $FD_2$.

The amplification transistor $TR2_{amp}$ includes a gate section, a channel formation region, and source/drain regions. The gate section is connected with the other source/drain region (second floating diffusion layer $FD_2$) of the reset transistor $TR2_{rst}$. In addition, the one source/drain region is connected with the power supply $V_{DD}$.

The selection transistor $TR2_{sel}$ includes a gate section, a channel formation region, and source/drain regions. The gate section is connected with a selection line $SEL_2$. In addition, one source/drain region shares a region with the other source/drain region included in the amplification transistor $TR2_{amp}$, and the other source/drain region is connected with a signal line (data output line) $VSL_2$.

The third image pickup element 12 includes, as a photoelectric conversion layer, an n-type semiconductor region 43 provided in the semiconductor substrate 70. A gate section 46 of a transfer transistor $TR3_{trs}$ is connected with a transfer gate line $TG_3$. In addition, a region 46C that is in the semiconductor substrate 70 and is near the gate section 46 of the transfer transistor $TR3_{trs}$ is provided with the third floating diffusion layer $FD_3$. An electric charge accumulated in the n-type semiconductor region 43 is read out to the third floating diffusion layer $FD_3$ via a transfer channel 46A formed along the gate section 46.

In the third image pickup element 12, a reset transistor $TR3_{rst}$, an amplification transistor $TR3_{amp}$, and a selection transistor $TR3_{sel}$ that are included in the control unit of the third image pickup element 12 are further provided on the first-surface side of the semiconductor substrate 70.

The reset transistor $TR3_{rst}$ includes a gate section, a channel formation region, and source/drain regions. The gate section of the reset transistor $TR3_{rst}$ is connected with a reset line $RST_3$, one source/drain region of the reset transistor $TR3_{rst}$ is connected with the power supply $V_{DD}$, and the other source/drain region doubles as the third floating diffusion layer $FD_3$.

The amplification transistor $TR3_{amp}$ includes a gate section, a channel formation region, and source/drain regions. The gate section is connected with the other source/drain region (third floating diffusion layer $FD_3$) of the reset transistor $TR3_{rst}$. In addition, one source/drain region is connected with the power supply $V_{DD}$.

The selection transistor $TR3_{sel}$ includes a gate section, a channel formation region, and source/drain regions. The gate section is connected with a selection line $SEL_3$. In addition, one source/drain region shares a region with the other source/drain region included in the amplification transistor $TR3_{amp}$, and the other source/drain region is connected with a signal line (data output line) $VSL_3$.

The reset lines $RST_1$, $RST_2$, and $RST_3$, the selection lines $SEL_1$, $SEL_2$, and $SEL_3$, and the transfer gate lines $TG_2$ and $TG_3$ are connected with the vertical drive circuit 112 included in the drive circuit, and the signal lines (data output lines) $VSL_1$, $VSL_2$, and $VSL_3$ are connected with a column signal processing circuit 113 included in the drive circuit.

A $p^+$ layer 44 is provided between the n-type semiconductor region 43 and a surface 70A of the semiconductor substrate 70 and suppresses occurrence of dark currents. A $p^+$ layer 42 is formed between the n-type semiconductor region 41 and the n-type semiconductor region 43, and further part of the side surface of the n-type semiconductor region 43 is surrounded by the $p^+$ layer 42. A $p^+$ layer 73 is formed closer to a rear surface 70B of the semiconductor substrate 70, and an $HfO_2$ film 74 and an insulation material film 75 are formed from the $p^+$ layer 73 to a section inside the semiconductor substrate 70 where the contact hole section 61 should be formed. The interlayer insulation layer 76 has a wire formed therein over a plurality of layers, but an illustration of the wire is omitted in the figure.

The $HfO_2$ film 74 is a film having a fixed negative electric charge, and it is possible to suppress occurrence of dark currents by providing such a film. Examples of films that can be used instead of the $HfO_2$ film include an aluminum oxide ($Al_2O_3$) film, a zirconium oxide ($ZrO_2$) film, a tantalum oxide ($Ta_2O_5$) film, a titanium oxide ($TiO_2$) film, a lanthanum oxide ($La_2O_3$) film, a praseodymium oxide ($Pr_2O_3$) film, a cerium oxide ($CeO_2$) film, a neodymium oxide ($Nd_2O_3$) film, a promethium oxide ($Pm_2O_3$) film, a samarium oxide ($Sm_2O_3$) film, a europium oxide ($Eu_2O_3$) film, a gadolinium oxide (($Gd_2O_3$) film, a terbium oxide ($Tb_2O_3$) film, a dysprosium oxide ($Dy_2O_3$) film, a holmium oxide ($Ho_2O_3$) film, a thulium oxide ($Tm_2O_3$) film, an ytterbium oxide ($Yb_2O_3$) film, a lutetium oxide ($Lu_2O_3$) film, an yttrium oxide ($Y_2O_3$) film, a hafnium nitride film, an aluminum nitride film, a hafnium oxynitride film, and an aluminum oxynitride film. Examples of the film formation method for these films include a CVD method, a PVD method, and an ALD method, for example.

In the following, operation of the stacked image pickup element (first image pickup element 10) including the charge accumulation electrode of Embodiment 1 is explained with reference to FIGS. 5 and 6A. The image pickup element of Embodiment 1 further includes a control unit that is provided in the semiconductor substrate 70 and has a drive circuit, and the first electrode 21, the second electrode 22, and the charge accumulation electrode 24 are connected with the drive circuit. Here, the potential of the first electrode 21 is made higher than the potential of the second electrode 22. That is, for example, a positive potential is applied to the first electrode 21, a negative potential is applied to the second electrode 22, and electrons generated by photoelectric conversion in the photoelectric conversion layer 23A are read out to the floating diffusion layer. The same also applies to other embodiments.

Reference signs used in FIG. 5, FIG. 20 and FIG. 21 that are related to Embodiment 4, and FIG. 32 and FIG. 33 that are related to Embodiment 6 mentioned below are as follows.

$P_A$ ... Potential at a point $P_A$ in a region that is in the inorganic oxide semiconductor material layer 23B and faces a region positioned at a middle point between the charge accumulation electrode 24 or a transfer control electrode (charge transfer electrode) 25 and the first electrode 21

$P_B$ ... Potential at a point $P_B$ in a region that is in the inorganic oxide semiconductor material layer 23B and faces the charge accumulation electrode 24

$P_{C1}$ ... Potential at a point $P_{C1}$ in a region that is in the inorganic oxide semiconductor material layer 23B and faces a charge accumulation electrode segment 24A

$P_{C2}$ ... Potential at a point $P_{C2}$ in a region that is in the inorganic oxide semiconductor material layer 23B and faces a charge accumulation electrode segment 24B

$P_{C3}$ ... Potential at a point $P_{C3}$ in a region that is in the inorganic oxide semiconductor material layer 23B and faces a charge accumulation electrode segment 24C

$P_D$ ... Potential at a point $P_D$ in a region that is in the inorganic oxide semiconductor material layer 23B and faces the transfer control electrode (charge transfer electrode) 25

FD ... Potential at the first floating diffusion layer $FD_1$ $V_{OA}$ ... Potential at the charge accumulation electrode 24

$V_{OA-A}$ ... Potential at the charge accumulation electrode segment 24A

$V_{OA-B}$ ... Potential at the charge accumulation electrode segment 24B

$V_{OA-C}$ ... Potential at the charge accumulation electrode segment 24C

$V_{OT}$ ... Potential at the transfer control electrode (charge transfer electrode) 25

RST ... Potential at the gate section 51 of the reset transistor $TR1_{rst}$ $V_{DD}$ ... Power supply potential $VSL_1$ ... Signal line (data output line) $VSL_1$ $TR1_{rst}$ ... Reset transistor $TR1_{rst}$ $TR1_{amp}$ ... Amplification transistor $TR1_{amp}$ $TR1_{sel}$ ... Selection transistor $TR1_{sel}$ In a charge accumulation period, from the drive circuit, the potential $V_{11}$ is applied to the first electrode 21, and the potential $V_{31}$ is applied to the charge accumulation electrode 24. With light having entered the photoelectric conversion layer 23A, photoelectric conversion occurs at the photoelectric conversion layer 23A. Holes generated by the photoelectric conversion are sent from the second electrode 22 to the drive circuit via a wire $V_{OU}$. On the other hand, because the potential of the first electrode 21 is made higher than the potential of the second electrode 22, that is, for example, a positive potential is applied to the first electrode 21, and a negative potential is applied to the second electrode 22, $V_{31} \geq V_{11}$, preferably $V_{31} > V_{11}$, is satisfied. Thereby, electrons generated by the photoelectric conversion are attracted to the charge accumulation electrode 24 and are stopped in a region that is in the inorganic oxide semiconductor material layer 23B or in the inorganic oxide semiconductor material layer 23B and the photoelectric conversion layer 23A (hereinafter, these are collectively called the "inorganic oxide semiconductor material layer 23B and the like") and faces the charge accumulation electrode 24. That is, an electric charge is accumulated in the inorganic oxide semiconductor material layer 23B and the like. Because $V_{31} > V_{11}$, electrons generated inside the photoelectric conversion layer 23A are not transferred toward the first electrode 21. Along with the time lapse of the photoelectric conversion, the value of the potential of the region that is in the inorganic oxide semiconductor material layer 23B and the like and faces the charge accumulation electrode 24 shifts toward the negative side.

In a latter period of the charge accumulation period, reset operation is performed. Thereby, the potential of the first floating diffusion layer $FD_1$ is reset, and the potential of the first floating diffusion layer $FD_1$ becomes a power supply potential $V_{DD}$.

Electric-charge read operation is performed after the completion of the reset operation. That is, in a charge transfer period, from the drive circuit, the potential $V_{12}$ is applied to the first electrode 21, and the potential $V_{32}$ is applied to the charge accumulation electrode 24. Here, $V_{32} < V_{12}$ is satisfied. Thereby, the electrons that are stopped in the region that is in the inorganic oxide semiconductor material layer 23B and the like and faces the charge accumulation electrode 24 are read out to the first electrode 21, and further to the first floating diffusion layer $FD_1$. That is, the electric charge accumulated in the inorganic oxide semiconductor material layer 23B and the like is read out to the control unit.

With the process explained thus far, a series of operation like charge accumulation, reset operation, and charge transfer is completed.

Operation at the amplification transistor $TR1_{amp}$ and the selection transistor $TR1_{sel}$ after the electrons are read out to the first floating diffusion layer $FD_1$ is the same as conventional operation in transistors of these types. In addition, a series of operation like charge accumulation, reset operation, and charge transfer at the second image pickup element 11 and the third image pickup element 12 is similar to a series of conventional operation like charge accumulation, reset operation, and charge transfer. In addition, reset noise of the first floating diffusion layer $FD_1$ can be eliminated by a correlated double sampling (CDS, Correlated Double Sampling) process, similarly to conventional technologies.

As described above, because the charge accumulation electrode that is arranged apart from the first electrode and that is arranged to face the photoelectric conversion layer via the insulation layer is included in Embodiment 1, when the light applies to the photoelectric conversion layer, and the light is photoelectrically converted in the photoelectric conversion layer, a type of capacitor is formed by the inorganic oxide semiconductor material layer and the like, the insulation layer, and the charge accumulation electrode, and an electric charge can be accumulated in the inorganic oxide semiconductor material layer and the like. Therefore, at the start of exposure, it becomes possible to completely deplete an electric charge in the charge accumulation section, and to erase the electric charge. As a result, it is possible to suppress occurrence of a phenomenon that kTC noise increases, random noise worsens, and the image pickup quality deteriorates. In addition, because it is possible to reset all the pixels all at once, what is generally called a global shutter functionality can be realized.

FIG. 68 illustrates a conceptual diagram of the solid-state image pickup apparatus of Embodiment 1. A solid-state image pickup apparatus 100 of Embodiment 1 includes: an image pickup region 111 in which stacked image pickup elements 101 are arrayed in a two-dimensional array; and the vertical drive circuit 112, the column signal processing circuits 113, a horizontal drive circuit 114, an output circuit 115, a drive control circuit 116, and the like as drive circuits therefor (peripheral circuits). These circuits can include well-known circuits, and also it is needless to say that those circuits can be formed by using other circuit configurations (e.g., various types of circuit used in a conventional CCD image pickup apparatus or CMOS image pickup apparatus). In FIG. 68, the reference numeral "101" is displayed only for one line of stacked image pickup elements 101.

On the basis of a vertical synchronizing signal, a horizontal synchronizing signal, and a master clock, the drive control circuit 116 generates a clock signal and a control signal that serve as reference signals for operation of the vertical drive circuit 112, the column signal processing circuits 113, and the horizontal drive circuit 114. Then, the generated clock signal and control signal are input to the vertical drive circuit 112, the column signal processing circuits 113, and the horizontal drive circuit 114.

For example, the vertical drive circuit 112 includes a shift register and sequentially selects and scans each of the stacked image pickup elements 101 of the image pickup region 111 in the unit of line in the vertical direction. Then, a pixel signal (image signal) based on a current (signal) generated according to an amount of light received at each stacked image pickup element 101 is sent to the column signal processing circuit 113 via the signal lines (data output lines) 117 and VSL.

For example, the column signal processing circuit 113 is arranged for each column of the stacked image pickup elements 101 and performs, for each image pickup element, signal processing of noise elimination and signal amplification on image signals output from the stacked image pickup elements 101 in one line by using a signal from a black reference pixel (not illustrated; formed around the active pixel region). At the output stage of the column signal processing circuits 113, horizontal selection switches (not illustrated) are provided being connected between the column signal processing circuits 113 and a horizontal signal line 118.

For example, the horizontal drive circuit 114 includes a shift register, sequentially selects each of the column signal processing circuits 113 by sequentially outputting horizontal scanning pulses, and outputs a signal from each of the column signal processing circuits 113 to the horizontal signal line 118.

The output circuit 115 performs signal processing on a signal sequentially supplied from each of the column signal processing circuits 113 via the horizontal signal line 118 and outputs the signal.

Figure 9:
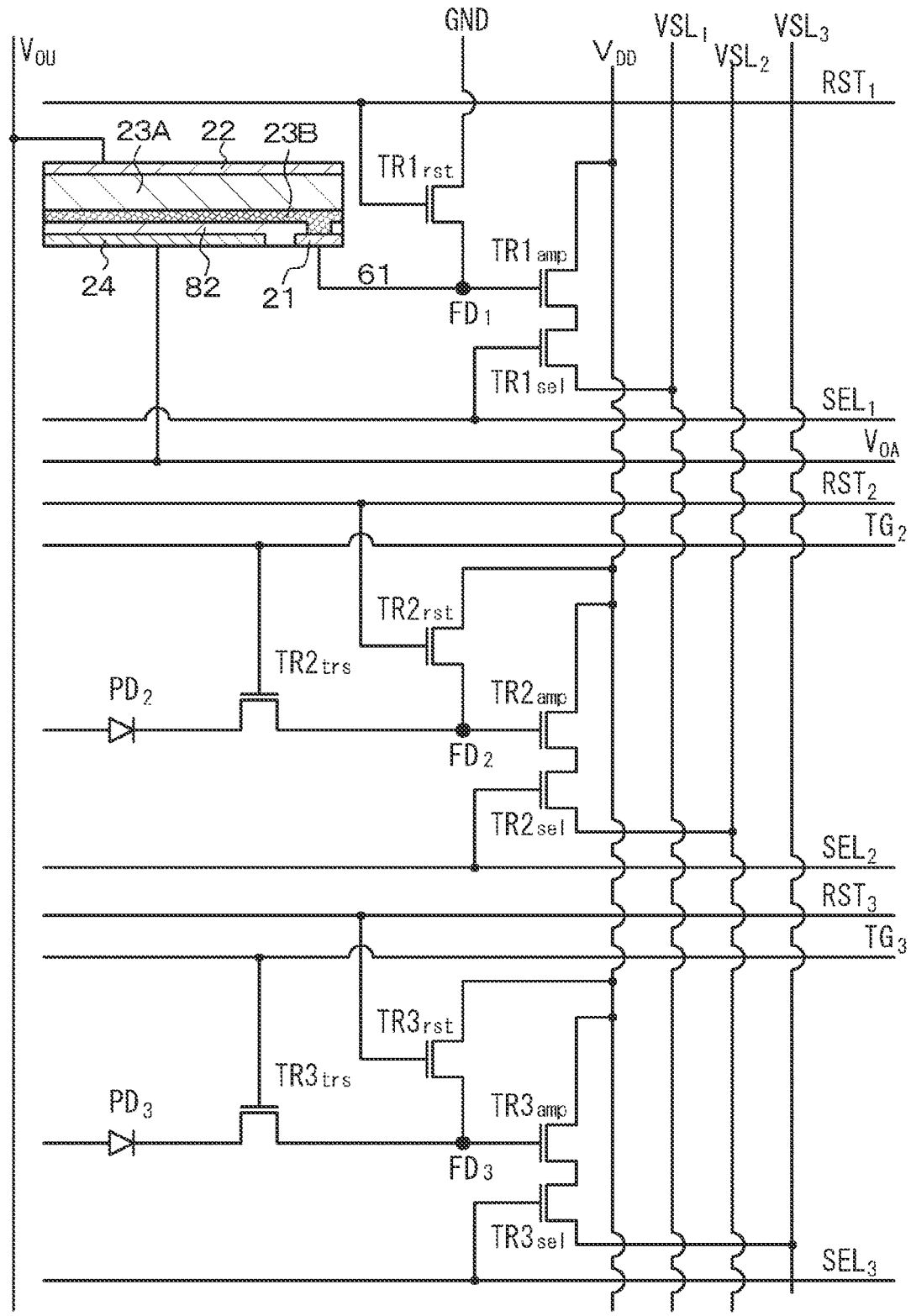
FIG. 9 is an equivalent circuit diagram of a modification example of the image pickup element of Embodiment 1.
Figure 10:
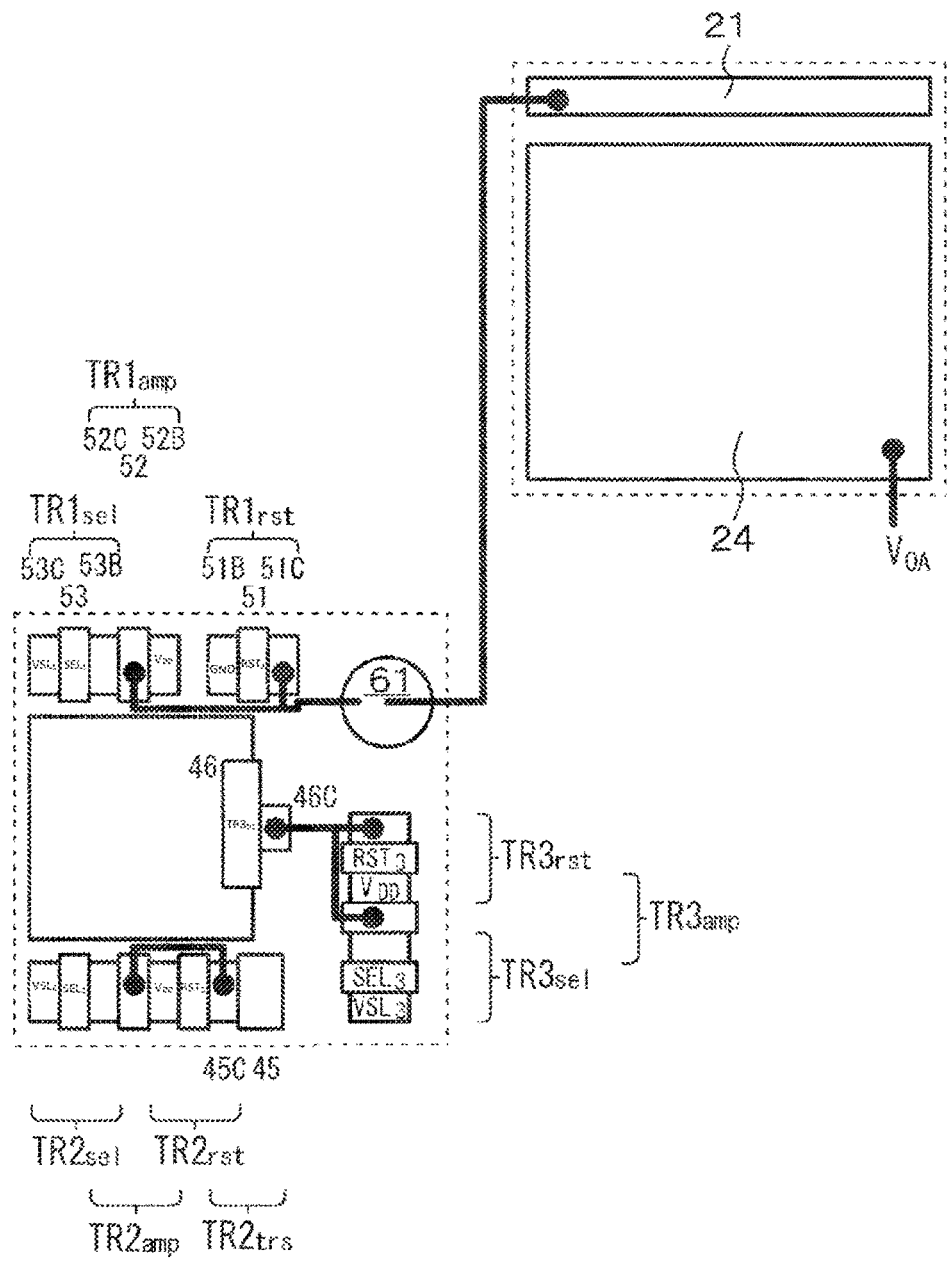
FIG. 10 is a schematic arrangement diagram of the first electrode and the charge accumulation electrode that are included in the modification example of the image pickup element of Embodiment 1 illustrated in FIG. 9, and the transistors included in the control unit.

As illustrated in FIG. 9 which illustrates an equivalent circuit diagram of a modification example of the image pickup element and the stacked image pickup element of Embodiment 1, and FIG. 10 which illustrates a schematic arrangement diagram of the first electrode and the charge accumulation electrode, and the transistors included in the control unit, the other source/drain region 51B of the reset transistor TR1$_{rst}$ may be grounded, instead being connected to the power supply V$_{DD}$.

The image pickup element and the stacked image pickup element of Embodiment 1 can be fabricated by the following method, for example. That is, first, an SOI substrate is prepared. Then, a first silicon layer is formed on a surface of the SOI substrate on the basis of an epitaxial growth method, and the p$^+$ layer 73 and the n-type semiconductor region 41 are formed in the first silicon layer. Next, a second silicon layer is formed on the first silicon layer on the basis of the epitaxial growth method, and the element separation region 71, the oxide film 72, the p$^+$ layer 42, the n-type semiconductor region 43, and the p$^+$ layer 44 are formed in the second silicon layer. In addition, various types of transistor and the like included in the control unit of the image pickup element are formed in the second silicon layer. Further, on them, the wiring layer 62, the interlayer insulation layer 76, and various types of wire are formed, and then the interlayer insulation layer 76 and a support substrate (not illustrated) are pasted onto each other. Thereafter, the SOI substrate is eliminated to make the first silicon layer exposed. A surface of the second silicon layer corresponds to the surface 70A of the semiconductor substrate 70, and a surface of the first silicon layer corresponds to the rear surface 70B of the semiconductor substrate 70. In addition, the first silicon layer and the second silicon layer are collectively expressed as the semiconductor substrate 70. Next, an opening section for forming the contact hole section 61 is formed closer to the rear surface 70B of the semiconductor substrate 70, the HfO$_2$ film 74, the insulation material film 75, and the contact hole section 61 are formed, and further the pad sections 63 and 64, the interlayer insulation layer 81, the connection holes 65 and 66, the first electrode 21, the charge accumulation electrode 24, and the insulation layer 82 are formed. Next, the connecting section 67 is formed as an opening, and the inorganic oxide semiconductor material layer 23B, the photoelectric conversion layer 23A, the second electrode 22, the protective layer 83, and the on-chip micro lens 14 are formed. With the process explained thus far, the image pickup element and the stacked image pickup element of Embodiment 1 can be obtained.

In addition, although an illustration in the figures is omitted, the insulation layer 82 can have a two-layer configuration including an insulation layer/lower layer and an insulation layer/upper layer. That is, it is sufficient if the insulation layer/lower layer are formed at least on the charge accumulation electrode 24, and in a region between the charge accumulation electrode 24 and the first electrode 21 (more specifically, the insulation layer/lower layer are formed on the interlayer insulation layer 81 including the charge accumulation electrode 24), a flattening process is performed on the insulation layer/lower layer, and then the insulation layer/upper layer are formed on the insulation layer/lower layer and the charge accumulation electrode 24. Thereby, flattening of the insulation layer 82 can surely be achieved. Then, it is sufficient if the connecting section 67 is formed as an opening through the thus-obtained insulation layer 82.

Embodiment 2

Figure 11:
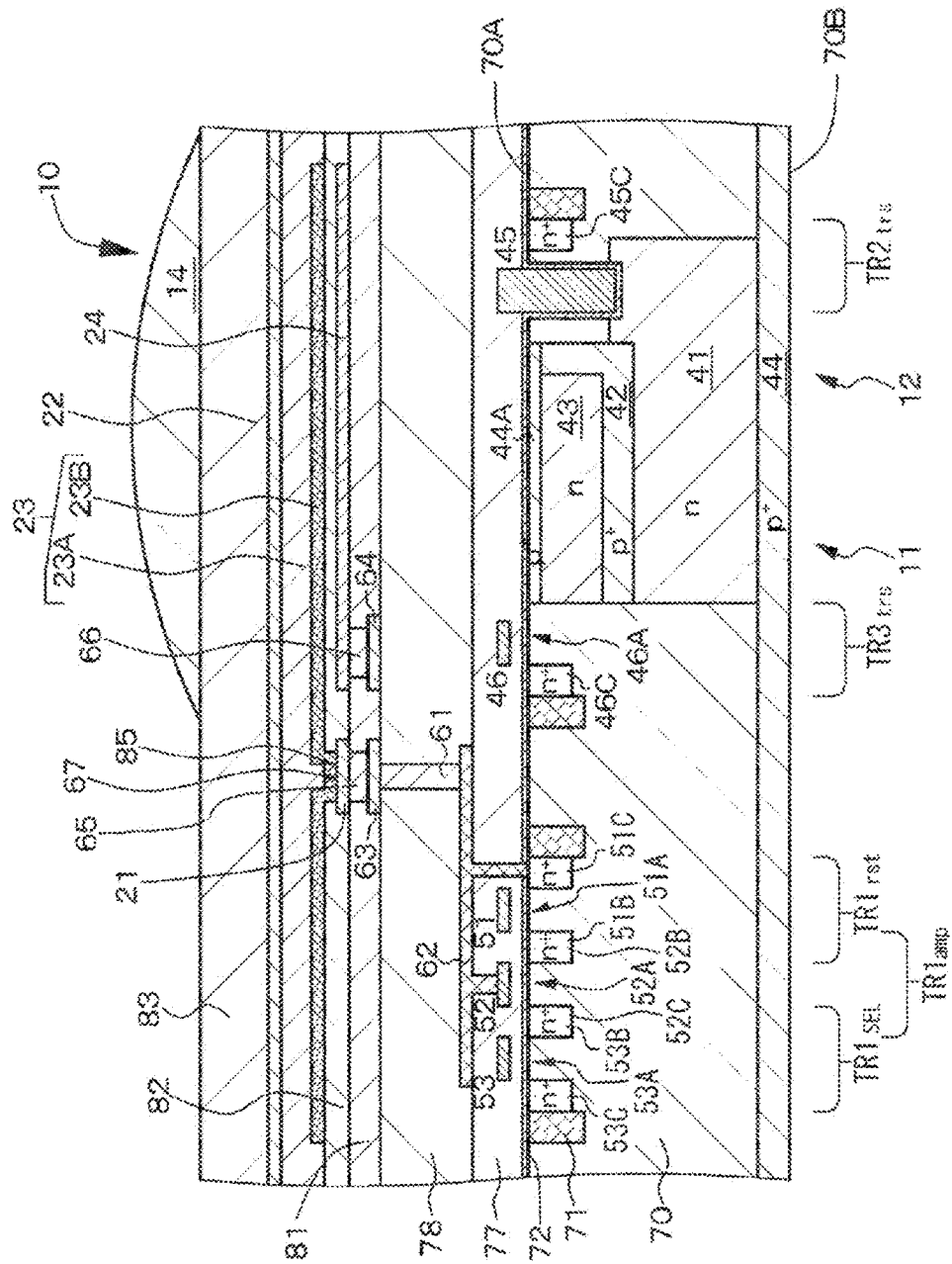
FIG. 11 is a schematic partial cross-sectional view of the image pickup element of Embodiment 2.

Embodiment 2 is a modification example of Embodiment 1. FIG. 11 illustrates a schematic partial cross-sectional view of the image pickup element and the stacked image pickup element of Embodiment 2. The image pickup element and the stacked image pickup element of Embodiment 2 are a frontside illumination image pickup element and stacked image pickup element and have a structure including three stacked image pickup elements which are a first-type image pickup element for green light of Embodiment 1 (first image pickup element 10) including a first-type photoelectric conversion layer for green light that absorbs green light and sensitive to green light, a conventional second-type image pickup element for blue light (second image pickup element 11) including a second-type photoelectric conversion layer for blue light that absorbs blue light and sensitive to blue light, and a conventional second-type image pickup element for red light (third image pickup element 12) including a second-type photoelectric conversion layer for red light that absorbs red light and sensitive to red light. Here, the image pickup element for red light (third image pickup element 12) and the image pickup element for blue light (second image pickup element 11) are provided in the semiconductor substrate 70, and the second image pickup element 11 is positioned on the light-incidence side relative to the third image pickup element 12. In addition, the image pickup element for green light (first image pickup element 10) is provided above the image pickup element for blue light (second image pickup element 11).

Similarly to Embodiment 1, various types of transistor included in the control unit are provided closer to the surface 70A of the semiconductor substrate 70. These transistors can have configurations and structures substantially similar to the transistors explained Embodiment 1. In addition, the semiconductor substrate 70 is provided with the second image pickup element 11 and the third image pickup element 12, and these image pickup elements also can have configurations and structures substantially similar to those of the second image pickup element 11 and the third image pickup element 12 explained in Embodiment 1.

The interlayer insulation layer 81 is formed above the surface 70A of the semiconductor substrate 70. Similarly to the image pickup element of Embodiment 1, the first electrode 21, the inorganic oxide semiconductor material layer 23B, the photoelectric conversion layer 23A and the second electrode 22, and the charge accumulation electrode 24 and the like are provided above the interlayer insulation layer 81.

In such a manner, except for the point that they are a frontside illumination image pickup element and stacked image pickup element, the configuration and structure of the image pickup element and the stacked image pickup element of Embodiment 2 can be made similar to the configuration and structure of the image pickup element and the stacked image pickup element of Embodiment 1, and so a detailed explanation thereof is omitted.

Embodiment 3

Embodiment 3 is a modification example of Embodiment 1 and Embodiment 2.

Figure 12:
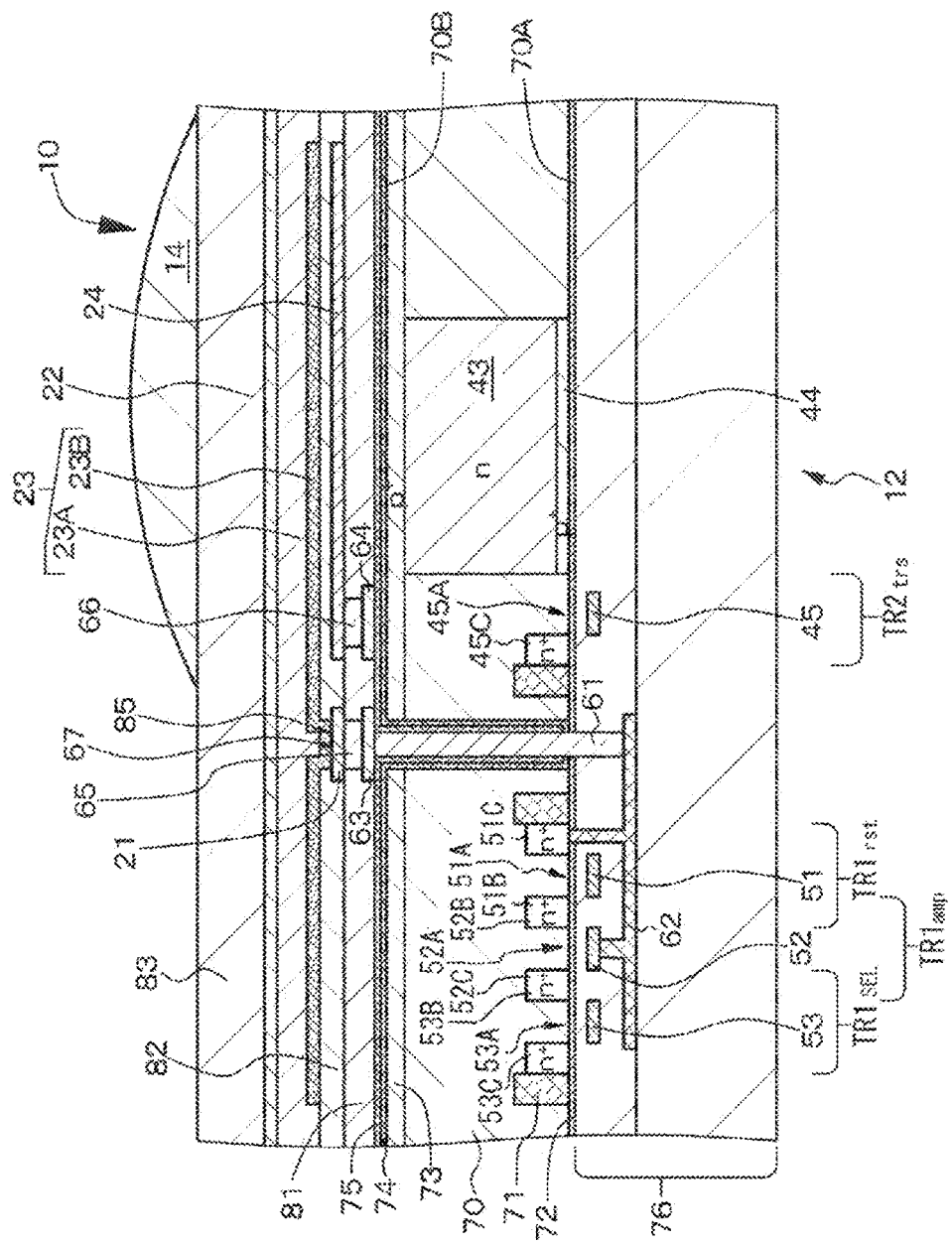
FIG. 12 is a schematic partial cross-sectional view of the image pickup element of Embodiment 3.
Figure 13:
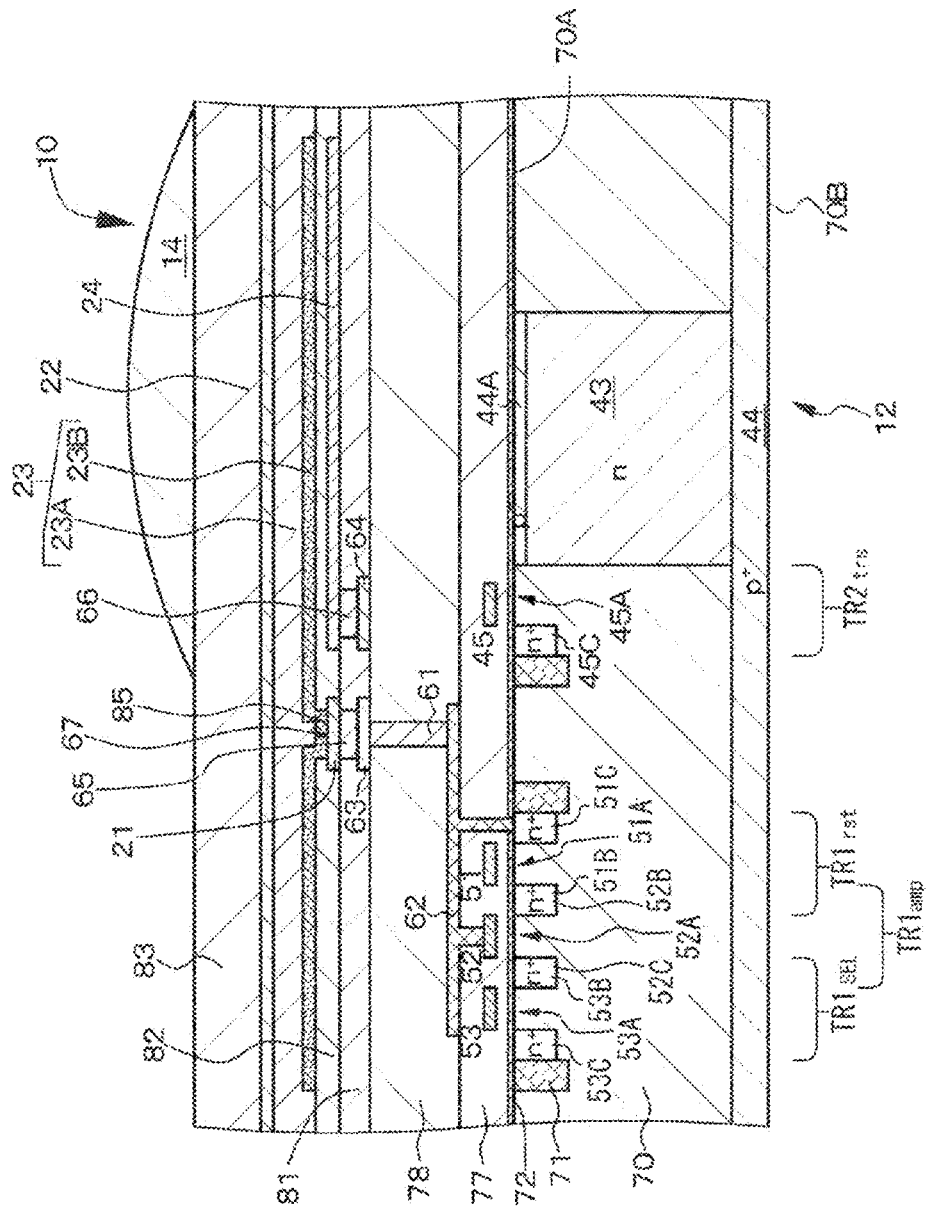
FIG. 13 is a schematic partial cross-sectional view of a modification example of the image pickup element of Embodiment 3.

FIG. 12 illustrates a schematic partial cross-sectional view of the image pickup element and the stacked image pickup element of Embodiment 3. The image pickup element and the stacked image pickup element of Embodiment 3 are a backside illumination image pickup element and stacked image pickup element and have a structure including two stacked image pickup elements which are the first-type first image pickup element 10 of Embodiment 1 and the second-type third image pickup element 12. In addition, FIG. 13 illustrates a schematic partial cross-sectional view of a modification example of the image pickup element and the stacked image pickup element of Embodiment 3. The modification example of the image pickup element and the stacked image pickup element of Embodiment 3 are a frontside illumination image pickup element and stacked image pickup element and have a structure including two stacked image pickup elements which are the first-type first image pickup element 10 of Embodiment 1 and the second-type third image pickup element 12. Here, the first image pickup element 10 absorbs primary color light, and the third image pickup element 12 absorbs complementary color light. Alternatively, the first image pickup element 10 absorbs white color light, and the third image pickup element 12 absorbs infrared rays.

Figure 14:
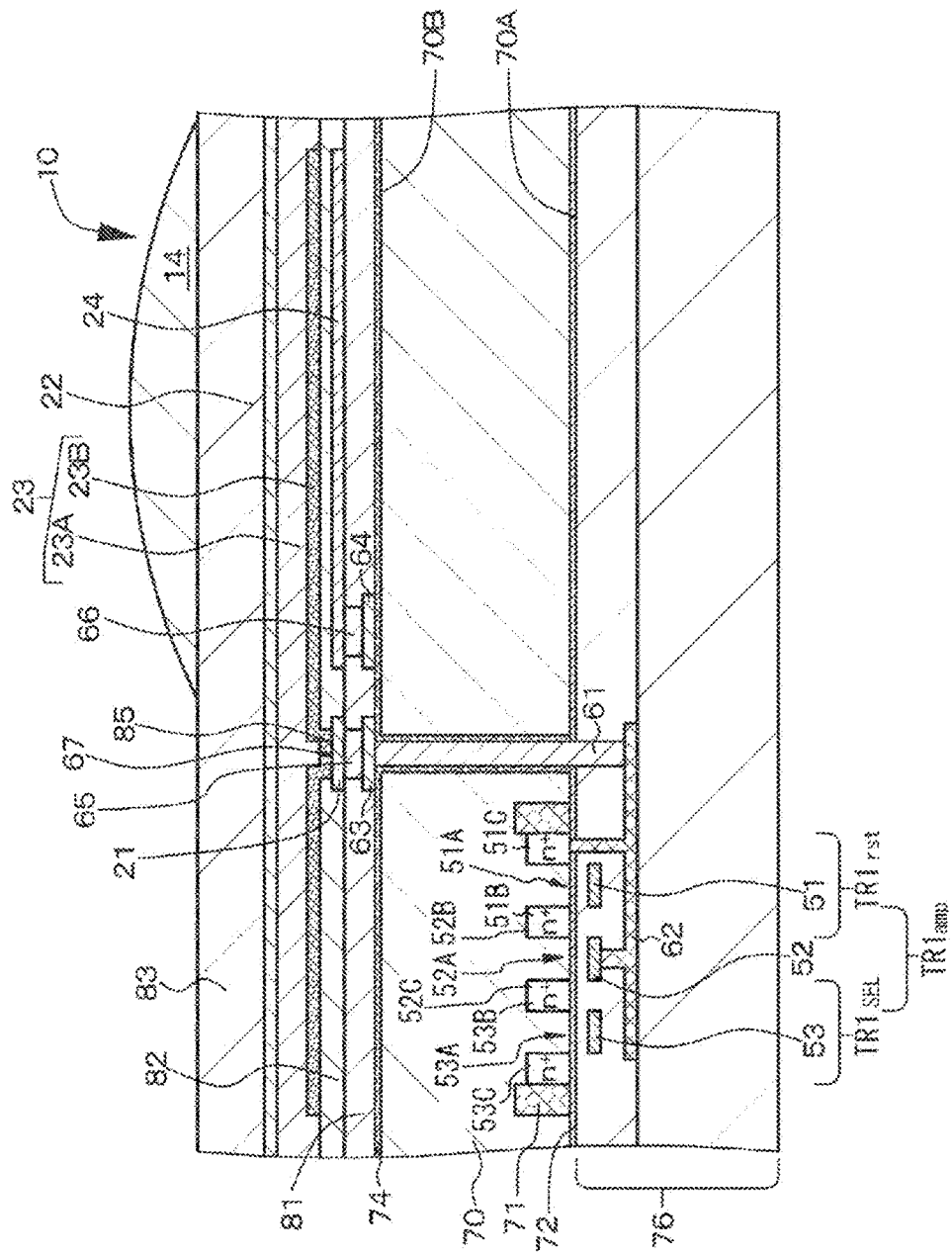
FIG. 14 is a schematic partial cross-sectional view of another modification example of the image pickup element of Embodiment 3.
Figure 15:
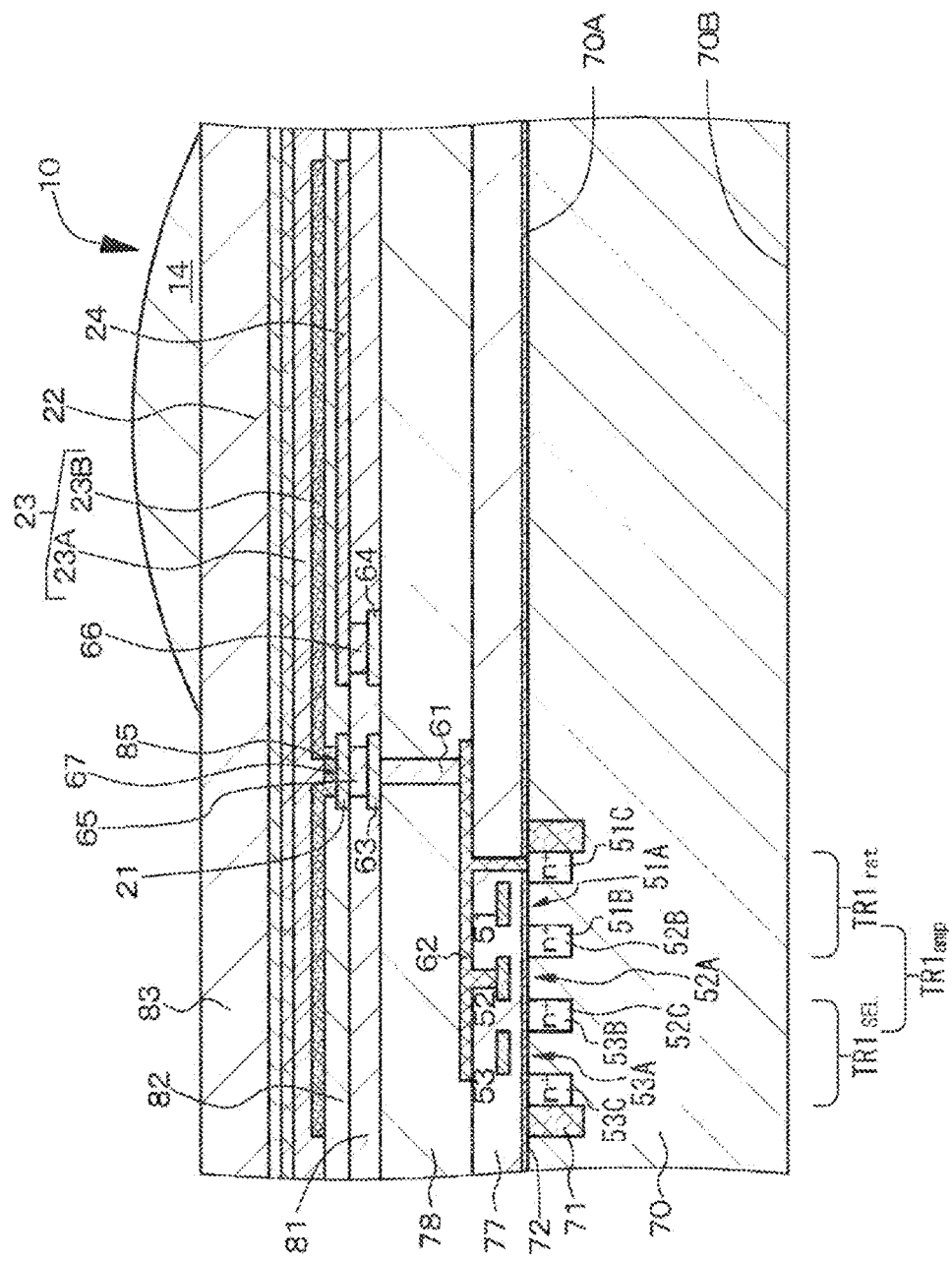
FIG. 15 is a schematic partial cross-sectional view of still another modification example of the image pickup element of Embodiment 3.

FIG. 14 illustrates a schematic partial cross-sectional view of a modification example of the image pickup element of Embodiment 3, and the modification example of the image pickup element of Embodiment 3 is a backside illumination image pickup element and includes the first-type first image pickup element 10 of Embodiment 1. In addition, FIG. 15 illustrates a schematic partial cross-sectional view of a modification example of the image pickup element of Embodiment 3, and the modification example of the image pickup element of Embodiment 3 is a frontside illumination image pickup element and includes the first-type first image pickup element 10 of Embodiment 1. Here, the first image pickup element 10 includes three types of image pickup elements which are an image pickup element that absorbs red light, an image pickup element that absorbs green light, and an image pickup element that absorbs blue light. Further, a plurality of the image pickup elements forms the solid-state image pickup apparatus according to the first aspect of the present disclosure. Examples of the arrangement of the plurality of image pickup elements include the Bayer array. A color filter layer for splitting light into blue, green, or red is arranged in place as necessary on the light-incidence side of each image pickup element.

In other possible modes, instead of providing one first-type image pickup element of Embodiment 1, two image pickup elements are stacked (i.e., a mode in which two photoelectric conversion units are stacked, and control units of the two photoelectric conversion units are provided in a semiconductor substrate), or three image pickup elements are stacked (i.e., a mode in which three photoelectric conversion units are stacked, and control units of the three photoelectric conversion units are provided in a semiconductor substrate). Examples of the stacked structure of the first-type image pickup element and the second-type image pickup element are illustrated in the following table.

|  | First type | Second type |
| --- | --- | --- |
| Backside illumination and frontside illumination | 1<br>Green<br>1<br>Primary color<br>1<br>White<br>1<br>Blue, green, or red<br>2<br>Green + infrared light<br>2<br>Green + blue<br>2<br>White + infrared light<br>3<br>Green + blue + red<br>3<br>Green + blue + red<br>3<br>Blue + green + red | 2<br>Blue + red<br>1<br>Complementary color<br>1<br>Infrared ray<br>0<br><br>2<br>Blue + red<br>1<br>Red<br>0<br><br>2<br>Blue-green (emerald) + infrared light<br>1<br>Infrared light<br>0 |

Embodiment 4

Figure 6B:
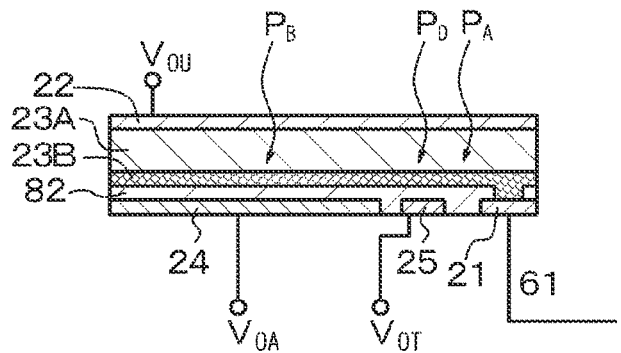
Figure 16:
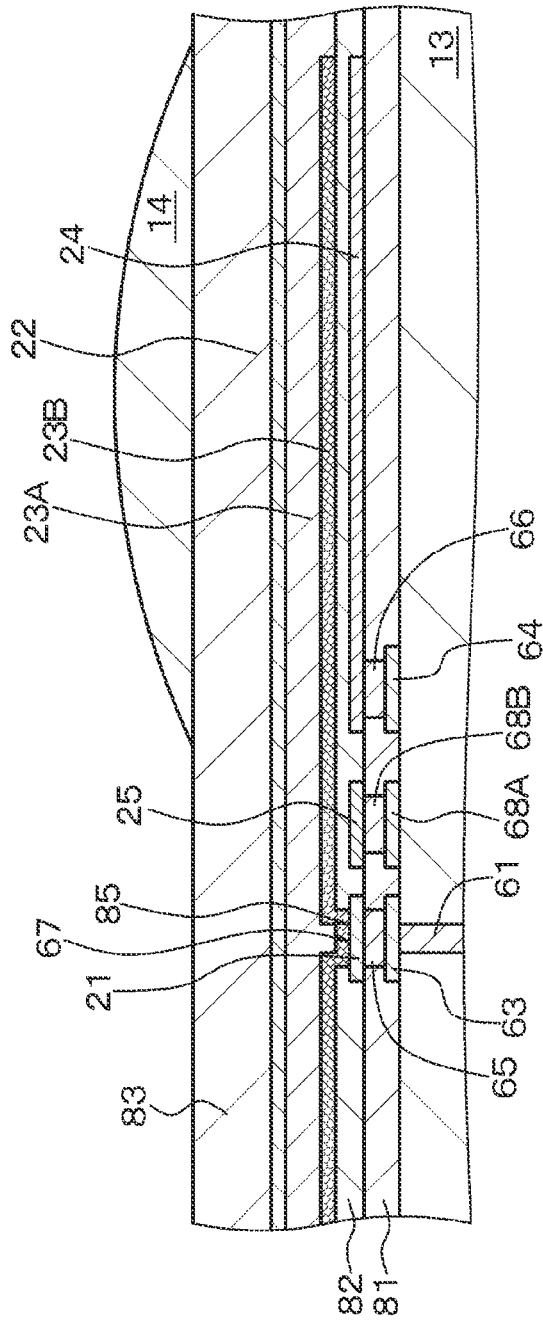
FIG. 16 is a schematic partial cross-sectional view of a section of the image pickup element of Embodiment 4.
Figure 17:
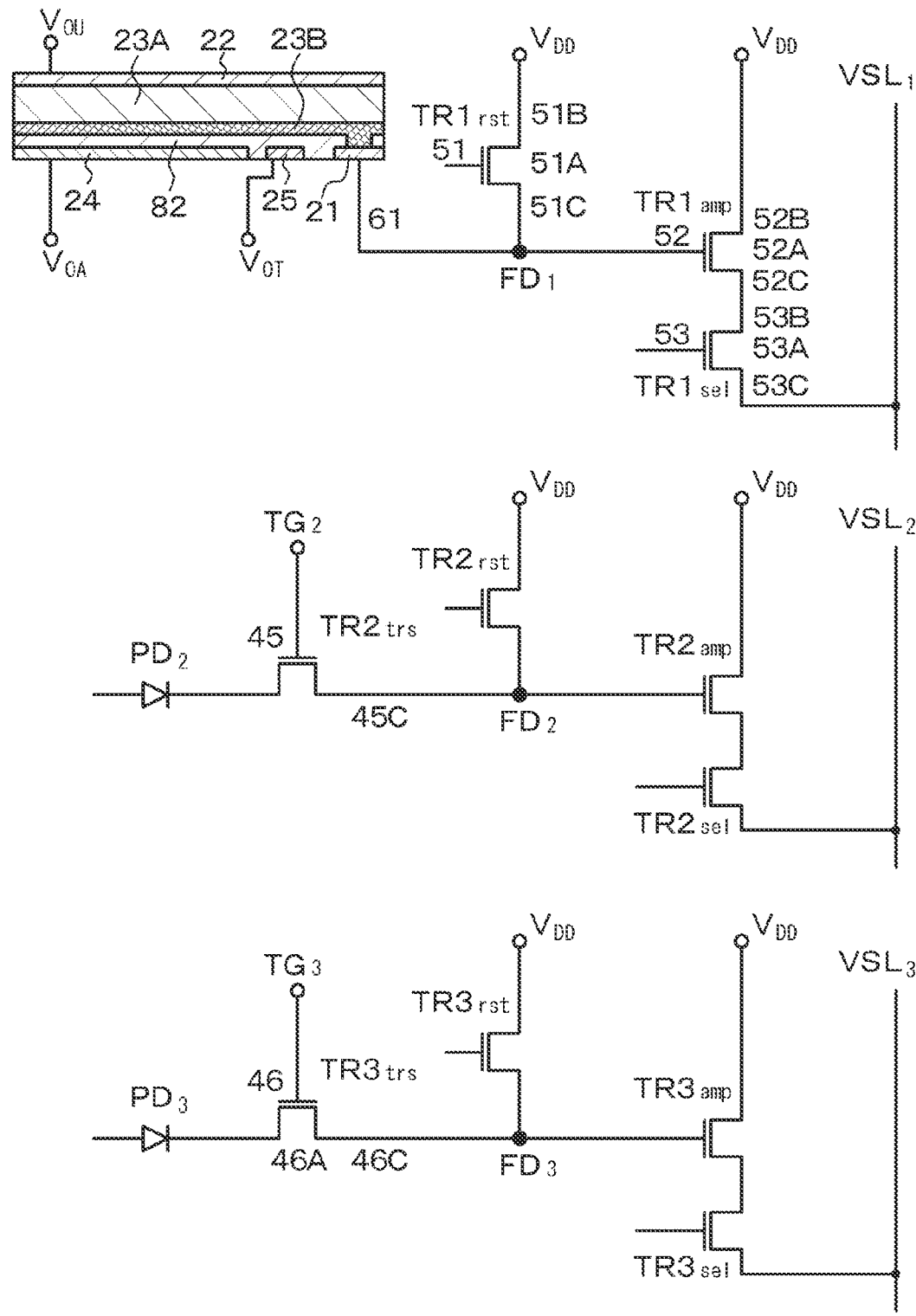
FIG. 17 is an equivalent circuit diagram of the image pickup element of Embodiment 4.
Figure 18:
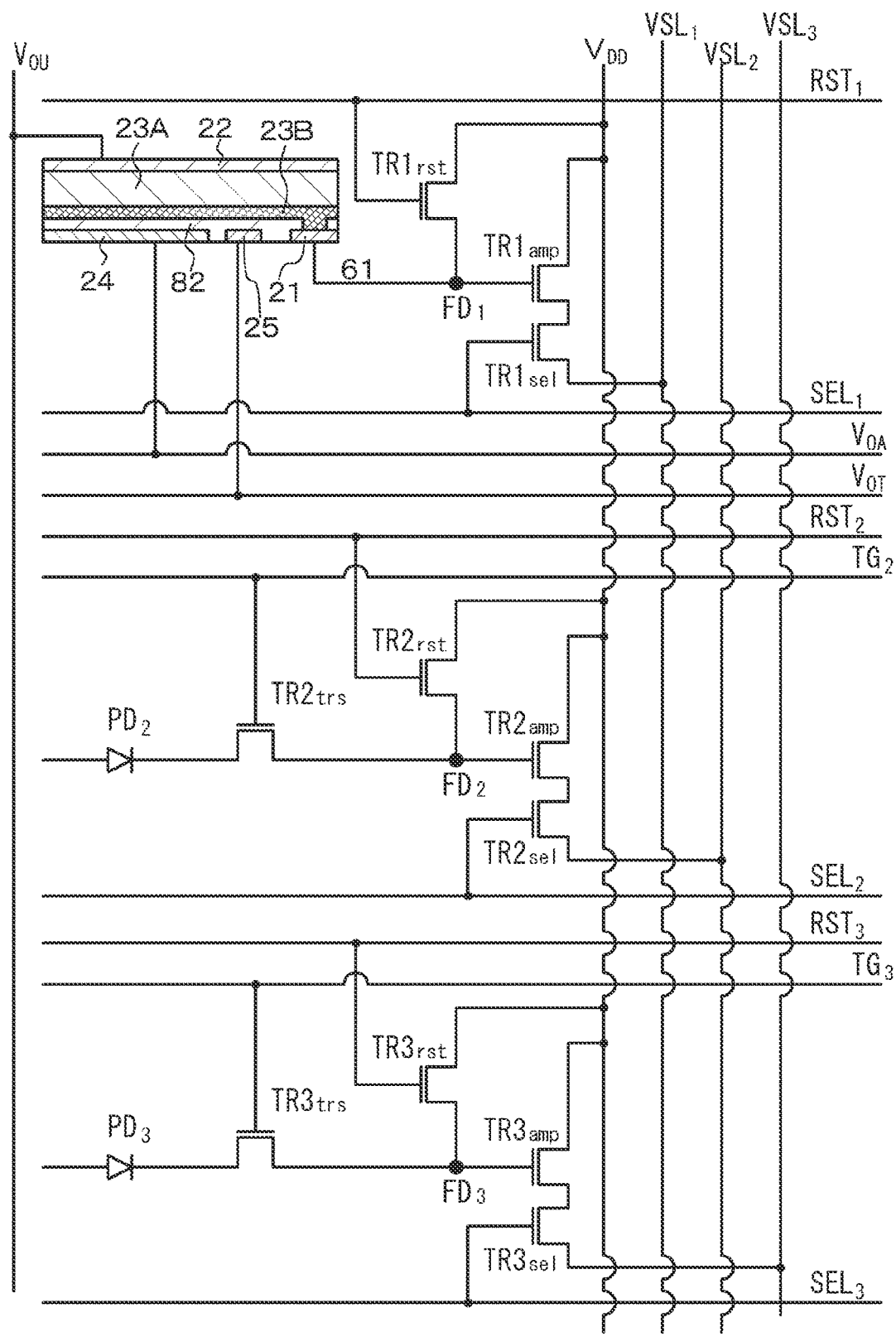
FIG. 18 is another equivalent circuit diagram of the image pickup element of Embodiment 4.
Figure 19:
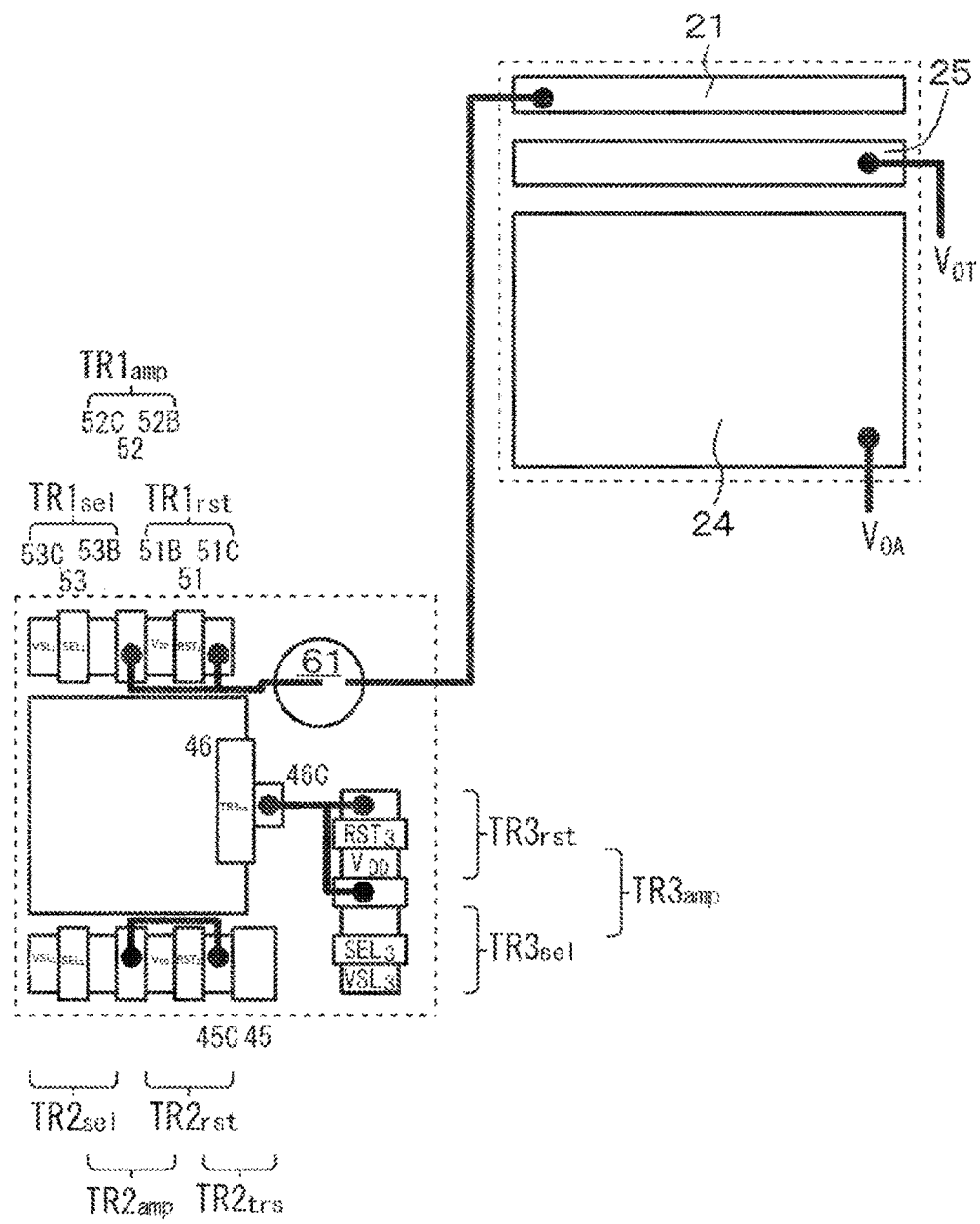
FIG. 19 is a schematic arrangement diagram of the first electrode, a transfer control electrode, and the charge accumulation electrode that are included in the image pickup element of Embodiment 4, and the transistors included in the control unit.
Figure 22:
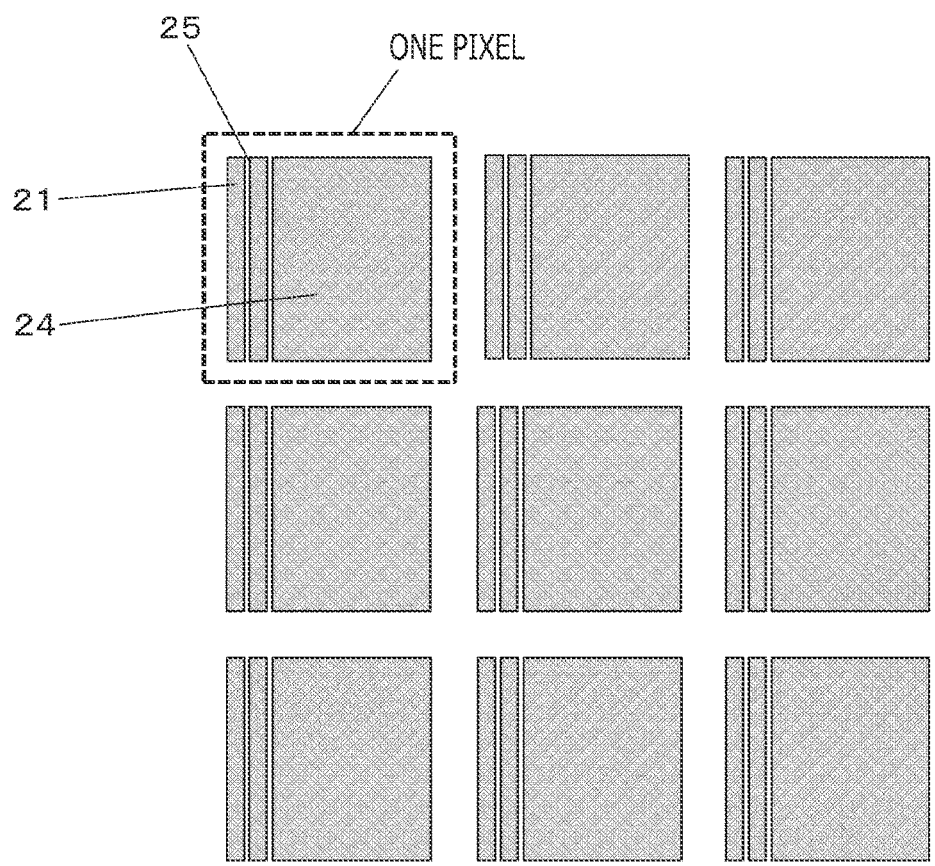
FIG. 22 is a schematic arrangement diagram of the first electrodes, the transfer control electrodes, and the charge accumulation electrodes that are included in the image pickup elements of Embodiment 4.

Embodiment 4 is a modification example of Embodiment 1 to Embodiment 3 and relates to the image pickup element and the like including the transfer control electrode (charge transfer electrode) of the present disclosure. FIG. 16 illustrates a schematic partial cross-sectional view of a section of the image pickup element and the stacked image pickup element of Embodiment 4, FIG. 17 and FIG. 18 illustrate equivalent circuit diagrams of the image pickup element and the stacked image pickup element of Embodiment 4, FIG. 19 illustrates a schematic arrangement diagram of the first electrode, the transfer control electrode, and the charge accumulation electrode that are included in the image pickup element of Embodiment 4, and the transistors included in the control unit, FIG. 20 and FIG. 21 schematically illustrate a state of the potential at each section at the time of operation of the image pickup element of Embodiment 4, and FIG. 6B illustrates an equivalent circuit diagram for explaining each section of the image pickup element of Embodiment 4. In addition, FIG. 22 illustrates a schematic arrangement diagram of the first electrodes, the transfer control electrodes, and the charge accumulation electrodes that are included in the photoelectric conversion units of the image pickup elements of Embodiment 4, and FIG. 23 illustrates a schematic perspective oblique view of the first electrodes, the transfer control electrodes, the charge accumulation electrodes, the second electrode, and the contact hole sections.

The image pickup element and the stacked image pickup element of Embodiment 4 further include the transfer control electrodes (charge transfer electrodes) 25 that are arranged between the first electrodes 21 and the charge accumulation electrodes 24 and apart from the first electrodes 21 and the charge accumulation electrodes 24 and are arranged to face the inorganic oxide semiconductor material layer 23B via the insulation layer 82. The transfer control electrodes 25 are connected with a pixel drive circuit included in the drive circuit, via connection holes 68B, pad sections 68A, and wires VOT that are provided in the interlayer insulation layer 81. Note that, in FIGS. 16, 25, 28, 37, 43, 46A, 46B, 47A, 47B, 66, and 67, various types of image pickup element constituent element positioned below the interlayer insulation layer 81 are collectively denoted by the reference numeral 13, for convenience, in order to simplify the drawings.

In the following, operation of the image pickup element (first image pickup element 10) of Embodiment 4 is explained with reference to FIG. 20 and FIG. 21. Note that, in FIG. 20 and FIG. 21, particularly, the values of the potential applied to the charge accumulation electrode 24 and the potential at the point $P_D$ are different.

In a charge accumulation period, from the drive circuit, the potential $V_{11}$ is applied to the first electrode 21, the potential $V_{31}$ is applied to the charge accumulation electrode 24, and the potential $V_{51}$ is applied to the transfer control electrode 25. With light having entered the photoelectric conversion layer 23A, photoelectric conversion occurs at the photoelectric conversion layer 23A. Holes generated by the photoelectric conversion are sent from the second electrode 22 to the drive circuit via the wire $V_{OU}$. On the other hand, because the potential of the first electrode 21 is made higher than the potential of the second electrode 22, that is, for example, a positive potential is applied to the first electrode 21, and a negative potential is applied to the second electrode 22, $V_{31}>V_{51}$ (e.g., $V_{31}>V_{11}>V_{51}$ or $V_{11}>V_{31}>V_{51}$) is satisfied. Thereby, electrons generated by the photoelectric conversion are attracted to the charge accumulation electrode 24 and are stopped in the region that is in the inorganic oxide semiconductor material layer 23B and the like and faces the charge accumulation electrode 24. That is, an electric charge is accumulated in the inorganic oxide semiconductor material layer 23B and the like. Because $V_{31}>V_{51}$, it is possible to surely prevent electrons generated inside the photoelectric conversion layer 23A from being transferred toward the first electrode 21. Along with the time lapse of the photoelectric conversion, the value of the potential of the region that is in the inorganic oxide semiconductor material layer 23B and the like and faces the charge accumulation electrode 24 shifts toward the negative side.

In a latter period of the charge accumulation period, reset operation is performed. Thereby, the potential of the first floating diffusion layer $FD_1$ is reset, and the potential of the first floating diffusion layer $FD_1$ becomes the power supply potential $V_{DD}$.

Electric-charge read operation is performed after the completion of the reset operation. That is, in a charge transfer period, from the drive circuit, the potential $V_{12}$ is applied to the first electrode 21, the potential $V_{32}$ is applied to the charge accumulation electrode 24, and the potential $V_{52}$ is applied to the transfer control electrode 25. Here, $V_{32} \leq V_{52} \leq V_{12}$ (preferably, $V_{32}<V_{52}<V_{12}$) is satisfied. Thereby, the electrons that are stopped in the region that is in the inorganic oxide semiconductor material layer 23B and the like and faces the charge accumulation electrode 24 are surely read out to the first electrode 21, and further to the first floating diffusion layer $FD_1$. That is, the electric charge accumulated in the inorganic oxide semiconductor material layer 23B and the like is read out to the control unit.

With the process explained thus far, a series of operation like charge accumulation, reset operation, and charge transfer is completed.

Operation at the amplification transistor $TR1_{amp}$ and the selection transistor $TR1_{sel}$ after the electrons are read out to the first floating diffusion layer $FD_1$ is the same as conventional operation in transistors of these types. In addition, for example, a series of operation like charge accumulation, reset operation, and charge transfer at the second image pickup element 11 and the third image pickup element 12 is similar to a series of conventional operation like charge accumulation, reset operation, and charge transfer.

Figure 24:
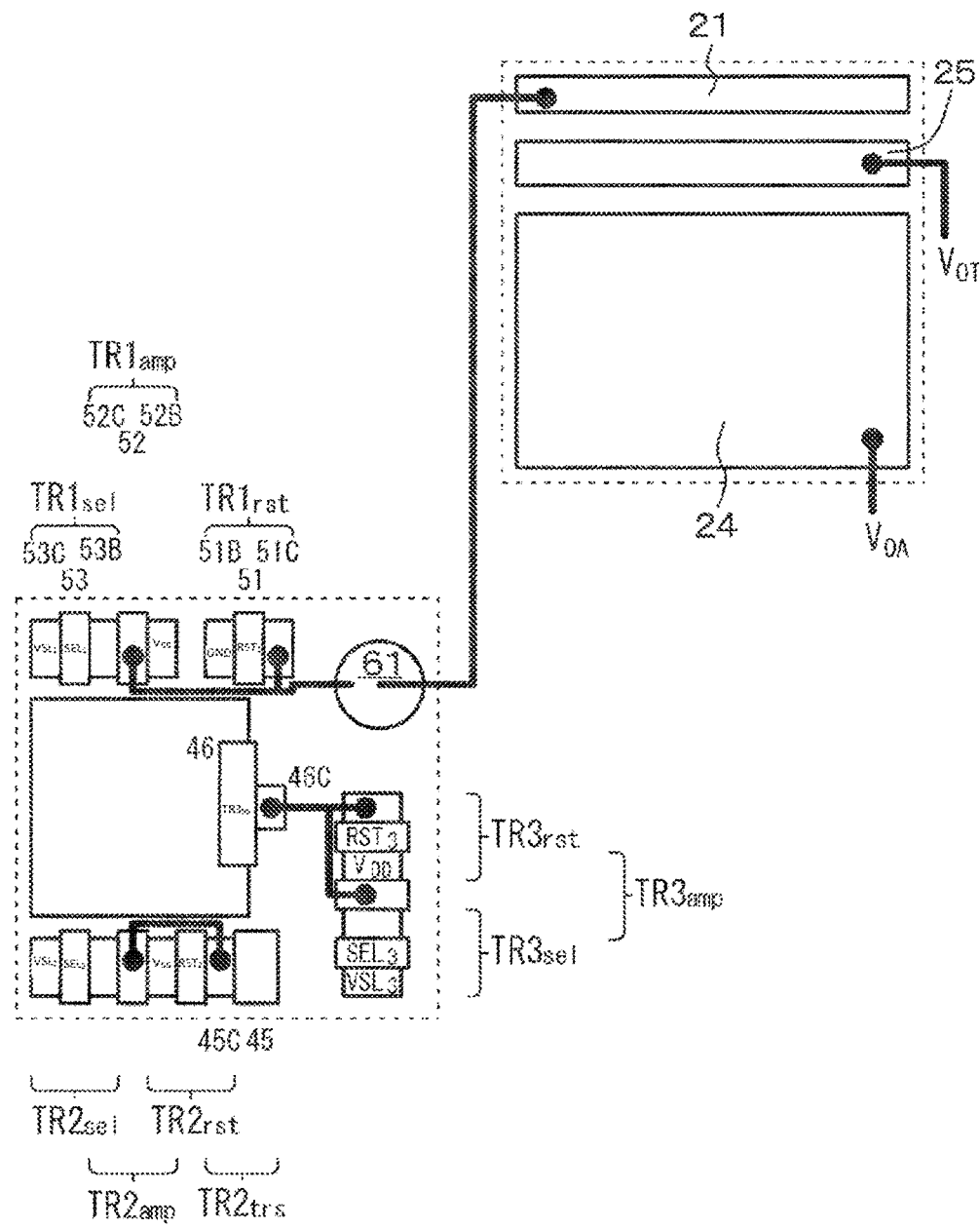
FIG. 24 is a schematic arrangement diagram of the first electrode, the transfer control electrode, and the charge accumulation electrode that are included in a modification example of the image pickup element of Embodiment 4, and the transistors included in the control unit.

As illustrated in FIG. 24 which illustrates a schematic arrangement diagram of the first electrode and the charge accumulation electrode that are included in a modification example of the image pickup element of Embodiment 4, and the transistors included in the control unit, the other source/drain region 51B of the reset transistor $TR1_{rst}$ may be grounded, instead being connected to the power supply $V_{DD}$.

Embodiment 5

Figure 26:
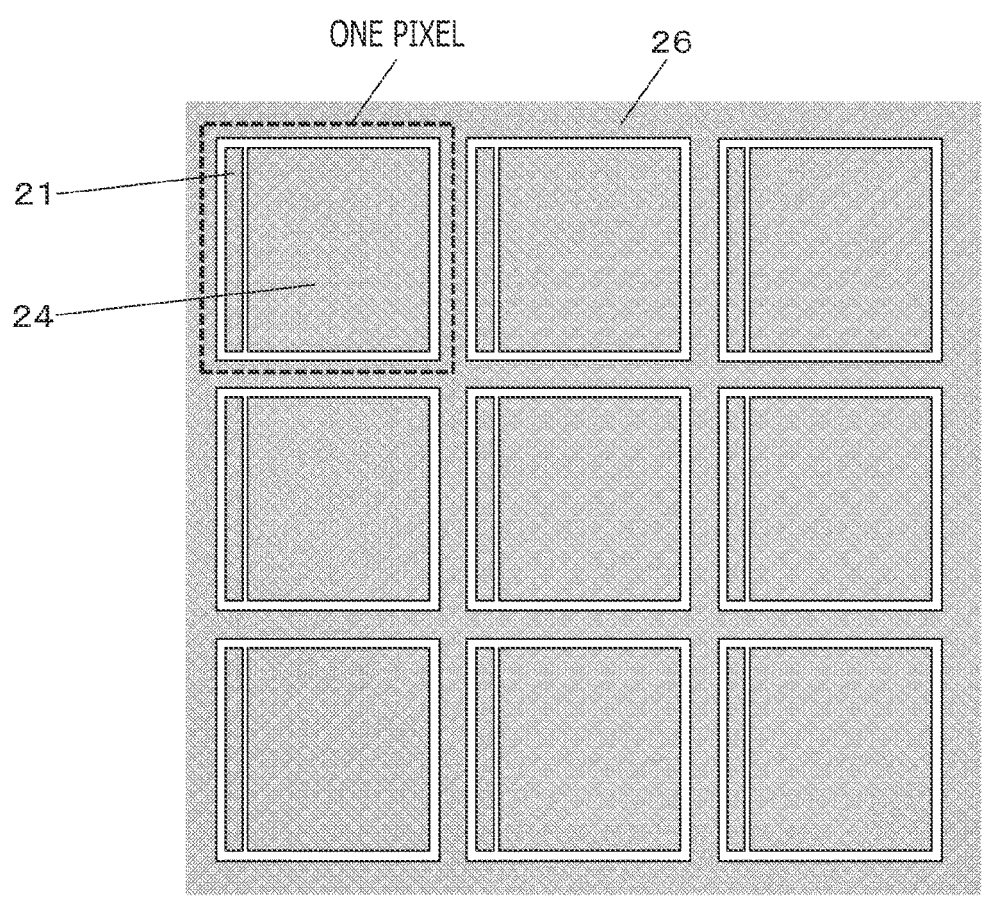
FIG. 26 is a schematic arrangement diagram of the first electrodes, the charge accumulation electrodes, and a charge discharge electrode that are included in the image pickup elements of Embodiment 5.
Figure 27:
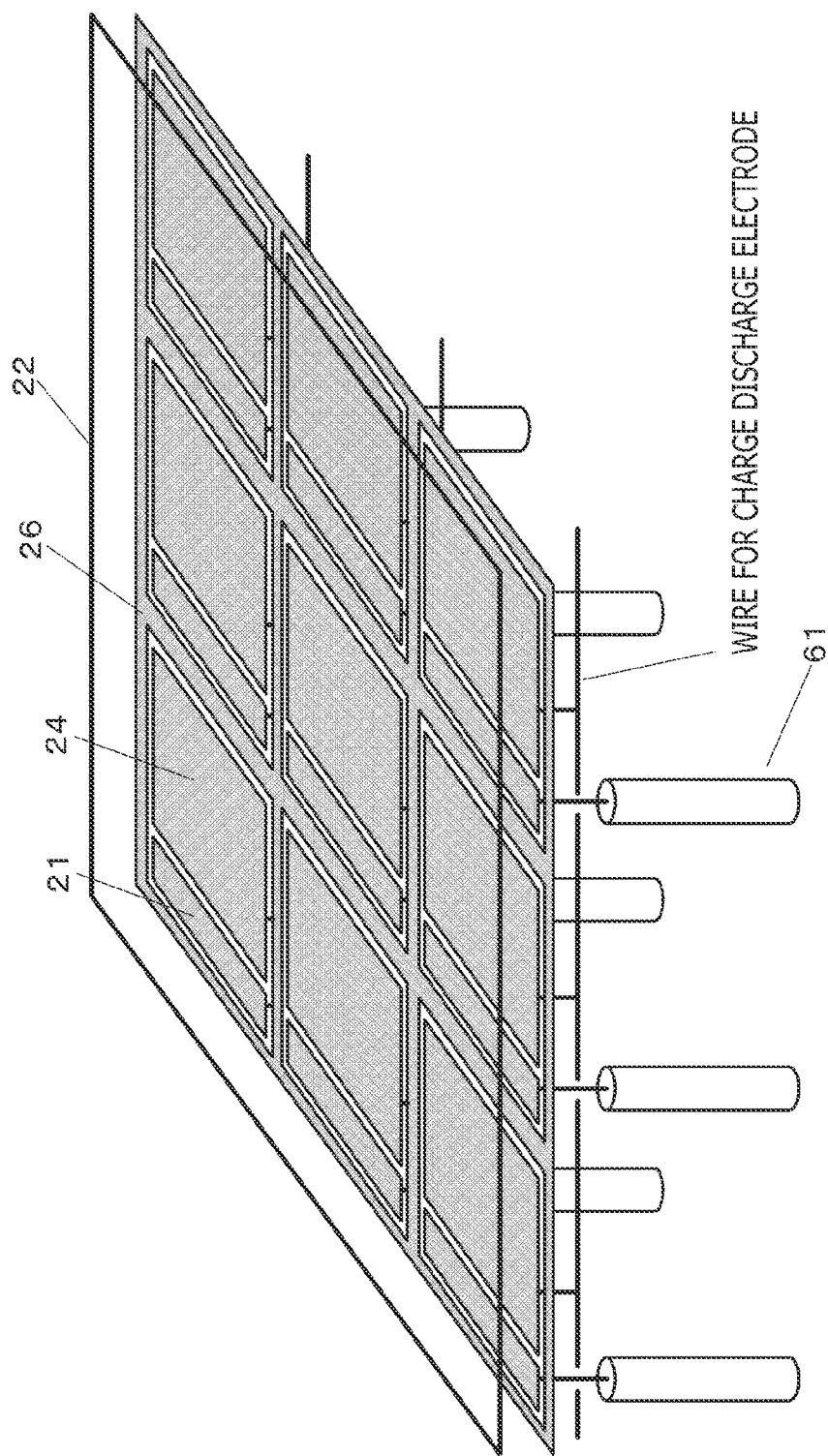
FIG. 27 is a schematic perspective oblique view of the first electrodes, the charge accumulation electrodes, the charge discharge electrode, the second electrode, and the contact hole sections that are included in the image pickup elements of Embodiment 5.

Embodiment 5 is a modification example of Embodiment 1 to Embodiment 4 and relates to the image pickup element and the like including the charge discharge electrode of the present disclosure. FIG. 25 illustrates a schematic partial cross-sectional view of a section of the image pickup element of Embodiment 5, FIG. 26 illustrates a schematic arrangement diagram of the first electrodes, the charge accumulation electrodes, and the charge discharge electrode that are included in the photoelectric conversion units including the charge accumulation electrodes of the image pickup elements of Embodiment 5, and FIG. 27 illustrates a schematic perspective oblique view of the first electrodes, the charge accumulation electrodes, the charge discharge electrode, the second electrode, and the contact hole sections.

The image pickup element of Embodiment 5 further includes a charge discharge electrode 26 that is connected with the inorganic oxide semiconductor material layer 23B via a connecting section 69 and that is arranged apart from the first electrode 21 and the charge accumulation electrode 24. Here, the charge discharge electrode 26 is arranged to surround the first electrode 21 and the charge accumulation electrode 24 (i.e., in a picture frame-like manner). The charge discharge electrode 26 is connected with a pixel drive circuit included in the drive circuit. The inorganic oxide semiconductor material layer 23B extends inside the connecting section 69. That is, the inorganic oxide semiconductor material layer 23B extends inside a second opening section 86 provided through the insulation layer 82 and is connected with the charge discharge electrode 26. The charge discharge electrode 26 is shared by (made common to) a plurality of image pickup elements. An inclination to spread upward may be formed on the side surface of the second opening section 86. The charge discharge electrode 26 can be used as a floating diffusion electrode or an overflow drain electrode of the photoelectric conversion unit 23, for example.

In Embodiment 5, in a charge accumulation period, from the drive circuit, the potential $V_{11}$ is applied to the first electrode 21, the potential $V_{31}$ is applied to the charge accumulation electrode 24, the potential $V_{61}$ is applied to the charge discharge electrode 26, and an electric charge is accumulated in the inorganic oxide semiconductor material layer 23B and the like. With light having entered the photoelectric conversion layer 23A, photoelectric conversion occurs at the photoelectric conversion layer 23A. Holes generated by the photoelectric conversion are sent from the second electrode 22 to the drive circuit via the wire $V_{OU}$. On the other hand, because the potential of the first electrode 21 is made higher than the potential of the second electrode 22, that is, for example, a positive potential is applied to the first electrode 21, and a negative potential is applied to the second electrode 22, $V_{61} > V_{11}$ (e.g., $V_{31} > V_{61} > V_{11}$) is satisfied. Thereby, electrons generated by the photoelectric conversion are attracted to the charge accumulation electrode 24, are stopped in the region that is in the inorganic oxide semiconductor material layer 23B and the like and faces the charge accumulation electrode 24, and can surely be prevented from being transferred toward the first electrode 21. Note that, if the attraction by the charge accumulation electrode 24 is not sufficient or if there are electrons that could not be accumulated in the inorganic oxide semiconductor material layer 23B and the like (what is generally called overflowed electrons), electrons are sent out to the drive circuit through the charge discharge electrode 26.

In a latter period of the charge accumulation period, reset operation is performed. Thereby, the potential of the first floating diffusion layer $FD_1$ is reset, and the potential of the first floating diffusion layer $FD_1$ becomes the power supply potential $V_{DD}$.

Electric-charge read operation is performed after the completion of the reset operation. That is, in a charge transfer period, from the drive circuit, the potential $V_{12}$ is applied to the first electrode 21, the potential $V_{32}$ is applied to the charge accumulation electrode 24, and the potential $V_{62}$ is applied to the charge discharge electrode 26. Here, $V_{62} < V_{12}$ (e.g., $V_{62} < V_{32} < V_{12}$) is satisfied. Thereby, the electrons that are stopped in the region that is in the inorganic oxide semiconductor material layer 23B and the like and faces the charge accumulation electrode 24 are surely read out to the first electrode 21, and further to the first floating diffusion layer $FD_1$. That is, the electric charge accumulated in the inorganic oxide semiconductor material layer 23B and the like is read out to the control unit.

With the process explained thus far, a series of operation like charge accumulation, reset operation, and charge transfer is completed.

Operation at the amplification transistor $TR1_{amp}$ and the selection transistor $TR1_{sel}$ after the electrons are read out to the first floating diffusion layer $FD_1$ is the same as conventional operation in transistors of these types. In addition, for example, a series of operation like charge accumulation, reset operation, and charge transfer at the second image pickup element and the third image pickup element is similar to a series of conventional operation like charge accumulation, reset operation, and charge transfer.

In Embodiment 5, what is generally called overflowed electrons are sent out to the drive circuit through the charge discharge electrode 26, and so it is possible to suppress leakage into charge accumulation sections of adjacent pixels and to suppress occurrence of blooming. Then, it is thereby possible to enhance the image pickup performance of the image pickup element.

Embodiment 6

Embodiment 6 is a modification example of Embodiment 1 to Embodiment 5 and relates to the image pickup element and the like including a plurality of charge accumulation electrode segments of the present disclosure.

Figure 6C:
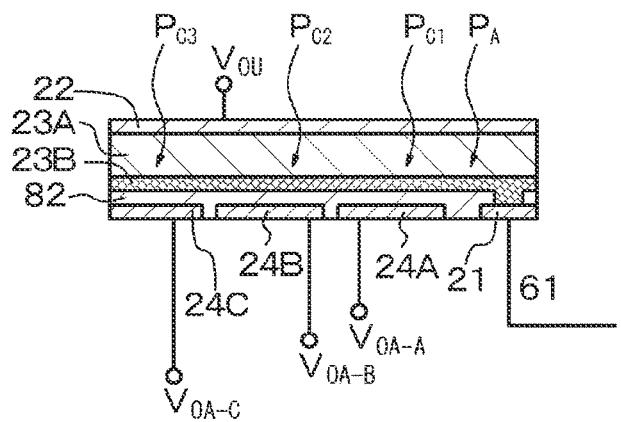
Figure 28:
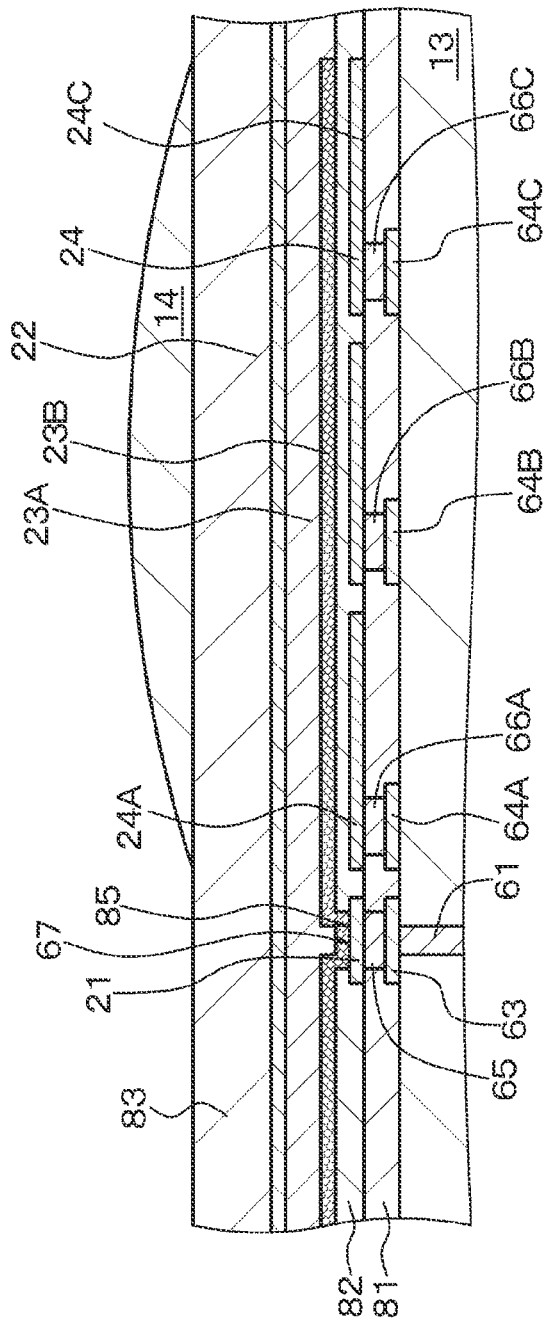
FIG. 28 is a schematic partial cross-sectional view of the image pickup element of Embodiment 6.
Figure 29:
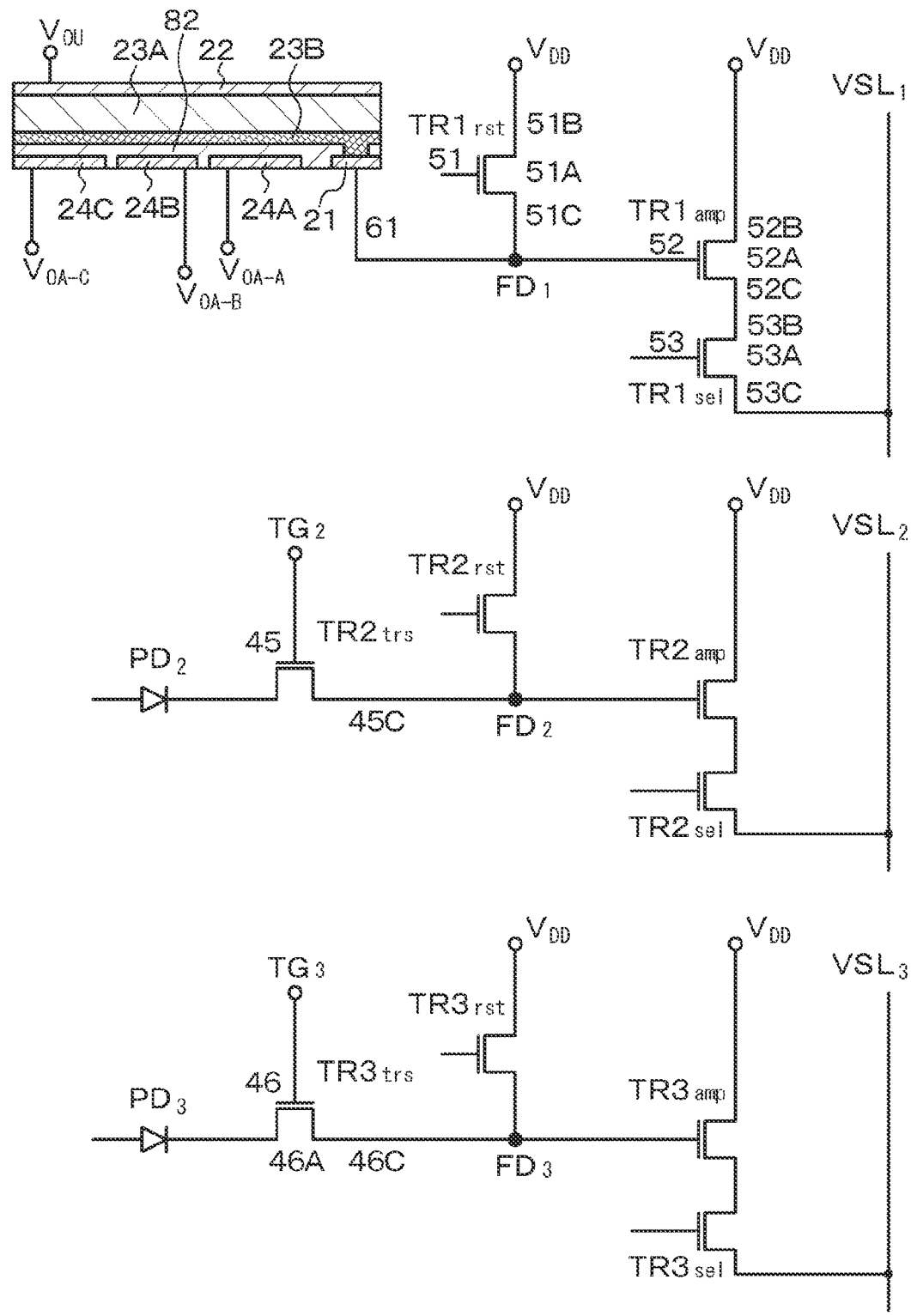
FIG. 29 is an equivalent circuit diagram of the image pickup element of Embodiment 6.
Figure 30:
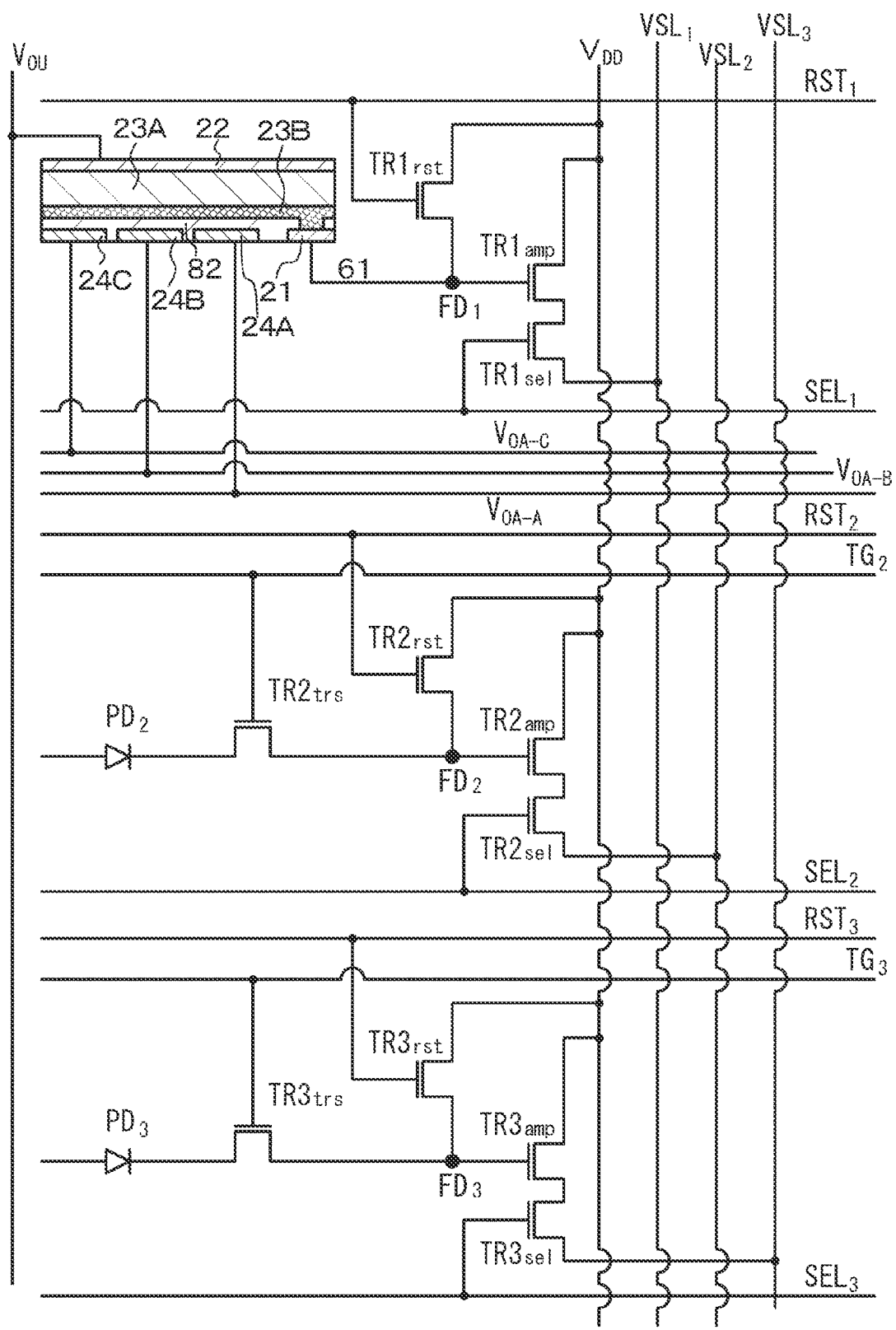
FIG. 30 is another equivalent circuit diagram of the image pickup element of Embodiment 6.
Figure 31:
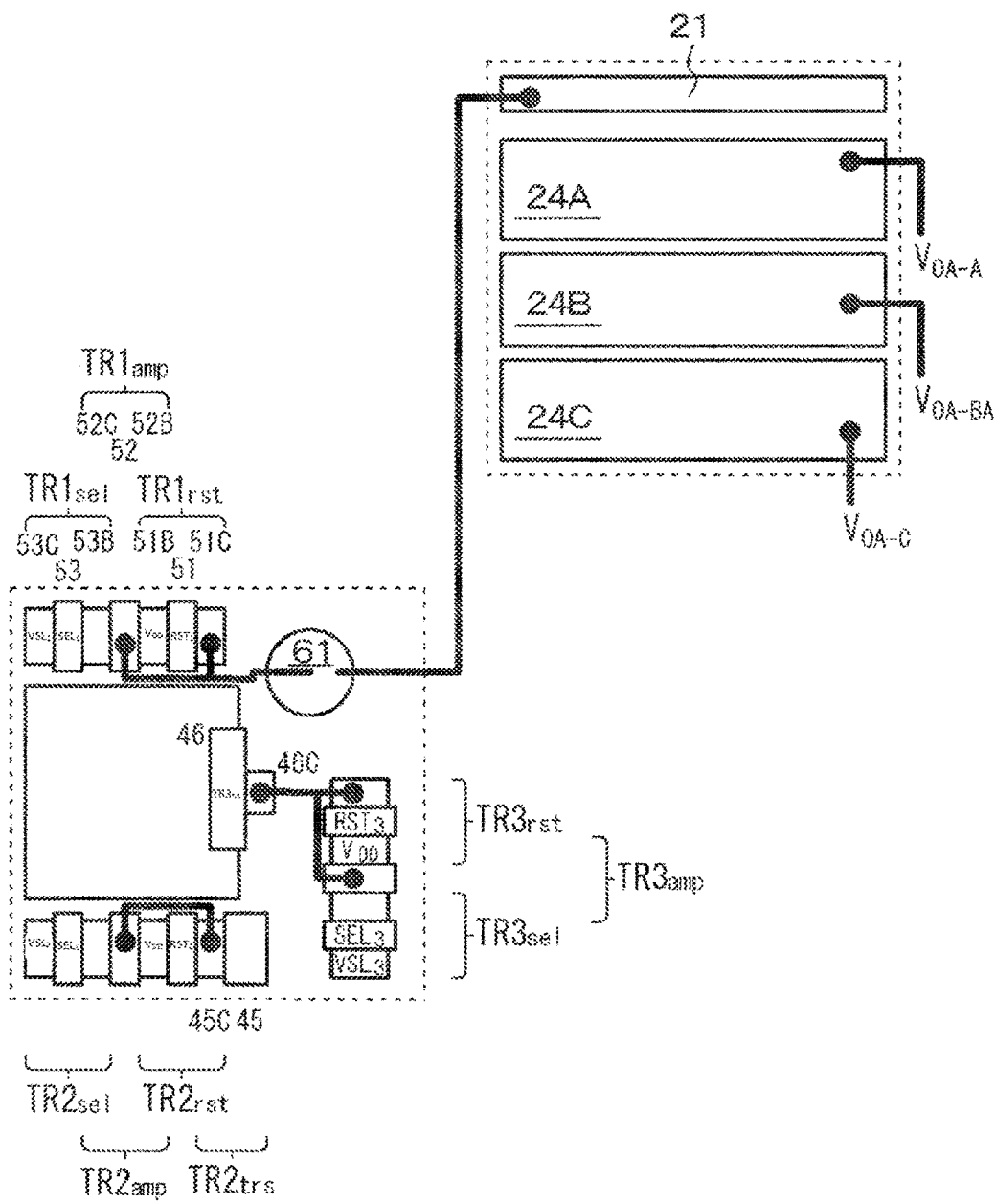
FIG. 31 is a schematic arrangement diagram of the first electrode and the charge accumulation electrode that are included in the image pickup element of Embodiment 6, and the transistors included in the control unit.
Figure 32:
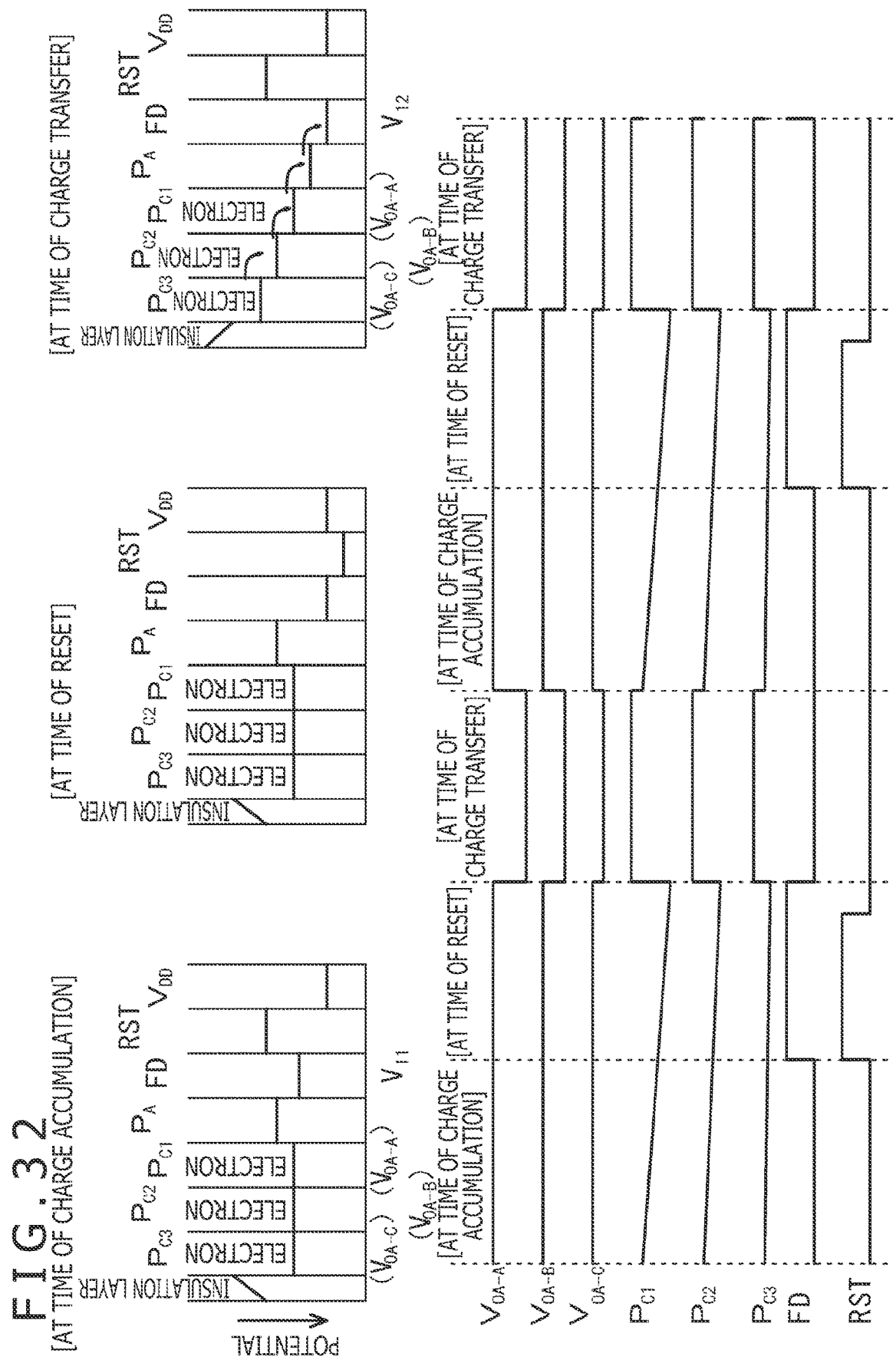
FIG. 32 is a figure schematically illustrating a state of a potential at each section at a time of operation of the image pickup element of Embodiment 6.
Figure 34:
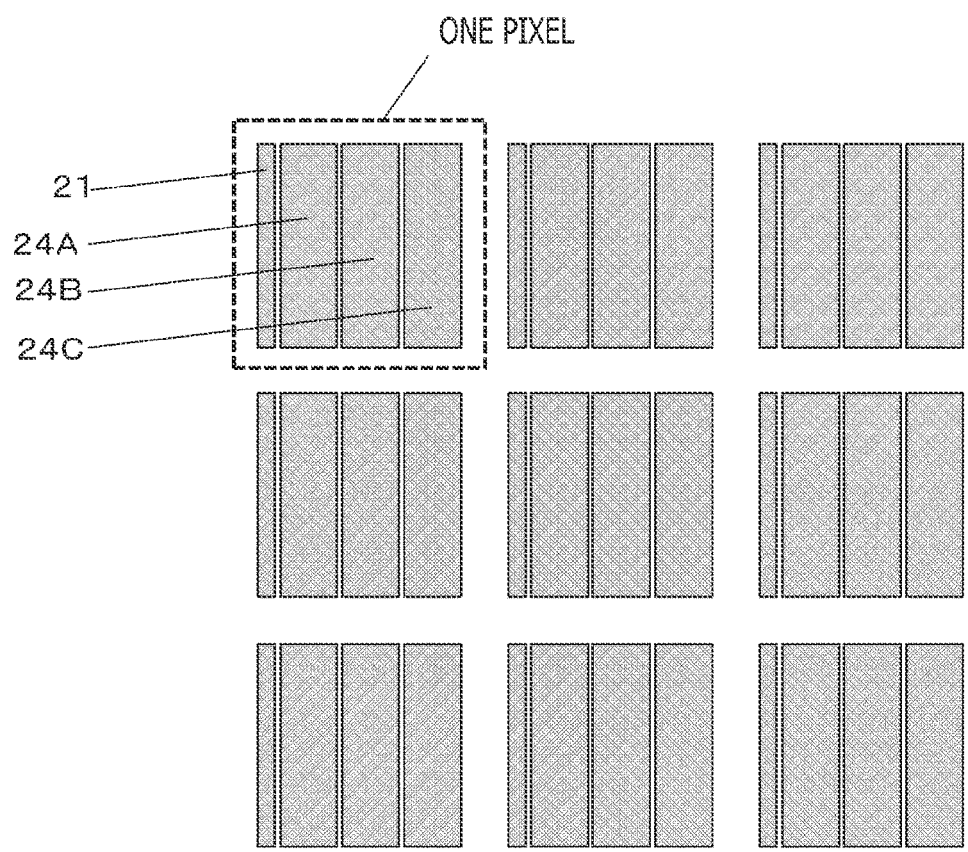
FIG. 34 is a schematic arrangement diagram of the first electrodes and the charge accumulation electrodes that are included in the image pickup elements of Embodiment 6.
Figure 35:
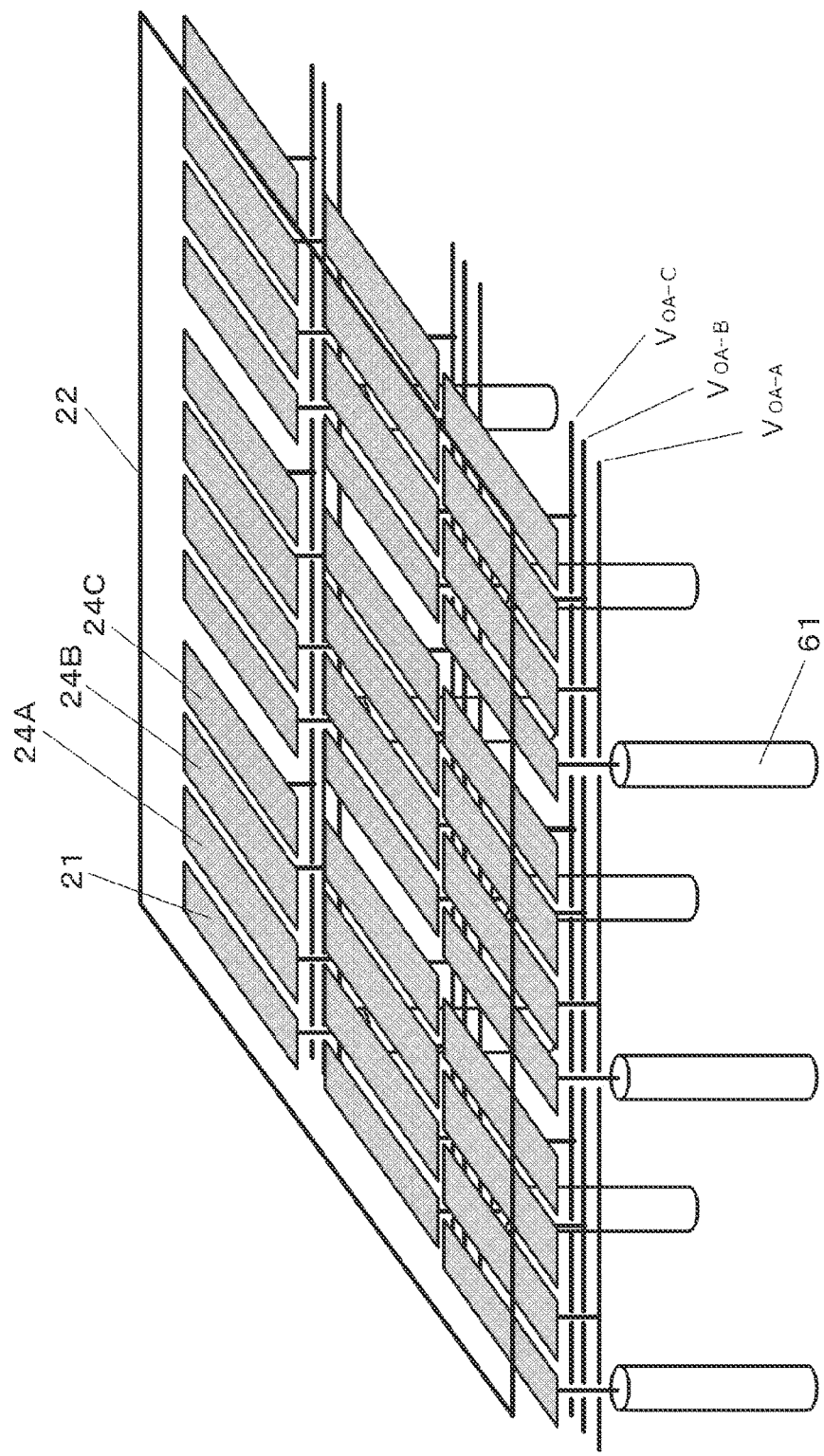
FIG. 35 is a schematic perspective oblique view of the first electrodes, the charge accumulation electrodes, the second electrode, and the contact hole sections that are included in the image pickup elements of Embodiment 6.

FIG. 28 illustrates a schematic partial cross-sectional view of a section of the image pickup element of Embodiment 6, FIG. 29 and FIG. 30 illustrate equivalent circuit diagrams of the image pickup element of Embodiment 6, FIG. 31 illustrates a schematic arrangement diagram of the first electrode and the charge accumulation electrode that are included in the photoelectric conversion unit including the charge accumulation electrode of the image pickup element of Embodiment 6, and the transistors included in the control unit, FIG. 32 and FIG. 33 schematically illustrate a state of the potential at each section at the time of operation of the image pickup element of Embodiment 6, and FIG. 6C illustrates an equivalent circuit diagram for explaining each section of the image pickup element of Embodiment 6. In addition, FIG. 34 illustrates a schematic arrangement diagram of the first electrodes and the charge accumulation electrodes that are included in the photoelectric conversion units including the charge accumulation electrodes of the image pickup elements of Embodiment 6, and FIG. 35 illustrates a schematic perspective oblique view of the first electrodes, the charge accumulation electrodes, the second electrode, and the contact hole sections.

In Embodiment 6, the charge accumulation electrode 24 includes a plurality of charge accumulation electrode segments 24A, 24B, and 24C. It is sufficient if the number of charge accumulation electrode segments are two or more, and are set to "3" in Embodiment 6. Then, in the image pickup element of Embodiment 6, the potential of the first electrode 21 is higher than the potential of second electrode 22, that is, for example, a positive potential is applied to the first electrode 21, and a negative potential is applied to the second electrode 22. Then, in a charge transfer period, the potential applied to the charge accumulation electrode segment 24A positioned closest to the first electrode 21 is higher than the potential applied to the charge accumulation electrode segment 24C positioned farthest from the first electrode 21. In such a manner, by forming a potential gradient in the charge accumulation electrode 24, electrons that are stopped in the region that is in the inorganic oxide semiconductor material layer 23B and the like and faces the charge accumulation electrode 24 are more surely read out to the first electrode 21, and further to the first floating diffusion layer $FD_1$. That is, the electric charge accumulated in the inorganic oxide semiconductor material layer 23B and the like is read out to the control unit.

In the example illustrated in FIG. 32, in a charge transfer period, the potential of the charge accumulation electrode segment 24C<the potential of the charge accumulation electrode segment 24B<the potential of the charge accumulation electrode segment 24A. Thereby, electrons that are stopped in the region in the inorganic oxide semiconductor material layer 23B and the like are read out to the first floating diffusion layer $FD_1$ all at once. On the other hand, in the example illustrated in FIG. 33, in a charge transfer period, the potential of the charge accumulation electrode segment 24C, the potential of the charge accumulation electrode segment 24B, and the potential of the charge accumulation electrode segment 24A are varied little by little (i.e., varied stepwise or slopewise). Thereby, electrons that are stopped in a region that is in the inorganic oxide semiconductor material layer 23B and the like and faces the charge accumulation electrode segment 24C are transferred to a region that is in the inorganic oxide semiconductor material layer 23B and the like and faces the charge accumulation electrode segment 24B. Next, electrons that are stopped in the region that is in the inorganic oxide semiconductor material layer 23B and the like and faces the charge accumulation electrode segment 24B are transferred to a region that is in the inorganic oxide semiconductor material layer 23B and the like and faces the charge accumulation electrode segment 24A. Next, electrons that are stopped in the region that is in the inorganic oxide semiconductor material layer 23B and the like and faces the charge accumulation electrode segment 24A are surely read out to the first floating diffusion layer $FD_1$.

Figure 36:
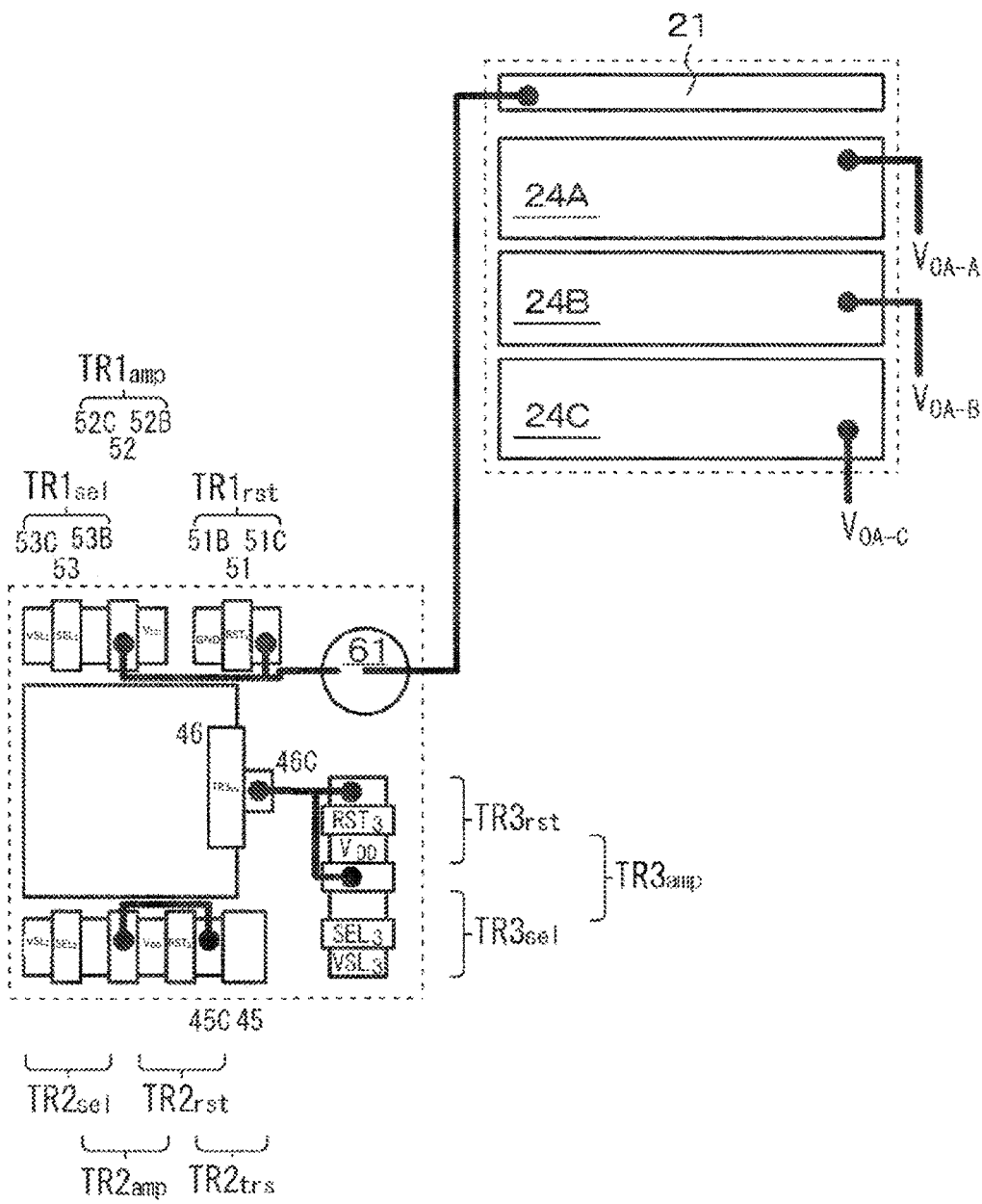
FIG. 36 is a schematic arrangement diagram of the first electrode and the charge accumulation electrode that are included in a modification example of the image pickup element of Embodiment 6.

As illustrated in FIG. 36 which illustrates a schematic arrangement diagram of the first electrode and the charge accumulation electrode that are included in a modification example of the image pickup element of Embodiment 6, and the transistors included in the control unit, the other source/drain region 51B of the reset transistor $TR1_{rst}$ may be grounded, instead being connected to the power supply $V_{DD}$.

Embodiment 7

Figure 37:
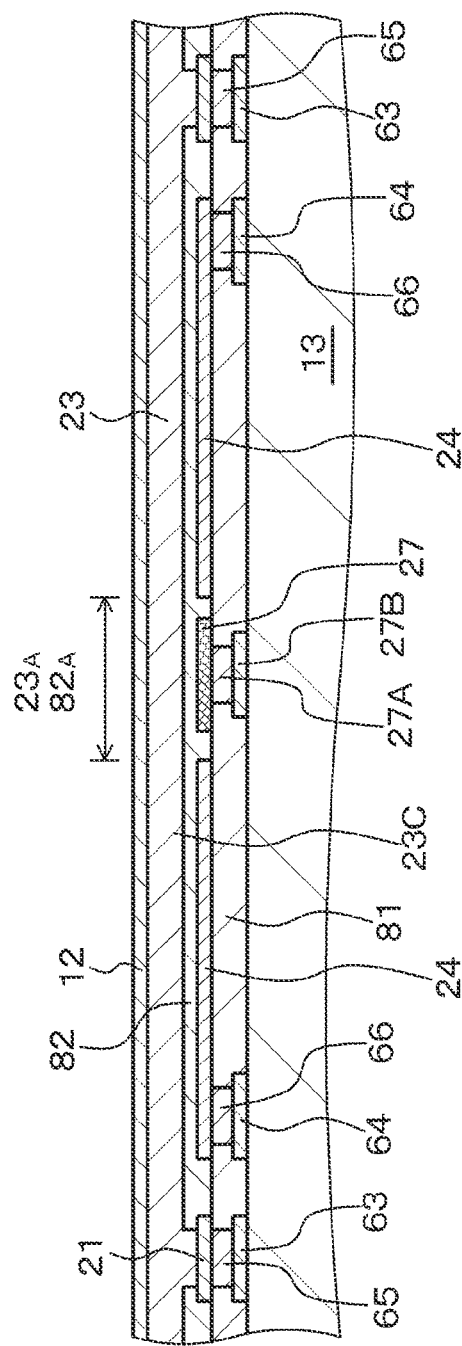
FIG. 37 is a schematic cross-sectional view of a section of the image pickup elements (two image pickup elements that are arranged side by side) of Embodiment 7.
Figure 38:
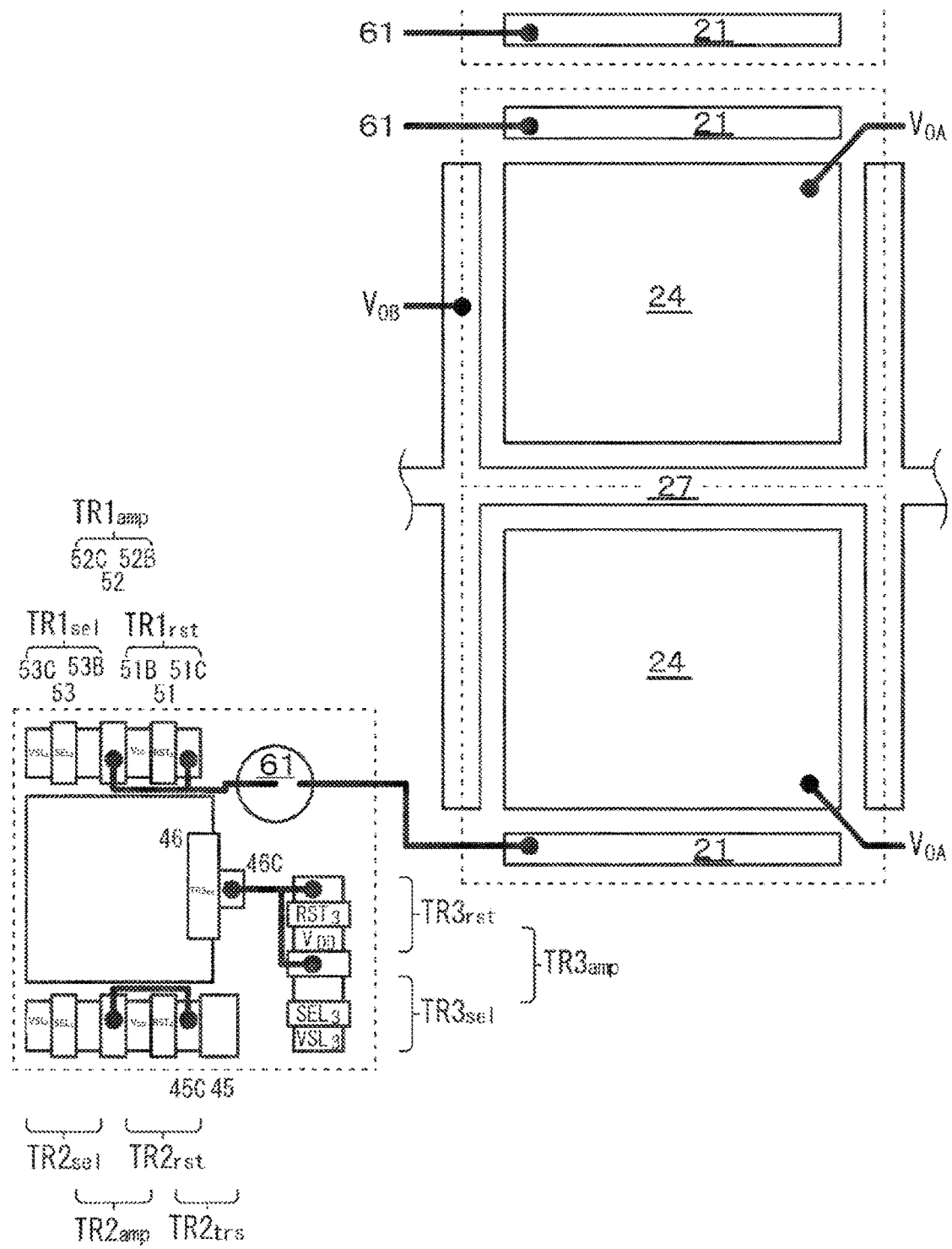
FIG. 38 is a schematic arrangement diagram of the first electrodes, the charge accumulation electrodes and the like that are included in the image pickup elements of Embodiment 7, and the transistors included in the control unit.
Figure 39:
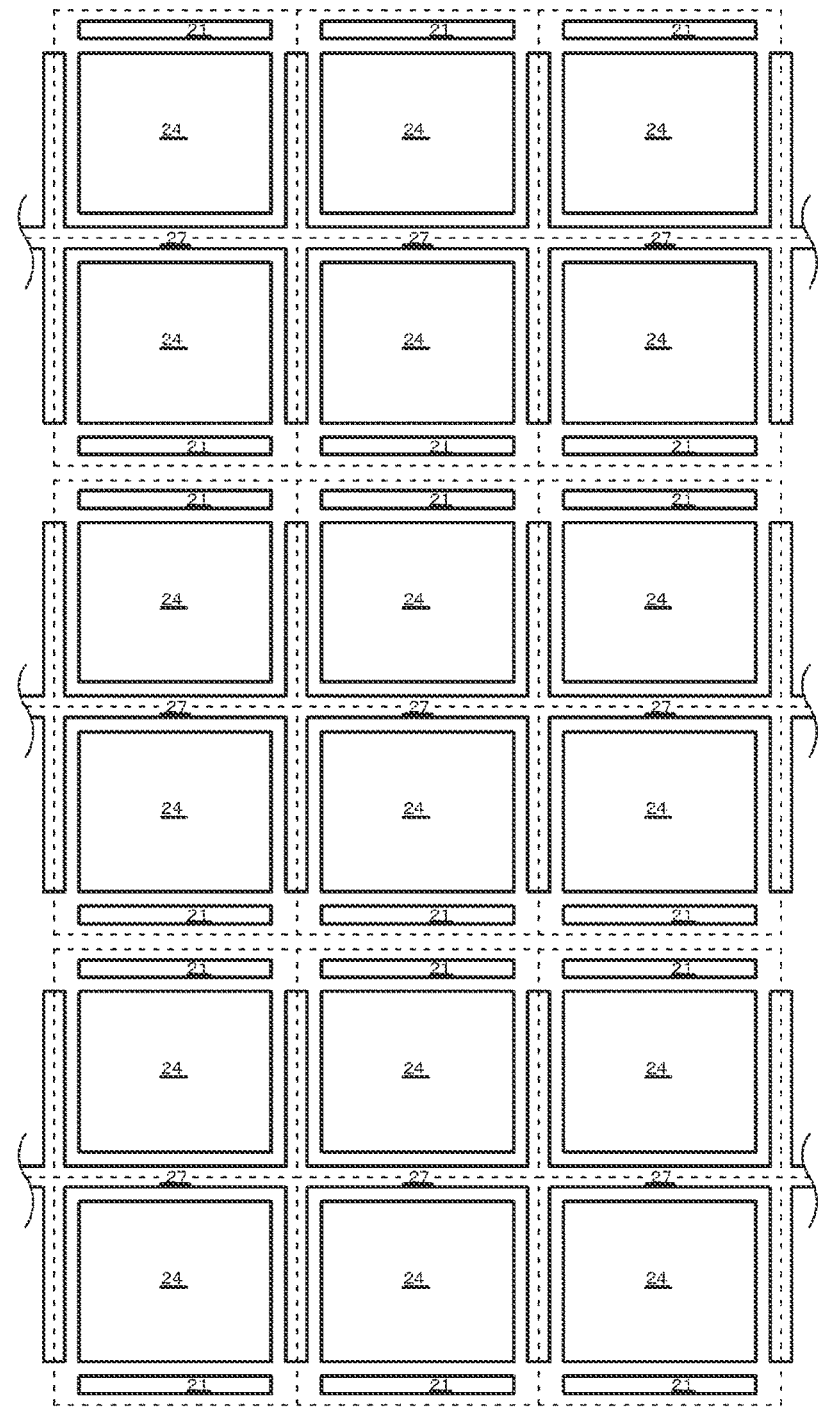
FIG. 39 is a schematic arrangement diagram of the first electrodes, the charge accumulation electrodes and the like that are included in the image pickup elements of Embodiment 7.
Figure 40:
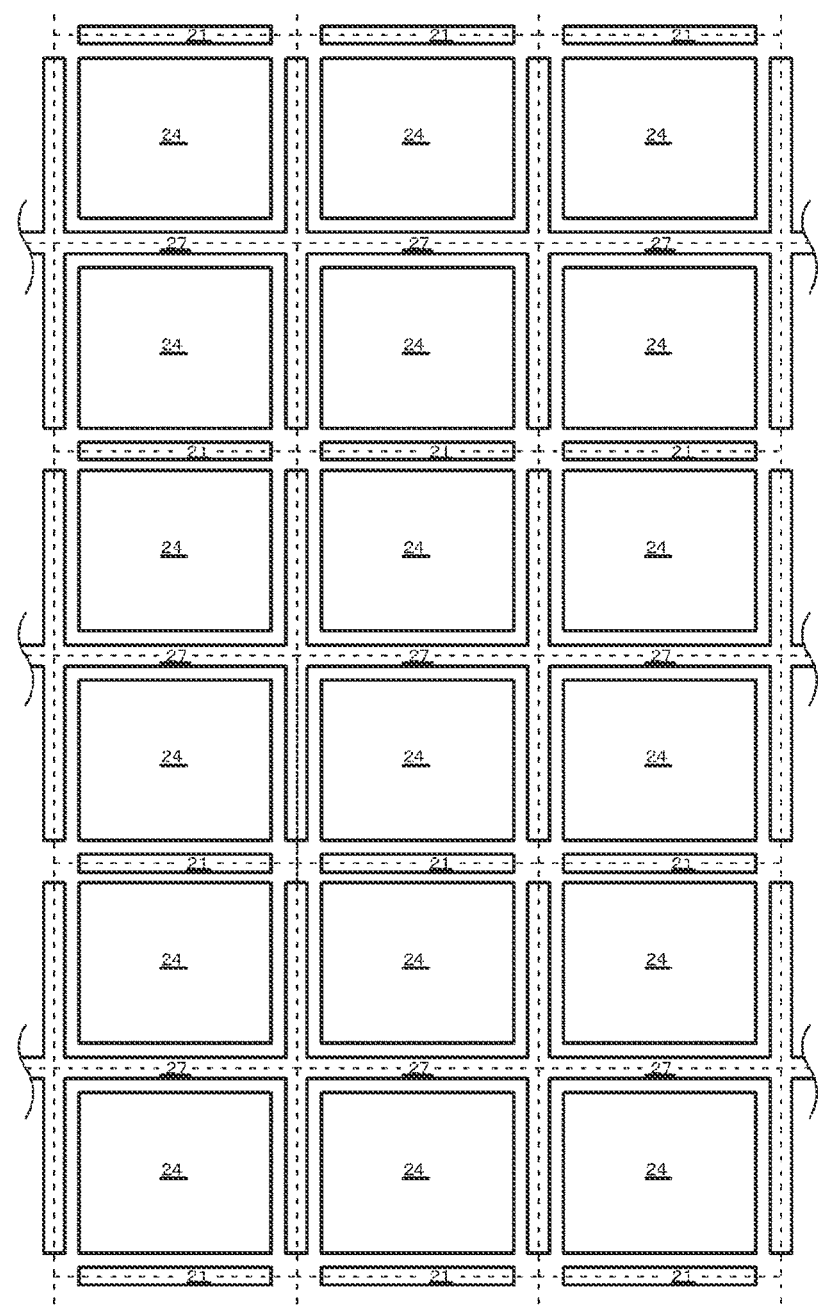
FIG. 40 is a schematic arrangement diagram of a modification example of the first electrodes, the charge accumulation electrodes and the like that are included in the image pickup elements of Embodiment 7.

Embodiment 7 is a modification example of Embodiment 1 to Embodiment 6 and relates to the image pickup element and the like including the charge transfer control electrode of the present disclosure, and specifically to the image pickup element and the like including the lower-section charge transfer control electrode (lower charge transfer control electrode) of the present disclosure. FIG. 37 illustrates a schematic partial cross-sectional view of a section of the image pickup elements of Embodiment 7, FIG. 38 illustrates a schematic arrangement diagram of the first electrodes, the charge accumulation electrodes and the like that are included in the image pickup elements of Embodiment 7, and the transistors included in the control unit, and FIGS. 39 and 40 illustrate schematic arrangement diagrams of the first electrodes, the charge accumulation electrodes, and the lower-section charge transfer control electrodes that are included in the photoelectric conversion units including the charge accumulation electrodes of the image pickup elements of Embodiment 7. Note that, in FIGS. 37, 43, 46A, 46B, 47A, and 47B, the photoelectric conversion layer 23A and the inorganic oxide semiconductor material layer 23B are collectively illustrated with a reference numeral 23.

In the image pickup elements of Embodiment 7, a lower-section charge transfer control electrode 27 is formed in a region that faces, via the insulation layer 82, a region (a region –A in the photoelectric conversion layer) $23_A$ that is in the photoelectric conversion unit 23 and is positioned between adjacent image pickup elements. In other words, the lower-section charge transfer control electrode 27 is formed under a section (the region –A of the insulation layer 82) $82_A$ that is in the insulation layer 82 and is in a region (region –a) sandwiched between a charge accumulation electrode 24 and a charge accumulation electrode 24 that are included in adjacent image pickup elements. The lower-section charge transfer control electrode 27 is provided apart from the charge accumulation electrodes 24. Alternatively, in other words, the lower-section charge transfer control electrode 27 is provided to surround the charge accumulation electrodes 24 and to be apart from the charge accumulation electrodes 24, and the lower-section charge transfer control electrode 27 is arranged to face the region –A ($23_A$) of the photoelectric conversion layer via the insulation layer 82. The lower-section charge transfer control electrode 27 is made common to the image pickup elements. Then, the lower-section charge transfer control electrode 27 is also connected with the drive circuit. Specifically, the lower-section charge transfer control electrode 27 is connected with the vertical drive circuit 112 included in the drive circuit via a connection hole 27A, a pad section 27B, and a wire $V_{OB}$ that are provided in the interlayer insulation layer 81. The lower-section charge transfer control electrode 27 may be formed at the same level as the first electrode 21 or the charge accumulation electrode 24 or may be formed at a different level (specifically, at a level lower than the first electrode 21 or the charge accumulation electrode 24). In the former case, the distance between the charge transfer control electrode 27 and the photoelectric conversion layer 23A can be made short, and so the potential can easily be controlled. On the other hand, in the latter case, the distance between the charge transfer control electrode 27 and the charge accumulation electrode 24 can be made short, and so it is advantageous for realizing miniaturization.

In the image pickup elements of Embodiment 7, the absolute value of a potential applied to a section that is in the photoelectric conversion layer 23A and faces the charge accumulation electrode 24 when light enters the photoelectric conversion layer 23A, and photoelectric conversion occurs at the photoelectric conversion layer 23A is larger than the absolute value of a potential applied the region –A in the photoelectric conversion layer 23A. Therefore, an electric charge generated by the photoelectric conversion is significantly attracted to the section that is in the inorganic oxide semiconductor material layer 23B and faces the charge accumulation electrode 24. As a result, it is possible to reduce the flow of the electric charge generated by the photoelectric conversion into adjacent image pickup elements, and so quality deterioration of a captured video (image) does not occur. Alternatively, because the lower-section charge transfer control electrode 27 is formed in a region that faces the region –A in the photoelectric conversion layer 23A via the insulation layer, the electrical field and potential of the region –A in the photoelectric conversion layer 23A positioned above the lower-section charge transfer control electrode 27 can be controlled. As a result, the lower-section charge transfer control electrode 27 can reduce the flow of the electric charge generated by the photoelectric conversion into the adjacent image pickup elements, and so quality deterioration of a captured video (image) does not occur.

Figure 41:
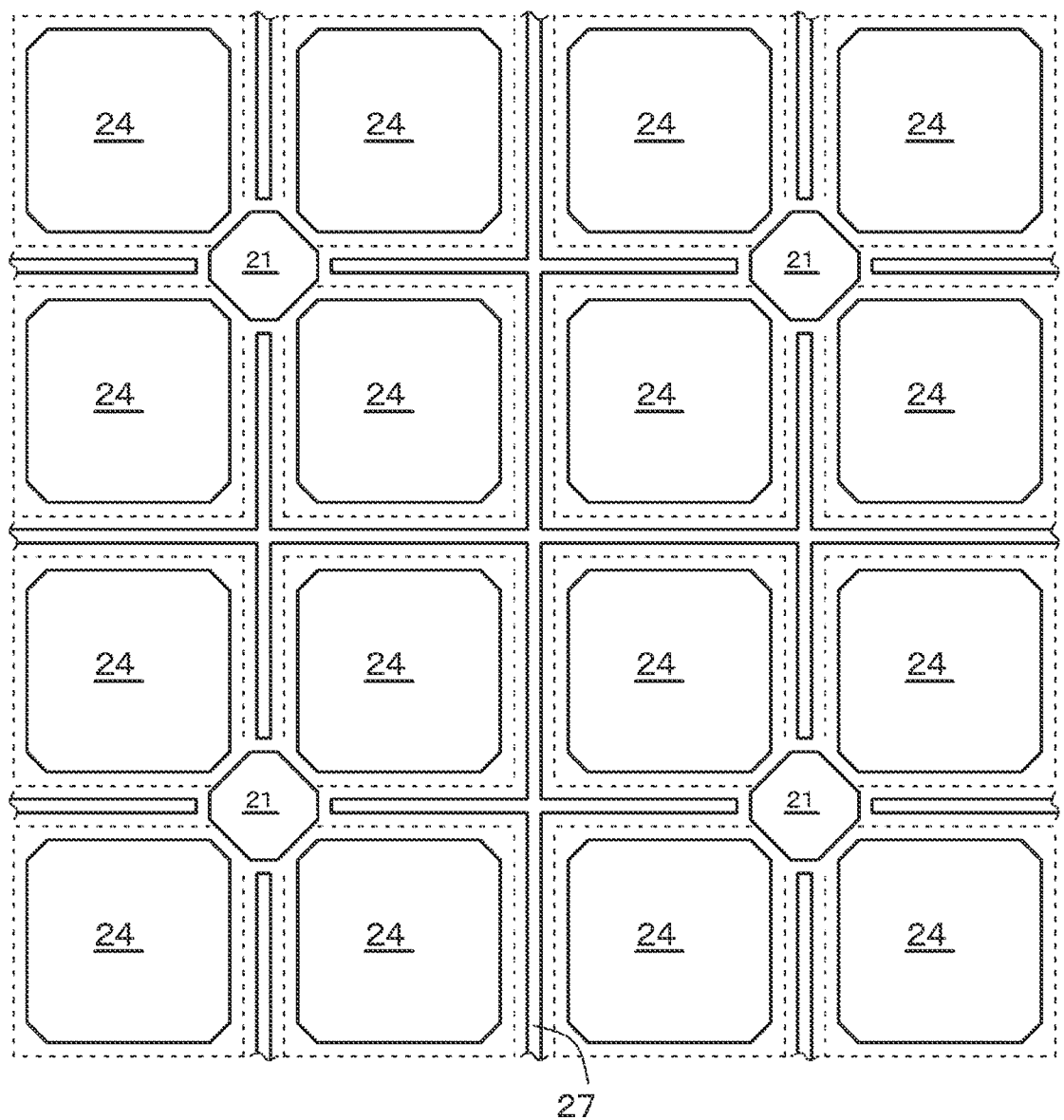
FIG. 41 is a schematic arrangement diagram of a modification example of the first electrodes, the charge accumulation electrodes and the like that are included in the image pickup elements of Embodiment 7.
Figure 42A:
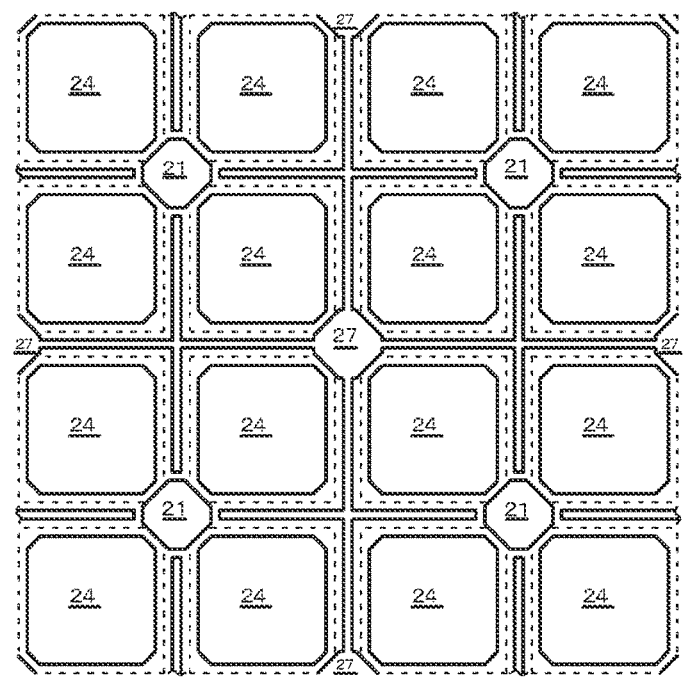
FIGS. 42A and 42B are schematic arrangement diagrams of modification examples of the first electrodes, the charge accumulation electrodes and the like that are included in the image pickup elements of Embodiment 7.
Figure 42B:
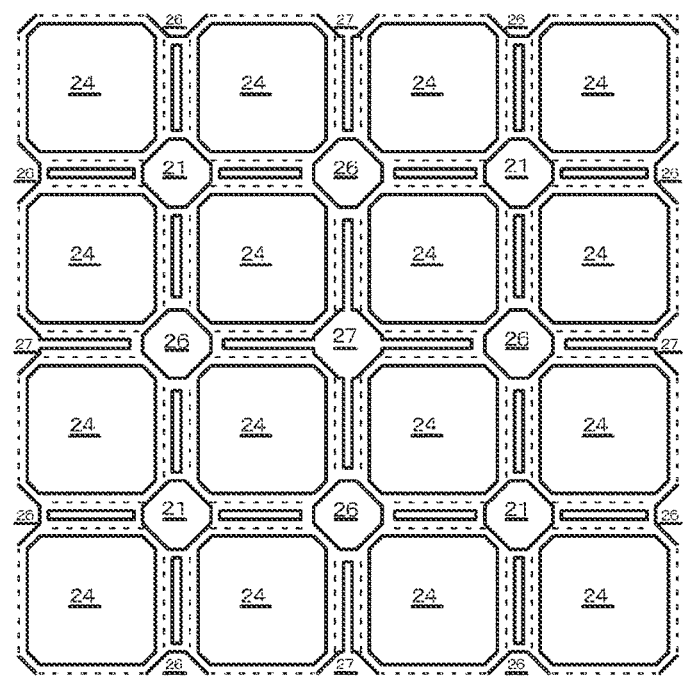

In the examples illustrated in FIGS. 39 and 40, a lower-section charge transfer control electrodes 27 is formed under the section 82A that is in the insulation layer 82 and is in the region (region—a) sandwiched between a charge accumulation electrode 24 and a charge accumulation electrode 24. On the other hand, in the examples illustrated in FIGS. 41, 42A, and 42B, a lower-section charge transfer control electrode 27 is formed under a section that is in the insulation layer 82 and is in a region surrounded by four charge accumulation electrodes 24. Note that the examples illustrated in FIGS. 41, 42A, and 42B are also the solid-state image pickup apparatus with the first configuration and the second configuration. Then, one common first electrode 21 is provided corresponding to the four charge accumulation electrodes 24 in the four image pickup elements.

In the example illustrated in FIG. 42B, the one common first electrode 21 is provided corresponding to the four charge accumulation electrodes 24 in the four image pickup elements, the lower-section charge transfer control electrode 27 is formed under the section that is in the insulation layer 82 and is in the region surrounded by the four charge accumulation electrodes 24, and further the charge discharge electrode 26 is formed under the section that is in the insulation layer 82 and is in the region surrounded by the four charge accumulation electrodes 24. As mentioned before, the charge discharge electrode 26 can be used as a floating diffusion electrode or an overflow drain electrode of the photoelectric conversion unit 23, for example.

Embodiment 8

Figure 43:
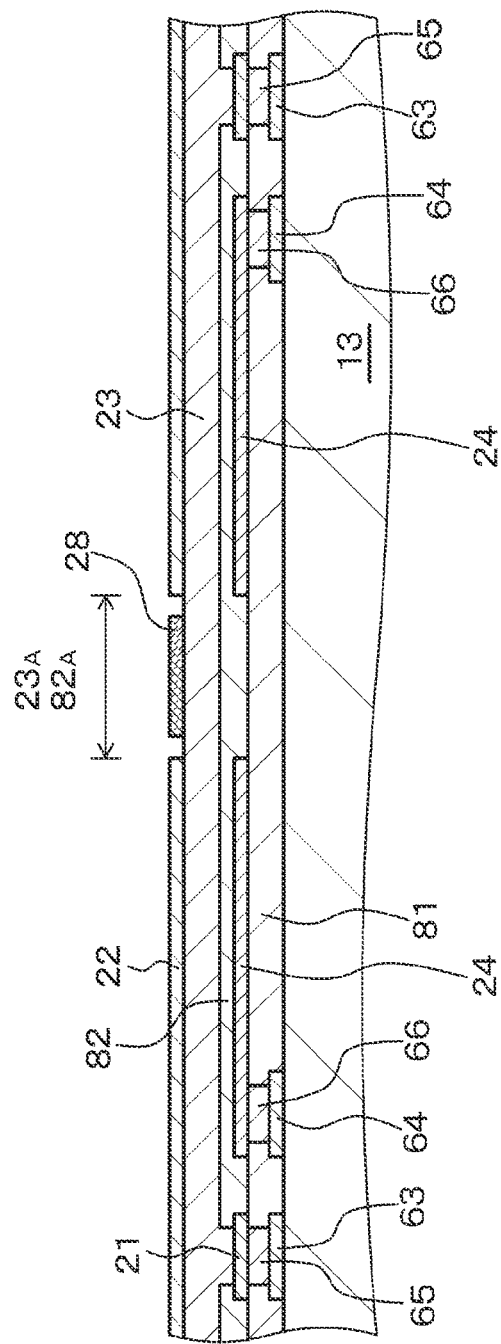
FIG. 43 is a schematic cross-sectional view of a section of the image pickup elements (two image pickup elements that are arranged side by side) of Embodiment 8.
Figure 44:
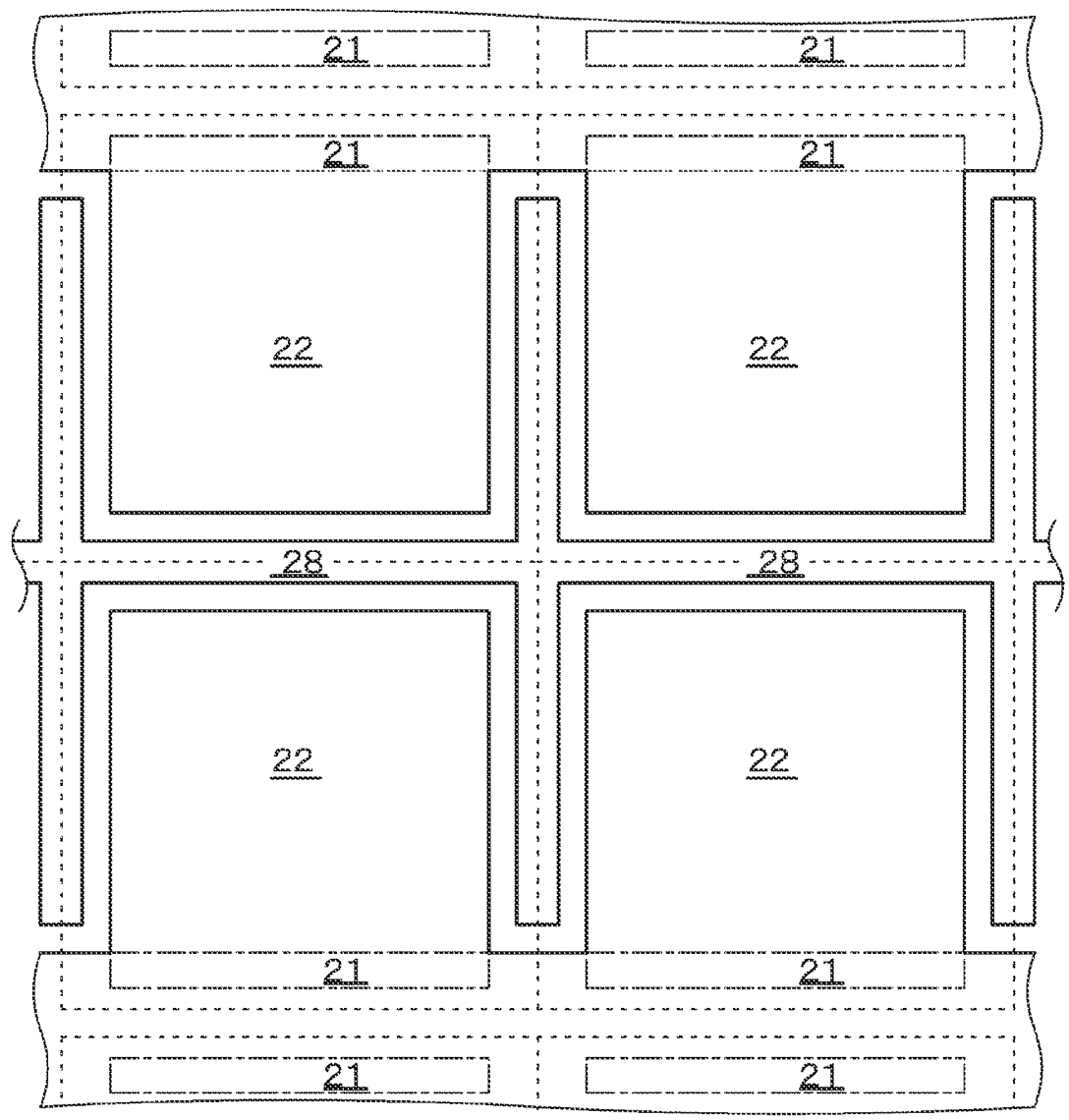
FIG. 44 is a schematic plan view of a section of the image pickup elements (2×2 image pickup elements that are arranged side by side) of Embodiment 8.
Figure 45:
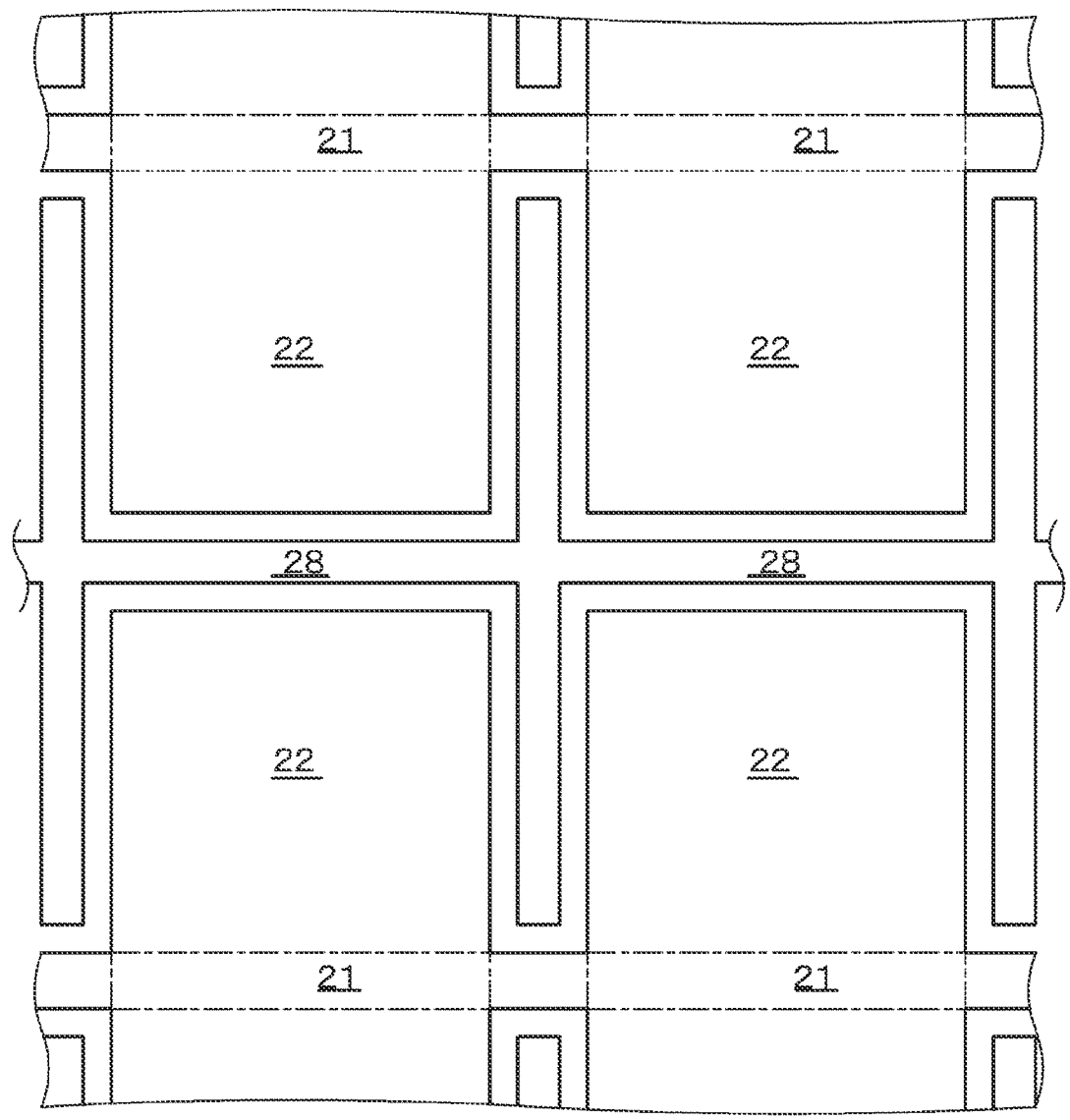
FIG. 45 is a schematic plan view of a section of a modification example of the image pickup elements (2×2 image pickup elements that are arranged side by side) of Embodiment 8.

Embodiment 8 relates to the image pickup element and the like including the upper-section charge transfer control electrode (upper charge transfer control electrode) of the present disclosure. FIG. 43 illustrates a schematic cross-sectional view of a section of the image pickup elements (two image pickup elements that are arranged side by side) of Embodiment 8, and FIG. 44 and FIG. 45 illustrate schematic plan views of sections of the image pickup elements (2×2 image pickup elements that are arranged side by side) of Embodiment 8. In the image pickup elements of Embodiment 8, instead of the formation of the second electrode 22, an upper-section charge transfer control electrode 28 is formed on the region 23A that is in the photoelectric conversion unit 23 and is positioned between adjacent image pickup elements. The upper-section charge transfer control electrode 28 is provided apart from the second electrodes 22. In other words, a second electrode 22 is provided for each image pickup element, and the upper-section charge transfer control electrode 28 is provided on the region −A in the photoelectric conversion unit 23 such that the upper-section charge transfer control electrode 28 surrounds at least some of the second electrodes 22 and is apart from the second electrodes 22. The upper-section charge transfer control electrode 28 is formed at the same level as the second electrode 22.

Note that, in the example illustrated in FIG. 44, in one image pickup element, one charge accumulation electrode 24 is provided corresponding to one first electrode 21. On the other hand, in the modification example illustrated in FIG. 45, in two image pickup elements, one common first electrode 21 is provided corresponding to two charge accumulation electrodes 24. A schematic cross-sectional view of a section of the image pickup elements (two image pickup elements that are arranged side by side) of Embodiment 8 illustrated in FIG. 43 corresponds to FIG. 45.

In addition, as illustrated in FIG. 46A which illustrates a schematic cross-sectional view of a section of the image pickup elements (two image pickup elements that are arranged side by side) of Embodiment 8, the second electrode 22 is divided into a plurality of pieces, and different potentials may be applied individually to the divided second electrodes 22. Further, as illustrated in FIG. 46B, the upper-section charge transfer control electrode 28 may be provided between a divided second electrode 22 and second electrode 22.

In Embodiment 8, a second electrode 22 positioned on the light-incidence side is made common to image pickup elements that are arrayed in the leftward/rightward direction on the paper surface of FIG. 44 and is made common to a pair of image pickup elements that are arrayed in the upward/downward direction on the paper surface of FIG. 44. In addition, an upper-section charge transfer control electrode 28 is also made common to image pickup elements that are arrayed in the leftward/rightward direction on the paper surface of FIG. 44 and is made common to a pair of image pickup elements that are arrayed in the upward/downward direction on the paper surface of FIG. 44. The second electrodes 22 and the upper-section charge transfer control electrodes 28 can be obtained by performing film formation for a material layer to be included in the second electrodes 22 and the upper-section charge transfer control electrodes 28 on the photoelectric conversion unit 23, and then performing patterning of the material layer. Each of the second electrodes 22 and the upper-section charge transfer control electrodes 28 is connected with a wire (not illustrated) separately, and these wires are connected with the drive circuit. The wire connected with the second electrode 22 is made common to a plurality of image pickup elements. The wire connected with the upper-section charge transfer control electrode 28 is also made common to a plurality of image pickup elements.

In the image pickup elements of Embodiment 8, in a charge accumulation period, from the drive circuit, the potential $V_{21}$ is applied to the second electrode 22, the potential $V_{41}$ is applied to the upper-section charge transfer control electrode 28, and an electric charge is accumulated in the photoelectric conversion unit 23, and in a charge transfer period, from the drive circuit, the potential $V_{22}$ is applied to the second electrode 22, the potential $V_{42}$ is applied to the upper-section charge transfer control electrode 28, and an electric charge that is accumulated in the photoelectric conversion unit 23 is read out to the control unit through the first electrode 21. Here, because the potential of the first electrode 21 is made higher than the potential of the second electrode 22, $V_{21} \geq V_{41}$ and $V_{22} \geq V_{42}$.

As has been described thus far, in the image pickup elements of Embodiment 8, instead of the formation of the second electrode, the charge transfer control electrode is formed in the region that is in the photoelectric conversion layer and is positioned between adjacent image pickup elements. Therefore, the charge transfer control electrode can reduce the flow of an electric charge generated by photoelectric conversion into the adjacent image pickup elements, and so quality deterioration of a captured video (image) does not occur.

Figure 48A:
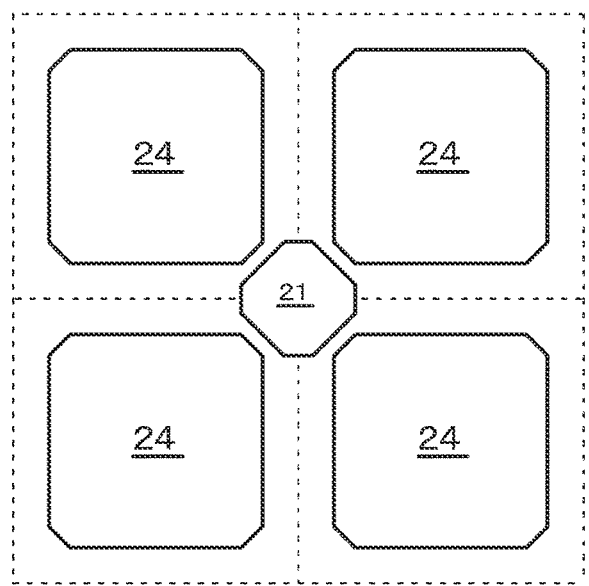
FIGS. 48A and 48B are schematic plan views of sections of modification examples of the image pickup elements of Embodiment 8.
Figure 48B:
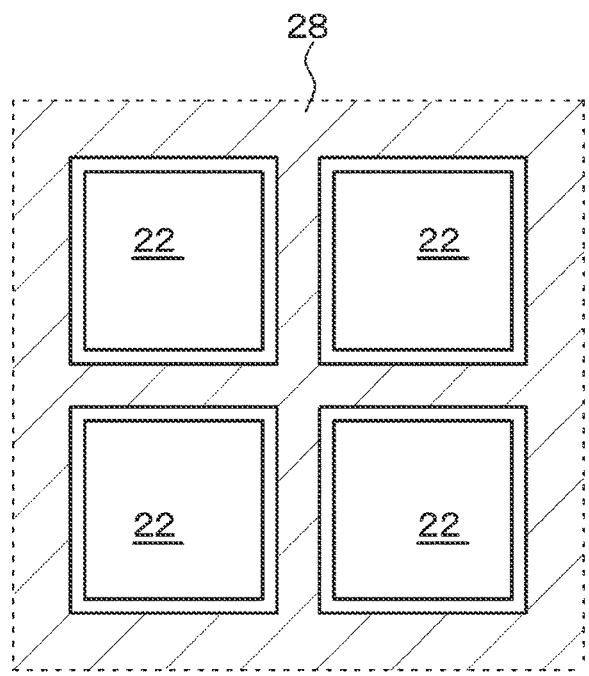

FIG. 47A illustrates a schematic cross-sectional view of a section of a modification example of the image pickup elements (two image pickup elements arranged side by side) of Embodiment 8, and FIGS. 48A and 48B illustrate schematic plan views of sections thereof. In this modification example, a second electrode 22 is provided for each image pickup element, the upper-section charge transfer control electrode 28 is provided such that the upper-section charge transfer control electrode 28 surrounds at least some of the second electrodes 22 and is apart from the second electrodes 22, and there are some of the charge accumulation electrodes 24 below the upper-section charge transfer control electrode 28. The second electrode 22 is provided above the charge accumulation electrode 24 and has a size smaller than that of the charge accumulation electrode 24.

Figure 49A:
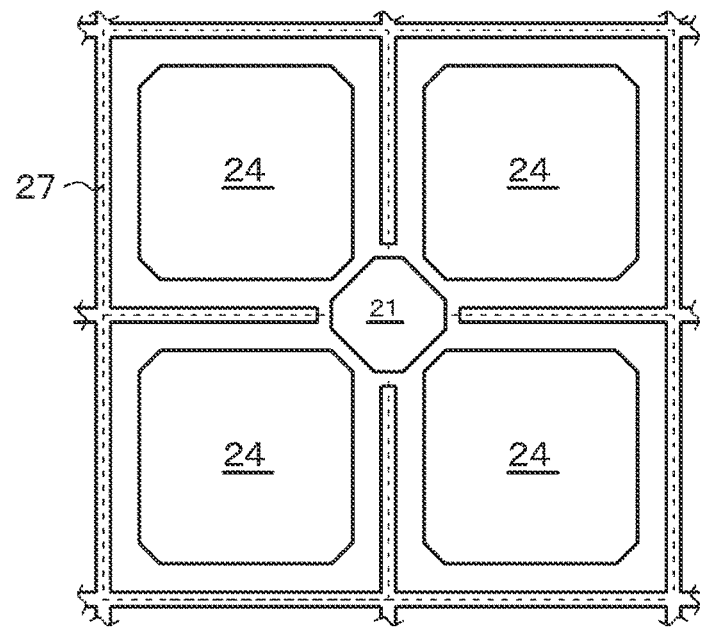
FIGS. 49A and 49B are other schematic plan views of sections of modification examples of the image pickup elements of Embodiment 8.
Figure 49B:
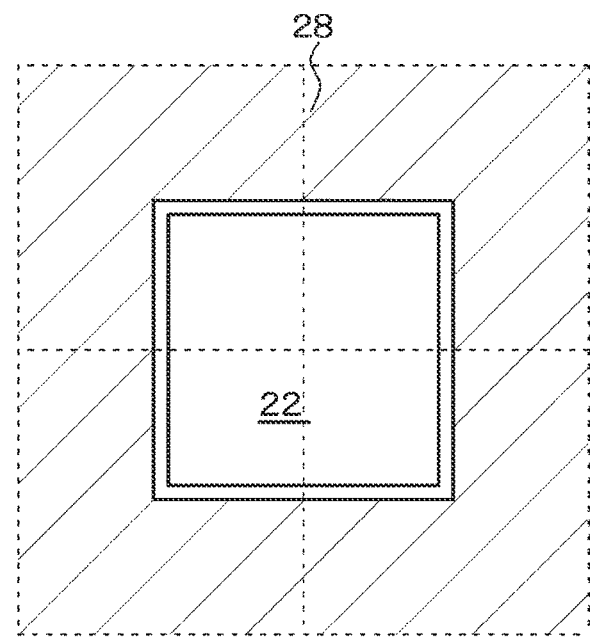

FIG. 47B illustrates a schematic cross-sectional view of a section of a modification example of the image pickup elements (two image pickup elements arranged side by side) of Embodiment 8, and FIGS. 49A and 49B illustrate schematic plan views of sections thereof. In this modification example, a second electrode 22 is provided for each image pickup element, the upper-section charge transfer control electrode 28 is provided such that the upper-section charge transfer control electrode 28 surrounds at least some of the second electrodes 22 and is apart from the second electrodes 22, there are some of the charge accumulation electrodes 24 below the upper-section charge transfer control electrode 28, and further the lower-section charge transfer control electrode (lower charge transfer control electrode) 27 is provided below the upper-section charge transfer control electrode (upper charge transfer control electrode) 28. The size of the second electrodes 22 is smaller than that in the modification example illustrated in FIG. 47A. That is, a region that is in a second electrode 22 and faces the upper-section charge transfer control electrode 28 is positioned closer to the first electrode 21 than a region that is in the second electrode 22 and faces the upper-section charge transfer control electrode 28 in the modification example illustrated in FIG. 47A. The charge accumulation electrodes 24 are surrounded by the lower-section charge transfer control electrode 27.

Embodiment 9

Embodiment 9 relates to the solid-state image pickup apparatus with the first configuration and the second configuration.

The solid-state image pickup apparatus of Embodiment 9 includes the photoelectric conversion unit including the stacked first electrode 21, inorganic oxide semiconductor material layer 23B, photoelectric conversion layer 23A, and second electrode 22,
the photoelectric conversion unit further has a plurality of image pickup elements each including the charge accumulation electrode 24 that is arranged apart from the first electrode 21 and that is arranged to face the inorganic oxide semiconductor material layer 23B via the insulation layer 82,
an image pickup element block includes the plurality of image pickup elements, and
the first electrode 21 is shared by the plurality of image pickup elements included in the image pickup element block.

Alternatively, the solid-state image pickup apparatus of Embodiment 9 includes a plurality of the image pickup elements explained in Embodiment 1 to Embodiment 8.

In Embodiment 9, one floating diffusion layer is provided for a plurality of image pickup elements. Then, by appropriately controlling the timing of charge transfer periods, it becomes possible for the plurality of image pickup elements to share the one floating diffusion layer. Then, in this case, the plurality of image pickup elements can share one contact hole section.

Note that, except for the point that the first electrode 21 is shared by the plurality of image pickup elements included in the image pickup element block, the solid-state image pickup apparatus of Embodiment 9 has a configuration and structure substantially similar to those of the solid-state image pickup apparatuses explained Embodiment 1 to Embodiment 8.

Figure 50:
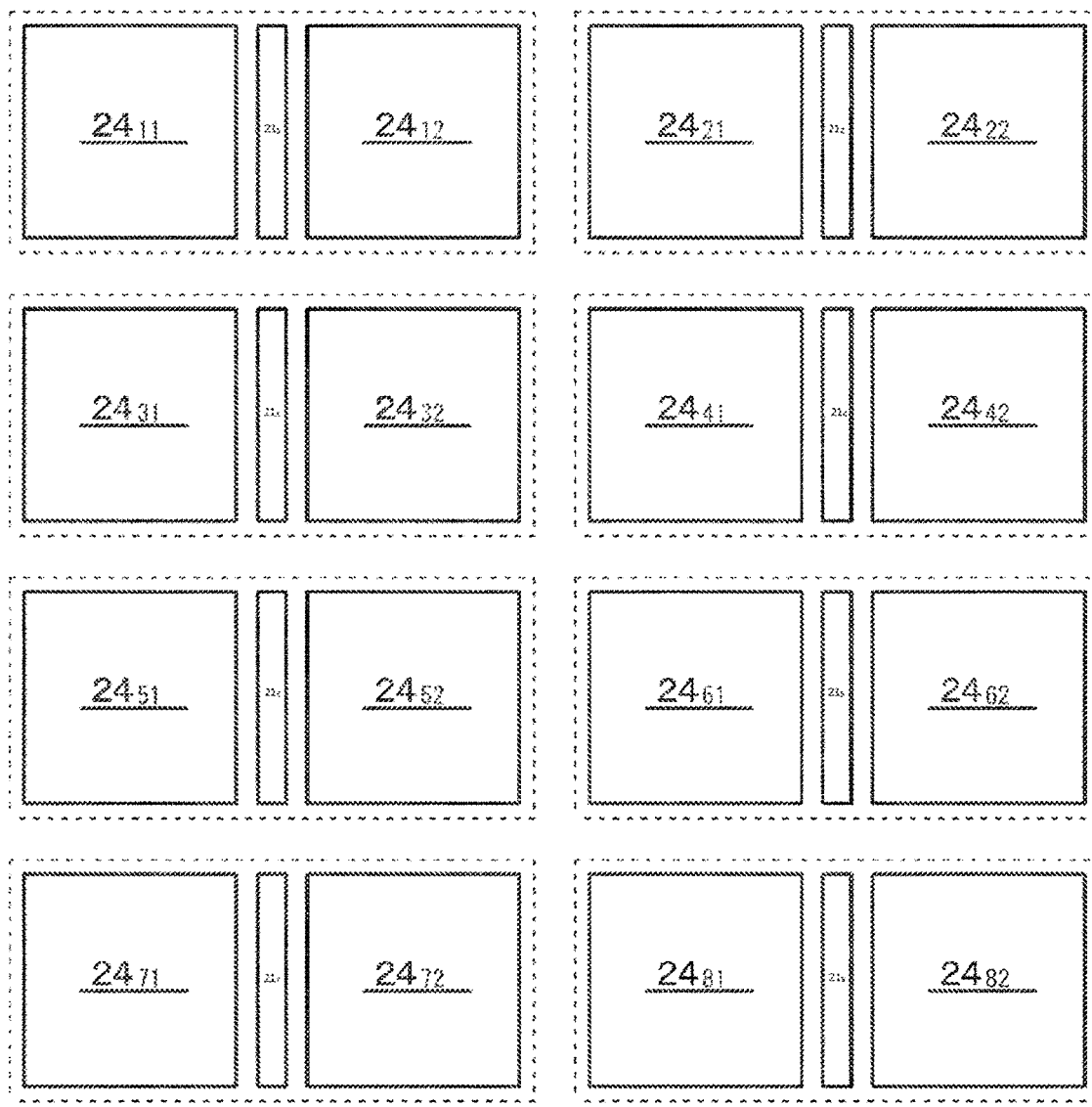
FIG. 50 is a schematic plan view of the first electrodes and the charge accumulation electrode segments in a solid-state image pickup apparatus of Embodiment 9.
Figure 51:
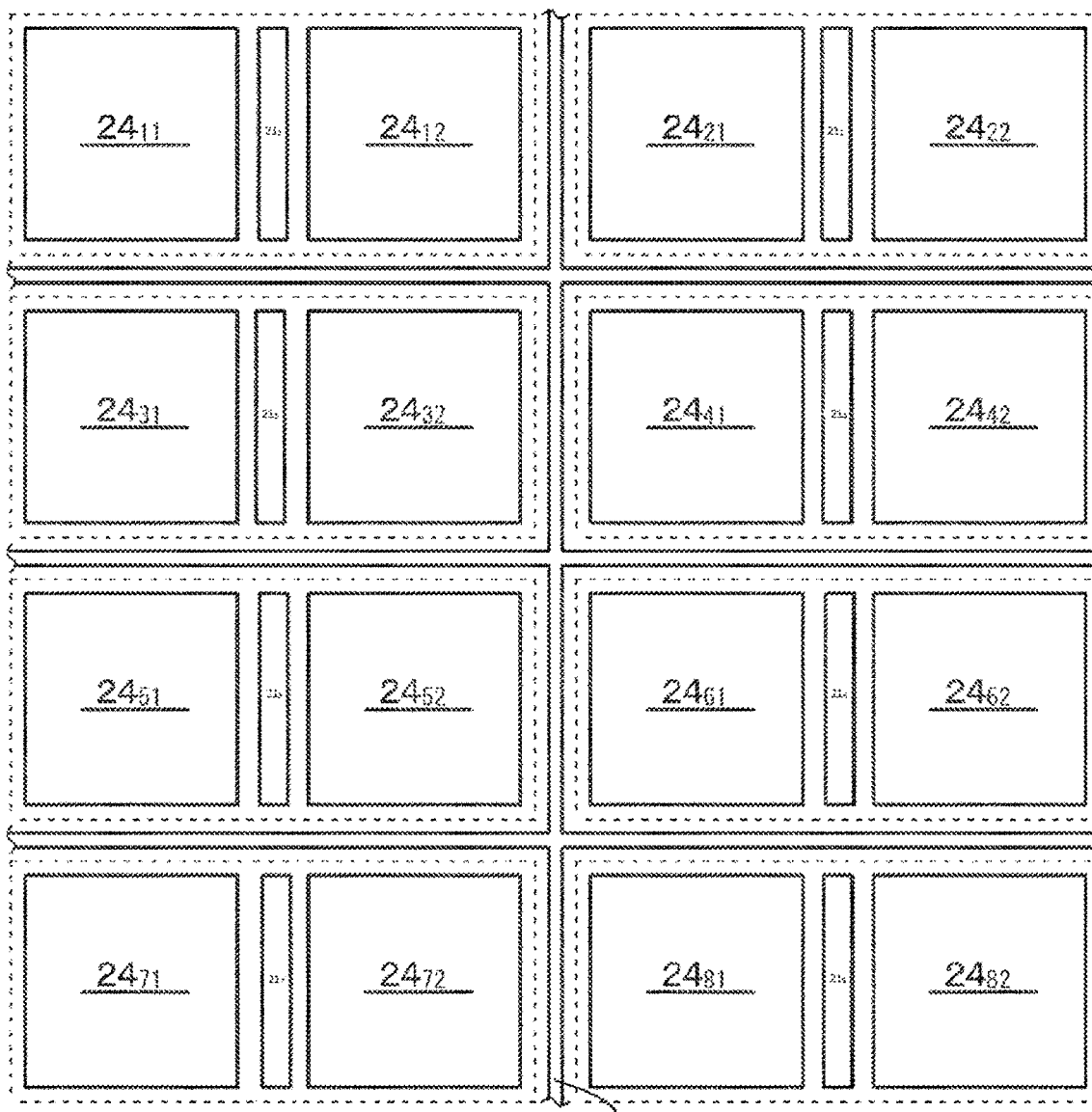
FIG. 51 is a schematic plan view of the first electrodes and the charge accumulation electrode segments in a first modification example of the solid-state image pickup apparatus of Embodiment 9.
Figure 52:
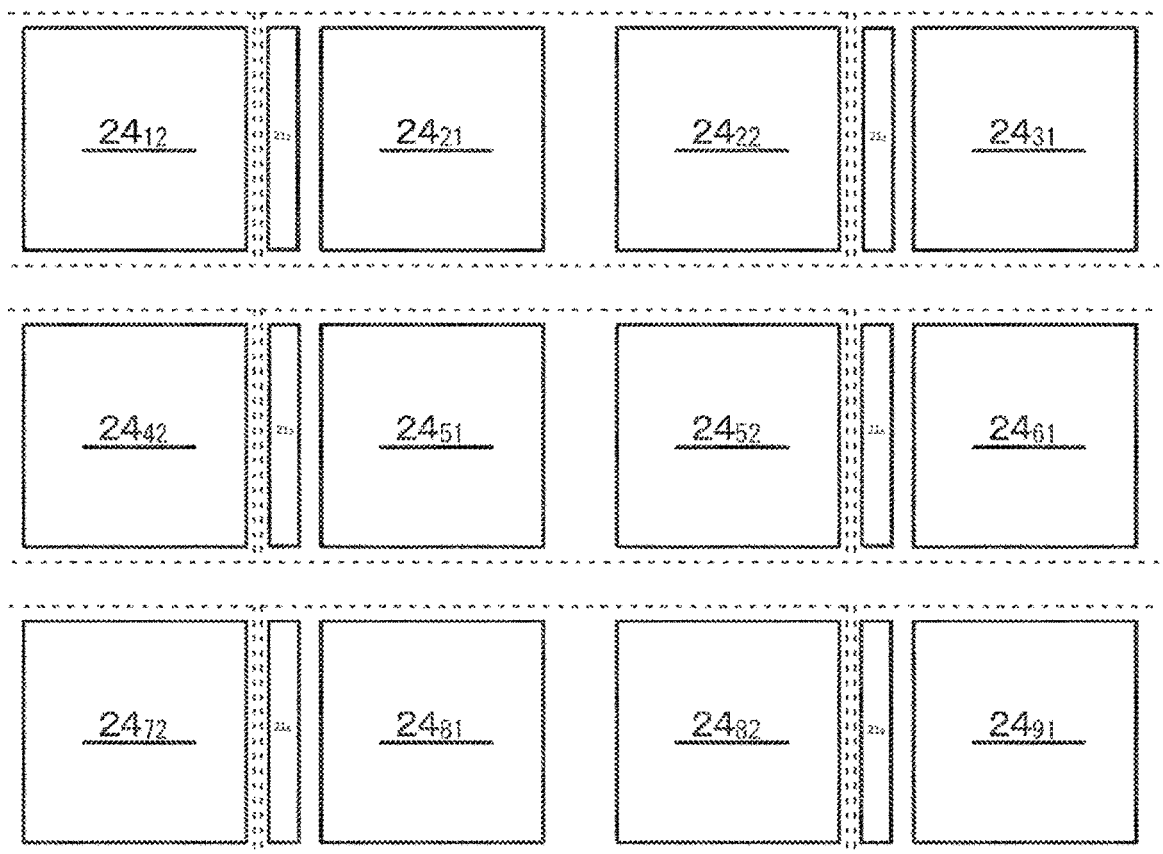
FIG. 52 is a schematic plan view of the first electrodes and the charge accumulation electrode segments in a second modification example of the solid-state image pickup apparatus of Embodiment 9.
Figure 53:
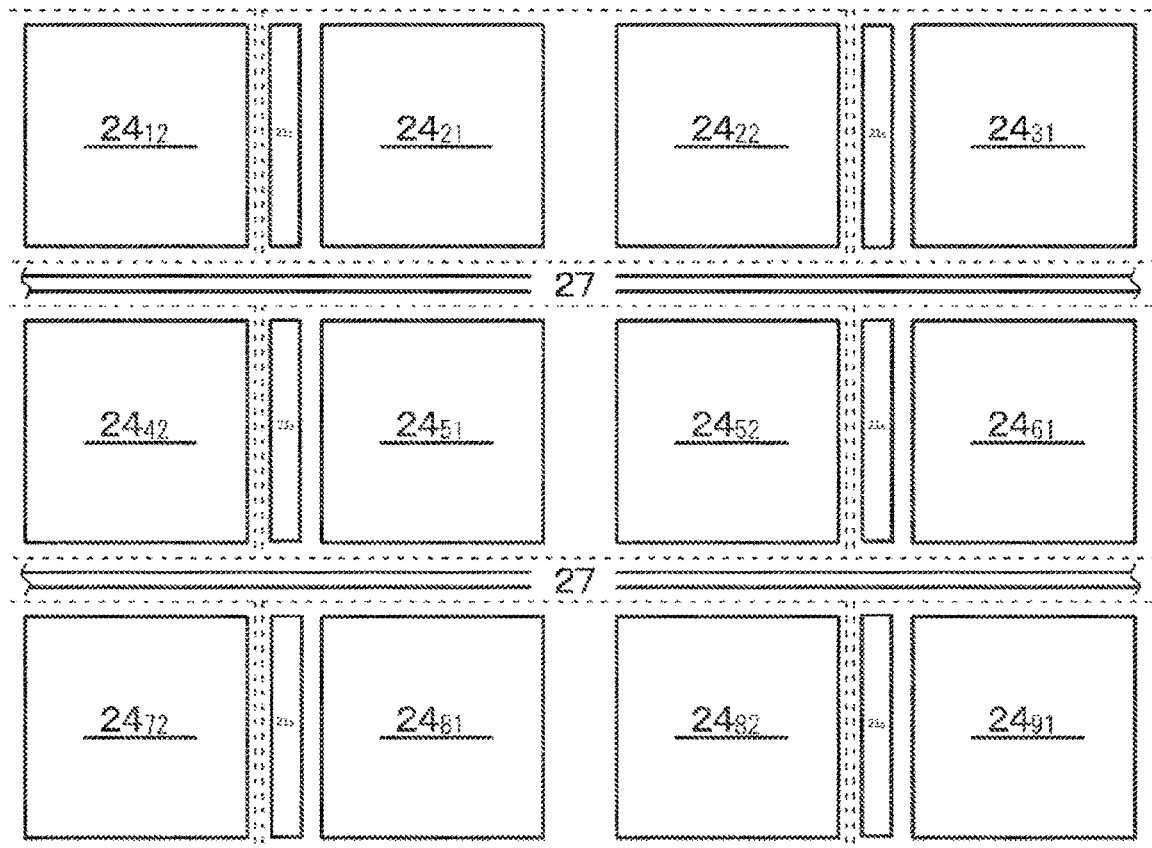
FIG. 53 is a schematic plan view of the first electrodes and the charge accumulation electrode segments in a third modification example of the solid-state image pickup apparatus of Embodiment 9.
Figure 54:
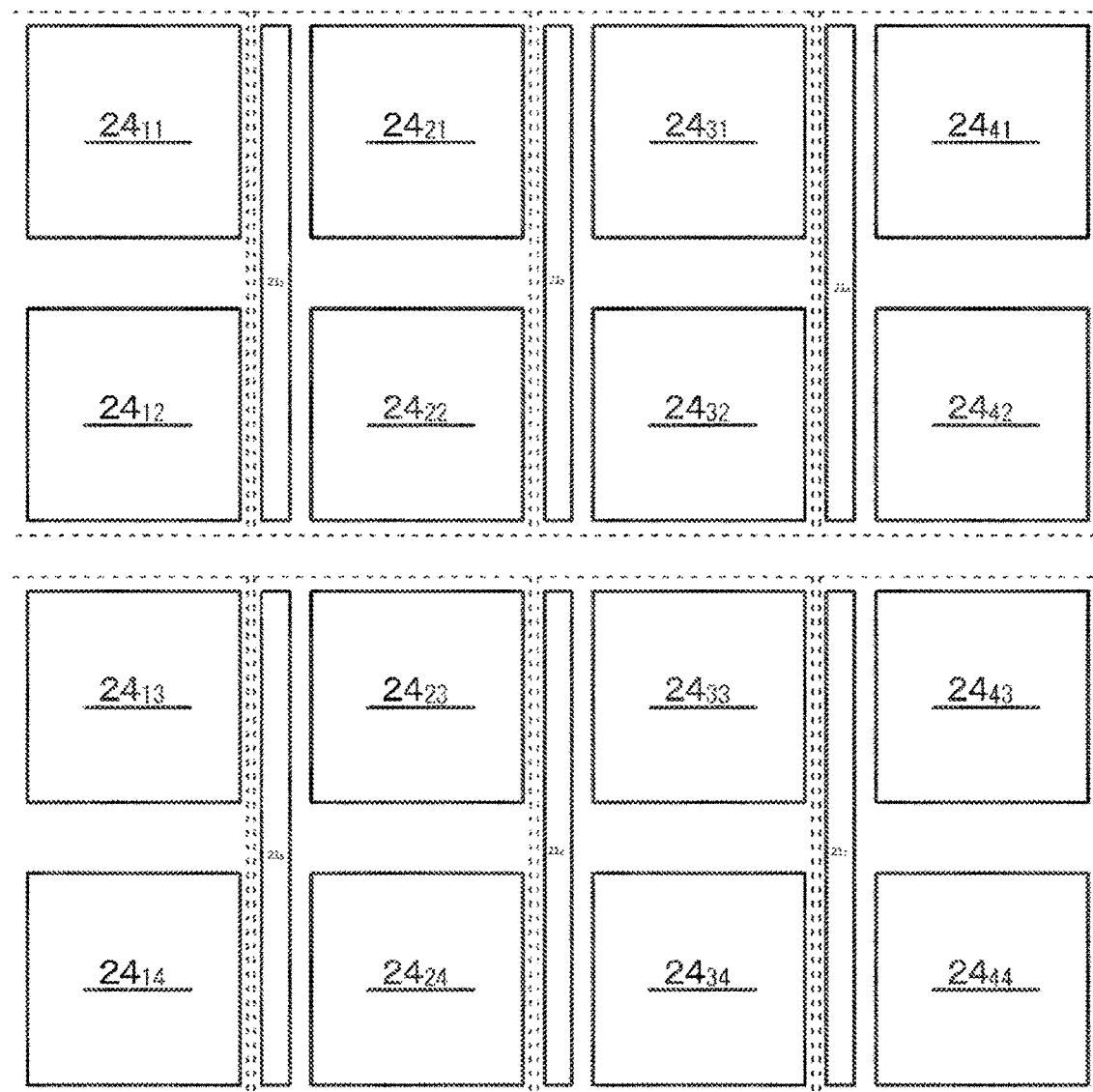
FIG. 54 is a schematic plan view of the first electrodes and the charge accumulation electrode segments in a fourth modification example of the solid-state image pickup apparatus of Embodiment 9.
Figure 55:
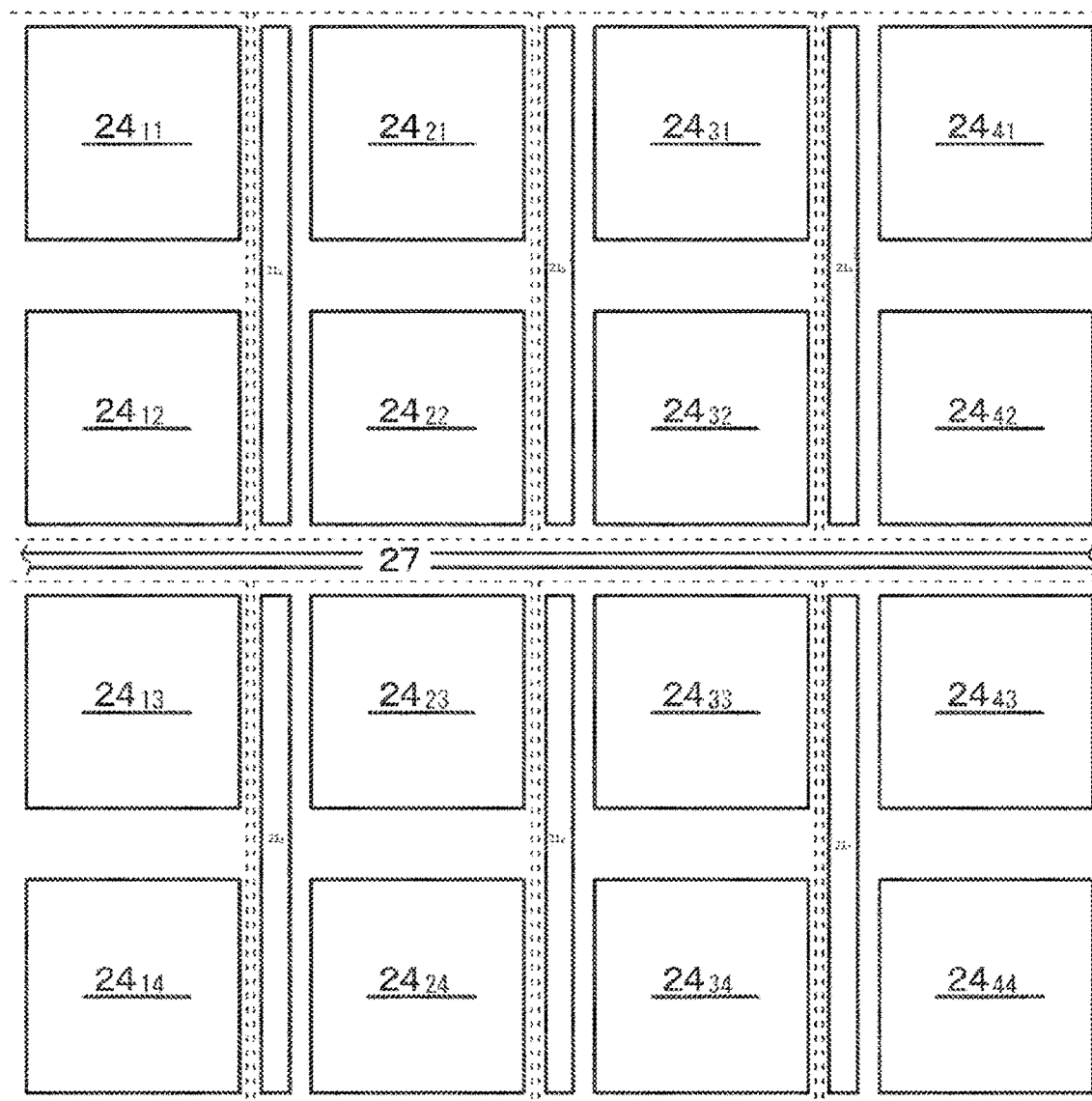
FIG. 55 is a schematic plan view of the first electrodes and the charge accumulation electrode segments in a fifth modification example of the solid-state image pickup apparatus of Embodiment 9.

Arrangement states of the first electrodes 21 and the charge accumulation electrodes 24 in the solid-state image pickup apparatus of Embodiment 9 are illustrated schematically in FIG. 50 (Embodiment 9), FIG. 51 (a first modification example of Embodiment 9), FIG. 52 (a second modification example of Embodiment 9), FIG. 53 (a third modification example of Embodiment 9), and FIG. 54 (a fourth modification example of Embodiment 9). FIG. 50, FIG. 51, FIG. 54, and FIG. 55 illustrate sixteen image pickup elements, and FIG. 52 and FIG. 53 illustrate twelve image pickup elements. Then, an image pickup element block includes two image pickup elements. Each image pickup element block is indicated by a dotted line surrounding it. Suffixes given to the first electrodes 21 and the charge accumulation electrodes 24 are for distinguishing between the first electrodes 21, and between the charge accumulation electrodes 24. The same also applies to the following explanation. In addition, one on-chip micro lens (not illustrated in FIG. 50 to FIG. 57) is arranged in place above one image pickup element. Then, in one image pickup element block, two charge accumulation electrodes 24 are arranged to sandwich a first electrode 21 (see FIG. 50 and FIG. 51). Alternatively, one first electrode 21 is arranged to face two charge accumulation electrodes 24 that are arranged side by side (see FIG. 54 and FIG. 55). That is, a first electrode is arranged adjacent to a charge accumulation electrode of each image pickup element. Alternatively, the first electrode is arranged adjacent to charge accumulation electrodes of some of the plurality of image pickup elements and is arranged not adjacent to charge accumulation electrodes of the rest of the plurality of image pickup elements (see FIG. 52 and FIG. 53). In this case, transfer of electric charges from the rest of the plurality of image pickup elements to the first electrode is transfer via the some of the plurality of image pickup elements. For the purpose of ensuring transfer of an electric charge from each image pickup element to the first electrode, the distance A between a charge accumulation electrode included in an image pickup element and a charge accumulation electrode included in an image pickup element is preferably longer than the distance B between a first electrode and a charge accumulation electrode in an image pickup element adjacent to the first electrode. In addition, an image pickup element that is positioned farther apart from the first electrode preferably has a larger value of the distance A. In addition, in the examples illustrated in FIG. 51, FIG. 53, and FIG. 55, a charge transfer control electrode 27 is arranged in place between a plurality of image pickup elements included in an image pickup element block. By disposing the charge transfer control electrode 27 in place, transfer of an electric charge between image pickup element blocks positioned to sandwich the charge transfer control electrode 27 can surely be suppressed.

In the following, operation of an image pickup element block including a first electrode $21_2$ and two charge accumulation electrodes $24_{21}$ and $24_{22}$ is explained.

In a charge accumulation period, from the drive circuit, the potential $V_{11}$ is applied to the first electrode $21_2$, and the potential $V_{31}$ is applied to the charge accumulation electrodes $24_{21}$ and $24_{22}$. With light having entered the photoelectric conversion layer 23A, photoelectric conversion occurs at the photoelectric conversion layer 23A. Holes generated by the photoelectric conversion are sent from the second electrode 22 to the drive circuit via the wire $V_{OU}$. On the other hand, because the potential $V_{11}$ of the first electrode $21_2$ is made higher than the potential $V_{21}$ of the second electrode 22, that is, for example, a positive potential is applied to the first electrode $21_2$, and a negative potential is applied to the second electrode 22, $V_{31} \geq V_{11}$, preferably $V_{31} > V_{11}$, is satisfied. Thereby, electrons generated by the photoelectric conversion are attracted to the charge accumulation electrodes $24_{21}$ and $24_{22}$ and are stopped in a region that is in the inorganic oxide semiconductor material layer 23B and the like and faces the charge accumulation electrodes $24_{21}$ and $24_{22}$. That is, an electric charge is accumulated in the inorganic oxide semiconductor material layer 23B and the like. Because $V_{31} \geq V_{11}$, electrons generated inside the photoelectric conversion layer 23A are not transferred toward the first electrode $21_2$. Along with the time lapse of the photoelectric conversion, the value of the potential of the region that is in the inorganic oxide semiconductor material layer 23B and the like and faces the charge accumulation electrodes $24_{21}$ and $24_{22}$ shifts toward the negative side.

In a latter period of the charge accumulation period, reset operation is performed. Thereby, the potential of the first floating diffusion layer is reset, and the potential of the first floating diffusion layer becomes the power supply potential $V_{DD}$.

Electric-charge read operation is performed after the completion of the reset operation. That is, in a charge transfer period, from the drive circuit, the potential $V_{21}$ is applied to the first electrode $21_2$, the potential $V_{32-A}$ is applied to the charge accumulation electrode $24_{21}$, and the potential $V_{32-B}$ is applied to the charge accumulation electrode $24_{22}$. Here, $V_{32-A} < V_{21} < V_{32-B}$ is satisfied. Thereby, the electrons that are stopped in the region that is in the inorganic oxide semiconductor material layer 23B and the like and faces the charge accumulation electrode $24_{21}$ are read out to the first electrode $21_2$, and further to the first floating diffusion layer. That is, the electric charge accumulated in the region that is in the inorganic oxide semiconductor material layer 23B and the like and faces the charge accumulation electrode $24_{21}$ is read out to the control unit. After the completion of the read operation, $V_{32-B} \leq V_{32-A} < V_{21}$ is satisfied. Note that, in the examples illustrated in FIG. 54 and FIG. 55, $V_{32-B} < V_{21} < V_{32-A}$ may be satisfied. Thereby, the electrons that are stopped in the region that is in the inorganic oxide semiconductor material layer 23B and the like and faces the charge accumulation electrode $24_{22}$ are read out to the first electrode $21_2$, and further to the first floating diffusion layer. In addition, electrons that are stopped in the region that is in the inorganic oxide semiconductor material layer 23B and the like and faces the charge accumulation electrode $24_{22}$ in the examples illustrated in FIG. 52 and FIG. 53 may be read out to the first floating diffusion layer through a first electrode $21_3$ to which the charge accumulation electrode $24_{22}$ is adjacent. In such a manner, the electric charge accumulated in the region that is in the inorganic oxide semiconductor material layer 23B and the like and faces the charge accumulation electrode $24_{22}$ is read out to the control unit. Note that, after the completion of the read operation for the electric charge accumulated in the region that is in the inorganic oxide semiconductor material layer 23B and the like and faces the charge accumulation electrode $24_{21}$ to the control unit, the potential of the first floating diffusion layer may be reset.

Figure 58A:
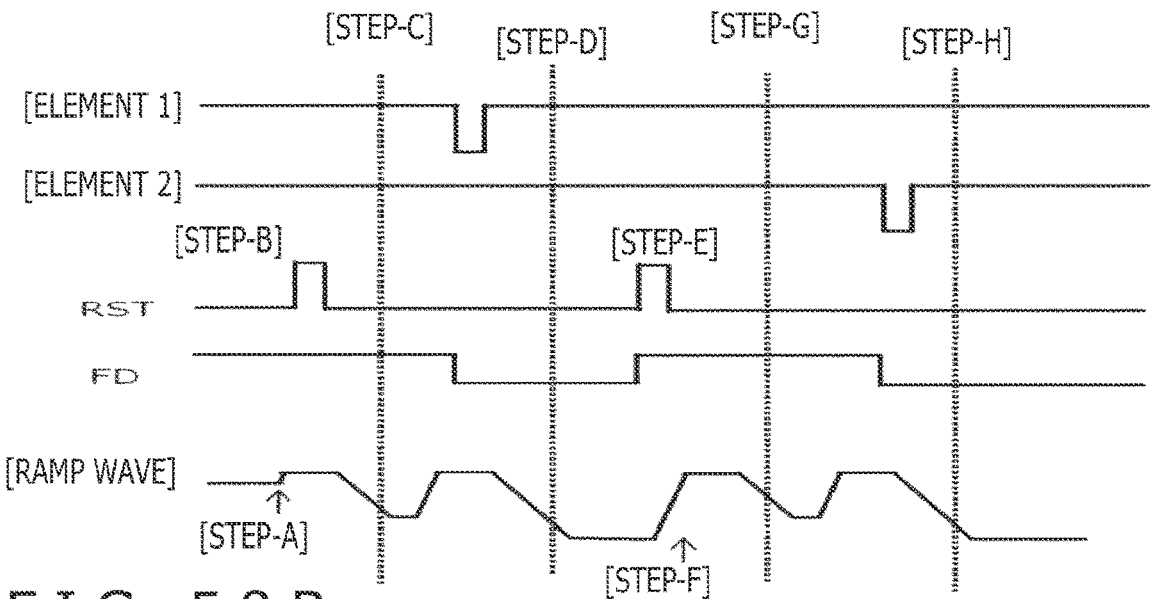
FIGS. 58A, 58B, and 58C are charts illustrating examples of read and drive operation in an image pickup element block of Embodiment 9. P

FIG. 58A illustrates an example of read and drive operation in the image pickup element block of Embodiment 9, and signals from two image pickup elements corresponding to the charge accumulation electrode $24_{21}$ and the charge accumulation electrode $24_{22}$ are read out in the order of:

[Step-A]
Auto zero signal input to a comparator
[Step-B]
Reset operation of one shared floating diffusion layer
[Step-C]
P-phase read operation in the image pickup element corresponding to the charge accumulation electrode $24_{21}$, and transfer of an electric charge to the first electrode $21_2$
[Step-D]
D-phase read operation in the image pickup element corresponding to the charge accumulation electrode $24_{21}$, and transfer of an electric charge to the first electrode $21_2$
[Step-E]
Reset operation of the one shared floating diffusion layer
[Step-F]
Auto zero signal input to the comparator
[Step-G]
P-phase read operation in the image pickup element corresponding to the charge accumulation electrode $24_{22}$, and transfer of an electric charge to the first electrode $21_2$
[Step-H]
D-phase read operation in the image pickup element corresponding to the charge accumulation electrode $24_{22}$, and transfer of an electric charge to the first electrode $21_2$ On the basis of a correlated double sampling (CDS) process, a difference between the reading in the P-phase read operation at [Step-C] and the reading in the D-phase read operation at [Step-D] is a signal from the image pickup element corresponding to the charge accumulation electrode $24_{21}$, and a difference between the reading in the P-phase read operation at [Step-G] and the reading in the D-phase read operation at [Step-H] is a signal from the image pickup element corresponding to the charge accumulation electrode $24_{22}$.

Figure 58B:
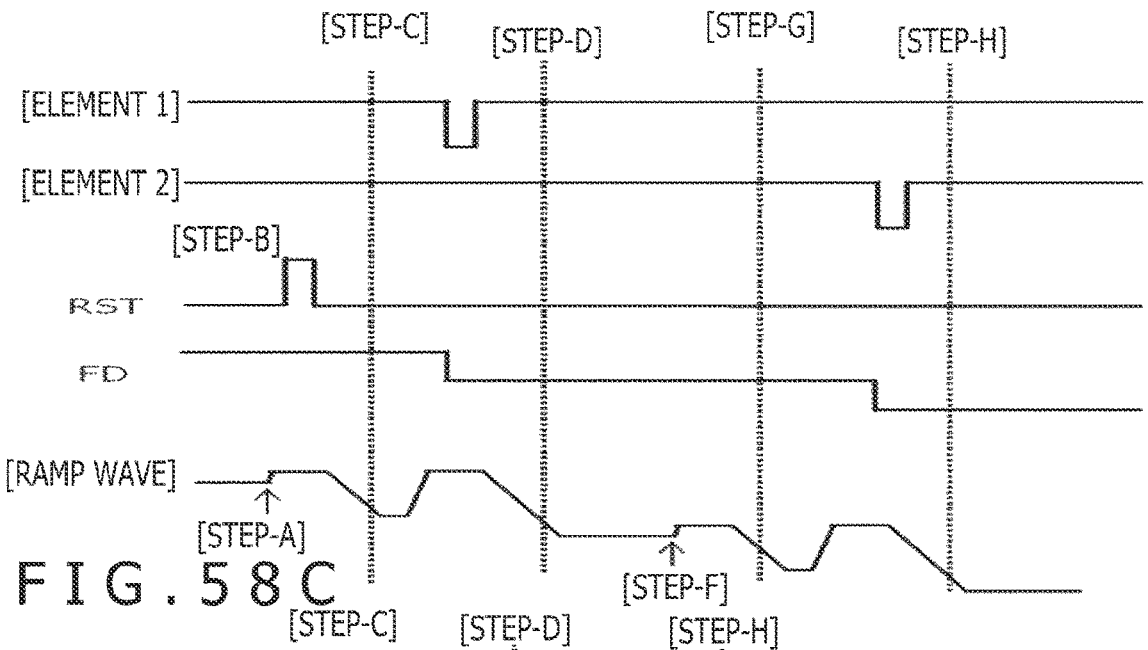
Figure 58C:
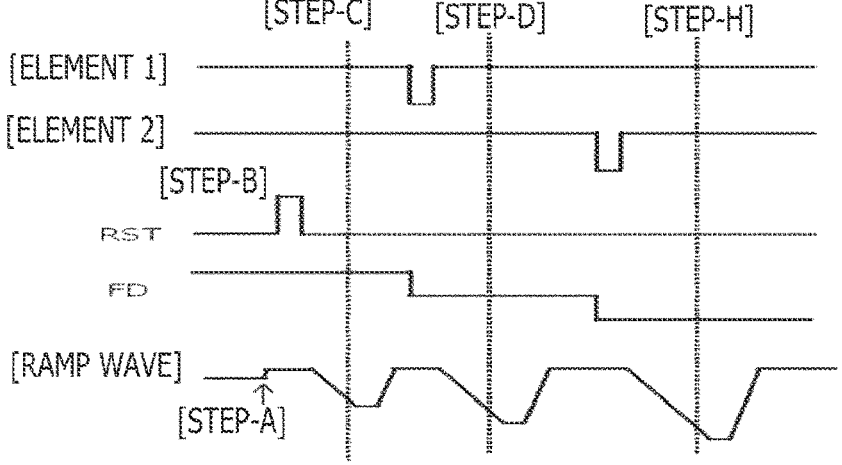
Figure 59:
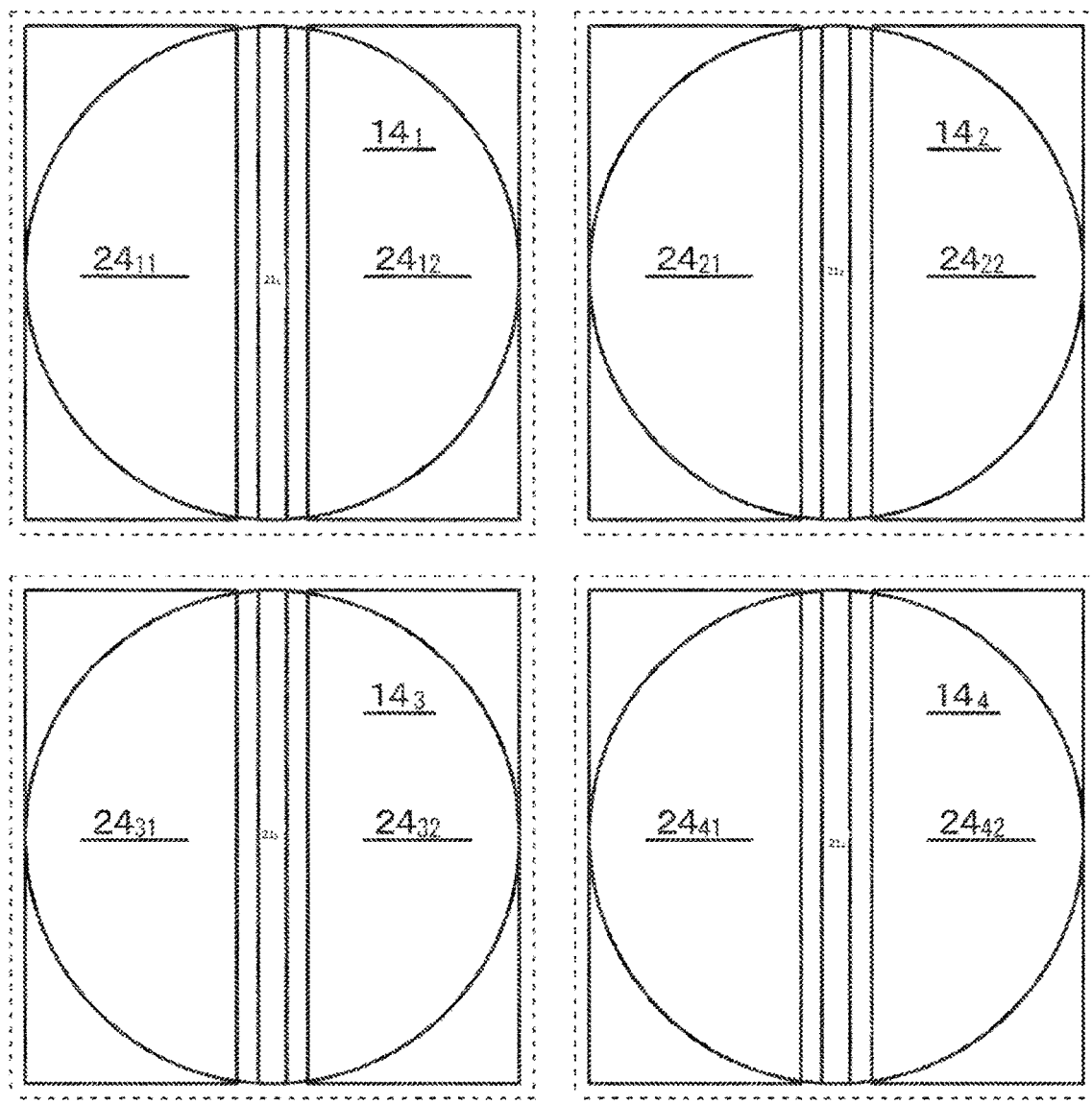
FIG. 59 is a schematic plan view of the first electrodes and the charge accumulation electrode segments in the solid-state image pickup apparatus of Embodiment 10.

Note that the operation of [Step-E] may be omitted (see FIG. 58B). In addition, the operation of [Step-F] may be omitted. In this case, further, [Step-G] can be omitted (see FIG. 58C), and a difference between the reading in the P-phase read operation at [Step-C] and the reading in the D-phase read operation at [Step-D] is a signal from the image pickup element corresponding to the charge accumulation electrode $24_{21}$, and a difference between the reading in the D-phase read operation at [Step-D] and the reading in the D-phase read operation at [Step-H] is a signal from the image pickup element corresponding to the charge accumulation electrode $24_{22}$.

Figure 56:
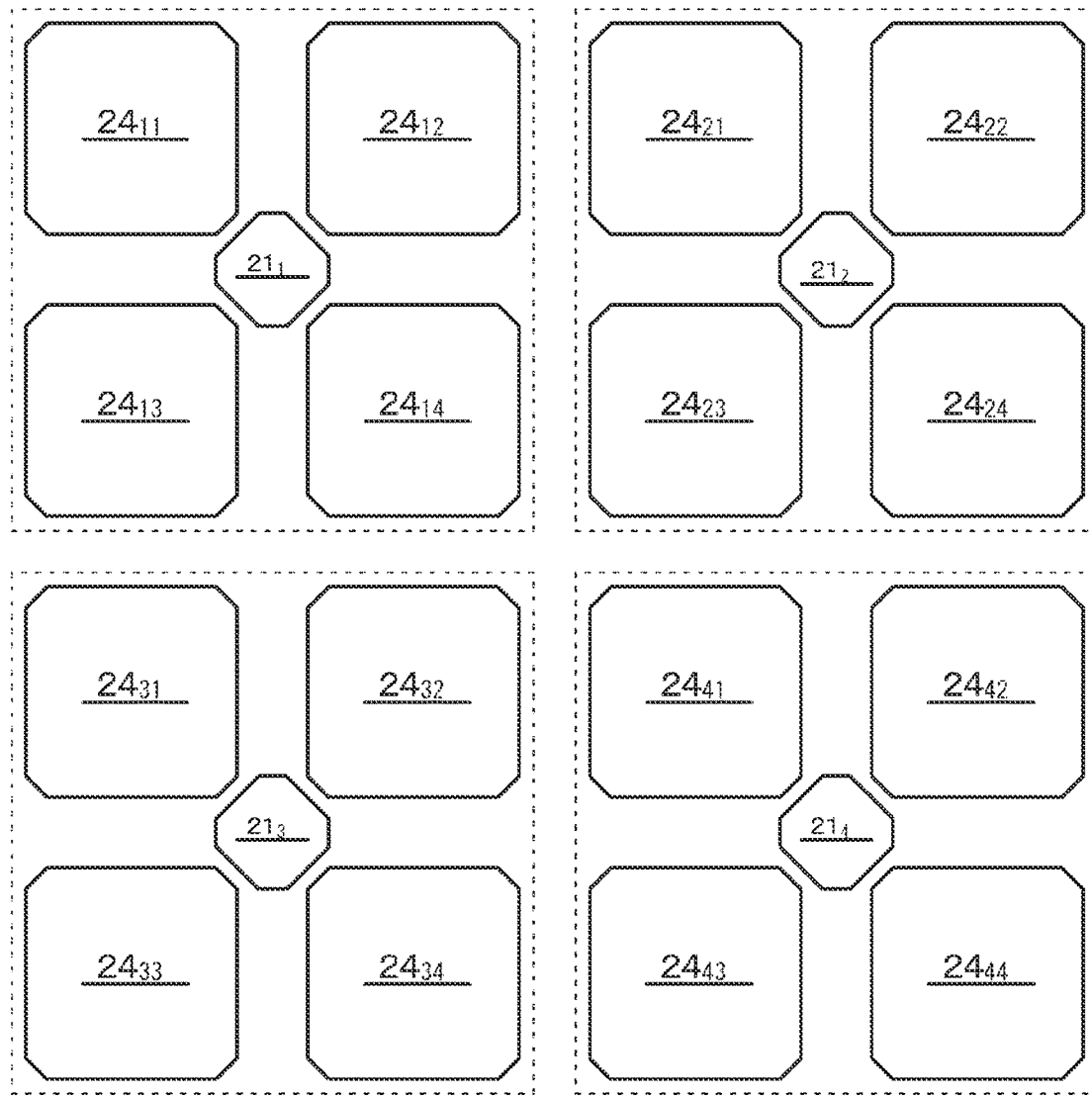
FIG. 56 is a schematic plan view of the first electrodes and the charge accumulation electrode segments in a sixth modification example of the solid-state image pickup apparatus of Embodiment 9.
Figure 57:
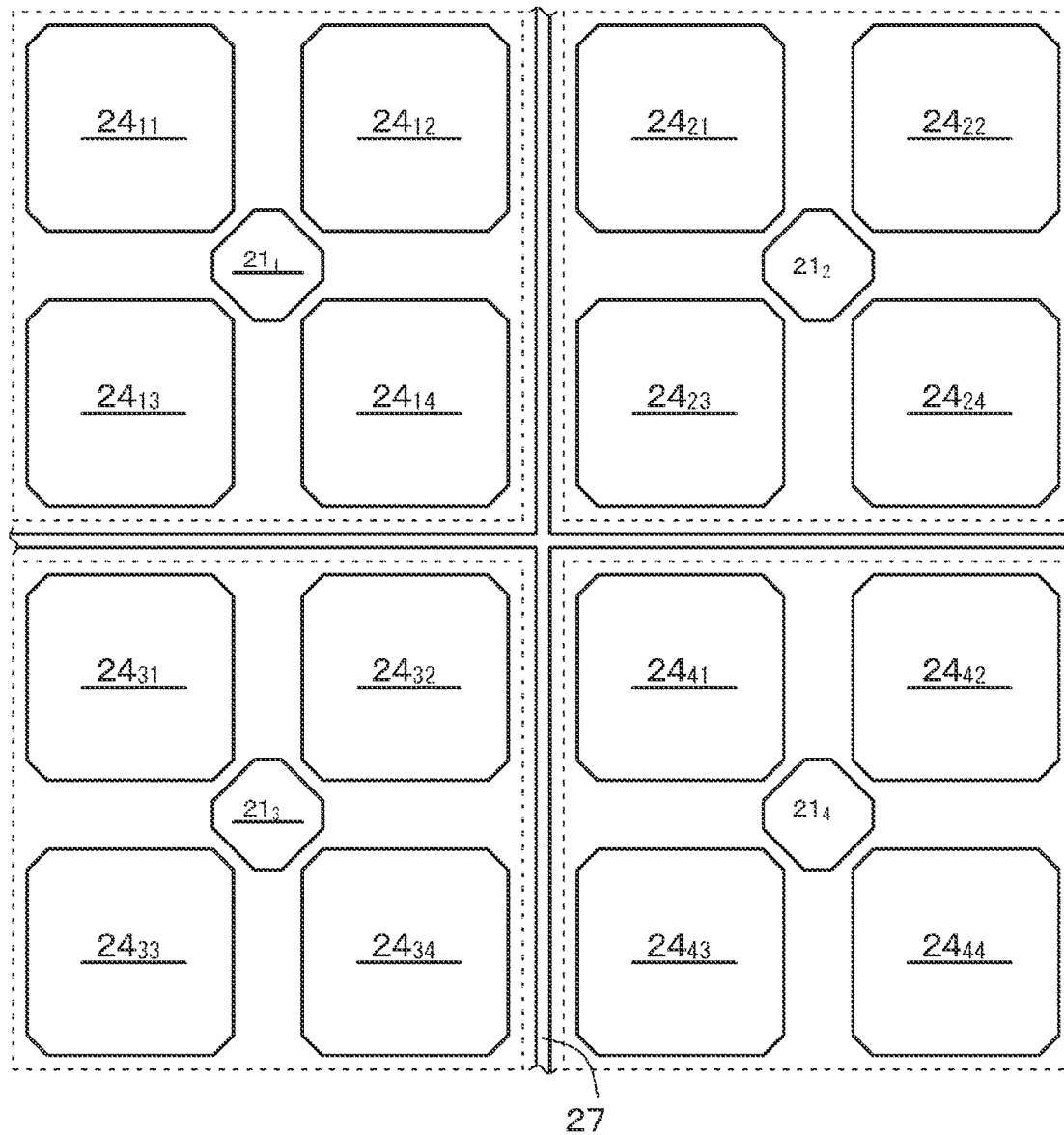
FIG. 57 is a schematic plan view of the first electrodes and the charge accumulation electrode segments in a seventh modification example of the solid-state image pickup apparatus of Embodiment 9.

In modification examples illustrated in FIG. 56 (a sixth modification example of Embodiment 9) and FIG. 57 (a seventh modification example of Embodiment 9) which schematically illustrate arrangement states of the first electrodes 21 and the charge accumulation electrodes 24, an image pickup element block includes four image pickup elements. Operation of these solid-state image pickup apparatuses can be made substantially similar to operation of the solid-state image pickup apparatuses illustrated in FIG. 50 to FIG. 55.

Because the first electrode is shared by the plurality of image pickup elements included in the image pickup element block in the solid-state image pickup apparatus of Embodiment 9, the configuration and structure of a pixel region in which a plurality of the image pickup elements is arrayed can be simplified and miniaturized. Note that the plurality of image pickup elements provided for the one floating diffusion layer may include a plurality of first-type image pickup elements or may include at least one first-type image pickup element and one or two or more second-type image pickup elements.

Embodiment 10

Figure 60:
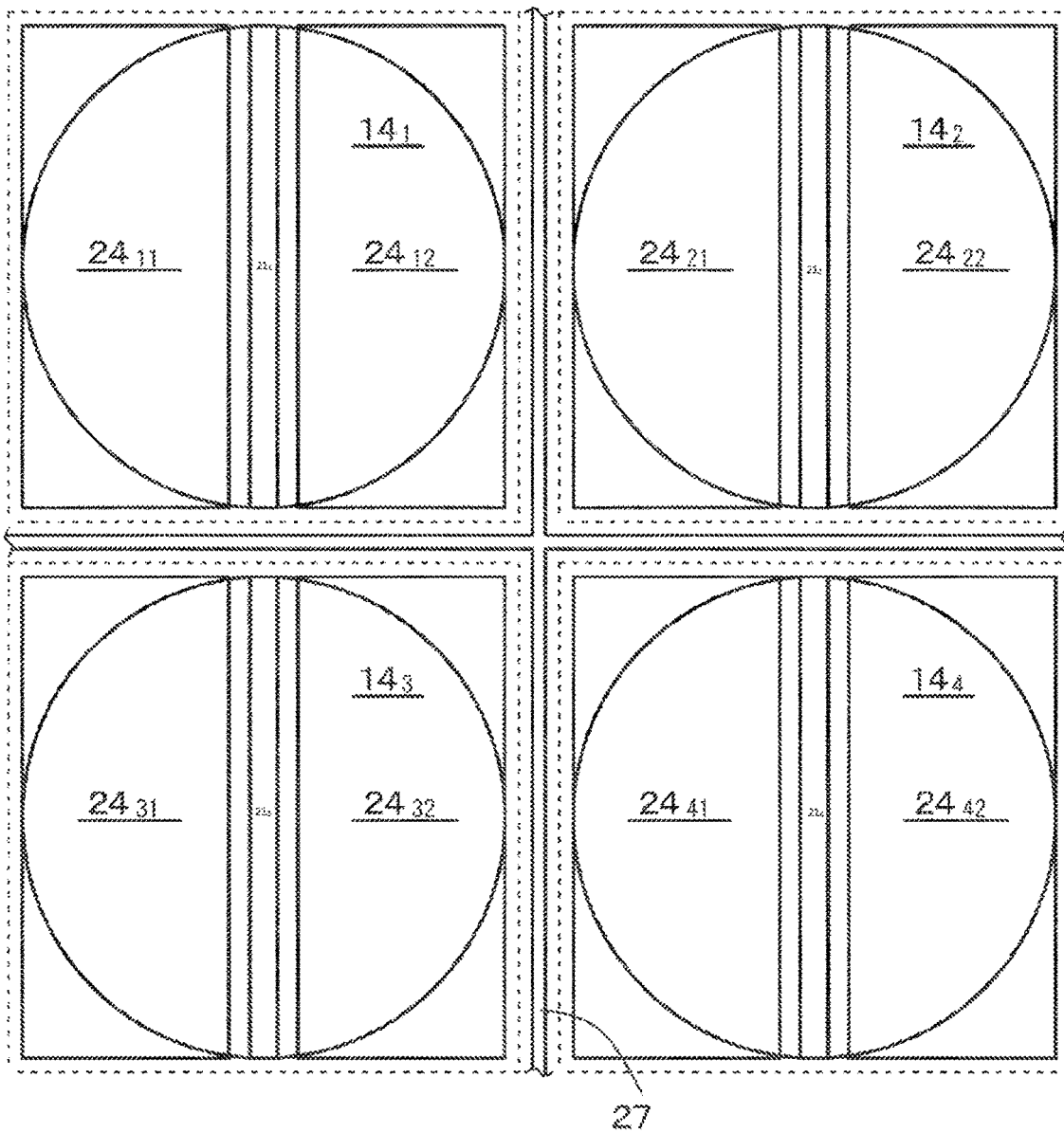
FIG. 60 is a schematic plan view of the first electrodes and the charge accumulation electrode segments in a modification example of the solid-state image pickup apparatus of Embodiment 10.
Figure 61:
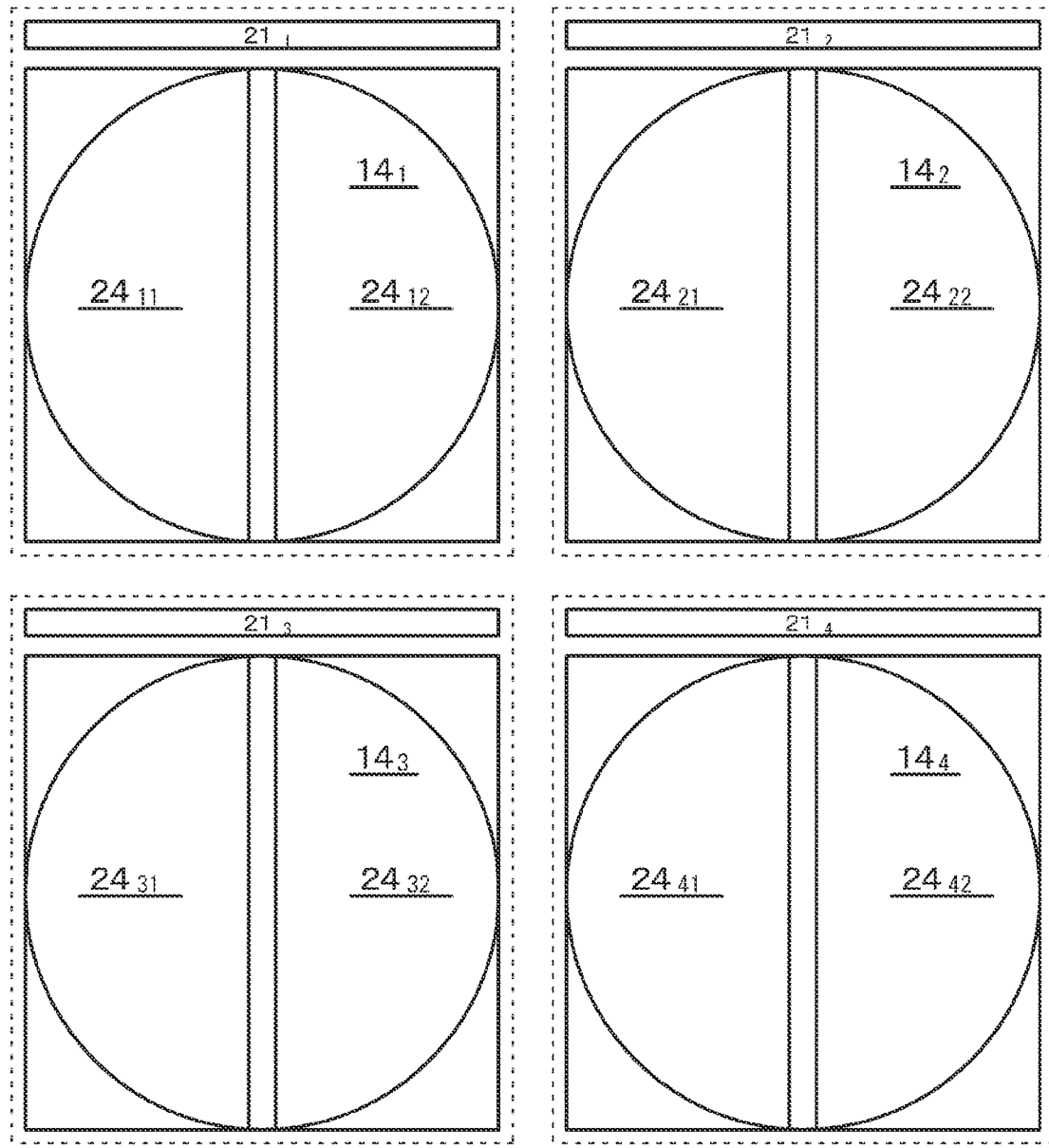
FIG. 61 is another schematic plan view of the first electrodes and the charge accumulation electrode segments in a modification example of the solid-state image pickup apparatus of Embodiment 10.
Figure 62:
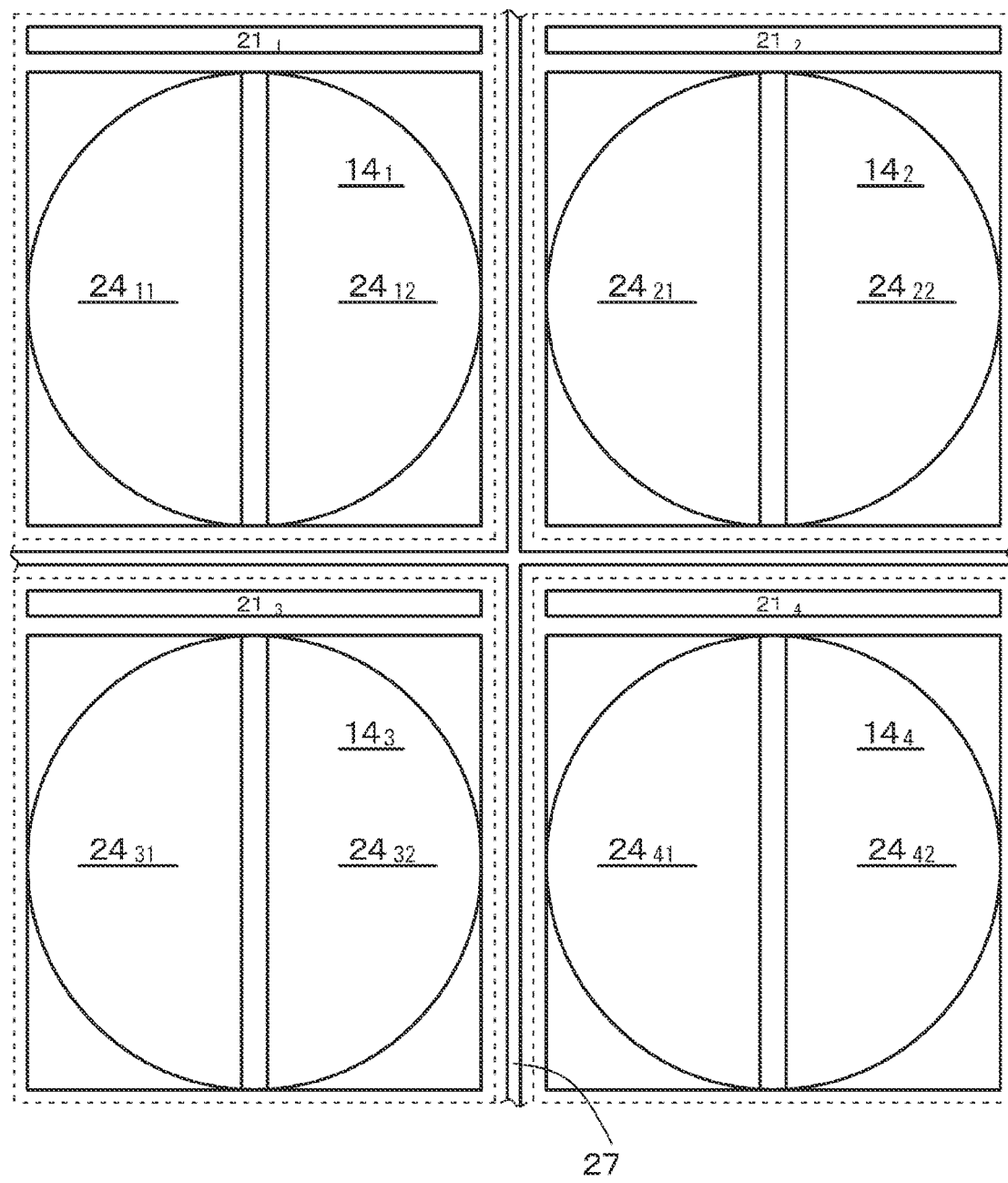
FIG. 62 is still another schematic plan view of the first electrodes and the charge accumulation electrode segments in a modification example of the solid-state image pickup apparatus of Embodiment 10.

Embodiment 10 is a modification example of Embodiment 9. In the solid-state image pickup apparatus of Embodiment 10 illustrated in FIG. 59, FIG. 60, FIG. 61, and FIG. 62 which schematically illustrate arrangement states of the first electrodes 21 and the charge accumulation electrodes 24, an image pickup element block includes two image pickup elements. Then, one on-chip micro lens 14 is arranged in place above the image pickup element block. Note that, in the examples illustrated in FIG. 60 and FIG. 62, a charge transfer control electrode 27 is arranged in place between a plurality of image pickup elements included in an image pickup element block.

For example, photoelectric conversion layers corresponding to the charge accumulation electrodes $24_{11}$, $24_{21}$, $24_{31}$, and $24_{41}$ included in image pickup element blocks are highly sensitive to incident light entering from upper right in the drawing. In addition, photoelectric conversion layers corresponding to the charge accumulation electrodes $24_{12}$, $24_{22}$, $24_{32}$, and $24_{42}$ included in the image pickup element blocks are highly sensitive to incident light entering from upper left in the drawing. Accordingly, for example, by combining an image pickup element having the charge accumulation electrode $24_{11}$ and an image pickup element having the charge accumulation electrode $24_{12}$, it becomes possible to acquire an image plane phase difference signal. In addition, by adding together a signal from the image pickup element having the charge accumulation electrode $24_{11}$ and a signal from the image pickup element having the charge accumulation electrode $24_{12}$, it is possible to form one image pickup element with a combination of these image pickup elements. Although a first electrode 211 is arranged between the charge accumulation electrode $24_{11}$ and the charge accumulation electrode $24_{12}$ in the example illustrated in FIG. 59, it is possible to attempt to further enhance the sensitivity by arranging one first electrode 211 to face the two charge accumulation electrodes $24_{11}$ and $24_{12}$ arranged side by side as in the example illustrated in FIG. 61.

The present disclosure has been explained on the basis of preferred embodiments thus far, but the present disclosure is not limited to the embodiments. The structure and configuration, manufacturing conditions, manufacturing methods, and materials that are used of the image pickup element, the stacked image pickup element, and the solid-state image pickup apparatus explained in the embodiments are illustrated as examples, and can be changed as appropriate. The image pickup element of each embodiment can be combined as appropriate. The configuration and structure of the image pickup element of the present disclosure can also be applied to a light emitting element such as an organic EL element and can also be applied to a channel formation region of a thin film transistor.

In some cases, as mentioned before, the floating diffusion layers $FD_1$, $FD_2$, $FD_3$, 51C, 45C, and 46C can also be shared.

Figure 63:
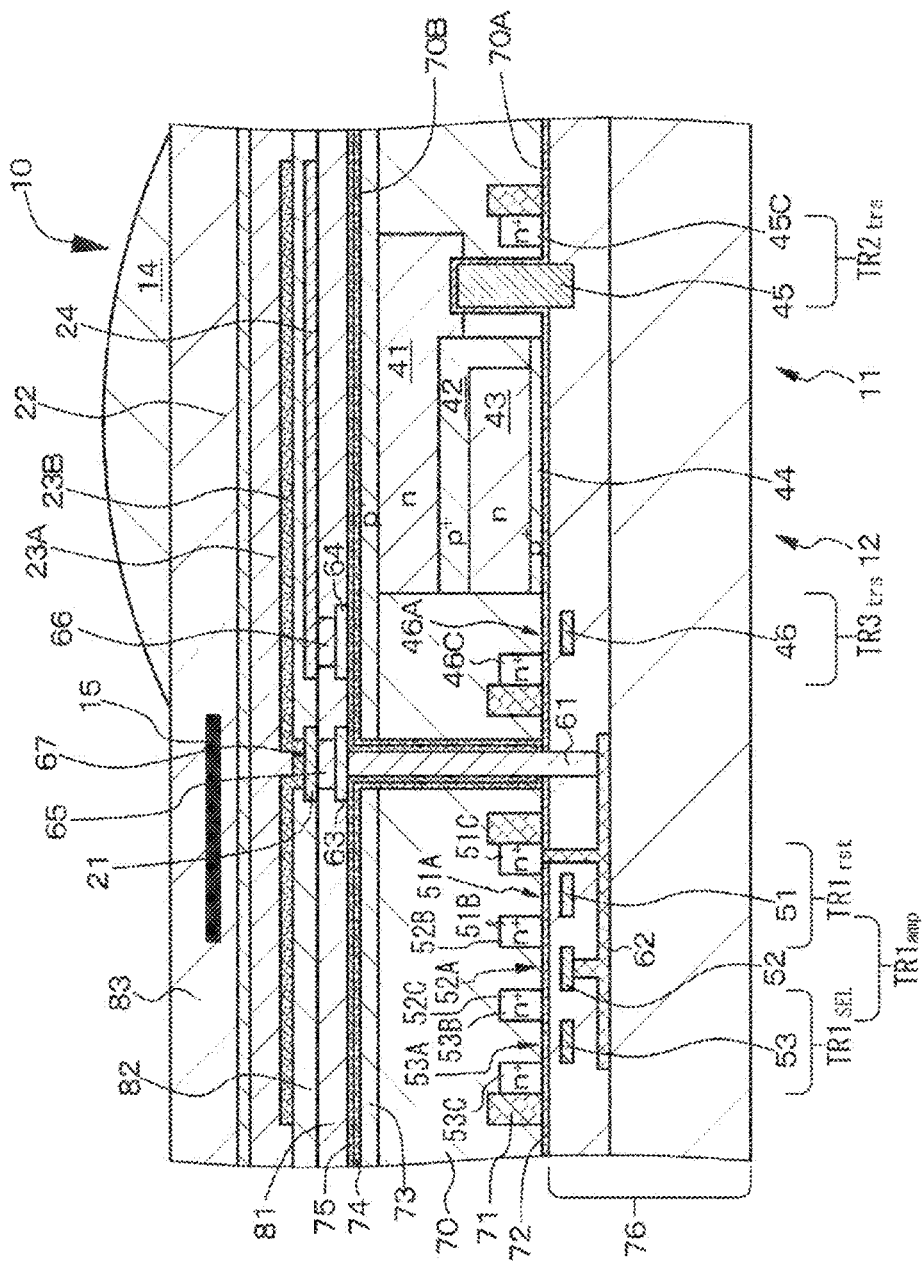
FIG. 63 is a schematic partial cross-sectional view of still another modification example of the image pickup element and a stacked image pickup element of Embodiment 1.

In addition, as illustrated in FIG. 63 which illustrates a modification example of the image pickup element and the stacked image pickup element explained in Embodiment 1, for example, light enters from the side closer to the second electrode 22, and a light-shielding layer 15 is formed on the light-incidence side closer to the second electrode 22, in a possible configuration. Note that it is possible to make various types of wire provided on the light-incidence side relative to the photoelectric conversion layer function as a light-shielding layer.

Figure 64:
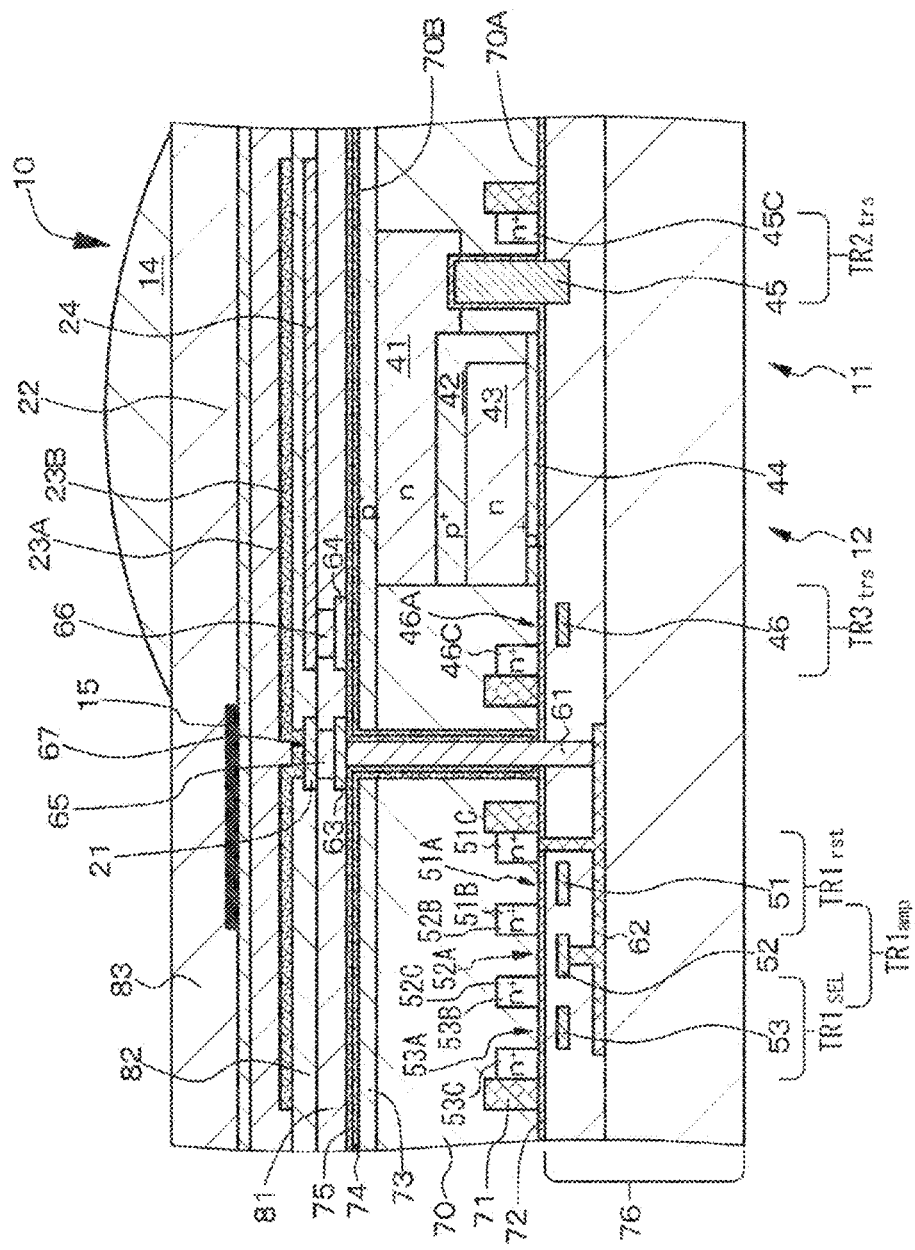
FIG. 64 is a schematic partial cross-sectional view of yet another modification example of the image pickup element and the stacked image pickup element of Embodiment 1.
Figure 65:
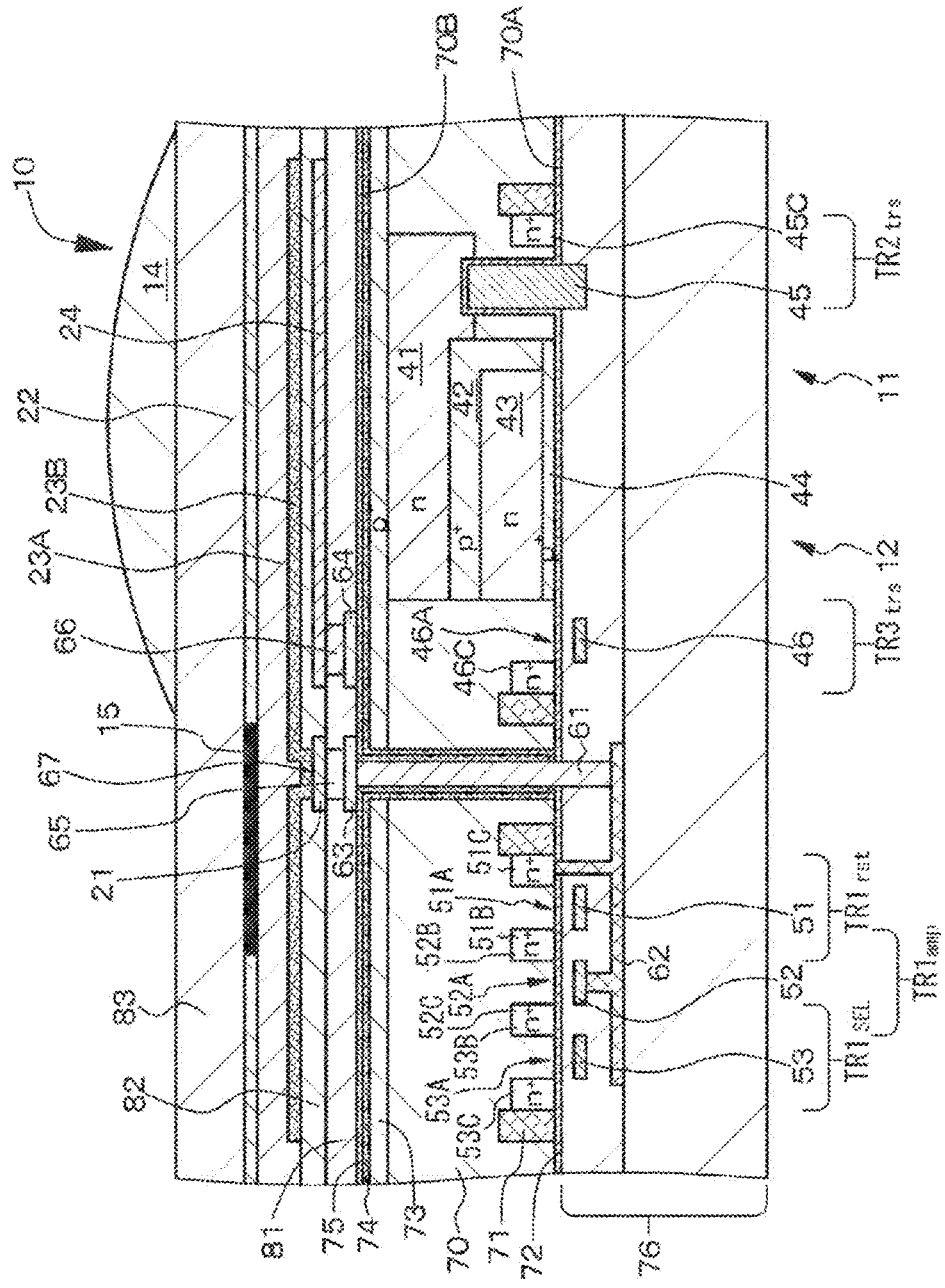
FIG. 65 is a schematic partial cross-sectional view of a further modification example of the image pickup element and the stacked image pickup element of Embodiment 1.

Note that, although the light-shielding layer 15 is formed above the second electrode 22 in the example illustrated in FIG. 63, that is, the light-shielding layer 15 is formed on the light-incidence side closer to the second electrode 22 and above the first electrode 21, the light-shielding layer 15 may be arranged in place on a light-incidence-side surface of the second electrode 22 as illustrated in FIG. 64. In addition, in some cases, the light-shielding layer 15 may be formed in the second electrode 22 as illustrated in FIG. 65.

Figure 66:
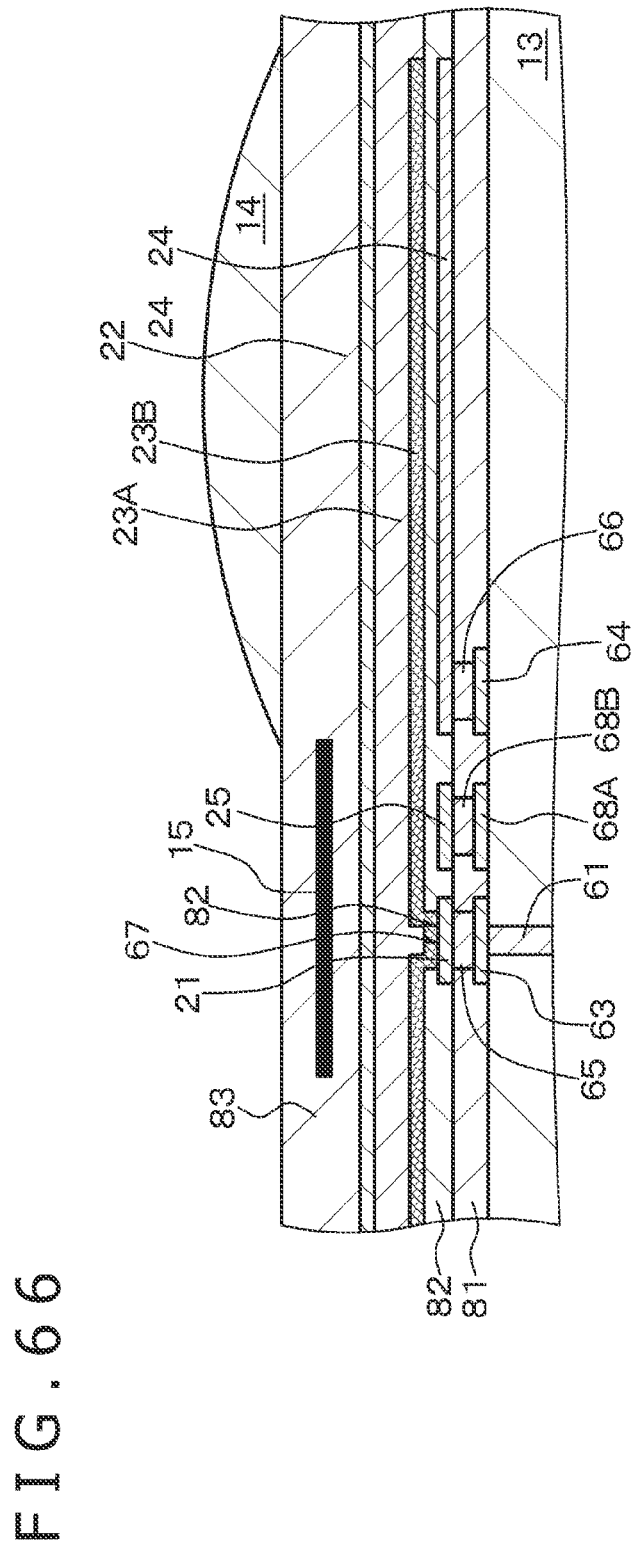
FIG. 66 is a schematic partial cross-sectional view of a still further modification example of the image pickup element and the stacked image pickup element of Embodiment 1.
Figure 67:
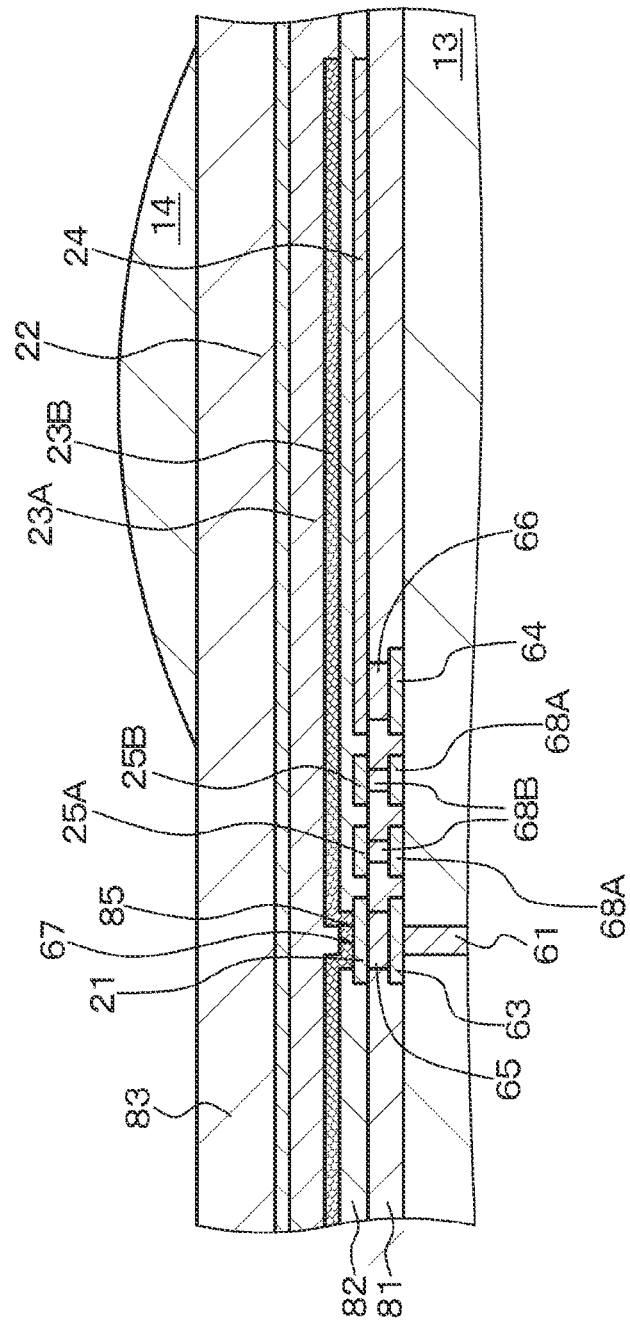
FIG. 67 is a schematic partial cross-sectional view of still another modification example of the image pickup element of Embodiment 4.

Alternatively, light enters from the side closer to the second electrode 22, and light does not enter the first electrode 21, in a possible structure. Specifically, as illustrated in FIG. 63, the light-shielding layer 15 is formed on the light-incidence side closer to the second electrode 22 and above the first electrode 21. Alternatively, as illustrated in FIG. 67, in a possible structure, the on-chip micro lens 14 is provided above the charge accumulation electrode 24 and the second electrode 22, and light that enters the on-chip micro lens 14 is concentrated onto the charge accumulation electrode 24 and does not reach the first electrode 21. Note that, in a case that the transfer control electrode 25 is provided as explained in Embodiment 4, light does not enter the first electrode 21 and the transfer control electrode 25 in a possible mode, and specifically as illustrated in FIG. 66, the light-shielding layer 15 is formed above the first electrode 21 and the transfer control electrode 25 in a possible structure. Alternatively, light that enters the on-chip micro lens 14 does not reach the first electrode 21, or the first electrode 21 and the transfer control electrode 25 in a possible structure.

By adopting these configurations and structures or by providing the light-shielding layer 15 or designing the on-chip micro lens 14 such that light enters only a section that is in the photoelectric conversion unit 23 and is positioned above the charge accumulation electrode 24, a section that is in the photoelectric conversion unit 23 and is positioned above the first electrode 21 (or above the first electrode 21 and the transfer control electrode 25) does not contribute to photoelectric conversion. Accordingly, all the pixels can be reset all at once more surely, and a global shutter functionality can be realized more easily. That is, in a drive method for the solid-state image pickup apparatus including a plurality of the image pickup elements having these configurations and structures, each step of while accumulating electric charges in inorganic oxide semiconductor material layers 23B and the like in all the image pickup elements all at once, discharging electric charges in the first electrodes 21 to the outside of the system, and then transferring, to the first electrodes 21, the electric charges accumulated in the inorganic oxide semiconductor material layers 23B and the like in all the image pickup elements all at once, and, after the completion of the transfer, sequentially reading out an electric charge transferred to the first electrode 21 in each image pickup element is repeated.

In such a drive method for the solid-state image pickup apparatus, each image pickup element has a structure in which light having entered from the second-electrode side does not enter the first electrode, and while electric charges are accumulated in the inorganic oxide semiconductor material layers and the like in all the image pickup elements all at once, electric charges at the first electrodes are discharged to the outside of the system. Accordingly, the first electrodes in all the image pickup elements can surely be reset simultaneously. Thereafter, the electric charges accumulated in the inorganic oxide semiconductor material layers and the like are transferred to the first electrodes in all the image pickup elements all at once, and after the completion of the transfer, an electric charge having been transferred to the first electrode is read out in each image pickup element sequentially. Therefore, what is generally called a global shutter functionality can easily be realized.

In a case that one inorganic oxide semiconductor material layer 23B made common to a plurality of image pickup elements is formed, end sections of the inorganic oxide semiconductor material layer 23B are desirably covered at least with the photoelectric conversion layer 23A, from the perspective of protection of the end sections of the inorganic oxide semiconductor material layer 23B. It is sufficient if the structure of the image pickup element in such a case is made the same as a structure like the one illustrated on the right end of the inorganic oxide semiconductor material layer 23B illustrated in FIG. 1 which illustrates a schematic cross-sectional view.

In addition, as a modification example of Embodiment 4, a plurality of transfer control electrodes may be provided from the position closest to the first electrode 21 toward the charge accumulation electrode 24, as illustrated in FIG. 67. Note that FIG. 67 illustrates an example in which two transfer control electrodes 25A and 25B are provided. Then, in a possible structure, the on-chip micro lens 14 is provided above the charge accumulation electrode 24 and the second electrode 22, and light that enters the on-chip micro lens 14 is concentrated onto the charge accumulation electrode 24 and does not reach the first electrode 21 and the transfer control electrodes 25A and 25B.

In a possible configuration, the first electrode 21 extends inside the opening section 85 provided through the insulation layer 82 and is connected with the inorganic oxide semiconductor material layer 23B.

In addition, although the present technology is applied to a CMOS solid-state image pickup apparatus in which unit pixels to sense signal charges according to amounts of incident light as physical quantities are arranged in a matrix in the examples explained in the embodiments, the present technology can be applied not only to CMOS solid-state image pickup apparatuses, but also to CCD solid-state image pickup apparatuses. In the latter case, signal charges are transferred vertically by a vertical transfer register with a CCD structure, are transferred horizontally by a horizontal transfer register, and are amplified, and pixel signals (image signals) are output thereby. In addition, the present technology can be applied not only to column-type solid-state image pickup apparatuses in general in which pixels are formed in a two-dimensional matrix, and a column signal processing circuit is arranged for each pixel column. Further, selection transistors can also be omitted in some cases.

Further, the image pickup element and the stacked image pickup element of the present disclosure can be applied not only to a solid-state image pickup apparatus that performs image-capturing by sensing the distribution of the incident light amounts of visible light to capture the light as an image, but also to a solid-state image pickup apparatus that captures the distribution of the amounts of incidence of infrared rays or X-rays, or particles or the like as an image. In addition, in a broad sense, the present technology can be applied to solid-state image pickup apparatuses (physical quantity distribution sensing apparatuses) in general such as a fingerprint detection sensor that senses the distribution of other physical quantities such as pressure or electrostatic capacitance to capture them as an image.

Further, the present technology can be applied not only to a solid-state image pickup apparatus that scans each unit pixel in an image pickup region sequentially in the unit of line and reads out a pixel signal from each unit pixel. The present technology can also be applied to an X-Y address type solid-state image pickup apparatus that selects a pixel in the unit of pixel and reads out a pixel signal from the selected pixel in the unit of pixel. The solid-state image pickup apparatus may be formed as one chip in a possible mode and may be a modular type having an image pickup functionality that is formed by collectively packaging an image pickup region, and a drive circuit or an optical system, in a possible mode.

In addition, the present technology can be applied not only to solid-state image pickup apparatuses, but also to image pickup apparatuses. Here, image pickup apparatuses mean camera systems such as digital still cameras or video camera, and electronic equipment having an image pickup functionality such as mobile phones. In some cases, in a possible mode, the image pickup apparatuses may be modular image pickup apparatuses to be mounted on electronic equipment, that is, the image pickup apparatuses may be camera modules.

Figure 69:
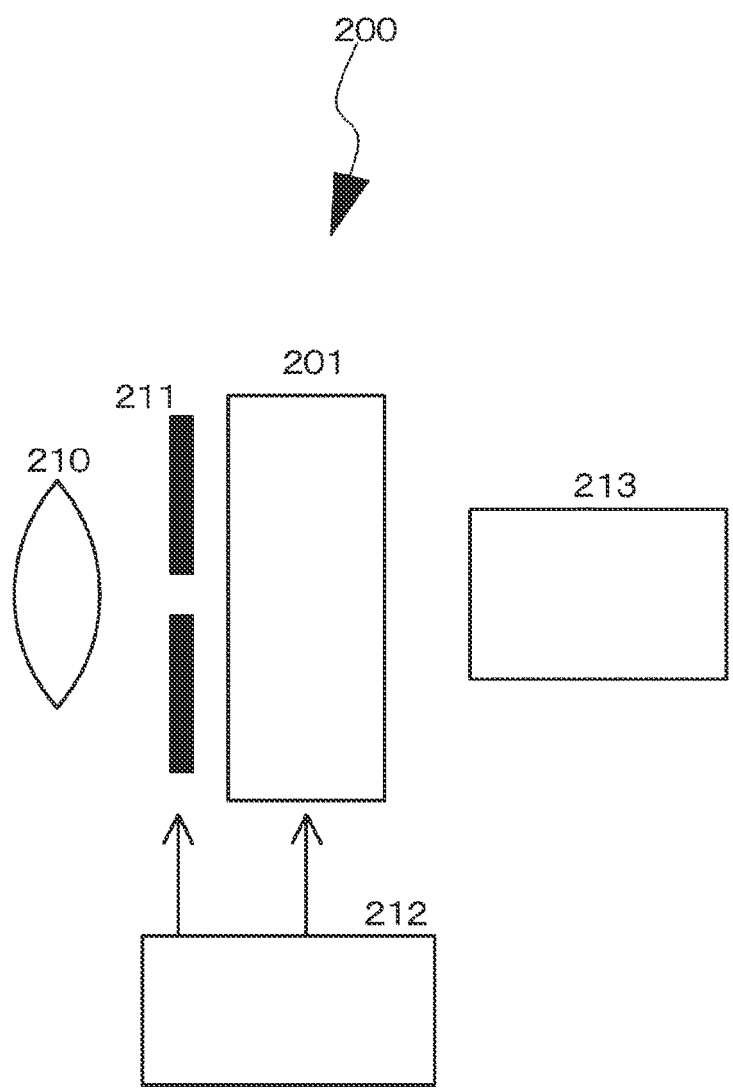
FIG. 69 is a conceptual diagram of an example in which the solid-state image pickup apparatus including the image pickup element and the stacked image pickup element of the present disclosure is used in electronic equipment (camera).

FIG. 69 illustrates a conceptual diagram of an example in which a solid-state image pickup apparatus 201 including the image pickup element and the stacked image pickup element of the present disclosure is used in electronic equipment (camera) 200. The electronic equipment 200 has the solid-state image pickup apparatus 201, an optical lens 210, a shutter apparatus 211, a drive circuit 212, and a signal processing circuit 213. The optical lens 210 forms an image of image light (incident light) from a subject onto an image pickup surface of the solid-state image pickup apparatus 201. Thereby, a signal charge is accumulated in the solid-state image pickup apparatus 201 for a predetermined period. The shutter apparatus 211 controls a light-illumination period and a light-shielding period of light into the solid-state image pickup apparatus 201. The drive circuit 212 supplies drive signals to control transfer operation and the like of the solid-state image pickup apparatus 201 and shutter operation of the shutter apparatus 211. On the basis of the drive signals (timing signals) supplied from the drive circuit 212, signal transfer of the solid-state image pickup apparatus 201 is performed. The signal processing circuit 213 performs various types of signal processing. Video signals on which the signal processing has been performed are stored on a storage medium such as a memory or output to a monitor. In such electronic equipment 200, miniaturization of pixel sizes and enhancement of transfer efficiency in the solid-state image pickup apparatus 201 can be achieved, and so it is possible to obtain the electronic equipment 200 for which it is attempted to enhance pixel characteristics. Examples of the electronic equipment 200 to which the solid-state image pickup apparatus 201 can be applied are not limited to cameras, but the solid-state image pickup apparatus 201 can be applied to image pickup apparatuses such as digital still cameras or camera modules for mobile equipment such as mobile phones.

The technology according to the present disclosure (the present technology) can be applied to various products. For example, the technology according to the present disclosure may be realized as an apparatus to be mounted on a type of moving body such as automobile, electric car, hybrid electric car, motorcycle, bicycle, personal transporter, airplane, drone, ship, or robot.

Figure 72:
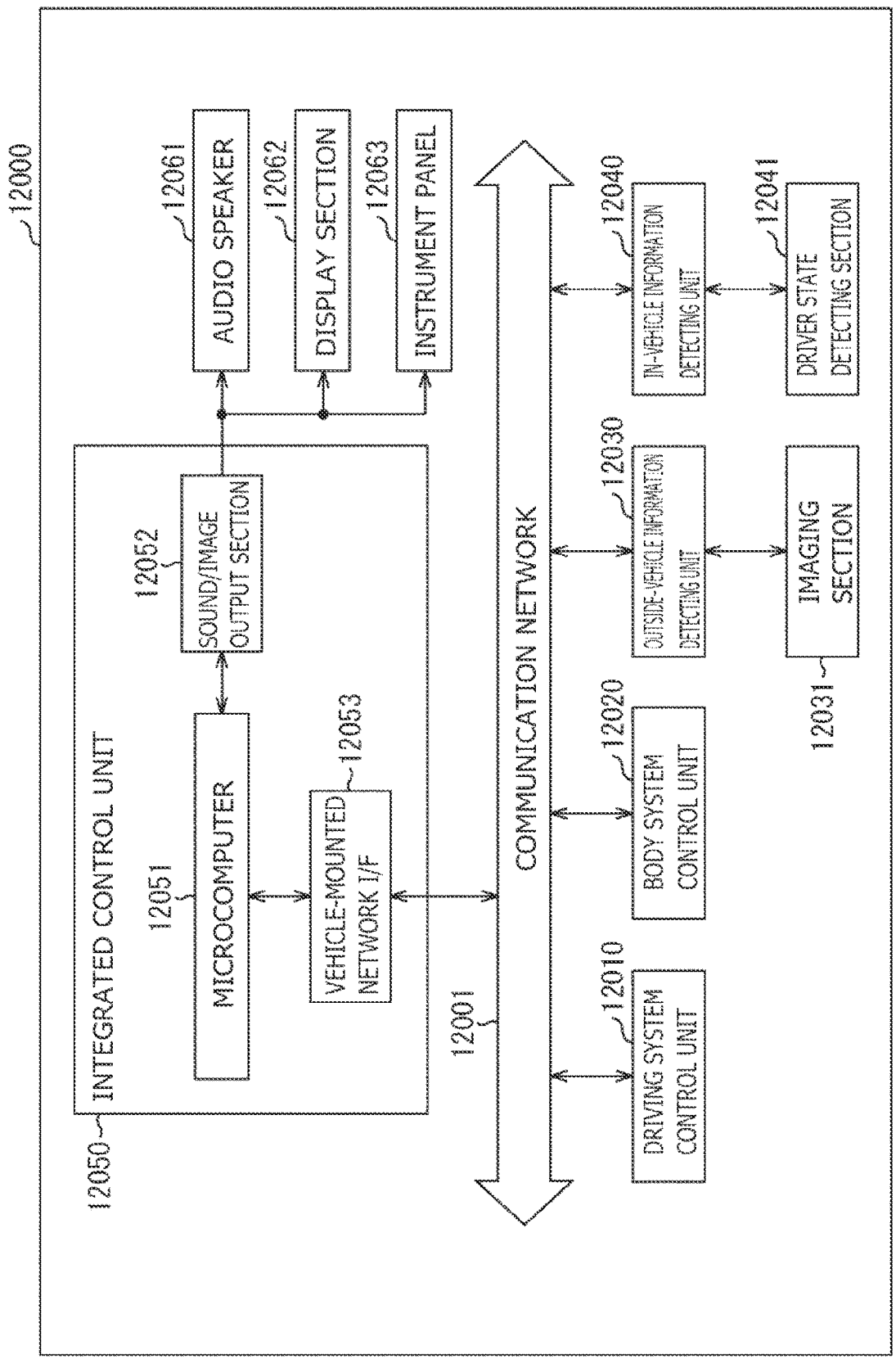
FIG. 72 is a block diagram depicting an example of schematic configuration of a vehicle control system.

FIG. 72 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 72, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 72, an audio speaker 12061, a display section 12062, and an instrument panel 12063 are illustrated as the output device. The display section 12062 may, for example, include at least one of an on-board display and a head-up display.

Figure 73:
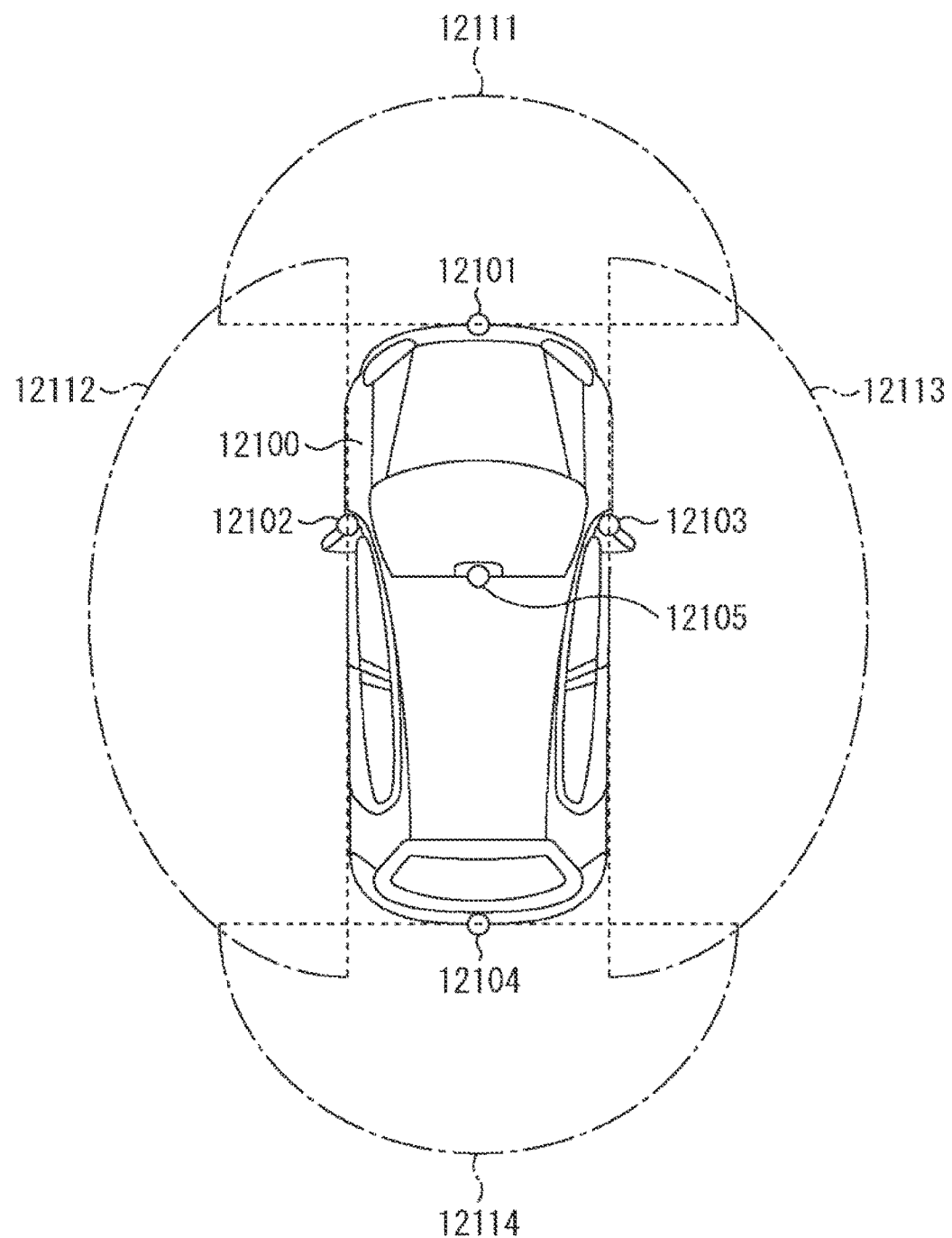
FIG. 73 is a diagram of assistance in explaining an example of installation positions of an outside-vehicle information detecting section and an imaging section.

FIG. 73 is a diagram depicting an example of the installation position of the imaging section 12031.

In FIG. 73, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 73 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object.

When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

In addition, for example, the technology according to the present disclosure may be applied to an endoscopic surgery system.

Figure 74:
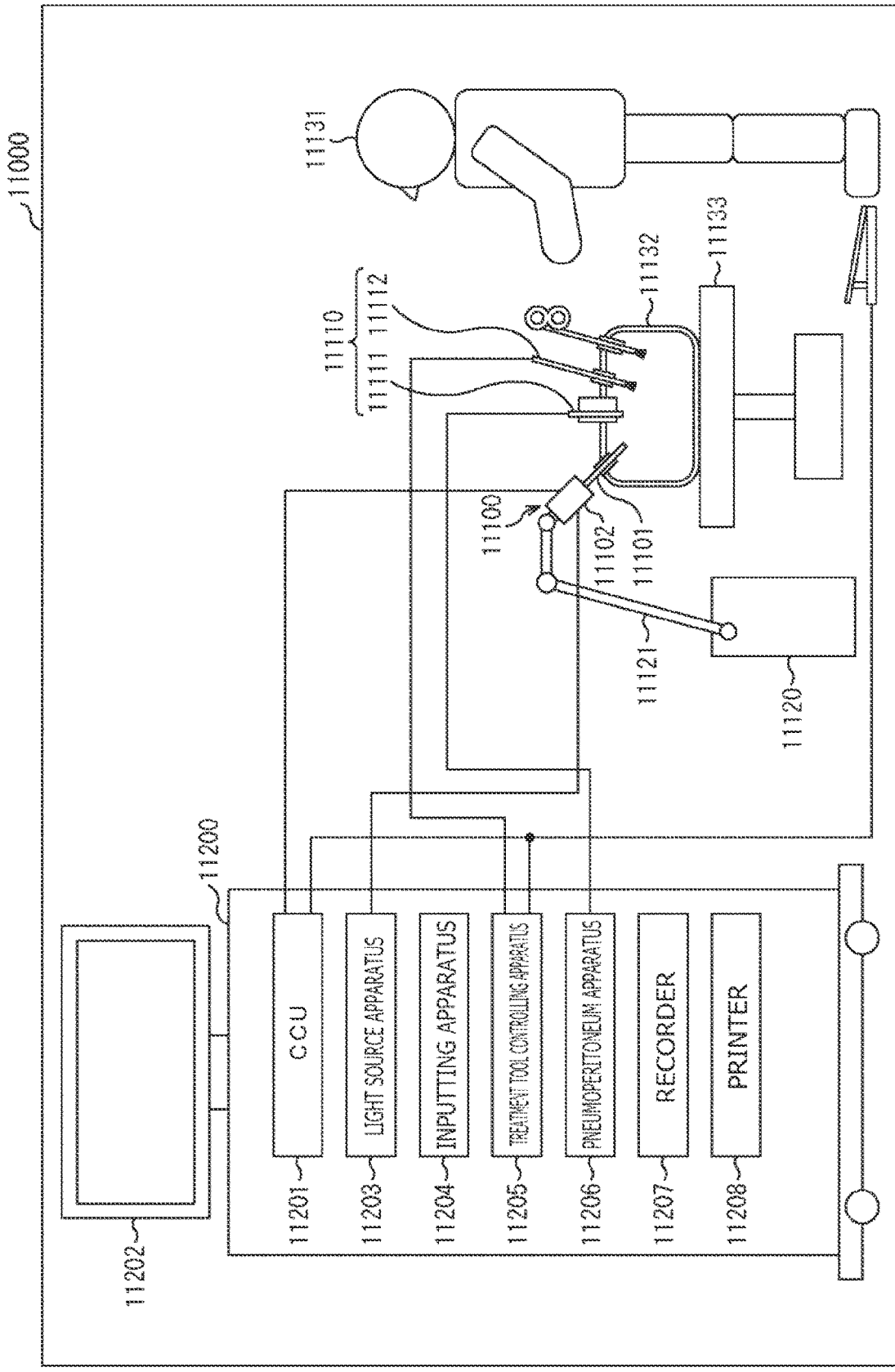
FIG. 74 is a view depicting an example of a schematic configuration of an endoscopic surgery system.

FIG. 74 is a view depicting an example of a schematic configuration of an endoscopic surgery system to which the technology according to an embodiment of the present disclosure (present technology) can be applied.

In FIG. 74, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 75:
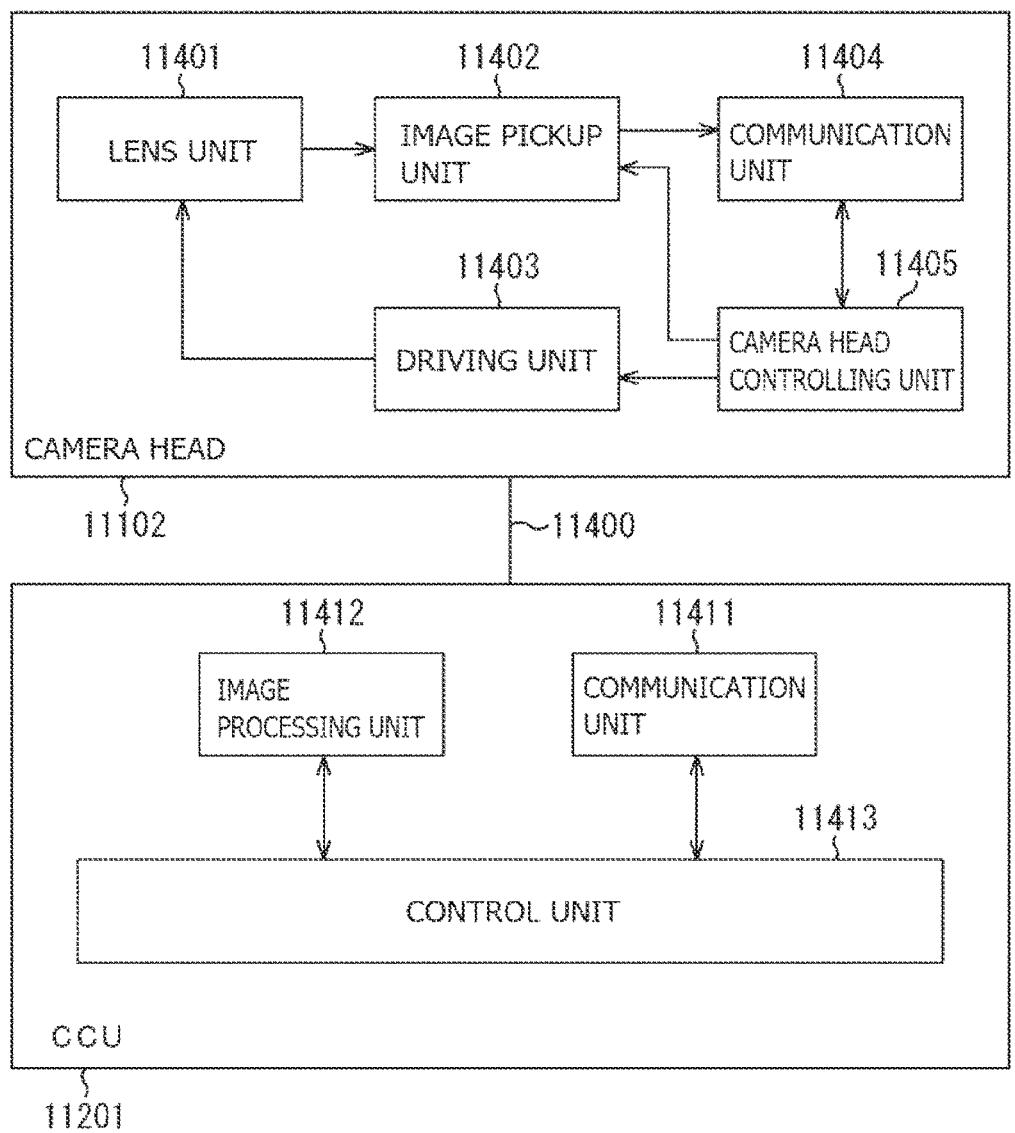
FIG. 75 is a block diagram depicting an example of a functional configuration of a camera head and a camera control unit (CCU).

FIG. 75 is a block diagram depicting an example of a functional configuration of the camera head 11102 and the CCU 11201 depicted in FIG. 74.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

Note that, although the endoscopic surgery system is explained as one example here, the technology according to the present disclosure may be applied to other systems such as a microscopic surgery system, for example.

Note that the present disclosure can also adopt configurations like the following ones.

[A01]
<<Image Pickup Element>>
An image pickup element including:
  a first electrode;
  a charge accumulation electrode arranged apart from the first electrode;
  a photoelectric conversion unit that contacts the first electrode and is formed above the charge accumulation electrode via an insulation layer; and
  a second electrode formed on the photoelectric conversion unit, in which
  the photoelectric conversion unit includes, from a second-electrode side, a photoelectric conversion layer, and an inorganic oxide semiconductor material layer including $In_aGa_bSn_cO_d$, and $$0.30 \leq b/(a+b+c) \leq 0.50$$

and $$b \geq c$$

are satisfied.

[A02]
The image pickup element according to [A01], in which $0.40 \leq b/(a+b+c) \leq 0.50$ is satisfied.

[A03]
The image pickup element according to [A01] or [A02], in which $b \geq 1.2c$ is satisfied.

[A04]
The image pickup element according to any one of [A01] to [A03], in which,
  if an energy average value of a maximum energy value in a conduction band of the inorganic oxide semiconductor material layer is $E_{11}$ (eV), and an energy average value of a LUMO value of the photoelectric conversion layer is $E_{12}$ (eV), $$E_{12} \geq E_{11}$$

is satisfied.

[A05]
The image pickup element according to any one of [A01] to [A04], in which,
  if an energy average value of a minimum energy value in a valence band of the inorganic oxide semiconductor material layer is $E_{21}$ (eV), and an energy average value of a HOMO value of the photoelectric conversion layer is $E_{22}$ (eV), $$E_{22} \geq E_{21}$$

is satisfied.

[A06]
The image pickup element according to any one of [A01] to [A05], in which,
  if an energy average value of a maximum energy value in a conduction band of the inorganic oxide semiconductor material layer is $En_{11}$, $$E_{11} \leq -4.5 \text{ eV}$$

is satisfied.

[A07]

The image pickup element according to any one of [A01] to [A06], in which the photoelectric conversion layer includes an n-type organic semiconductor.

[A08]

The image pickup element according to [A07], in which the photoelectric conversion layer includes a fullerene, a fullerene derivative or a fullerene derivative.

[A09]

The image pickup element according to any one of [A01] to [A06], in which the photoelectric conversion layer includes an electron transport material.

[A10]

The image pickup element according to any one of [A01] to [A09], in which an electric charge generated in the photoelectric conversion layer is transferred to the first electrode via the inorganic oxide semiconductor material layer.

[A11]

The image pickup element according to [A10], in which the electric charge is electrons.

[B01]

The image pickup element according to any one of [A01] to [A11], further including:

a semiconductor substrate, in which the photoelectric conversion unit is arranged above the semiconductor substrate.

[B02]

The image pickup element according to any one of [A01] to [B01], in which the first electrode extends inside an opening section provided through the insulation layer and is connected with the inorganic oxide semiconductor material layer.

[B03]

The image pickup element according to any one of [A01] to [B01], in which the inorganic oxide semiconductor material layer extends inside an opening section provided through the insulation layer and is connected with the first electrode.

[B04]

The image pickup element according to [B03], in which edge sections of a top surface of the first electrode are covered with the insulation layer, the first electrode is exposed at a bottom surface of the opening section, and, if a surface of the insulation layer contacting the top surface of the first electrode is a first surface, and a surface of the insulation layer contacting a section that is in the inorganic oxide semiconductor material layer and faces the charge accumulation electrode is a second surface, a side surface of the opening section has an inclination that spreads from the first surface toward the second surface.

[B05]

The image pickup element according to [B04], in which the side surface of the opening section having the inclination that spreads from the first surface toward the second surface is positioned closer to the charge accumulation electrode.

[B06]

<<Control of Potentials of First Electrode and Charge Accumulation Electrode>>

The image pickup element according to any one of [A01] to [B05], further including:

a control unit that is provided in a semiconductor substrate and has a drive circuit, in which the first electrode and the charge accumulation electrode are connected with the drive circuit, in a charge accumulation period, from the drive circuit, a potential $V_{11}$ is applied to the first electrode, a potential $V_{31}$ is applied to the charge accumulation electrode, and an electric charge is accumulated in the inorganic oxide semiconductor material layer (or the inorganic oxide semiconductor material layer and the photoelectric conversion layer), and, in a charge transfer period, from the drive circuit, a potential $V_{12}$ is applied to the first electrode, a potential $V_{32}$ is applied to the charge accumulation electrode, and the electric charge accumulated in the inorganic oxide semiconductor material layer (or the inorganic oxide semiconductor material layer and the photoelectric conversion layer) is read out to the control unit through the first electrode, where the potentials of the first electrode are higher than the potentials of the second electrode, and $V_{31} \geq V_{11}$ and $V_{32} < V_{12}$.

[B07]

<<Lower-Section Charge Transfer Control Electrode>>

The image pickup element according to any one of [A01] to [B06], in which a charge transfer control electrode is formed in a region that faces, via the insulation layer, a region that is in the photoelectric conversion layer and is positioned between adjacent image pickup elements.

[B08]

<<Control of Potentials of First Electrode, Charge Accumulation Electrode, and Lower-Section Charge Transfer Control Electrode>>

The image pickup element according to [B07], further including:

a control unit that is provided in a semiconductor substrate and has a drive circuit, in which the first electrode, the second electrode, the charge accumulation electrode, and the lower-section charge transfer control electrode are connected with the drive circuit, in a charge accumulation period, from the drive circuit, a potential $V_{11}$ is applied to the first electrode, a potential $V_{31}$ is applied to the charge accumulation electrode, a potential $V_{41}$ is applied to the lower-section charge transfer control electrode, and an electric charge is accumulated in the inorganic oxide semiconductor material layer (or the inorganic oxide semiconductor material layer and the photoelectric conversion layer), and, in a charge transfer period, from the drive circuit, a potential $V_{12}$ is applied to the first electrode, a potential $V_{32}$ is applied to the charge accumulation electrode, a potential $V_{42}$ is applied to the lower-section charge transfer control electrode, and the electric charge accumulated in the inorganic oxide semiconductor material layer (or the inorganic oxide semiconductor material layer and the photoelectric conversion layer) is read out to the control unit through the first electrode, where $V_{31} \geq V_{11}$, $V_{31} > V_{41}$, and $V_{12} > V_{32} > V_{42}$.

[B09]
<<Lower-Section Charge Transfer Control Electrode>>
The image pickup element according to any one of [A01] to [B06], in which,
  instead of the formation of the second electrode, a charge transfer control electrode is formed on a region that is in the photoelectric conversion layer and is positioned between adjacent image pickup elements.

[B10]
The image pickup element according to [B09], in which
  the second electrode is provided for each image pickup element, and the upper-section charge transfer control electrode is provided on a region −A of the photoelectric conversion layer such that the upper-section charge transfer control electrode surrounds at least some of the second electrodes and is apart from the second electrodes.

[B11]
The image pickup element according to [B09], in which
  the second electrode is provided for each image pickup element, the upper-section charge transfer control electrode is provided to surround at least some of the second electrodes and to be apart from the second electrodes, and there are some of the charge accumulation electrodes below the upper-section charge transfer control electrode.

[B12]
The image pickup element according to [B09], in which
  the second electrode is provided for each image pickup element, the upper-section charge transfer control electrode is provided to surround at least some of the second electrodes and to be apart from the second electrodes, there are some of the charge accumulation electrodes below the upper-section charge transfer control electrode, and further a lower-section charge transfer control electrode is formed below the upper-section charge transfer control electrode.

[B13]
<<Control of Potentials of First Electrode, Charge Accumulation Electrode, and Lower-Section Charge Transfer Control Electrode>>
The image pickup element according to any one of [B09] to [B12], further including:
  a control unit that is provided in a semiconductor substrate and has a drive circuit, in which
  the first electrode, the second electrode, the charge accumulation electrode, and the upper-section charge transfer control electrode are connected with the drive circuit,
  in a charge accumulation period, from the drive circuit, a potential $V_{21}$ is applied to the second electrode, a potential $V_{41}$ is applied to the upper-section charge transfer control electrode, and an electric charge is accumulated in the inorganic oxide semiconductor material layer (or the inorganic oxide semiconductor material layer and the photoelectric conversion layer), and,
  in a charge transfer period, from the drive circuit, a potential $V_{22}$ is applied to the second electrode, a potential $V_{42}$ is applied to the upper-section charge transfer control electrode, and the electric charge accumulated in the inorganic oxide semiconductor material layer (or the inorganic oxide semiconductor material layer and the photoelectric conversion layer) is read out to the control unit through the first electrode, where $V_{21} \geq V_{41}$ and $V_{22} \geq V_{42}$.

[B14]
<<Transfer Control Electrode>>
The image pickup element according to any one of [A01] to [B13], further including:
  a transfer control electrode that is arranged between the first electrode and the charge accumulation electrode and apart from the first electrode and the charge accumulation electrode and that is arranged to face the inorganic oxide semiconductor material layer via the insulation layer.

[B15]
<<Control of Potentials of First Electrode, Charge Accumulation Electrode, and Transfer Control Electrode>>
The image pickup element according to [B14], further including:
  a control unit that is provided in a semiconductor substrate and has a drive circuit, in which
  the first electrode, the charge accumulation electrode, and the transfer control electrode are connected with the drive circuit,
  in a charge accumulation period, from the drive circuit, a potential $V_{11}$ is applied to the first electrode, a potential $V_{31}$ is applied to the charge accumulation electrode, a potential $V_{51}$ is applied to the transfer control electrode, and an electric charge is accumulated in the inorganic oxide semiconductor material layer (or the inorganic oxide semiconductor material layer and the photoelectric conversion layer), and,
  in a charge transfer period, from the drive circuit, a potential $V_{12}$ is applied to the first electrode, a potential $V_{32}$ is applied to the charge accumulation electrode, a potential $V_{52}$ is applied to the transfer control electrode, and the electric charge accumulated in the inorganic oxide semiconductor material layer (or the inorganic oxide semiconductor material layer and the photoelectric conversion layer) is read out to the control unit via the first electrode, where the potentials of the first electrode are higher than the potentials of the second electrode, and $V_{31} > V_{51}$ and $V_{32} \leq V_{52} \leq V_{12}$.

[B16]
<<Charge Discharge Electrode>>
The image pickup element according to any one of [A01] to [B15], further including:
  a charge discharge electrode that is connected with the inorganic oxide semiconductor material layer and is arranged apart from the first electrode and the charge accumulation electrode.

[B17]
The image pickup element according to [B16], in which
  the charge discharge electrode is arranged to surround the first electrode and the charge accumulation electrode.

[B18]
The image pickup element according to [B16] or [B17], in which
  the inorganic oxide semiconductor material layer extends inside a second opening section provided through the insulation layer and is connected with the charge discharge electrode,
  edge sections of a top surface of the charge discharge electrode are covered with the insulation layer,
  the charge discharge electrode is exposed at a bottom surface of the second opening section, and,
  if a surface of the insulation layer contacting the top surface of the charge discharge electrode is a third surface, and a surface of the insulation layer contacting a section that is in the inorganic oxide semiconductor material layer and faces the charge accumulation electrode is a second surface, a side surface of the second opening section has an inclination that spreads from the third surface toward the second surface.

[B19]

<<Control of Potentials of First Electrode, Charge Accumulation Electrode, and Charge Discharge Electrode>>

The image pickup element according to any one of [B16] to [B18], further including:
- a control unit that is provided in a semiconductor substrate and has a drive circuit, in which
- the first electrode, the charge accumulation electrode, and the charge discharge electrode are connected with the drive circuit,
- in a charge accumulation period, from the drive circuit, a potential $V_{11}$ is applied to the first electrode, a potential $V_{31}$ is applied to the charge accumulation electrode, a potential $V_{61}$ is applied to the charge discharge electrode, and an electric charge is accumulated in the inorganic oxide semiconductor material layer (or the inorganic oxide semiconductor material layer and the photoelectric conversion layer), and,
- in a charge transfer period, from the drive circuit, a potential $V_{12}$ is applied to the first electrode, a potential $V_{32}$ is applied to the charge accumulation electrode, a potential $V_{62}$ is applied to the charge discharge electrode, and the electric charge accumulated in the inorganic oxide semiconductor material layer (or the inorganic oxide semiconductor material layer and the photoelectric conversion layer) is read out to the control unit via the first electrode, where the potentials of the first electrode are higher than the potentials of the second electrode, and $$V_{61}>V_{11} \text{ and } V_{62}<V_{12}.$$

[B20]

<<Charge Accumulation Electrode Segment>>

The image pickup element according to any one of [A01] to [B19], in which
- the charge accumulation electrode includes a plurality of charge accumulation electrode segments.

[B21]

The image pickup element according to [B20], in which,
- in a case that a potential of the first electrode is higher than a potential of the second electrode, in a charge transfer period, a potential applied to a charge accumulation electrode segment positioned closest to the first electrode is higher than a potential applied to a charge accumulation electrode segment positioned farthest from the first electrode, and,
- in a case that a potential of the first electrode is lower than a potential of the second electrode, in a charge transfer period, a potential applied to the charge accumulation electrode segment positioned closest to the first electrode is lower than a potential applied to the charge accumulation electrode segment positioned farthest from the first electrode.

[B22]

The image pickup element according to any one of [A01] to [B21], in which
- a semiconductor substrate is provided with at least a floating diffusion layer and an amplification transistor that are included in a control unit, and
- the first electrode is connected with the floating diffusion layer and a gate section of the amplification transistor.

[B23]

The image pickup element according to [B22], in which
- the semiconductor substrate is further provided with a reset transistor and a selection transistor that are included in the control unit,
- the floating diffusion layer is connected with one source/drain region of the reset transistor, and
- one source/drain region of the amplification transistor is connected with one source/drain region of the selection transistor, and the other source/drain region of the selection transistor is connected with a signal line.

[B24]

The image pickup element according to any one of [A01] to [B23], in which
- a size of the charge accumulation electrode is larger than the first electrode.

[B25]

The image pickup element according to any one of [A01] to [B24], in which
- light enters from a second-electrode side, and a light-shielding layer is formed on a light-incidence side closer to the second electrode.

[B26]

The image pickup element according to any one of [A01] to [B24], in which
- light enters from a second-electrode side, and light does not enter the first electrode.

[B27]

The image pickup element according to [B26], in which
- a light-shielding layer is formed above the first electrode and on a light-incidence side closer to the second electrode.

[B28]

The image pickup element according to [B26], in which
- an on-chip micro lens is provided above the charge accumulation electrode and the second electrode, and
- light that enters the on-chip micro lens is concentrated onto the charge accumulation electrode.

[B29]

<<Image Pickup Element: First Configuration>>

The image pickup element according to any one of [A01] to [B28], in which
- the photoelectric conversion unit includes N (where N≥2) photoelectric conversion unit segments,
- the inorganic oxide semiconductor material layer and the photoelectric conversion layer include N photoelectric conversion layer segments,
- the insulation layer includes N insulation layer segments,
- the charge accumulation electrode includes N charge accumulation electrode segments,
- an n-th (where n=1, 2, 3 . . . N) photoelectric conversion unit segment includes an n-th charge accumulation electrode segment, an n-th insulation layer segment, and an n-th photoelectric conversion layer segment,
- a photoelectric conversion unit segment with a larger value of n is positioned farther apart from the first electrode, and
- thicknesses of the insulation layer segments vary gradually from the first photoelectric conversion unit segment to the N-th photoelectric conversion unit segment.

[B30]

<<Image Pickup Element: Second Configuration>>

The image pickup element according to any one of [A01] to [B28], in which
- the photoelectric conversion unit includes N (where N≥2) photoelectric conversion unit segments, the inorganic oxide semiconductor material layer and the photoelectric conversion layer include N photoelectric conversion layer segments, the insulation layer includes N insulation layer segments, the charge accumulation electrode includes N charge accumulation electrode segments, an n-th (where n=1, 2, 3 . . . N) photoelectric conversion unit segment includes an n-th charge accumulation electrode segment, an n-th insulation layer segment, and an n-th photoelectric conversion layer segment, a photoelectric conversion unit segment with a larger value of n is positioned farther apart from the first electrode, and thicknesses of the photoelectric conversion layer segments vary gradually from the first photoelectric conversion unit segment to the N-th photoelectric conversion unit segment.

[B31]

<<Image Pickup Element: Third Configuration>>

The image pickup element according to any one of [A01] to [B28], in which the photoelectric conversion unit includes N (where N≥2) photoelectric conversion unit segments, the inorganic oxide semiconductor material layer and the photoelectric conversion layer include N photoelectric conversion layer segments, the insulation layer includes N insulation layer segments, the charge accumulation electrode includes N charge accumulation electrode segments, an n-th (where n=1, 2, 3 . . . N) photoelectric conversion unit segment includes an n-th charge accumulation electrode segment, an n-th insulation layer segment, and an n-th photoelectric conversion layer segment, a photoelectric conversion unit segment with a larger value of n is positioned farther apart from the first electrode, and materials included in the insulation layer segments are different between adjacent photoelectric conversion unit segments.

[B32]

<<Image Pickup Element: Fourth Configuration>>

The image pickup element according to any one of [A01] to [B28], in which the photoelectric conversion unit includes N (where N≥2) photoelectric conversion unit segments, the inorganic oxide semiconductor material layer and the photoelectric conversion layer include N photoelectric conversion layer segments, the insulation layer includes N insulation layer segments, the charge accumulation electrode includes N charge accumulation electrode segments that are arranged apart from each other, an n-th (where n=1, 2, 3 . . . N) photoelectric conversion unit segment includes an n-th charge accumulation electrode segment, an n-th insulation layer segment, and an n-th photoelectric conversion layer segment, a photoelectric conversion unit segment with a larger value of n is positioned farther apart from the first electrode, and materials included in charge accumulation electrode segments are different between adjacent photoelectric conversion unit segments.

[B33]

<<Image Pickup Element: Fifth Configuration>>

The image pickup element according to any one of [A01] to [B28], in which the photoelectric conversion unit includes N (where N≥2) photoelectric conversion unit segments, the inorganic oxide semiconductor material layer and the photoelectric conversion layer include N photoelectric conversion layer segments, the insulation layer includes N insulation layer segments, the charge accumulation electrode includes N charge accumulation electrode segments that are arranged apart from each other, an n-th (where n=1, 2, 3 . . . N) photoelectric conversion unit segment includes an n-th charge accumulation electrode segment, an n-th insulation layer segment, and an n-th photoelectric conversion layer segment, a photoelectric conversion unit segment with a larger value of n is positioned farther apart from the first electrode, and areas of the charge accumulation electrode segments decrease gradually from the first photoelectric conversion unit segment to the N-th photoelectric conversion unit segment.

[B34]

<<Image Pickup Element: Sixth Configuration>>

The image pickup element according to any one of [A01] to [B28], in which, if a stacking direction of the charge accumulation electrode, the insulation layer, the inorganic oxide semiconductor material layer, and the photoelectric conversion layer is a Z-direction, and a direction away from the first electrode is an X direction, a cross-sectional area, taken along an imaginary YZ plane, of a stacked section where the charge accumulation electrode, the insulation layer, the inorganic oxide semiconductor material layer, and the photoelectric conversion layer are stacked varies depending on a distance from the first electrode.

[C01]

<<Stacked Image Pickup Element>>

A stacked image pickup element including:

at least one of the image pickup element according to any one of [A01] to [B34].

[D01]

<<Solid-State Image Pickup Apparatus: First Aspect>>

A solid-state image pickup apparatus including:

a plurality of the image pickup elements according to any one of [A01] to [B34].

[D02]

<<Solid-State Image Pickup Apparatus: Second Aspect>>

A solid-state image pickup apparatus including:

a plurality of the stacked image pickup elements according to [C01].

[E01]

<<Solid-State Image Pickup Apparatus: First Configuration>>

A solid-state image pickup apparatus including:

a photoelectric conversion unit including a stacked first electrode, photoelectric conversion layer, and second electrode, in which the photoelectric conversion unit has a plurality of the image pickup elements according to any one of [A01] to [B34], an image pickup element block includes a plurality of image pickup elements, and the first electrode is shared by the plurality of image pickup elements included in the image pickup element block.

[E02]

<<Solid-State Image Pickup Apparatus: Second Configuration>>

A solid-state image pickup apparatus including:
a plurality of the stacked image pickup elements according to [C01], in which
an image pickup element block includes a plurality of image pickup elements, and
the first electrode is shared by the plurality of image pickup elements included in the image pickup element block.

[E03]

The solid-state image pickup apparatus according to [E01] or [E02], in which
one on-chip micro lens is arranged in place above one image pickup element.

[E04]

The solid-state image pickup apparatus according to [E01] or [E02], in which
an image pickup element block includes two image pickup elements, and
one on-chip micro lens is arranged in place above the image pickup element block.

[E05]

The solid-state image pickup apparatus according to any one of [E01] to [E04], in which one floating diffusion layer is provided for a plurality of image pickup elements.

[E06]

The solid-state image pickup apparatus according to any one of [E01] to [E05], in which
the first electrode is arranged adjacent to a charge accumulation electrode of each image pickup element.

[E07]

The solid-state image pickup apparatus according to any one of [E01] to [E06], in which
the first electrode is arranged adjacent to charge accumulation electrodes of some of the plurality of image pickup elements and is arranged not adjacent to charge accumulation electrodes of the rest of the plurality of image pickup elements.

[E08]

The solid-state image pickup apparatus according to [E07], in which
a distance between a charge accumulation electrode included in an image pickup element and a charge accumulation electrode included in an image pickup element is longer than a distance between a first electrode and a charge accumulation electrode in an image pickup element adjacent to the first electrode.

[F01]

<<Solid-State Image Pickup Apparatus Drive Method>>

A drive method for a solid-state image pickup apparatus including a plurality of image pickup elements each including
a photoelectric conversion unit including a stacked first electrode, photoelectric conversion layer, and second electrode,
the photoelectric conversion unit further including a charge accumulation electrode that is arranged apart from the first electrode and is arranged to face the photoelectric conversion layer via an insulation layer,
the image pickup element having a structure in which light enters from a second-electrode side, and light does not enter the first electrode, the method including repeating each step of:
while accumulating electric charges in inorganic oxide semiconductor material layers in all the image pickup elements all at once, discharging electric charges in the first electrodes to an outside of a system; and then
transferring, to the first electrodes, the electric charges accumulated in the inorganic oxide semiconductor material layers in all the image pickup elements all at once, and, after completion of the transfer, sequentially reading out an electric charge transferred to a first electrode in each image pickup element.

REFERENCE SIGNS LIST

10: Image pickup element (stacked image pickup element, first image pickup element)
11: Second image pickup element
12: Third image pickup element
13: Various types of image pickup element constituent element positioned below interlayer insulation layer
14: On-chip micro lens (OCL)
15: Light-shielding layer
21: First electrode
22: Second electrode
23: Photoelectric conversion unit
23A: Photoelectric conversion layer
23B: Inorganic oxide semiconductor material layer
24: Charge accumulation electrode
24A, 24B, 24C: Charge accumulation electrode segment
25, 25A, 25B: Transfer control electrode (charge transfer electrode)
26: Charge discharge electrode
27: Lower-section charge transfer control electrode (lower charge transfer control electrode)
27A: Connection hole
27B: Pad section
28: Upper-section charge transfer control electrode (upper charge transfer control electrode)
41: n-type semiconductor region included in second image pickup element
43: n-type semiconductor region included in third image pickup element
42, 44, 73: p$^+$ layer
45, 46: Gate section of transfer transistor
51: Gate section of reset transistor $TR1_{rst}$
51A: Channel formation region of reset transistor $TR1_{rst}$
51B, 51C: Source/drain region of reset transistor $TR1_{rst}$
52: Gate section of amplification transistor $TR1_{amp}$
52A: Channel formation region of amplification transistor $TR1_{amp}$
52B, 52C: Source/drain region of amplification transistor $TR1_{amp}$
53: Gate section of selection transistor $TR1_{sel}$
53A: Channel formation region of selection transistor $TR1_{sel}$
53B, 53C: Source/drain region of selection transistor $TR1_{sel}$
61: Contact hole section
62: Wiring layer
63, 64, 68A: Pad section
65, 68B: Connection hole
66, 67, 69: Connecting section
70: Semiconductor substrate 70A: First surface (front surface) of semiconductor substrate
70B: Second surface (rear surface) of semiconductor substrate
71: Element separation region
72: Oxide film
74: HfO$_2$ film
75: Insulation material film
76, 81: Interlayer insulation layer
82: Insulation layer
82$_A$: Region (region −a) between adjacent image pickup elements
83: Protective layer
85: Opening section
86: Second opening section
100: Solid-state image pickup apparatus
101: Stacked image pickup element
111: Image pickup region
112: Vertical drive circuit
113: Column signal processing circuit
114: Horizontal drive circuit
115: Output circuit
116: Drive control circuit
117: Signal line (data output line)
118: Horizontal signal line
200: Electronic equipment (camera)
201: Solid-state image pickup apparatus
210: Optical lens
211: Shutter apparatus
21$_2$: Drive circuit
21$_3$: Signal processing circuit
FD$_1$, FD$_2$, FD$_3$, 45C, 46C: Floating diffusion layer
TR1$_{trs}$, TR2$_{trs}$, TR3$_{trs}$: Transfer transistor
TR1$_{rst}$, TR2$_{rst}$, TR3$_{rst}$: Reset transistor
TR1$_{amp}$, TR2$_{amp}$, TR3$_{amp}$: Amplification transistor
TR1$_{sel}$, TR3$_{sel}$, TR3$_{sel}$: Selection transistor
V$_{DD}$: Power supply
RST$_1$, RST$_2$, RST$_3$: Reset line
SEL$_1$, SEL$_2$, SEL$_3$: Selection line
117, VSL, VSL$_1$, VSL$_2$, VSL$_3$: Signal line (data output line)
TG$_2$, TG$_3$: Transfer gate line
V$_{OA}$, V$_{OB}$, V$_{OT}$, V$_{OU}$: Wire

The invention claimed is:

1. An image pickup element, comprising:
a first electrode;
a charge accumulation electrode arranged apart from the first electrode;
a photoelectric conversion unit that contacts the first electrode and is formed above the charge accumulation electrode via an insulation layer; and
a second electrode formed on the photoelectric conversion unit, wherein
the photoelectric conversion unit includes, from a second-electrode side, a photoelectric conversion layer, and an inorganic oxide semiconductor material layer including a composite oxide of an indium oxide, a gallium oxide, and a tin oxide,
the composite oxide is In$_a$Ga$_b$Sn$_c$O$_d$,
a indicates an atomic ratio of indium (In) atoms,
b indicates an atomic ratio of gallium (Ga) atoms,
c indicates an atomic ratio of tin (Sn) atoms, and
0.30≤b/(a+b+c)≤0.50 and b≥c are satisfied.

2. The image pickup element according to claim 1, wherein 0.40≤b/(a+b+c)≤0.50 is satisfied.

3. The image pickup element according to claim 1, wherein b≥1.2c is satisfied.

4. The image pickup element according to claim 1, wherein
an energy average value of a maximum energy value in a conduction band of the inorganic oxide semiconductor material layer is E11,
an energy average value of a LUMO value of the photoelectric conversion layer is E12, and
E12≥E11 is satisfied.

5. The image pickup element according to claim 1, wherein
an energy average value of a minimum energy value in a valence band of the inorganic oxide semiconductor material layer is E21,
an energy average value of a HOMO value of the photoelectric conversion layer is E22, and
E22≥E21 is satisfied.

6. The image pickup element according to claim 1, wherein
an energy average value of a maximum energy value in a conduction band of the inorganic oxide semiconductor material layer is E11, and
E11≤−4.5 eV is satisfied.

7. The image pickup element according to claim 1, wherein
the photoelectric conversion layer includes an n-type organic semiconductor.

8. The image pickup element according to claim 7, wherein
the photoelectric conversion layer includes a fullerene or a fullerene derivative.

9. The image pickup element according to claim 1, wherein
the photoelectric conversion layer includes an electron transport material.

10. The image pickup element according to claim 1, wherein
the photoelectric conversion layer is configured to generate an electric charge, and
the electric charge is transferred to the first electrode via the inorganic oxide semiconductor material layer.

11. The image pickup element according to claim 10, wherein
the electric charge is electrons.

12. A stacked image pickup element, comprising:
at least one of the image pickup element according to claim 1.

13. A solid-state image pickup apparatus, comprising:
a plurality of the image pickup elements according to claim 1.

14. A solid-state image pickup apparatus, comprising:
a plurality of the stacked image pickup elements according to claim 12.

* * * * *